US012776369B2

(12) United States Patent
Clampitt et al.

(10) Patent No.: US 12,776,369 B2
(45) Date of Patent: Oct. 27, 2026

(54) SELECT GATE TRANSISTOR WITH SEGMENTED CHANNEL FIN

(71) Applicant: Micron Technology, Inc., Boise, ID (US)

(72) Inventors: Darwin A. Clampitt, Wilder, ID (US); Albert Fayrushin, Boise, ID (US); Matthew J. King, Boise, ID (US); Madison D. Drake, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 373 days.

(21) Appl. No.: 18/529,731

(22) Filed: Dec. 5, 2023

(65) Prior Publication Data

US 2024/0112734 A1 Apr. 4, 2024

Related U.S. Application Data

(62) Division of application No. 17/397,603, filed on Aug. 9, 2021, now Pat. No. 11,887,667.

(51) Int. Cl.

*G11C 16/04* (2006.01)
*H10B 41/10* (2023.01)

(Continued)

(52) U.S. Cl.

CPC ......... *G11C 16/0483* (2013.01); *H10B 41/10* (2023.02); *H10B 41/27* (2023.02);

(Continued)

(58) Field of Classification Search

CPC .... G11C 16/0483; G11C 16/16; H10B 41/10; H10B 41/27; H10B 41/35; H10B 43/10;

(Continued)

(56) References Cited

U.S. PATENT DOCUMENTS 8,884,357 B2 11/2014 Wang et al.
9,356,043 B1 5/2016 Sakakibara et al.

(Continued)

FOREIGN PATENT DOCUMENTS

CN 111354734 6/2020
CN 111540748 8/2020

(Continued)

OTHER PUBLICATIONS

"Chinese Application Serial No. 202210949317.4, Office Action mailed Mar. 25, 2026", w/ English Translation, 9 pgs.

(Continued)

*Primary Examiner* — Yara B Green
*Assistant Examiner* — Fakeha Sehar
(74) *Attorney, Agent, or Firm* — Schwegman Lundberg & Woessner, P.A.

(57) ABSTRACT

A variety of applications can include memory devices designed to provide enhanced gate-induced-drain-leakage (GIDL) current during memory erase operations. The enhanced operation can be provided by enhancing the electric field in the channel structures of select gate transistors to strings of memory cells. The channel structures can be implemented as a segmented portion for drains and a portion opposite a gate. The segmented portion includes one or more fins and one or more non-conductive regions with both fins and non-conductive regions extending vertically from the portion opposite the gate. Variations of a border region for the portion opposite the gate with the segmented portion can include fanged regions extending from the fins into the portion opposite the gate or rounded border regions below the non-conductive regions. Such select gate transistors can be formed using a single photo mask process. Additional devices, systems, and methods are discussed.

20 Claims, 102 Drawing Sheets

(51) Int. Cl.

| | |
|---|---|
| ***H10B 41/27*** | (2023.01) |
| ***H10B 41/35*** | (2023.01) |
| ***H10B 43/10*** | (2023.01) |
| ***H10B 43/27*** | (2023.01) |
| ***H10B 43/35*** | (2023.01) |
| ***H10D 30/01*** | (2025.01) |
| ***H10D 30/62*** | (2025.01) |

(52) U.S. Cl.

CPC ............. *H10B 41/35* (2023.02); *H10B 43/10* (2023.02); *H10B 43/27* (2023.02); *H10B 43/35* (2023.02); *H10D 30/024* (2025.01); *H10D 30/6211* (2025.01)

(58) Field of Classification Search

CPC ...... H10B 43/27; H10B 43/35; H10D 30/024; H10D 30/6211

See application file for complete search history.

(56) References Cited

U.S. PATENT DOCUMENTS

| | | | |
|---|---|---|---|
| 9,711,522 | B2 | 7/2017 | Park et al. |
| 10,103,155 | B2 | 10/2018 | Sakaike et al. |
| 11,211,400 | B2 | 12/2021 | She et al. |
| 11,362,175 | B1 | 6/2022 | Fayrushin et al. |
| 11,742,380 | B2 | 8/2023 | Fayrushin et al. |
| 2009/0103367 | A1 | 4/2009 | Lue |
| 2010/0327323 | A1 | 12/2010 | Choi |
| 2011/0180941 | A1 | 7/2011 | Hwang et al. |
| 2011/0298037 | A1 | 12/2011 | Choe et al. |
| 2013/0017629 | A1 | 1/2013 | Pyo et al. |
| 2014/0167129 | A1 | 6/2014 | Kim |
| 2017/0069731 | A1 | 3/2017 | Kim et al. |
| 2018/0053768 | A1 | 2/2018 | Kim et al. |
| 2019/0147954 | A1 | 5/2019 | Yip |
| 2019/0214395 | A1 | 7/2019 | Zhang et al. |
| 2020/0066736 | A1* | 2/2020 | Sakui ..................... H10B 69/00 |
| 2020/0066749 | A1 | 2/2020 | Yamasaki et al. |
| 2020/0152793 | A1 | 5/2020 | Majhi et al. |
| 2020/0176033 | A1 | 6/2020 | Hosotani et al. |
| 2020/0395374 | A1 | 12/2020 | Huo et al. |
| 2021/0066334 | A1 | 3/2021 | Yang |
| 2022/0293726 | A1 | 9/2022 | Fayrushin et al. |
| 2023/0041326 | A1 | 2/2023 | Clampitt et al. |
| 2025/0006261 | A1 | 1/2025 | Clampitt et al. |

FOREIGN PATENT DOCUMENTS

| | | |
|---|---|---|
| CN | 111725219 | 9/2020 |
| CN | 112530973 A | 3/2021 |
| CN | 113178451 A | 7/2021 |
| CN | 115019845 A | 9/2022 |
| CN | 115706150 A | 2/2023 |
| CN | 115019845 B | 2/2026 |
| KR | 20190085475 | 7/2019 |

OTHER PUBLICATIONS

"Fayrushin, Albert et al, Select Gate Gate-Induced-Drain-Leakage Enhancement, U.S. Appl. No. 17/193,845, filed Mar. 5, 2021, 46 pgs.", 46 pgs.

Lee, G H., et al., "Architecture and Process Integration Overview of 3D NAND Flash Technologies", Appl. Sci. 11,6703., (2021), 18 pgs.

U.S. Appl. No. 17/193,845 U.S. Pat. No. 11,362,175, filed Mar. 5, 2021, Select Gate Gate-Induced-Drain-Leakage Enhancement.

U.S. Appl. No. 17/714,740 U.S. Pat. No. 11,742,380, filed Apr. 6, 2022, Select Gate Gate-Induced-Drain-Leakage Enhancement.

U.S. Appl. No. 17/397,603, filed Aug. 9, 2021, Select Gate Transistor With Segmented Channel Fin.

* cited by examiner

SELECT GATE TRANSISTOR WITH SEGMENTED CHANNEL FIN

PRIORITY APPLICATION

This application is a divisional application of U.S. application Ser. No. 17/397,603, filed 9 Aug. 2021, which application is incorporated herein by reference in its entirety.

FIELD OF THE DISCLOSURE

Embodiments of the disclosure relate generally to memory devices and operation of memory devices and, more specifically, to structures and methods related to erase operations of memory devices.

BACKGROUND

Memory devices are typically provided as internal, semiconductor, integrated circuits in computers or other electronic devices. There are many different types of memory, including volatile and non-volatile memory. Volatile memory requires power to maintain its data, and includes random-access memory (RAM), dynamic random-access memory (DRAM), or synchronous dynamic random-access memory (SDRAM), among others. Non-volatile memory can retain stored data when not powered, and includes flash memory, read-only memory (ROM), electrically erasable programmable ROM (EEPROM), erasable programmable ROM (EPROM), resistance variable memory, such as phase-change random-access memory (PCRAM), resistive random-access memory (RRAM), magnetoresistive random-access memory (MRAM), or three-dimensional (3D) XPoint™ memory, among others. A 3D X-Point memory is a non-volatile memory (NVM) technology with a stackable cross-grid data access array in which bit storage is based on a change of bulk resistance.

Flash memory is utilized as non-volatile memory for a wide range of electronic applications. Flash memory devices typically include one or more groups of one-transistor, floating gate or charge trap memory cells, that allow for high memory densities, high reliability, and low power consumption. Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a data line.

Using 3D architectures for memory devices, such as NAND memory devices, can provide increased capacity over planar structures. The memory arrays for 3D structures can include memory cells stacked vertically as strings of memory cells. In selecting one or more strings for access to given memory cells, gating structures can be located at the top and bottom of these strings with memory cells storing data therebetween. The gating structures can include a select gate transistor with its drain coupled to a data line, such as a bitline, at one end of a string and a select gate transistor with its source coupled to a source line at the other end of the string.

In a number of NAND flash devices, an erase operation on a string of memory cells is performed by applying high positive voltages to the string body. In the case of 3D NAND architectures, with the string body of memory cells being electrically isolated, holes can be generated and injected in the string body in order to sustain a positive potential in the string during erase of the memory cells of the string. Gate-Induced-Drain-Leakage (GIDL) is a technique to achieve high-performance and reliable erase operation. It is a leakage mechanism in devices, such as insulated gate field effect transistor (IGFETs), due to large field effect in the drain junction. Existing methods to enhance GIDL operations in a 3D NAND flash memory device include attempts at optimization of the device doping profile of a select transistor to a string of memory cells to make the junction of the select transistor abrupt. With the number of tiers of memory cells in vertical strings in 3D NAND flash memory devices rising to several hundreds or more, it is important to provide sufficient GIDL current during erase operations.

BRIEF DESCRIPTION OF THE DRAWINGS

The drawings, which are not necessarily drawn to scale, illustrate generally, by way of example, but not by way of limitation, various embodiments discussed in the present document.

DETAILED DESCRIPTION

Figure 1A:
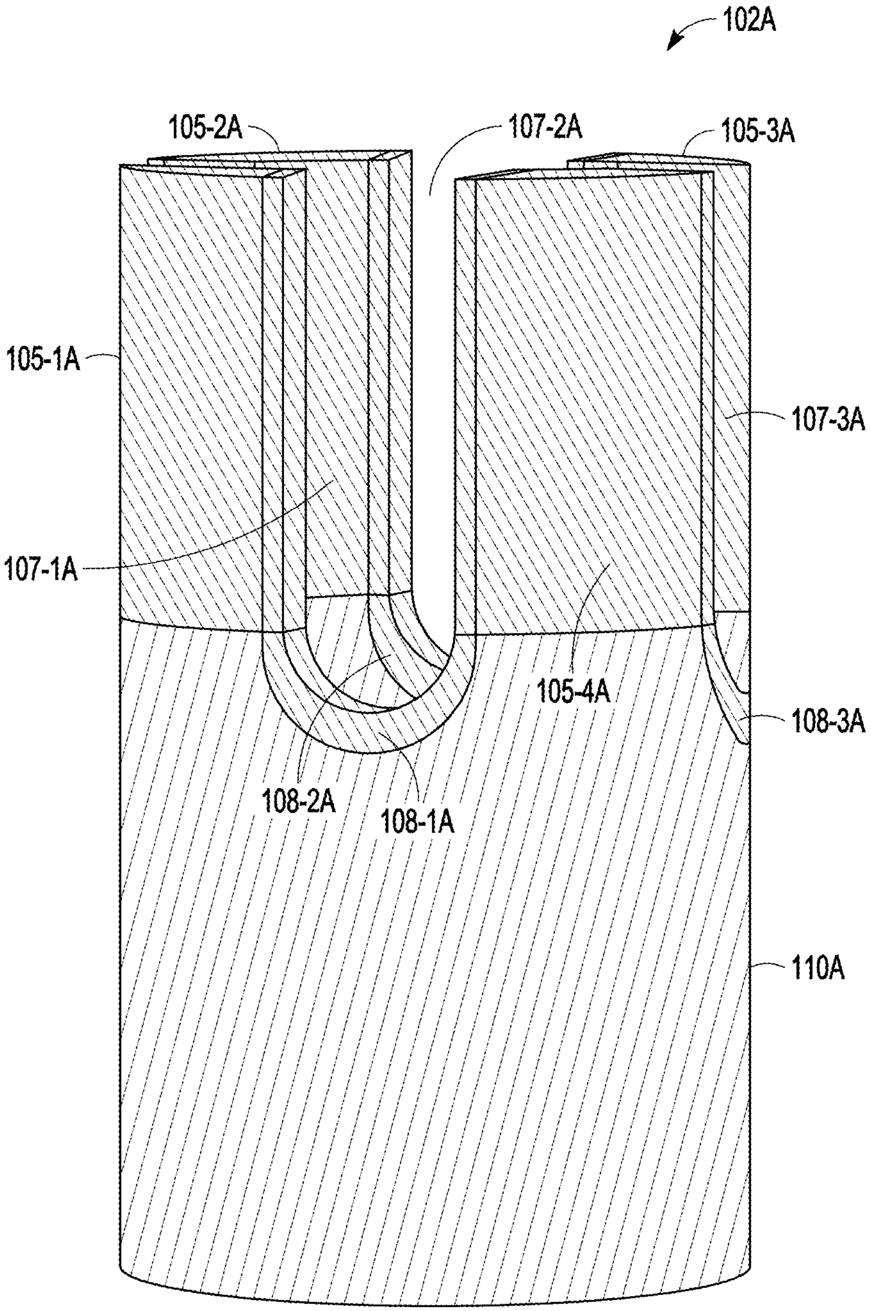
FIGS. 1A-1D illustrate a set of example channel structures that can be implemented in a transistor to couple a data line to a vertical pillar of memory cells, according to various embodiments.

The following detailed description refers to the accompanying drawings that show, by way of illustration, various embodiments that can be implemented. These embodiments are described in sufficient detail to enable those of ordinary skill in the art to practice these and other embodiments. Other embodiments may be utilized, and structural, logical, mechanical, and electrical changes may be made to these embodiments. The term “horizontal” as used in this application is defined as a plane parallel to a conventional plane or surface of a wafer or substrate, regardless of the orientation of the wafer or substrate. The term “vertical” refers to a direction perpendicular to the horizontal as defined above. The various embodiments are not necessarily mutually exclusive, as some embodiments can be combined with one or more other embodiments to form new embodiments. The following detailed description is, therefore, not to be taken in a limiting sense.

Both NOR and NAND flash architecture semiconductor memory arrays of flash memory devices are accessed through decoders that activate specific memory cells by selecting an access line (WL) coupled to gates of specific memory cells. In a NOR architecture semiconductor memory array, once activated, the selected memory cells place their data values on data lines, causing different currents to flow depending on the state at which a particular cell is programmed. In a NAND architecture semiconductor memory array, a relatively high bias voltage is applied to a drain-side select gate (SGD) line. Access lines coupled to the gates of the unselected memory cells of each group are driven at a specified pass voltage (e.g., Vpass) to operate the unselected memory cells of each group as pass transistors (e.g., to pass current in a manner unrestricted by their stored data values). Current then flows in the line between the source line and the data line through each series-coupled group, restricted only by the selected memory cells of each group, placing current-encoded data values of selected memory cells on the data lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data. Flash memory cells can also represent more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC has been referred to as a memory cell that can store two bits of data per cell (e.g., one of four programmed states). MLC is used herein in its broader context, to refer to any memory cell(s) that can store more than one bit of data per cell (i.e., that can represent more than two programmed states). Herein, a memory cell that can store two bits of data per cell (e.g., one of four programmed states) is referred to as a dual-level cell (DLC). A triple-level cell (TLC) refers to a memory cell that can store three bits of data per cell (e.g., one of eight programmed states). A quad-level cell (QLC) can store four bits of data per cell, and a penta-level cell (PLC) can store five bits of data per cell. In a string of memory cells in a 3D memory device such as a 3D NAND memory, access to the string to operate on a memory cell in the string can be controlled by a gating selector device, such as a select gate transistor, which is in series with the memory cells of the string.

In various embodiments, band-to-band charge generation in a transisor channel of a select gate transistor at the data line side of a 3D NAND flash pillar of memory cells can be increased based on segmentation of a channel structure of the select gate transistor. The pillar can include a string of memory cells coupled, at one end of the pillar, to a source line by one or more source-side select gate (SGS) transistors coupled to the pillar with the string of memory cells arranged in series to the source line. At the other end, the string of memory cells can be coupled to the data line by one or more SGD transistors coupled to the pillar and arranged to couple the string of memory cells to the data line. A channel structure of an SGD transistor can include two portions. A first portion of the channel structure of the SGD transistor can be coupled to channel material of the vertical pillar of memory cells and extend vertically from the coupling to the channel material of the vertical pillar. The first portion is a channel region of the SGD transistor that is operated with respect to a gate of the SGD transistor, where the gate is separated by a dielectric from the first portion. The second portion of the channel structure is a segmented portion of the channel structure of the SGD transistor. The segmented portion can extend vertically from the first portion, with the segmented portion having one or more fins contacting and extending vertically from the first portion of the channel structure and one or more non-conductive region contacting and extending vertically from the first portion of the channel structure. The first portion provides a transistor channel region to a drain with the one or more fins of the segmented portion structured as one or more drain channels providing a drain interface to the first portion. In various embodiments, pillars of memory cells in a 3D NAND memory array can be coupled with one SGD to a data line and one SGS to a source line.

The increased generation of band-to-band charge, based on the structural interface of the segmented portion with the first portion of the topmost SGD, can further enhance drain side current GIDL in an erase operation. This structural interface of the segmented portion with the first portion provides a different approach from doping optimization between a contact and a channel structure of the SGD. The band-to-band tunneling field giving rise to GIDL current is enhanced by using the segmented portion coupled to the first portion of the channel structure. The cross-dissected segmented portion provided by the fins and non-conductive regions of the segmented portion breaks uniformity of the electric field and allows electric field lines to concentrate in the dissected area, enhancing band-to-band offset.

In various embodiments, a SGD transistor for a vertical NAND string of memory cells can be implemented with a segmented structure of fins interfacing a channel region of the SGD transistor, with fanged regions extending from the fins into the channel region. A SGD transistor with segmented fins and fangs can be realized in a number of arrangements. In one arrangement, a thin low capacitance drain contact can be built in situ with the segmented module. The drain contact can be, but is not limited to, a tungsten drain contact. In another arrangement, a drain contact can be constructed to touch down to a conductive landing pad. The drain contact can be, but is not limited to, a tungsten drain contact, and the conductive landing pad can be, but is not limited to, a n+ drain landing pad. A high GIDL de-integrated single photo mask process can be used to construct SGD transistors with segmented fin and fang for vertical memory strings in a memory array of a memory device, such as a NAND memory device. A single photo mask process can create a small form factor segmented SGD transistor for high GIDL operation for a vertical NAND drain.

In a segmented SGD single photo level process, a single photo layer can be used to create SGD transistors such that cuts and block segmentation in a memory array are self-aligned. Processing can include overlap of a control gate of the SGD transistor with an interface between a channel region of the SGD transistor and segmented fins for a drain of the SGD transistor, which overlap can be controlled due to layering of sacrificial materials when building up drain and transistor channel segments. The control gate can be constructed to overlap a top level of channel material for the memory cells of a memory string to which the SGD transistor is structured, which can improve performance. The channel material can be poly-silicon. Other semiconductor material can be used for the channel material.

Many options exist to engineer the configuration and shape of the interface between a channel region of the SGD transistor and segmented fins for a drain and the gate overlap to improve performance. The segmented fins for the drain can be more heavily doped than the channel region. For example, the segmented fins for the drain can be a n+ regions and the channel region can be an n− region. The use of a single photo layer and wet etches in processing these regions can also lower cost to manufacture. In addition, self-aligned and self-contained drain contacts provided by these processes should mitigate a number of fail modes that can be associated with current processes for a SGD module.

FIGS. 1A-1D illustrate a set of example channel structures 102A, 102B, 102C, and 102D that can be implemented in a transistor to couple a data line to a vertical pillar of memory cells, in accordance with various embodiments. The transistor coupling the data line to the vertical pillar of memory cells can be implemented, for example, as a SGD transistor in a memory array of a NAND memory device. Each of the channel structures 102A, 102B, 102C, and 102D includes a first portion to couple to channel material of the vertical pillar of memory cells and extend vertically from the channel material. The first portion provides a transistor channel region for transistor operation and is separated from a gate of the transistor by dielectric material providing a transistor gate dielectric. Each of the channel structures 102A, 102B, 102C, and 102D also includes a segmented portion extending vertically from the first portion, with the segmented portion doped more heavily than the first portion providing an interface for a drain region. The segmented portion has one or more fins contacting and extending vertically from the first portion and one or more non-conductive regions contacting and extending vertically from the first portion.

FIG. 1A shows channel structure 102A having fins 105-1A, 105-2A, 105-3A, and 105-4A and electrically non-conductive regions 107-1A, 107-2A, and 107-3A, with the fins 105-1A, 105-2A, 105-3A, and 105-4A and non-conductive regions 107-1A, 107-2A, and 107-3A extending vertically from a first portion 110A of the channel structure 102A. Though not shown, there is a non-conductive region between fin 105-1A and fin 105-2A. Though non-conductive regions 107-1A, 107-2A, and 107-3A are shown as voids, these non-conductive regions can include dielectric material. The interface of the non-conductive region 107-1A with the first portion 110A has a rounding 108-1A, which is a rounded border for the first portion 110A, from a lower end corner of the fin 105-1A to a lower end corner of the fin 105-4A. The interface of the non-conductive region 107-2A with the first portion 110A has a rounding 108-2A, which is a rounded border for the first portion 110A, from a lower end corner of the fin 105-2A to a lower end corner of the fin 105-3A. The interface of the non-conductive region 107-3A with the first portion 110A has a rounding 108-3A, which is a rounded border for the first portion 110A, from a lower end corner of the fin 105-3A to a lower end corner of the fin 105-4A. A non-conductive region between fin 105-1A and fin 105-2A can also have a rounding as a rounded border for the first portion 110A. The roundings of the channel structure 102A can be structured as regions more heavily doped than the first portion 110A. For example, with the first portion 110A doped as a n− structure, n+ doping can be added to the roundings of the channel structure 102A. Implemented in a SGD transistor for a memory string of a memory array of a memory device, the structure 102A can be disposed around a dielectric region.

Figure 1B:
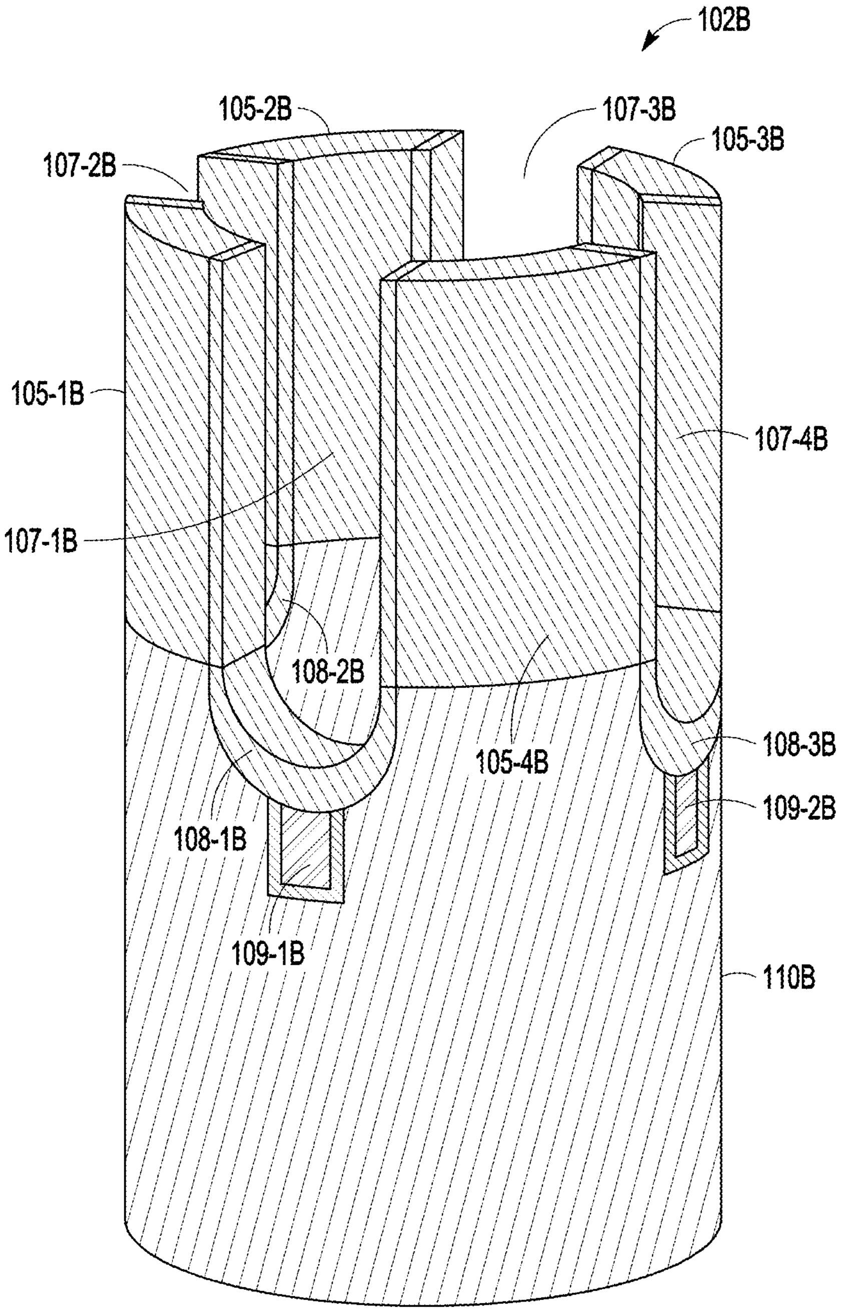

FIG. 1B shows channel structure 102B having fins 105-1B, 105-2B, 105-3B, and 105-4B and electrically non-conductive regions 107-1B, 107-2B, 107-3B, and 107-4B, with the fins 105-1B, 105-2B, 105-3B, and 105-4B and non-conductive regions 107-1B, 107-2B, 107-3B, and 107-4B extending vertically from a first portion 110B of the channel structure 102B. Though non-conductive regions 107-1B, 107-2B, 107-3B, and 107-4B are shown as voids, these non-conductive regions can include dielectric material. The interface of the non-conductive region 107-1B with the first portion 110B has a rounding 108-1B, which is a rounded border for the first portion 110B, from a lower end corner of the fin 105-1B to a lower end corner of the fin 105-4B. The interface of the non-conductive region 107-2B with the first portion 110B has a rounding 108-2B, which is a rounded border for the first portion 110B, from a lower end corner of the fin 105-1B to a lower end corner of the fin 105-2B. The interface of the non-conductive region 107-4B with the first portion 110B has a rounding 108-3B, which is a rounded border for the first portion 110B, from a lower end corner of the fin 105-3B to a lower end corner of the fin 105-4B. The interface of the non-conductive region 107-3B with the first portion 110B can also have a rounding as a rounded border for the first portion 110B between fin 105-2B and fin 105-3B. The roundings of the channel structure 102B can be structured as regions more heavily doped than the first portion 110B. For example, with the first portion 110B doped as a n-structure, n+ doping can be added to the roundings of the channel structure 102B.

Additionally, an emitter 109-1B can be structured extending from the rounding 108-1B into the first portion 110B. The emitter 109-1B can be located extending downward in the first portion 110B from a location at about a center of the rounding 108-1B and can have a width in size that is a portion of the rounding 108-1B along the rounding 108-1B. An emitter 109-2B can be structured extending from the rounding 108-3B into the first portion 110B. The emitter 109-2B can be located extending downward in the first portion 110B from a location at about a center of the rounding 108-3B and can have a width in size that is a portion of the rounding 108-3B along the rounding 108-3B. Though not shown, emitters can be structured into the first portion 110B extending from other roundings at interfaces of non-conductive regions with the first portion 110B. The emitters of the channel structure 102B can be structured to be more heavily doped than the first portion 110B. For example, with the first portion 110B doped as a n-structure, the emitters can be n+ emitters. Implemented in a SGD transistor for a memory string of a memory array of a memory device, the structure 102B can be disposed around a dielectric region.

Figure 1C:
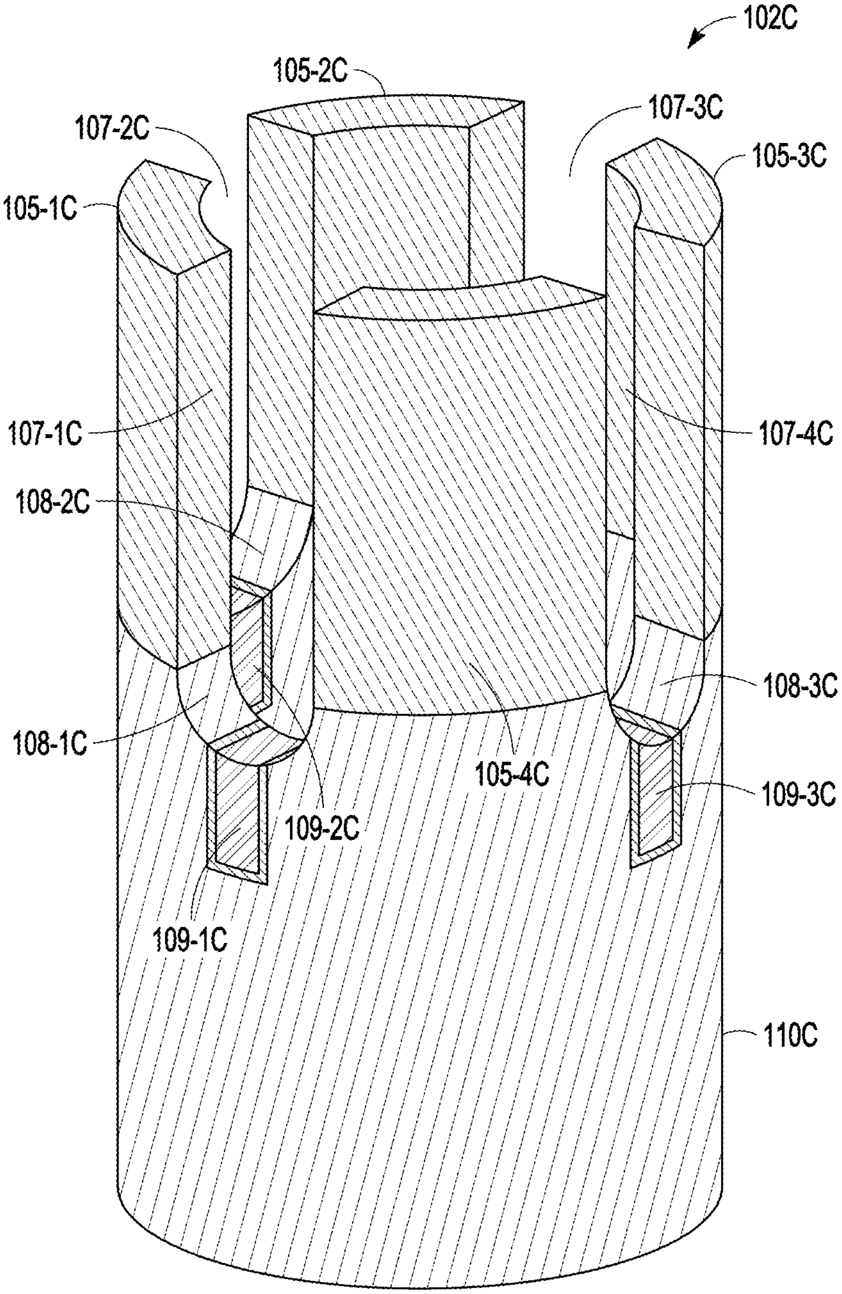

FIG. 1C shows a channel structure 102C having fins 105-1C, 105-2C, 105-3C, and 105-4C and electrically non-conductive regions 107-1C, 107-2C, 107-3C, and 107-4C, with the fins 105-1C, 105-2C, 105-3C, and 105-4C and non-conductive regions 107-1C, 107-2C, 107-3C, and 107-4C extending vertically from a first portion 110C of the channel structure 102C. Though non-conductive regions 107-1C, 107-2C, 107-3C, and 107-4C are shown as voids, these non-conductive regions can include dielectric material. The interface of the non-conductive region 107-1C with the first portion 110B has a rounding 108-1C, which is a rounded border for the first portion 110C, from a lower end corner of the fin 105-1C to a lower end corner of the fin 105-4C. The interface of the non-conductive region 107-2C with the first portion 110C has a rounding 108-2C, which is a rounded border for the first portion 110C, from a lower end corner of the fin 105-1C to a lower end corner of the fin 105-2C. The interface of the non-conductive region 107-4C with the first portion 110C has a rounding 108-3C, which is a rounded border for the first portion 110C, from a lower end corner of the fin 105-3C to a lower end corner of the fin 105-4C. The interface of the non-conductive region 107-3C with the first portion 110C can also have a rounding as a rounded border for the first portion 110C between fin 105-2C and fin 105-3C.

An emitter 109-1C can be structured extending from the rounding 108-1C into the first portion 110C. The emitter 109-1C can be located extending downward in the first portion 110C from a location at about a center of the rounding 108-1C and can have a width in size that is a portion of the rounding 108-1C along the rounding 108-1C. An emitter 109-2C can be structured extending from the rounding 108-2C into the first portion 110C. The emitter 109-2C can be located extending downward in the first portion 110C from a location at about a center of the rounding 108-2C and can have a width in size that is a portion of the rounding 108-2C along the rounding 108-2C. An emitter 109-3C can be structured extending from the rounding 108-3C into the first portion 110C. The emitter 109-3C can be located extending downward in the first portion 110C from a location at about a center of the rounding 108-3C and can have a width in size that is a portion of the rounding 108-3C along the rounding 108-3C. Though not shown, other emitters can similarly be structured extending into the first portion 110C from other roundings of the channel structure 102C at interfaces of non-conductive regions with the first portion 110C. The emitters of the channel structure 102C can be structured to be more heavily doped than the first portion 110C. For example, with the first portion 110C doped as a n-structure, the emitters can be n+ emitters. The channel structure 102C of FIG. 1C differs from the channel structure 102B of FIG. 1B in that the roundings of the first portion 110C of the channel structure 102C do not have added charge doping with respect to the first portion 110C except at emitters. Implemented in a SGD transistor for a memory string of a memory array of a memory device, the structure 102C can be structured around a dielectric region.

Figure 1D:
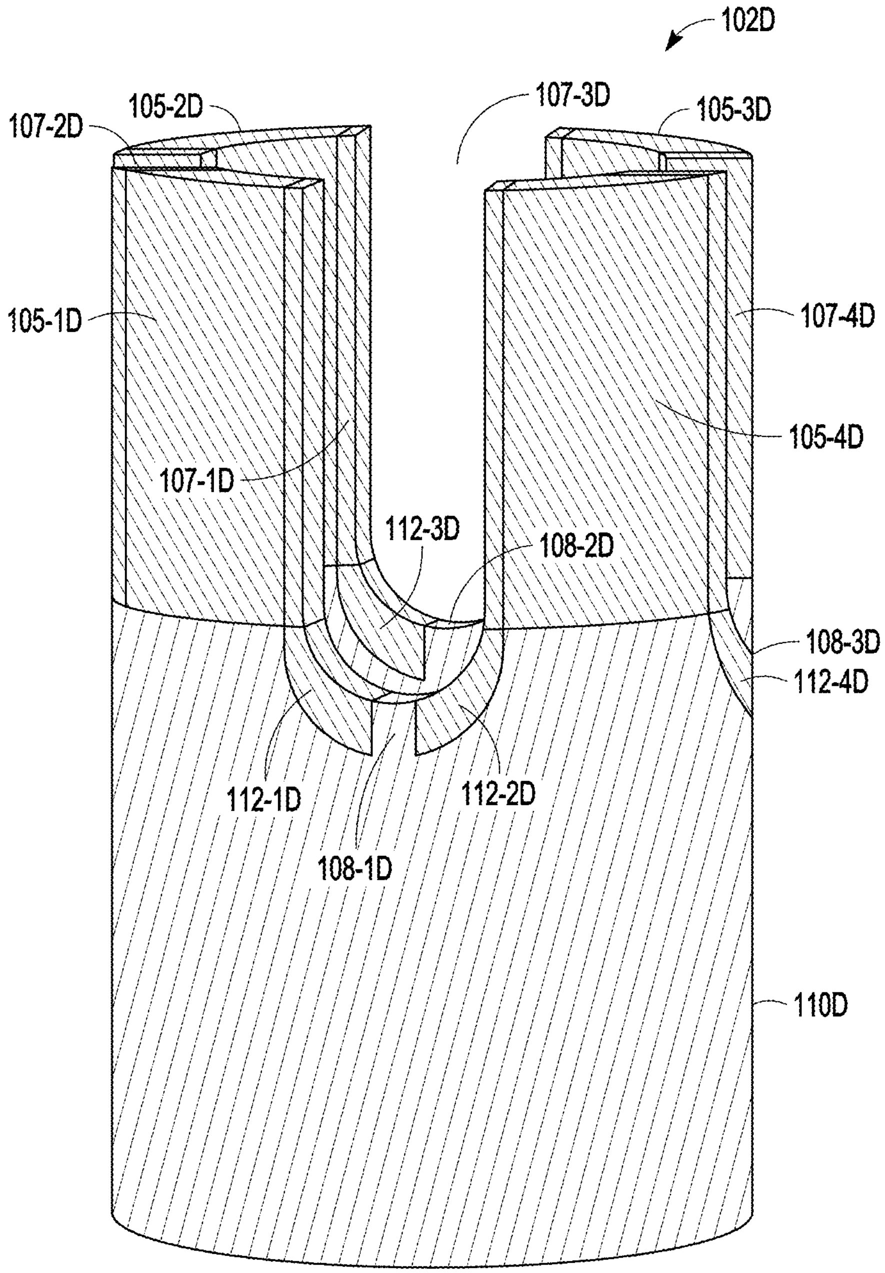

FIG. 1D shows a channel structure 102D having fins 105-1D, 105-2D, 105-3D, and 105-4D and electrically non-conductive regions 107-1D, 107-2D, 107-3D, and 107-4D, with the fins 105-1D, 105-2D, 105-3D, and 105-4D and non-conductive regions 107-1D, 107-2D, 107-3D, and 107-4D extending vertically from a first portion 110D of the channel structure 102D. Though non-conductive regions 107-1D, 107-2D, 107-3D, and 107-4D are shown as voids, these non-conductive regions can include dielectric material. The interface of the non-conductive region 107-1D with the first portion 110D has a rounding 108-1D, which is a rounded border for the first portion 110D, from a lower end corner of the fin 105-1D to a lower end corner of the fin 105-4D. The interface of the non-conductive region 107-3D with the first portion 110D has a rounding 108-2D, which is a rounded border for the first portion 110D, from a lower end corner of the fin 105-2D to a lower end corner of the fin 105-3D. The interface of the non-conductive region 107-4D with the first portion 110D has a rounding 108-3D, which is a rounded border for the first portion 110D, from a lower end corner of the fin 105-3D to a lower end corner of the fin 105-4D. The interface of the non-conductive region 107-2D with the first portion 110D can also have a rounding as a rounded border for the first portion 110D between fin 105-1D and fin 105-2D.

Portions of the rounding 108-1D of the channel structure 102D can be structured to be more heavily doped than the first portion 110A without completely doping the rounding 108-1D more heavily than the first portion 110D. Partially doping the rounding 108-1D more heavily than the first portion 110D can structure two fanged regions 112-1D and 112-2D into the first portion 110D. The fanged region 112-1D extends from the lower end corner of the fin 105-1D towards the lower end corner of the fin 105-4D along the rounding 108-1D. The fanged region 112-2D extends from the lower end corner of the fin 105-4D towards a lower end corner of the fin 105-1D along the rounding 108-1D. The fanged regions 112-1D and 112-2D are separated from each other by a region of the rounding 108-1D. With the first portion 110D doped as a n-structure, fangs of the channel structure 102D can have n+ doping with the regions between fangs under a non-conductive region having a n− structure. Also shown in FIG. 1D is a fanged region 112-3D extending from a lower end of fin 105-2D along rounding 108-2D. Though not shown, each fin of channel structure 102D can be structured with two fanged regions extending into the first portion 110D with each fanged region disposed along a portion of a corresponding rounding of the first portion 110D. The channel structure 102D of FIG. 1D differs from the channel structure 102A of FIG. 1A in that the roundings of the channel structure 102D between fins and under non-conductive regions have two fanged regions more heavily doped than the first portion of the channel structure with the region between the fangs being part of the first portion of the channel structure, while the roundings in the channel structure 102A of FIG. 1A are more heavily doped completely from one fin to an adjacent fin. Implemented in a SGD transistor for a memory string of a memory array of a memory device, the structure 102D can be structured around a dielectric region.

Figure 2C:
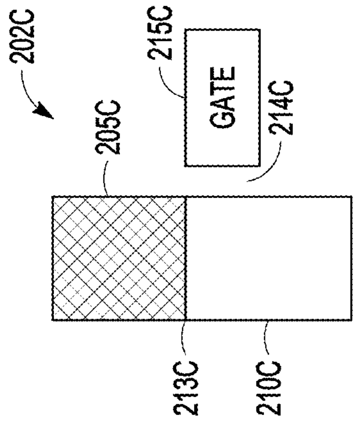
FIGS. 2A-2C illustrate, in block diagrams, different example arrangements of a channel structure separated from a gate by a dielectric region in a transistor, according to various embodiments.
Figure 2B:
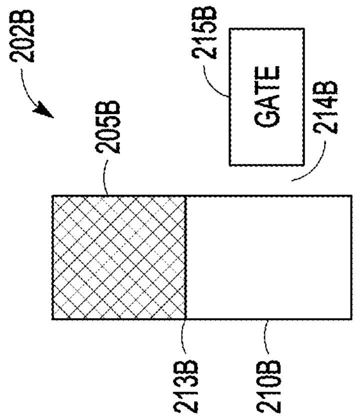
Figure 2A:
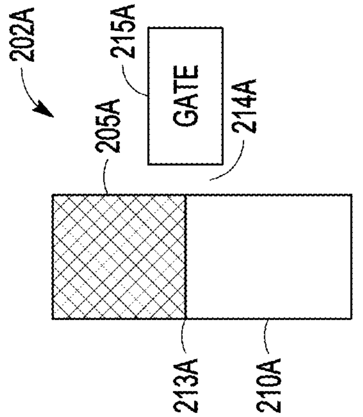

FIGS. 2A-2C illustrate, in block diagrams, different example arrangements of a channel structure separated from a gate by a dielectric region in a transistor. The channel structures can be implemented similar to, but not limited to, any one of the channel structures 102A, 102B, 102C, or 102D. For ease of discussion, each of the channel structures shown in FIGS. 2A-2C is cross-section showing only a single fin extending from an interface to a first portion that is structured as a channel region for the associated transistor. The interface provides a junction of a transistor channel region with a more heavily doped region for a drain of the transistor.

FIG. 2A illustrates a vertical channel structure 202A having a fin 205A extending vertically from an interface 213A to a first portion 210A that is more lightly doped than the fin 205A. The vertical channel structure 202A is separated from a gate 215A by a dielectric region 214A. The top of the gate 215A is at a level such that the gate 215A vertically overlaps the interface 213A and vertically terminates at its top end at a level corresponding to a level in the fin 205A.

FIG. 2B illustrates a vertical channel structure 202B having a fin 205B extending vertically from an interface 213B to a first portion 210B, where the first portion 210B is more lightly doped than the fin 205B. The vertical channel structure 202B is separated from a gate 215B by a dielectric region 214B. The top of the gate 215B is at a level such that the gate 215B vertically underlaps the interface 213B and vertically terminates at its top end at a level corresponding to a level in the first portion 210B.

FIG. 2C illustrates a vertical channel structure 202C having a fin 205C extending vertically from an interface 213C to a first portion 210C, where the first portion 210C is more lightly doped than the fin 205C. The vertical channel structure 202C is separated from a gate 215C by a dielectric region 214C. The top of the gate 215C is vertically aligned at a level corresponding to the interface 213C such that the gate 215C vertically terminates at its top end at the level aligned with the interface 213C.

With a channel structure having a segmented fin extending from a first portion as part of a SGD transistor for a memory string in a memory array of a memory device, the channel structure can have an impact on GIDL operation of the memory string. The impact can depend on a number of factors such as the channel structure and the relationship of the portions of the channel structure with a gate of the SGD transistor. Simulations can show relationships between GIDL operation and the channel structures 102A, 102B, 102C, and 102D of FIGS. 1A-1D along with the gate-junction relationships of FIGS. 2A-2C.

The simulations indicate that a deeper cut provides improvement to GIDL operation independent of gate-junction overlap. Gain can be obtained with any n+ fin-gate overlap, but typically GIDL variability is larger than in the case of the cut being deeper than the junction line (interface between fin of a segmented portion and a first portion of a channel structure). With the channel structure arranged as the channel structure 102A of FIG. 1A with the junction aligned with the top of the associated gate, adding n+ to the roundings relative to the doping of the first portion 110A helps to improve GIDL current at lower bias. With the channel structure arranged as channel structure 102A of FIG. 1A with the junction overlapping the gate top, doping of the rounding does not appear to provide an advantage. With the junction underlapping the gate top, doping of the rounding appears to have an advantage. However, it may be appropriate to use a small overlap without doping of the roundings.

With the channel structure arranged as the channel structure 102B of FIG. 1B, the emitters help to make GIDL current less dependent on junction variation. The emitters can increase GIDL current at lower bias, even more than doping the roundings to provide a n+ region in the border of the first portion 110B of the channel structure 102B. GIDL current can be degraded at higher bias, though still higher than in a segmented structure without roundings.

With the channel structure arranged as the channel structure 102C of FIG. 1C, implementation of emitters without doped roundings may provide the largest enhancements. However, emitters alone may not be desirable, due to high dependence on gate-junction overlap. With the channel structure arranged as the channel structure 102D of FIG. 1D, roundings with fanged regions can offer larger current than just roundings with n+ doping.

Figure 3A:
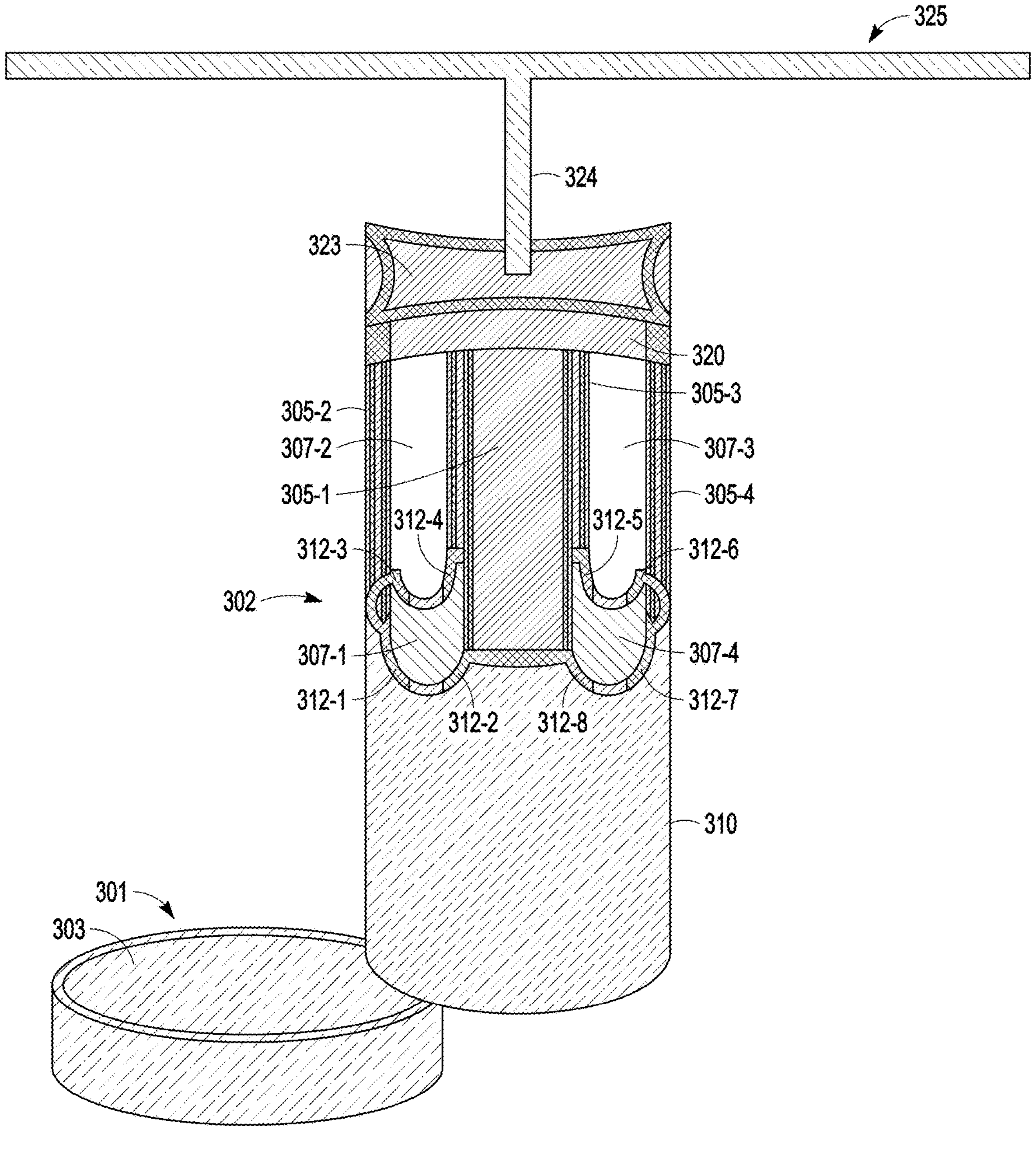
FIG. 3A illustrates an example channel structure for a transistor arranged to couple a data line to channel material of a vertical pillar of memory cells of a memory device, according to various embodiments.

FIG. 3A illustrates an embodiment of an example channel structure 302 for a transistor arranged to couple a data line 325 to channel material 301 of a vertical pillar of memory cells of a memory device. The transistor for the channel structure 302 can be structured as a SGD transistor to the vertical pillar of memory cells. The channel material 301 can be arranged around a dielectric 303 and the transistor having the channel structure 302 can be disposed with its structure shifted horizontally with respect to the pillar.

The channel structure 302 can be structured as a first portion 310 and a segmented portion. The first portion 310 of the channel structure 302 for the transistor can be coupled to the channel material 301 of the vertical pillar of memory cells and can extend vertically from the channel material 301. The segmented portion of the channel structure 302 can extend vertically from the first portion 310, where the segmented portion has one or more fins and one or more non-conductive regions. In the example of FIG. 3A, the segmented portion of the channel structure 302 has four fins 305-1, 305-2, 305-3, and 305-4 and four non-conductive regions 307-1, 307-2, 307-3, and 307-4. Each of the fins 305-1, 305-2, 305-3, and 305-4 contact and extend vertically from the first portion 310 of the channel structure 302. Each of the non-conductive regions 307-1, 307-2, 307-3, and 307-4 contact and extend vertically from the first portion 310 of the channel structure 302. The segmented portion of the channel structure 302 can also include fanged regions 312-1 and 312-2, fanged regions 312-3 and 312-4, fanged regions 312-5 and 312-6, and fanged regions 312-7 and 312-8 extending from the fins 305-1, 305-2, 305-3, and 305-4, respectively, into the first portion 310 of the channel structure 302. The channel structure 302 can be implemented similar or identical to the channel structure 102D of FIG. 1D.

The fins 305-1, 305-2, 305-3, and 305-4 can extend from the first portion 310 to a drain 320 for the transistor. A drain contact 323 disposed on and contacting the drain 320 can be coupled to the data line 325 by a conductive structure 324. The conductive structure 324 can be a metal contact. The metal contact can include, but is not limited to, tungsten, titanium nitride, a combination of tungsten and titanium nitride, or other appropriate metal. The conductive structure 324 can be disposed on and contacting a titanium silicide between the conductive structure 324 and the drain contact. The conductive structure 324 provides an additional drain contact coupled to the fins of the channel structure 302, where the conductive structure 324 can have a width equal to or less than a width of the data line 325. The fins 305-1, 305-2, 305-3, and 305-4, the fanged regions 312-1, 312-2, 312-3, 312-4, 312-5, 312-6, 312-7, and 312-8, drain contact 323, and drain 320 can be heavily doped relative to doping of the first portion 310. The first portion 310 can be doped n− and these other doped regions can be doped n+.

Figure 3B:
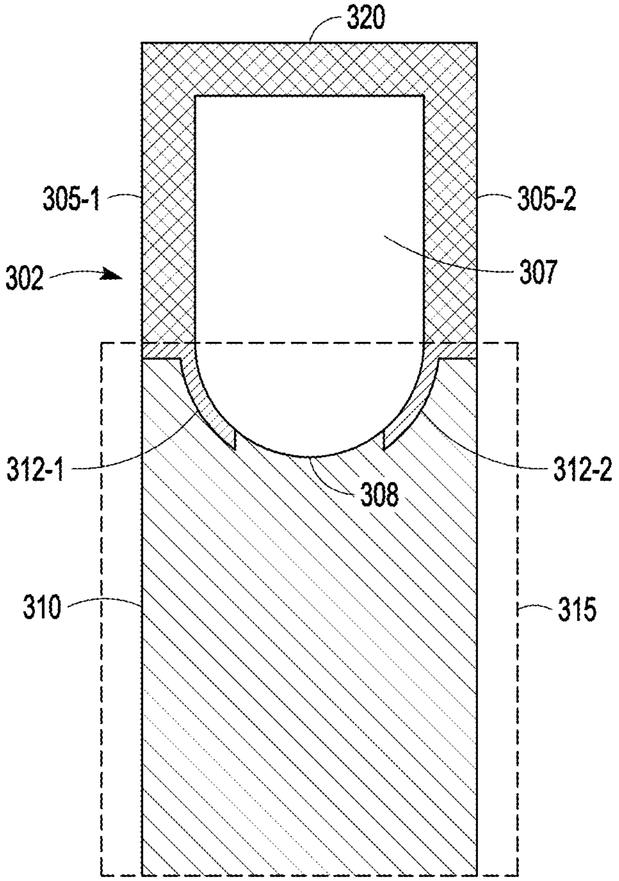
FIG. 3B shows a cross-sectional view of the channel structure of FIG. 3A with a gate arranged with respect to a first portion of the channel structure of FIG. 3A, according to various embodiments.

FIG. 3B shows a cross-sectional view of the channel structure 302 of FIG. 3A with a gate 315 arranged with respect to the first portion 310. The first portion 310 provides a transistor channel for the drain 320 with the first portion 310 separated from the gate 315. The drain 320 can be integrated with the segmented portion of fins 305-1 and 305-2 and non-conductive region 307. The non-conductive region 307 can be a void region or a solid dielectric region.

Fanged regions 312-1 and 312-2 extend from the fins 305-1 and 305-2 into the first portion 310.

In this example, a top of the gate 315 is aligned at a bottom of the fins 305-1 and 305-2. In other embodiments, the top of the gate 315 overlaps an interface between the first portion 310 and the fins 305-1 and 305-2 or underlaps the interface between the first portion 310 and the fins 305-1 and 305-2. The top of the first portion 310 has a rounded border 308 between the fins 305-1 and 305-2, with the rounded border 308 decreasing from the fins 305-1 and 305-2 towards a lower border location of the first portion 310 with the non-conductive region 307. The fins 305-1 and 305-2 and the fanged regions 312-1 and 312-2 are more highly doped portions than the rounded border 308 between the fanged regions 312-1 and 312-2.

FIGS. 4-47 illustrate an embodiment of an example method of forming a memory device having an array of strings of memory cells with each string formed as a vertical pillar coupled to a SGD transistor for the string. Features associated with stages of forming the SGD transistors coupled to the strings of memory cells are shown in some of these figures. In this embodiment, a SGD transistor with segmented fins and fangs is formed with a thin low-capacitance drain contact built in situ with building the segmented module. For the procedures discussed herein, the selection of processing materials can depend on the materials selected to form various components of and contacts to devices of the memory array. The processing materials can be selected to allow removal of one or more materials, while retaining one or more other materials. In addition, deposition techniques can be used that are typical for the material being formed, the dimensions of the material being formed, and the architecture in which the material is being formed.

Figure 4:
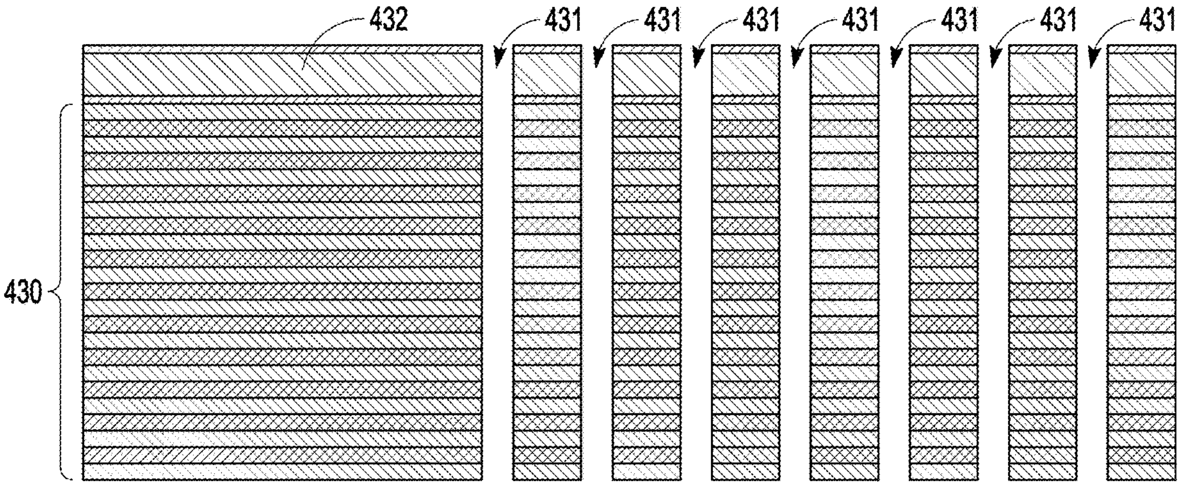
FIGS. 4-47 illustrate an example method of forming a memory device having an array of strings of memory cells with each string formed as a vertical pillar coupled to a drain-side select gate transistor for the string, according to various embodiments.
Figure 5:
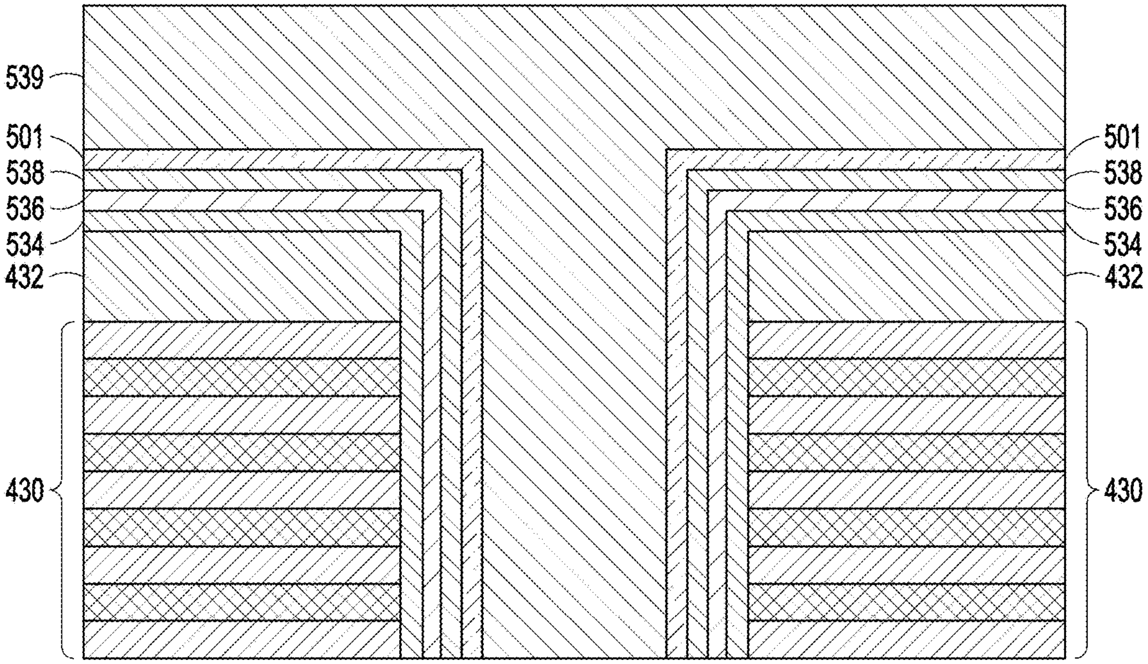

FIG. 4 shows layers of material 430 with an oxide layer 432 on the layers of material 430 after etching to form openings 431 in the layers of material 430 and the oxide layer 432. Pillars of memory cells are to be formed in the openings 431. The oxide layer 432 can be a silicon oxide layer. Dielectric materials other than an oxide can be used for the oxide layer 432. The layers of material 430 can include a material stack of alternating layers of isolation dielectrics and sacrificial regions, with the sacrificial regions to be used to form gates of the memory cells in which each isolation dielectric separates adjacent tiers of memory cells. The number of layers of material 430 depends on the number of tiers of memory cells to be formed in the openings 431. The number of memory cells, hence the number of tiers, in a string can range from several to thousands or more FIG. 5 shows a cross-sectional view of one of the openings 431 after cell films and channel material have been formed with an oxide 539 formed on the material for the cell films. The formation can use appropriate deposition processes for the materials used. Appropriate deposition techniques can include, for example, chemical vapor deposition (CVD), atomic layer deposition (ALD), variations of CVD and ALD, or other techniques. Each opening 431 of FIG. 4 can be filled in the same manner forming similar of identical structures. Each cell formed in an opening 431 can include elements of a transistor to store charge. For example, each cell can include a channel region in which current can flow in operation of the memory device, a tunnel region separating the channel from a charge trap region used to store charge, and a dielectric blocking region that separates a gate from the charge trap region. In various embodiments, a dielectric barrier region, structured as a thin region, can be disposed between the dielectric blocking region and the gate that enables an enhanced tunneling barrier that prevents back-tunneling of electrons from the gate through the dielectric blocking region into the charge trap region. The material for the cell films formed in the openings 431 can include a dielectric blocking material 534, a charge trap material 536, a tunneling material 538, and a channel material 501.

In an embodiment in which a dielectric barrier is used, though not shown in FIG. 5, the dielectric barrier material can be deposited on surfaces for the opening 431. The dielectric barrier material can be realized as an aluminum oxide region or a dielectric region having a higher dielectric constant than aluminum oxide. For example, the dielectric barrier material can include one or more of aluminum oxide, hafnium oxide, zirconium oxide, or mixtures of hafnium oxide and/or zirconium oxide with one or more of aluminum oxide, silicon oxide, titanium oxide, gadolinium oxide, niobium oxide, or tantalum oxide. Other high-K dielectrics can be used for in the dielectric barrier material, where K is a dielectric constant. A high-K dielectric is a dielectric with a dielectric constant greater than the dielectric constant of silicon dioxide. The dielectric barrier material can be formed in a region as a nanolaminate of a number of different compounds in each sub-region of the region in which the nanolaminate is formed, with the formed region having a total thickness in the nanometer region. The term "nanolaminate" means a composite film of ultra thin layers of two or more materials in a layered stack. Typically, each layer in a nanolaminate has a thickness of an order of magnitude in the nanometer range. Further, each individual material layer of the nanolaminate may have a thickness as low as a monolayer of the material or as high as 5 nanometers. The dielectric barrier material can be formed with a thickness from the wall of the openings 431 in the range of 20 to 50 angstroms. The transition from one layer of a nanolaminate to another layer of the nanolaminate for the dielectric barrier material provides further disruption to a tendency for an ordered structure in a nanolaminate stack, reducing or eliminating the occurrence of convenient back-tunneling paths.

The dielectric blocking material 534 can be formed on the surface of the openings 431 as shown in FIG. 5 or on dielectric barrier material after forming such dielectric barrier material on the surface of the openings 431. The dielectric blocking material 534 can be a silicon oxide, a high-K dielectric, or a combination of silicon oxide or one or more high-K dielectric materials. When dielectric barrier material is used, material of the dielectric blocking material 534 that interfaces with the dielectric barrier material is selected to be different from material of the dielectric barrier material at the interface.

The charge trap material 536 can be formed on the dielectric blocking material 534 after forming the dielectric blocking material 534. The charge trap material 536 can be structured from material that in operation can hold electrons received from the channel region of the respective memory cell. For example, the charge trap material 536 can be a dielectric material that can store charge. The charge trap material 536 can be a dielectric nitride region such as a region including dielectric silicon nitride. Other dielectric materials for charge trap material 536 can be used to trap charge. Depending on the memory cell design, materials for operation as a floating-gate structure may be used for the charge trap material 536.

The tunneling material 538 can be formed on the charge trap material 536 after forming the charge trap material 536. The tunneling material 538 can be constructed as an engineered region to meet a selected criterion, such as, for example but not limited to, an equivalent oxide thickness (EOT). The EOT quantifies the electrical properties of the tunneling material 538, such as capacitance, of a dielectric in terms of a representative physical thickness. For example, EOT can be defined as the thickness of a theoretical $SiO_2$ layer that would be required to have the same capacitance density as a given dielectric (tunneling material 538), ignoring leakage current and reliability considerations. The tunneling material 538 can include an oxide and a nitride. The tunneling material 538 can include a high-K dielectric. The tunneling material 538 may include a set of dielectric regions. The tunneling material 538 can be a three region structure. Such a three region structure can be arranged as a region of dielectric oxide followed by a region of dielectric nitride followed by another region of dielectric oxide. The tunneling material 538 can be a two region tunnel structure or a one region tunnel structure. Further, the tunneling material 538 may have four or more regions, where the selection of material and thicknesses depends on the capability of the material with the given thicknesses to perform as a tunneling region in the trapping of charge.

The channel material 501 can be formed on the tunneling material 538 after forming the tunneling material 538. The channel material 501 can be structured as a pillar of semiconductor material arranged vertically from a source line for the array of strings of memory cells and arranged to couple with a SGD transistor to be formed. The channel material 501 can be implemented as a polysilicon channel structure. Other semiconductor types and materials can be used for the channel material 501.

Figure 6:
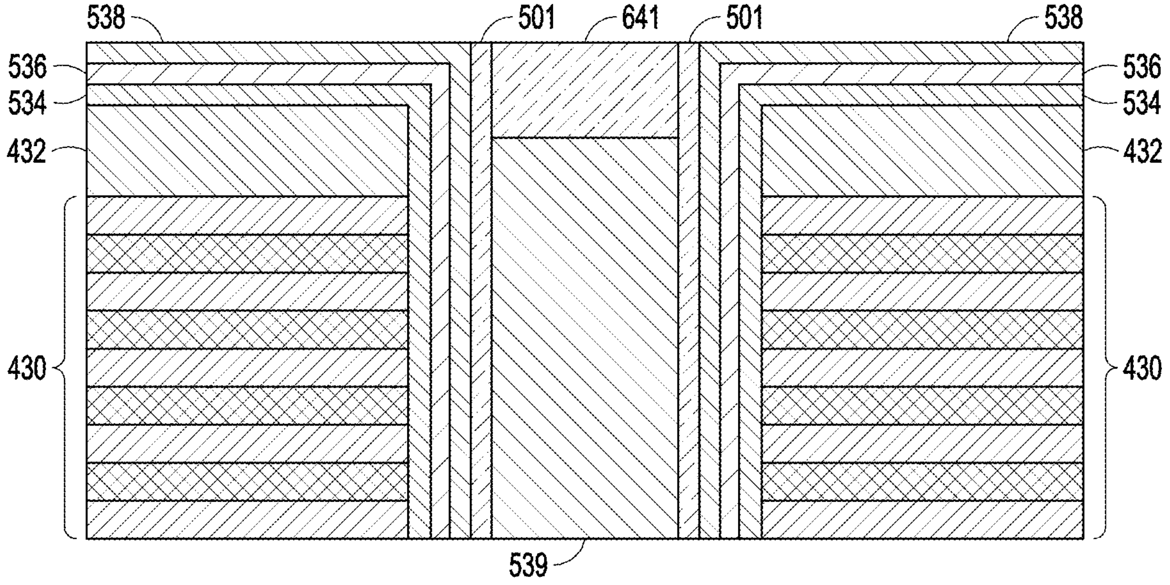

FIG. 6 shows a cross-sectional view of the structure of FIG. 5 after several processing stages have been performed. A chemical mechanical planarization (CMP) has been performed on the oxide 539 and the oxide 539 has been recessed. The recess has been filled with a semiconductive material 641. The semiconductive material 641 can be, but is not limited to, the same as the channel material 501. For example, the semiconductive material 641 can be polysilicon. A CMP procedure has been applied to the surface after filing the recess such that a portion of the channel material 501, which had been formed horizontally on top of the tunnel material 538, has been removed, leaving the channel material 501, the semiconductive material 641, and the tunnel material 538 around the channel material 501 and the semiconductive material 641 exposed as a top surface.

Figure 7:
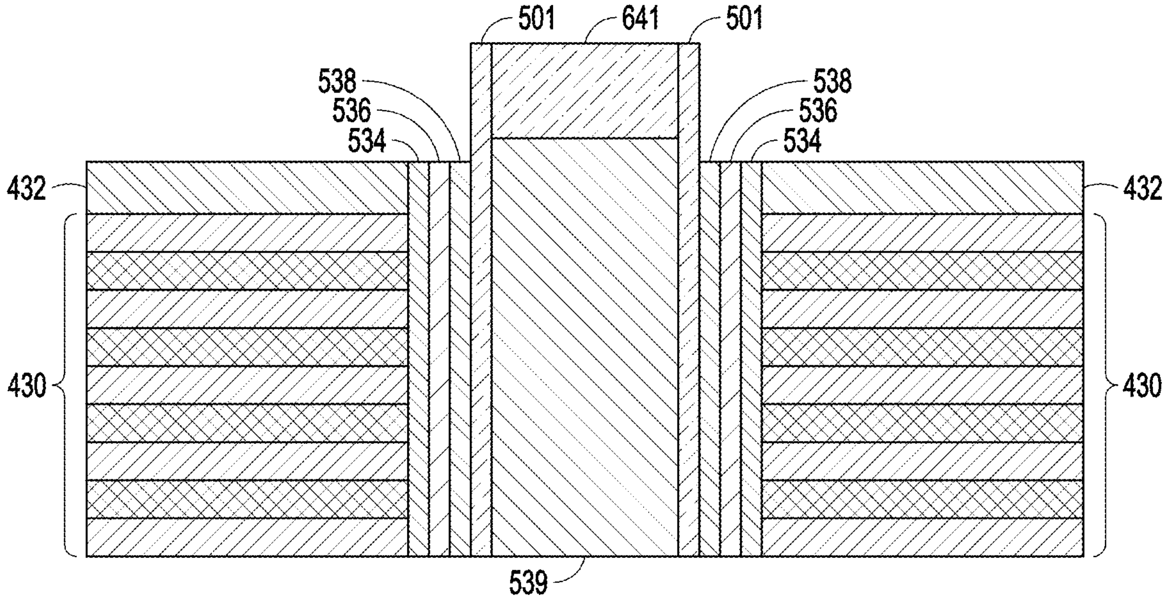

FIG. 7 shows a cross-sectional view of the structure of FIG. 6 after removing the dielectric blocking material 534, the charge trap material 536, and the tunneling material 538 that were formed on horizontally on top of the oxide layer 432. The removal can include recessing the oxide layer 432. The removal can be performed by wet etching.

Figure 8:
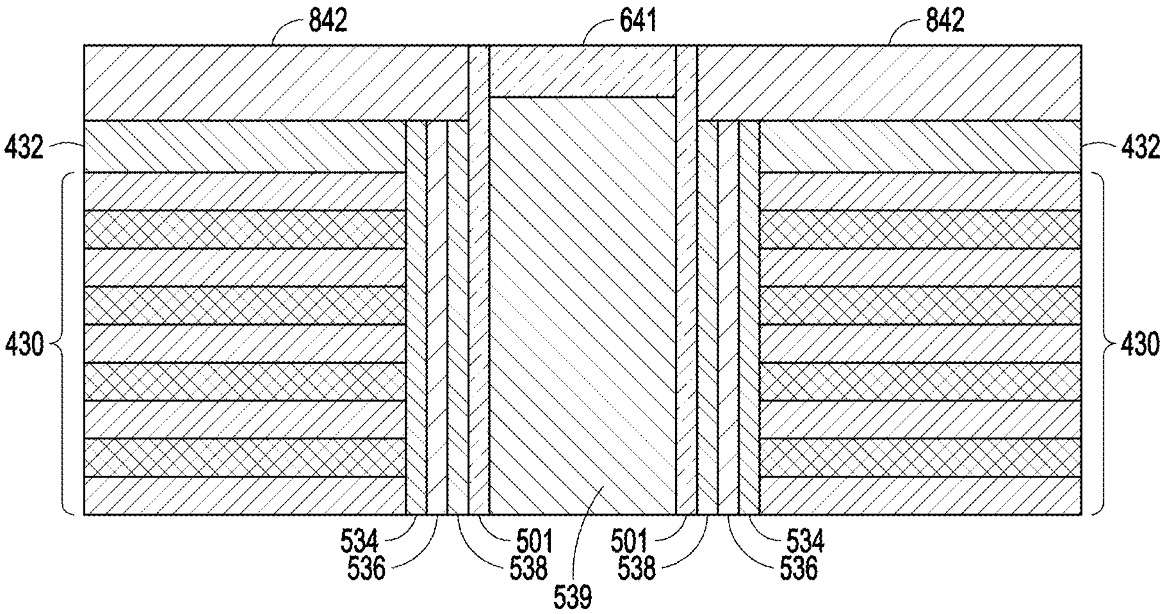

FIG. 8 shows a cross-sectional view of the structure of FIG. 7 after further processing stages have been performed. A carbon nitride 842 has been formed on the recessed oxide layer 432, the tops of the dielectric blocking material 534, the charge trap material 536, and the tunneling material 538, the tops of the channel material 501, and the semiconductive material 641. The formation of the carbon nitride 842 can be performed using a suitable deposition technique. After forming the carbon nitride 842, a CMP procedure was applied, removing the carbon nitride 842 from the tops of the channel material 501 and the semiconductive material 641, exposing the channel material 501 and the semiconductive material 641. The carbon nitride has been reduced leaving carbon nitride 842 on the oxide layer 432 and tops of the dielectric blocking material 534, the charge trap material 536, and the tunneling material 538 that are used for memory cells.

Figure 9:
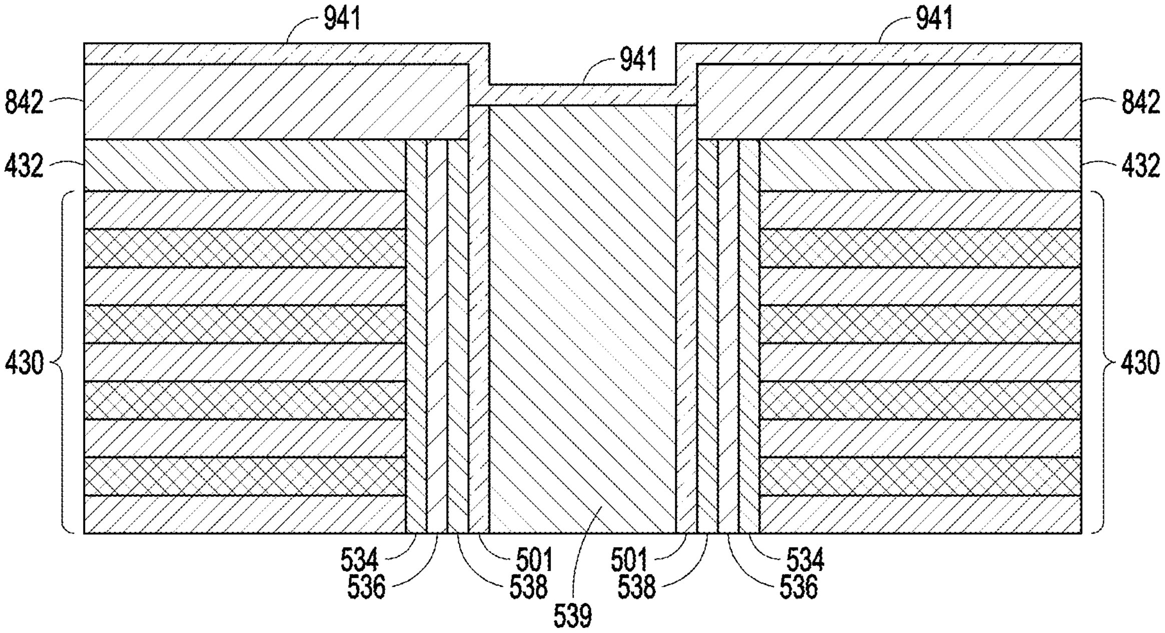

FIG. 9 shows a cross-sectional view of the structure of FIG. 8 after further processing stages have been performed. The semiconductive material 641 and portions of the channel material 501 that are higher than the oxide 539 have been removed. The removal can be performed by wet etching. Another semiconductive material 941 has been formed on the surface of the structure of FIG. 8 after removing the semiconductive material 641 and the portions of the channel material 501. The semiconductive material 941 can be, but is not limited to, the same as the channel material 501 or the semiconductive material 641. For example, the semiconductive material 941 can be polysilicon. The formation of the semiconductive material 941 can be performed using a suitable deposition technique.

Figure 10:
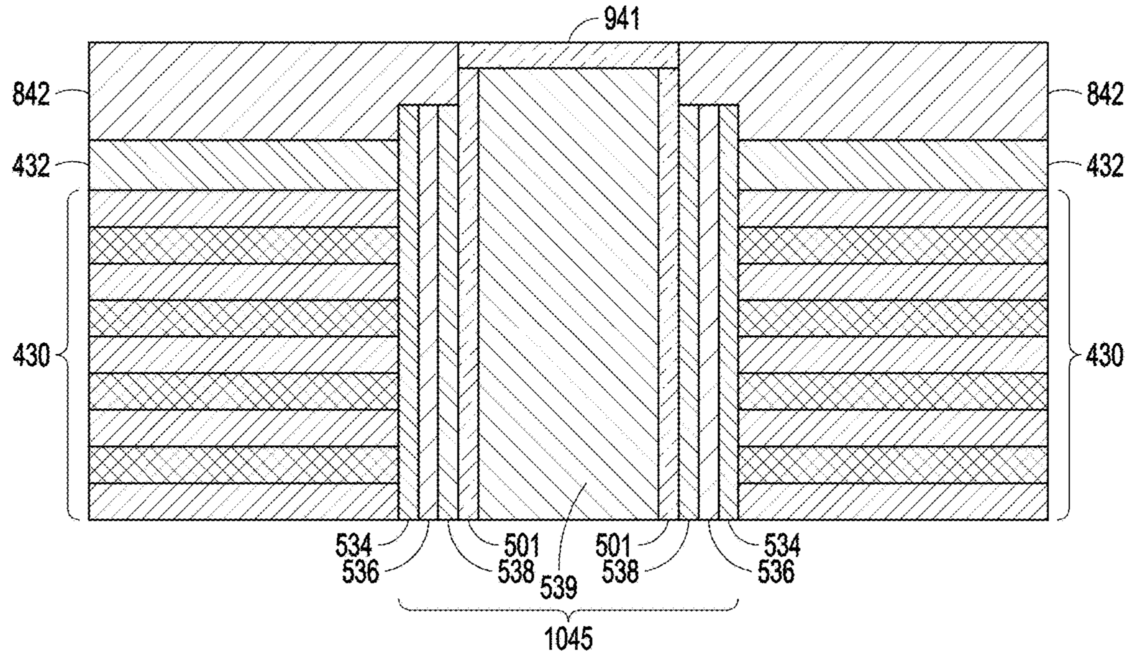

FIG. 10 shows a cross-sectional view of the structure of FIG. 9 after applying a CMP procedure to the semiconductor material 941, removing the semiconductive material 941 from above the carbon nitride 842. The CMP procedure leaves the channel material 501 above the oxide 539, the semiconductive material 941 above the oxide 539, and the carbon nitride 842 as a planarized top surface. The cell films 534, 536, and 538, the channel material 501, and the oxide 539 below the carbon nitride 842 form a structure 1045 that remains essentially the same as additional procedures are applied above the carbon nitride 842.

Figure 11:
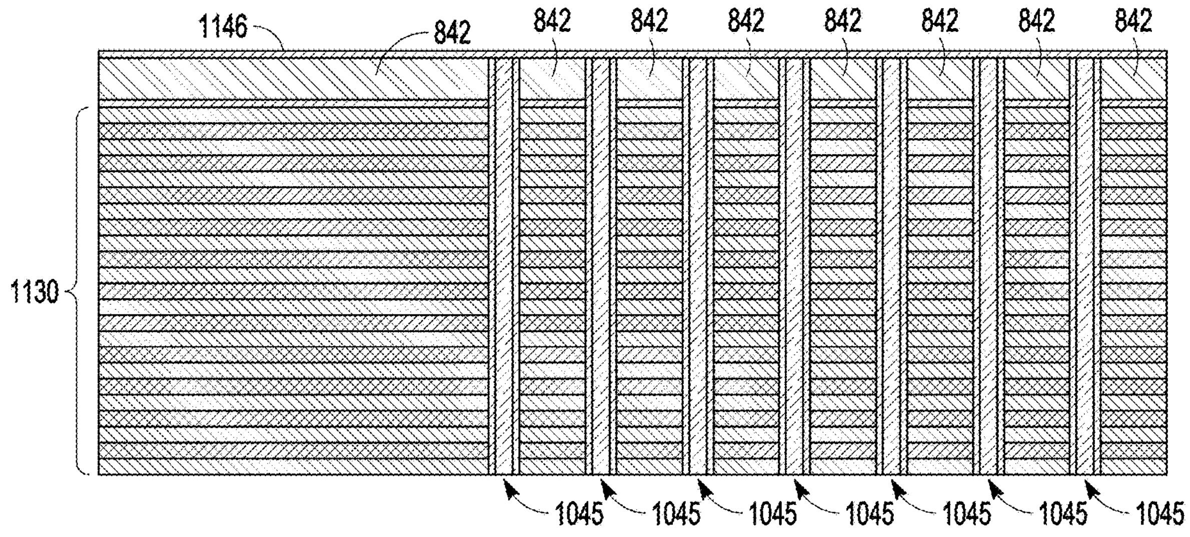

FIG. 11 shows a cross-sectional view of the carbon nitride, channel material, and semiconductive material planarization forming the structure of FIG. 10 in the previous openings 431 of FIG. 4. FIG. 11 also shows a thicker oxide 1146 formed across the array of structures 1045 and the carbon nitride 842 between these pillars of cell films. The structure of FIG. 11 can be processed with appropriate removal of portions of the set of layers of material 430 of FIG. 4 to form gates for memory cells. The removal can include etching in a replacement gate procedure to form the gates. The processing of the set of layers of material 430 results in a set of tiers 1130 of memory cells having gates coupled to cell films of the structure 1045. These procedures can be accomplished by known techniques for forming an array of vertical memory cells. During subsequent processing, discussed below, for a SGD transistor, the configuration of the tiers 1130 and structure 1045 remains.

Figure 12:
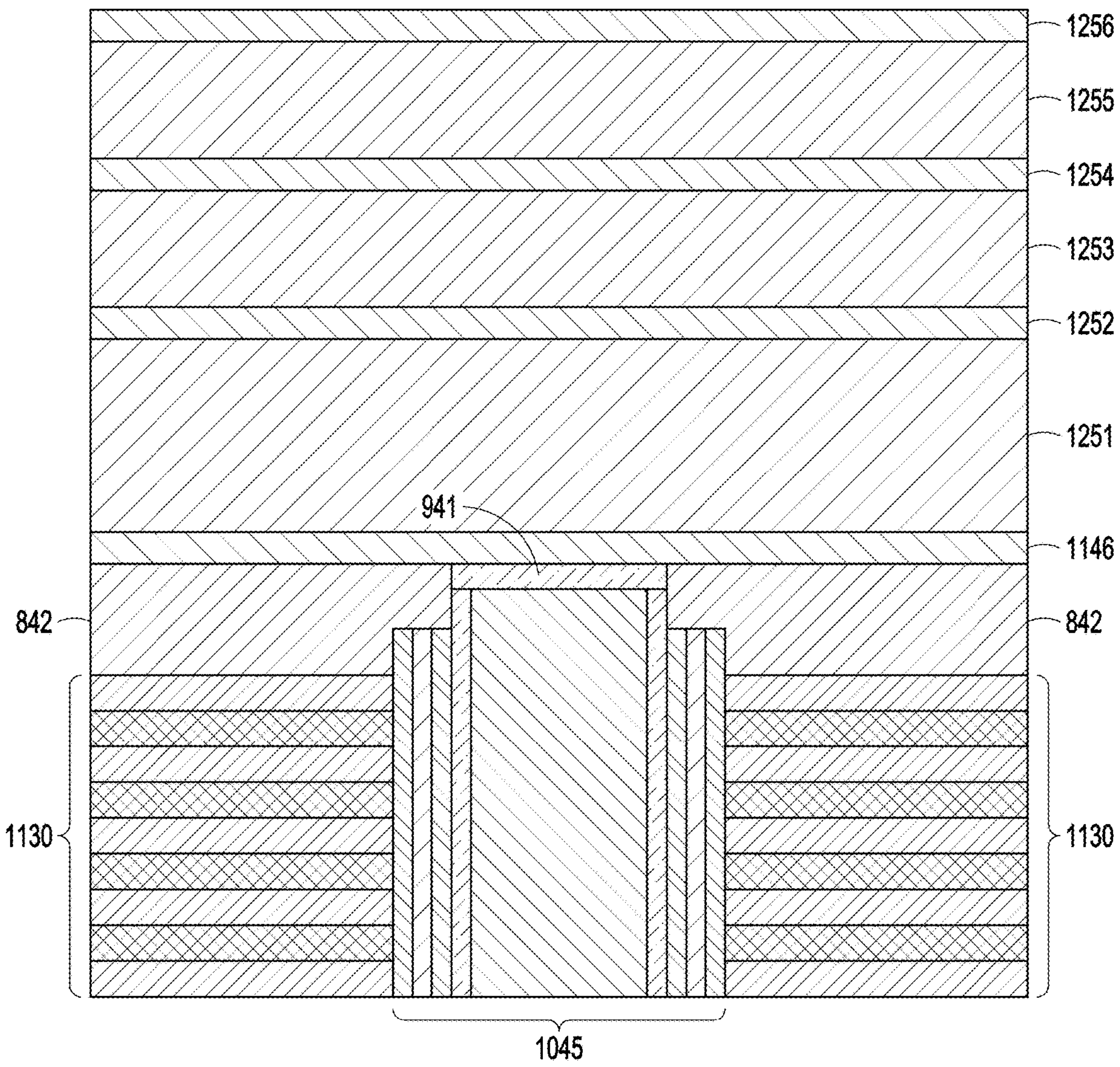

FIG. 12 shows a cross-sectional view of the set of tiers 1130, structure 1045, carbon nitride 842, semiconductive material 941, and oxide 1146 for one example string pillar of FIG. 11 after forming processing layers on oxide 1146. The processing layers can include a nitride 1251, an oxide 1252, a nitride 1253, an oxide 1254, a nitride 1255, and an oxide 1256. The formation of these processing layers can be performed using one or more suitable deposition techniques. The oxides used can be, but are not limited to, silicon oxide, and the nitrides used can be, but are not limited to, silicon nitride.

Figure 13A:
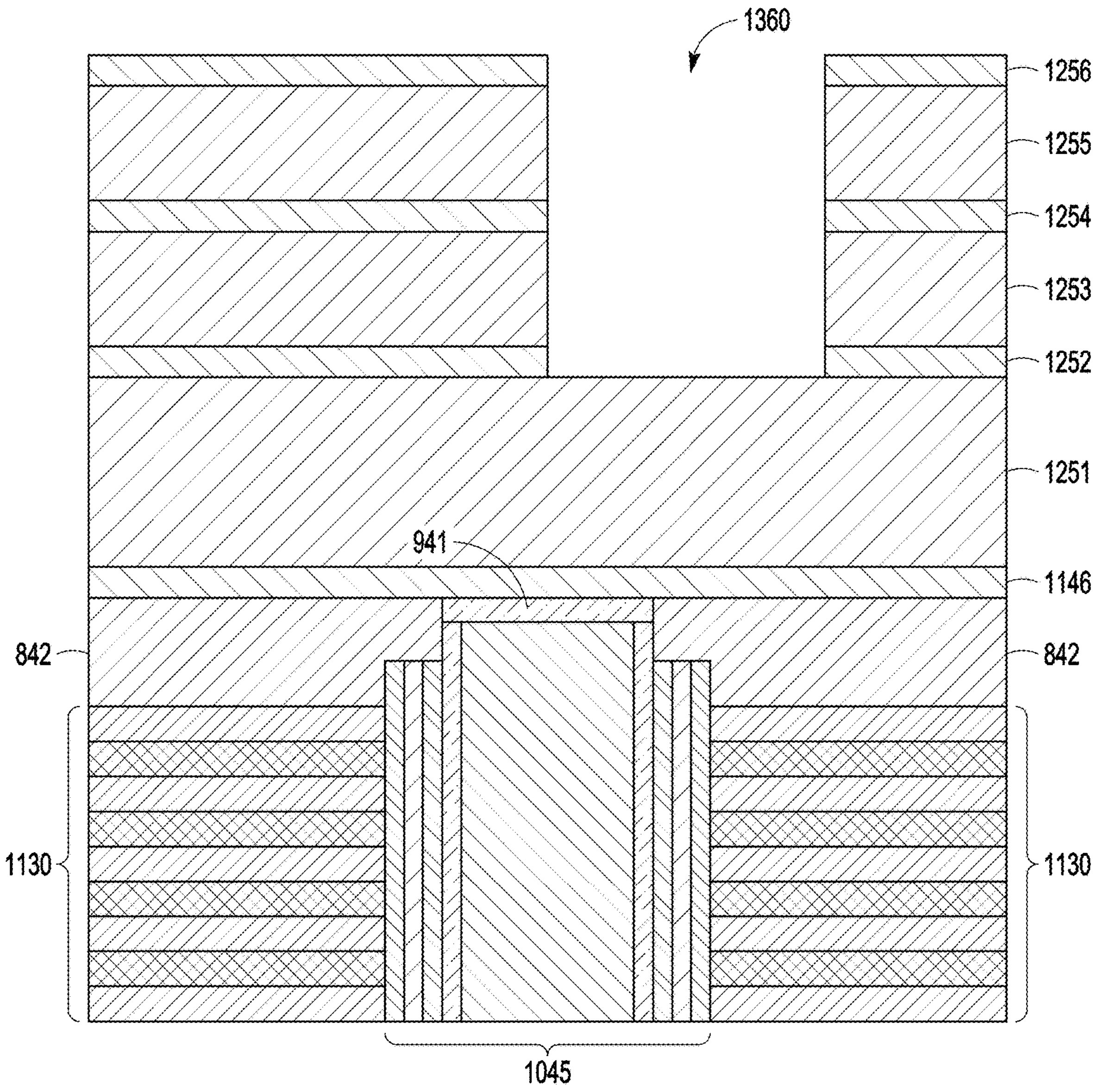
Figure 13B:
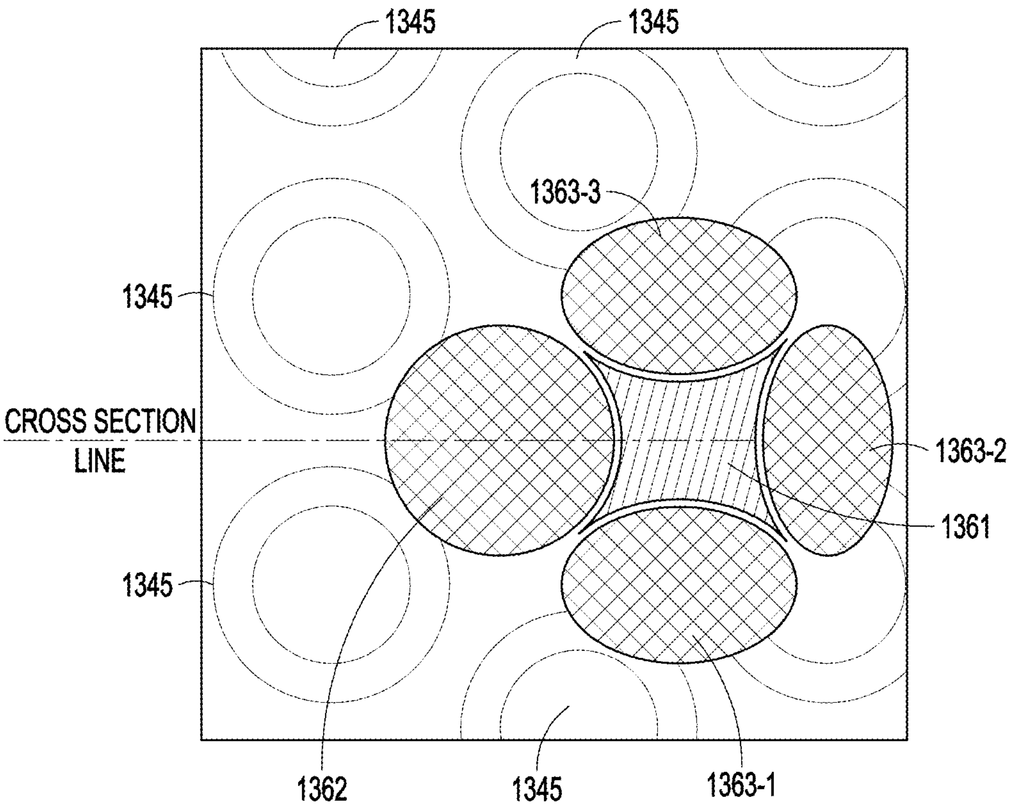

FIG. 13A shows a cross-sectional view of the structure of FIG. 12 after forming an opening 1360 through the oxide 1256, the nitride 1255, the oxide 1254, the nitride 1253, and the oxide 1252 to the nitride 1251. In this example, round and oval patterns are etched through the top of the oxide 1256, the nitride 1255, the oxide 1254, the nitride 1253, and the oxide 1252 to the nitride 1251. FIG. 13B shows a top view, above a surface of pillar structures 1345, of a potential resist pattern of a round pattern 1362 and oval patterns 1363-1, 1363-2, and 1363-3 for an etch pattern 1361. This single set of patterns can be used for the subsequent formation of the SGD transistors being fabricated for the array of memory cells in the tiers 1130. The cross-sectional view of FIG. 13A is along the cross-section line of FIG. 13B. The patterns allow gaps to be engineered between the patterns being etched down to form keyholes, where the keyholes remain without material deposited therein in later stages. Narrow gaps in between the resist pattern of round pattern 1362 and oval patterns 1363-1, 1363-2, and 1363-3 and the etch pattern 1361 form the ends of the star of the etch pattern 1361. Fins and the etch points in between the fins are formed by the narrow gaps between the resist pattern of round pattern 1362 and oval patterns 1363-1, 1363-2, and 1363-3 and the etch pattern 1361. The number of points of the star pattern 1361 corresponds to the number of fins to be formed.

Figure 13C:
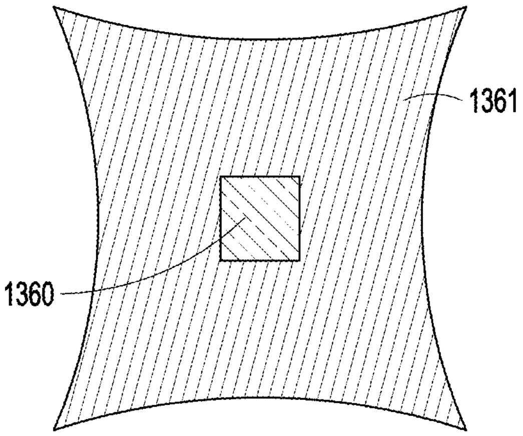

FIG. 13C shows a top view of the opening 1360 of FIG. 13A with respect to the star pattern 1361 of FIG. 13B. The opening 1361 between circles and ovals is centered for location of contacts to the SGD being formed. Multiple such openings between circles and ovals above and across the surface of pillar structures 1345 are laid out so that the centers of the openings are located for the contacts to the multiple SGD transistors for the pillar structures 1345. The center of the opening 1360 is shifted horizontally with respect to the vertical pillar structure 1045 of FIG. 13A.

Figure 14:
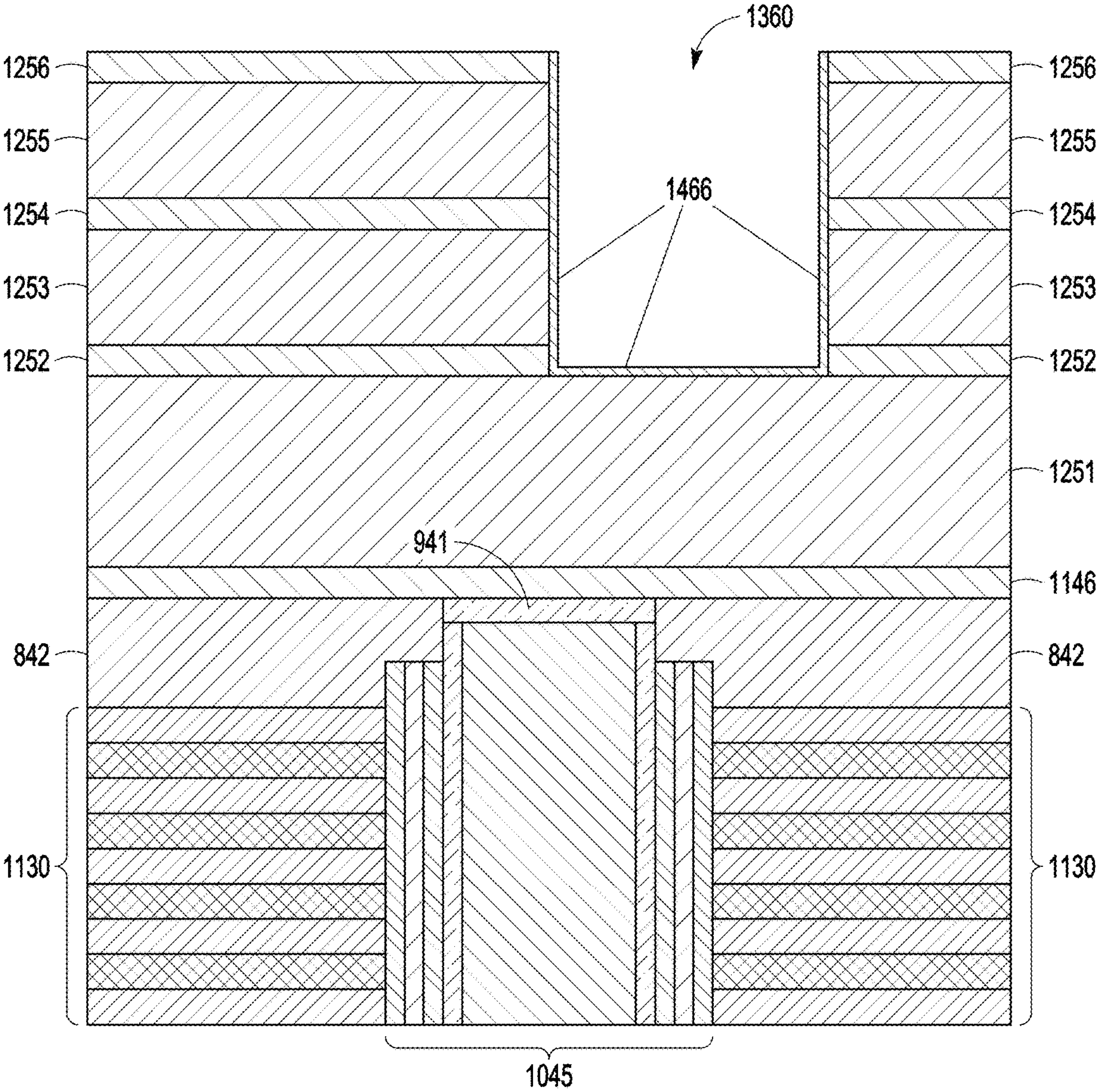

FIG. 14 shows a cross-sectional view of the structure of FIG. 13A after forming an oxide 1466 on the surfaces of the opening 1360. The cross-sectional view is along the cross-section line of FIG. 13B. The oxide 1466 can be formed by oxidizing the surface of the exposed nitrides 1255, 1253, and 1251 in the opening 1360. The oxide 1466 can be thermally grown oxide. The oxide 1466 is used to protect the void areas from allowing etch chemicals for etching nitride 1255 from going down through the voids formed by the resist and etch patterns and attacking the nitrides 1253 and 1251.

Figure 15A:
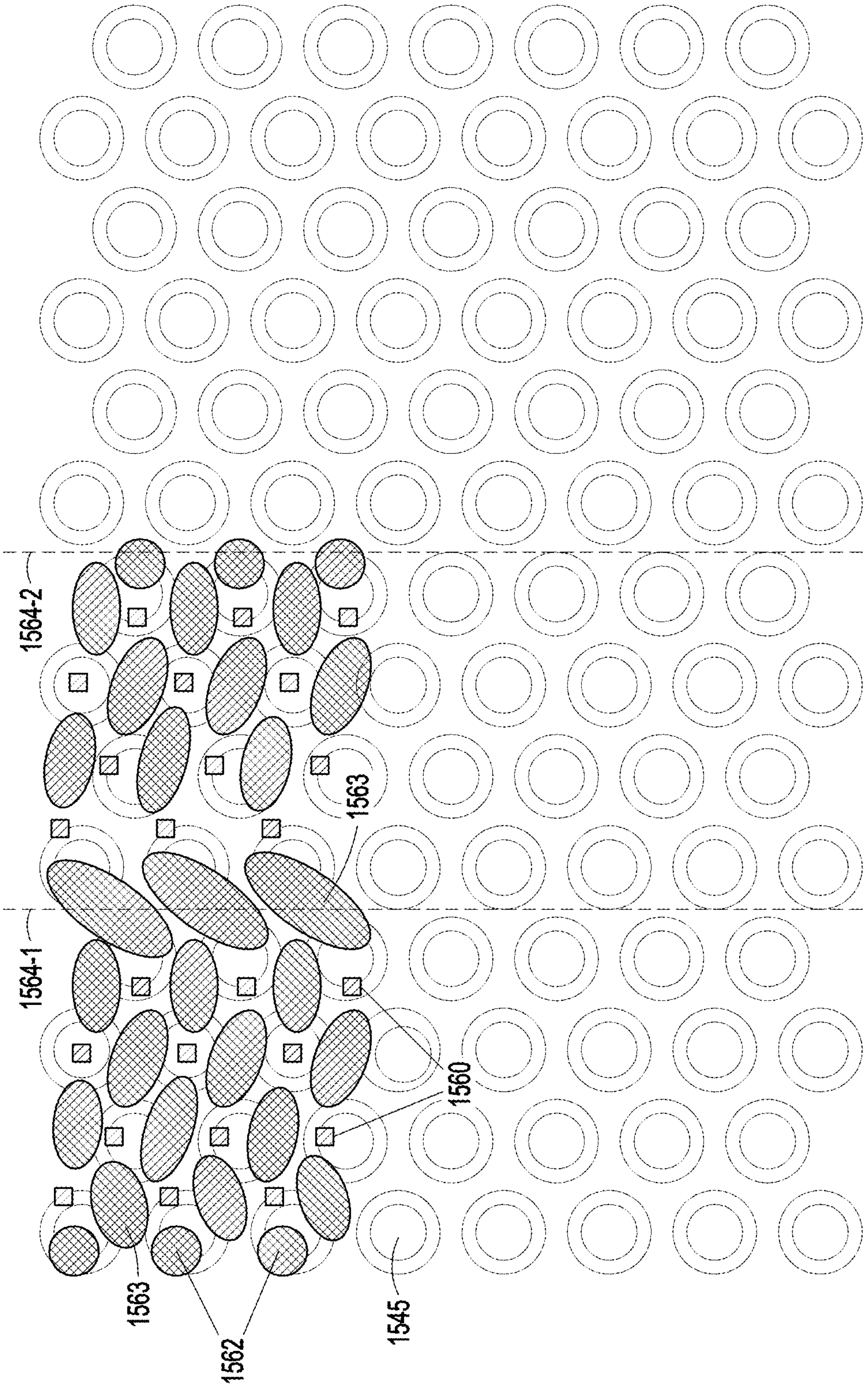
Figure 15B:
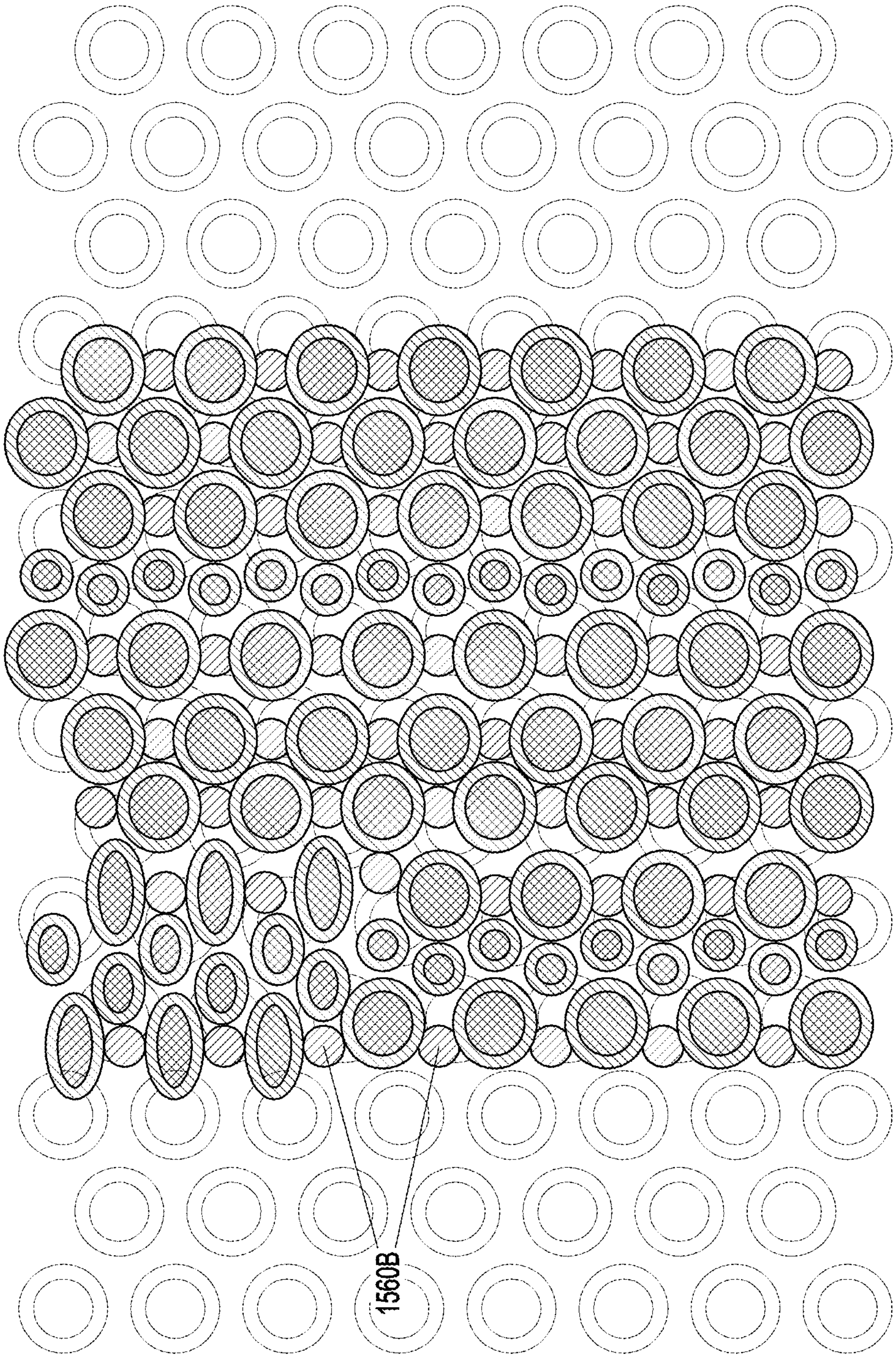

FIG. 15A shows an embodiment of an example of different patterns to form opening 1560 for contacts with respect to cell pillars 1545. The different patterns can include round patterns 1562 and different sizes of oval patterns 1563. The patterns can be generated across boundaries 1564-1 and 1564-2 for sub-blocks of the memory array. FIG. 15B shows an embodiment of a another example of patterns for openings 1560B.

Figure 16A:
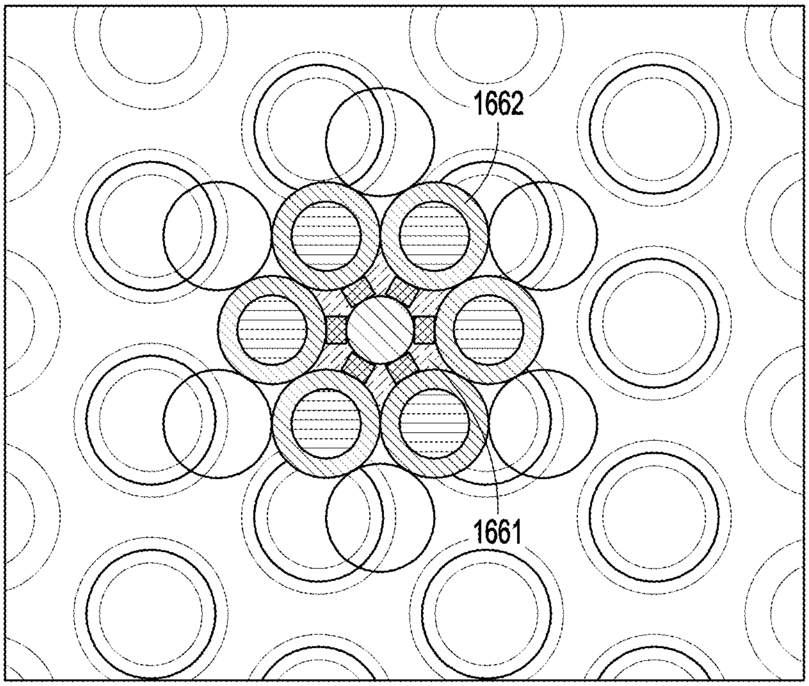
Figure 16B:
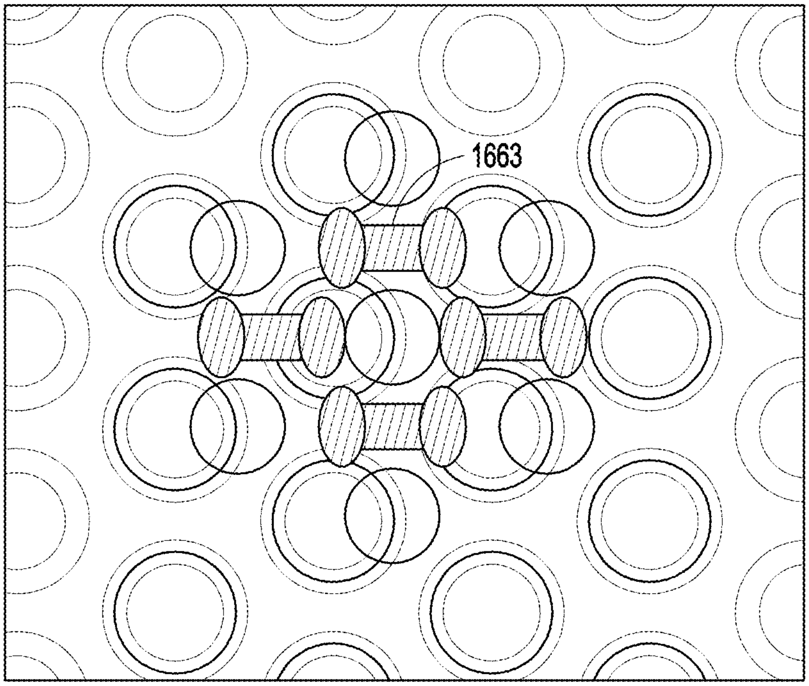

FIG. 16A shows an embodiment of a combination 1662 of patterns for forming a pattern 1661 of fins. The pattern 1661 is for six fins. FIG. 16B shows an embodiment of a combination 1663 of patterns for forming a structure of four fins. The example patterns of FIGS. 16A and 16B provide a mechanism for creating patterns and air gaps for segmented fins. The segmented fins can be n+ fins. The formation of the fins can be based on providing a sufficient air gap as well as providing spaces for SGD transistors, where the spaces are uniform and properly located. Other patterns can be used to form SGD transistors having a segmented portion of a channel structure having N fins, with N being a positive integer. The number N can be limited by the number of separated fins that can be formed in a designated area for a SGD transistor.

Figure 17:
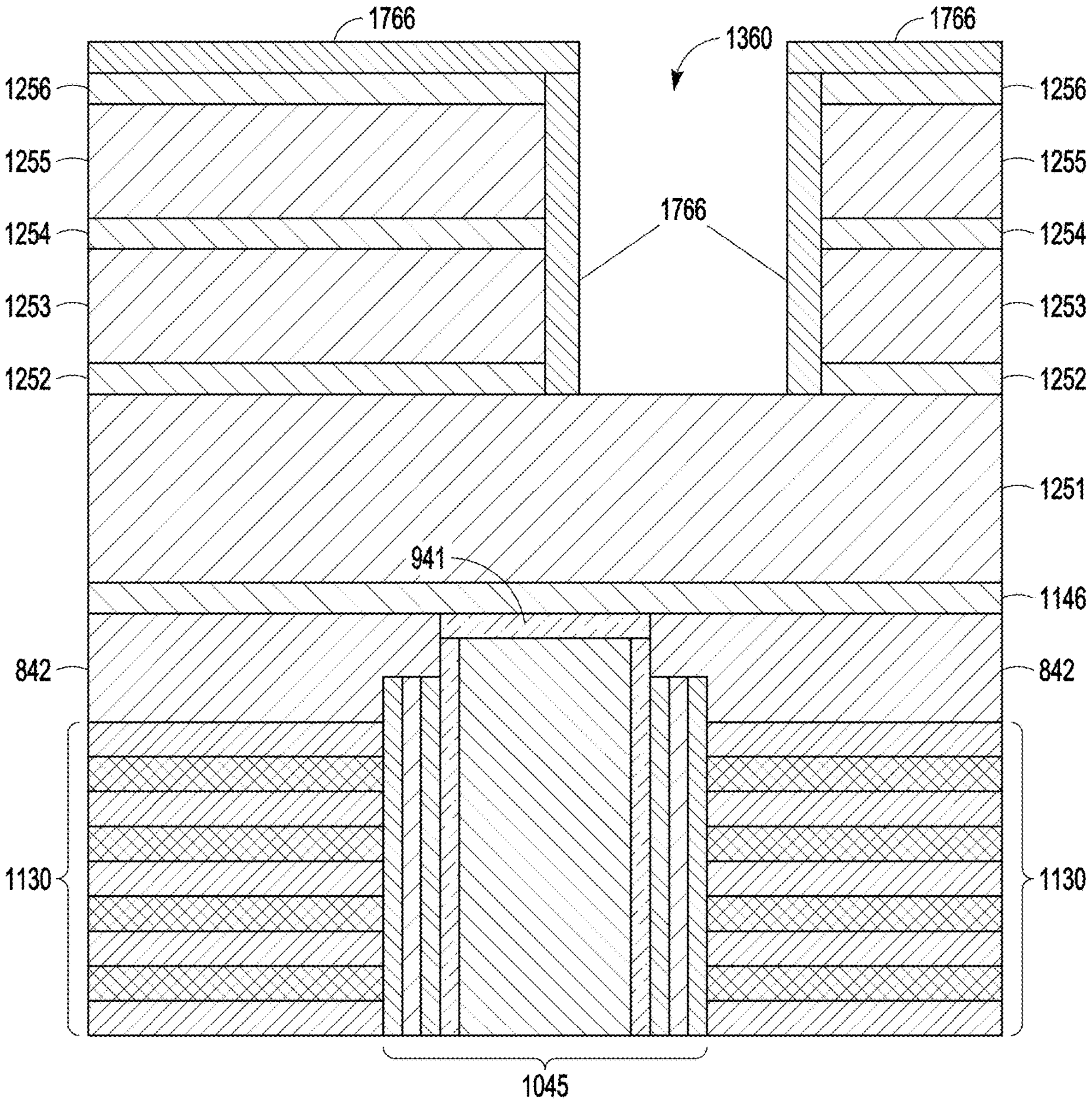

FIG. 17 shows a cross-sectional view of the structure of FIG. 14 after depositing and etching an oxide spacer 1766 to bridge together round and oval patterns to form sharp corners. The oxide spacer 1766 was formed non-conformal sufficiently to be deposited more on surface of oxide 1256 than on sidewalls and bottom of opening 1360 so that, after spacer etch, the oxide is removed from the bottom of opening 1360 but remains on the surface to protect voids between patterns. Large void formation between the round and oval features is desirable. The cross-sectional view is along the cross-section line of FIG. 13B. The oxide spacer 1766 can include the oxide 1466.

Figure 18:
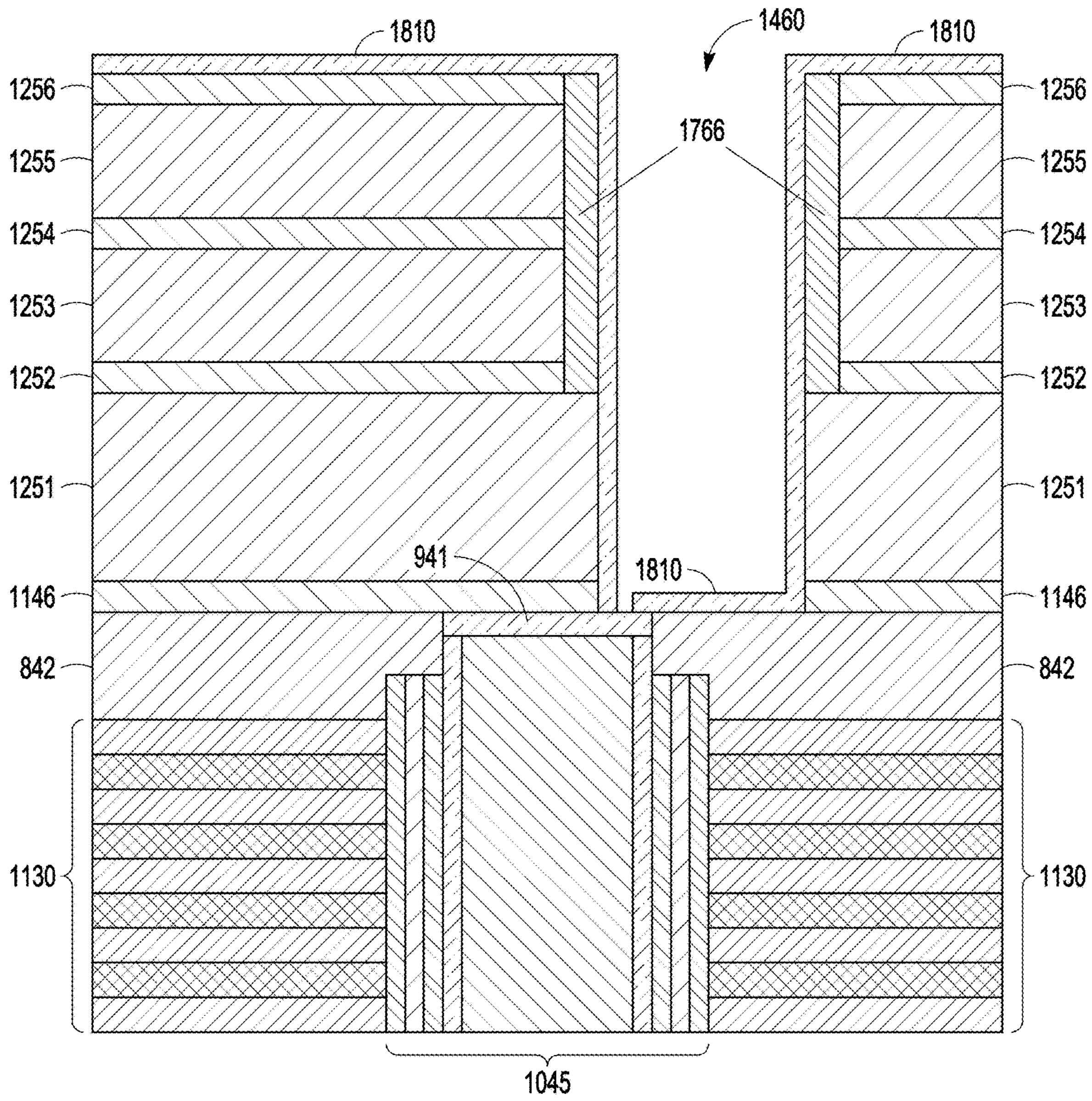

FIG. 18 shows a cross-sectional view of the structure of FIG. 17 after further processing stages have been performed. The cross-sectional view is along the cross-section line of FIG. 13B. Using the opening 1360, the nitride 1251 has been selectively etched. The etch causes a square pattern to etch as round. After etching the nitride 1251, the oxide 1146 is etched to the semiconductive material 941 and to a portion of the top of the channel material 501, where the portion of the top of the channel material 501 has been removed by the etchant. A semiconductive material 1810 has been deposited in the opening 1460 formed from removing the portions of the channel material 501, on top of the surface of the oxide spacer 1766, and on the top surface of the oxide 1256. The semiconductive material 1810 can be, but is not limited to, the same as the channel material 501, the semiconductive material 641, or the semiconductive material 941. For example, a semiconductive material 1810 can be polysilicon. The deposited semiconductive material 1810 can be n− semiconductive material for forming a transistor channel region of the SGD transistor to be formed.

Figure 19:
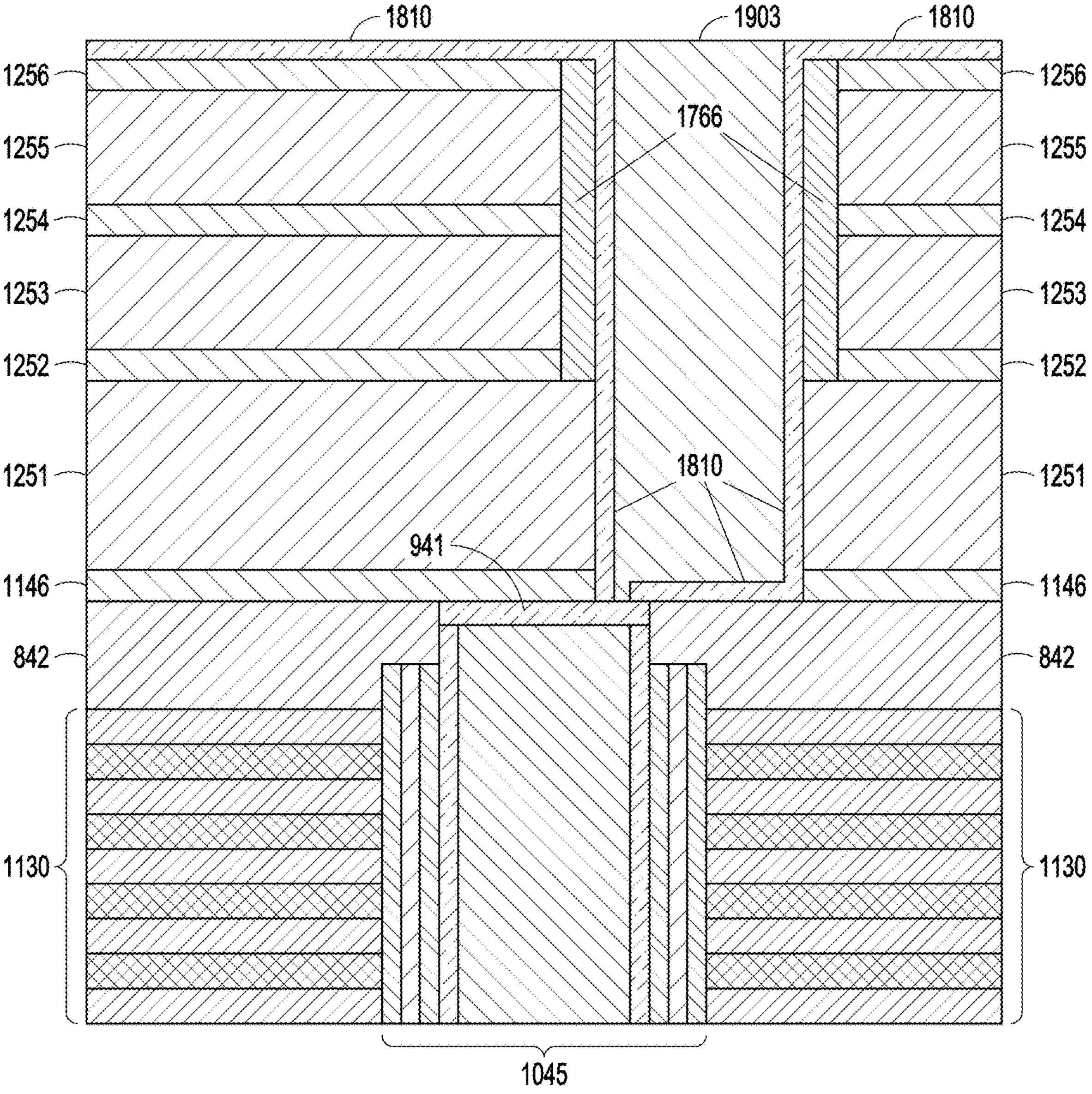

FIG. 19 shows a cross-sectional view of the structure of FIG. 18 after further processing stages have been performed. The cross-sectional view is along the cross-section line of FIG. 13B. An oxide 1903 has been formed in the opening 1460 shown in FIG. 18 and on the top surface of the semiconductive material 1810 that is on top of the surface of the oxide spacer 1766 and on the oxide 1256. The formation of the oxide 1903 can be performed using a suitable deposition technique. The oxide 1903 fills the opening 1460 to fill a region for the SGD transistor. CMP procedure has been applied to the surface of the oxide 1903 resulting in exposing the semiconductive material 1810 that is on the oxide 1256 and structuring the top surface of the oxide 1903 that filled the 1460 opening with the top surface of the exposed semiconductor material 1810.

Figure 20:
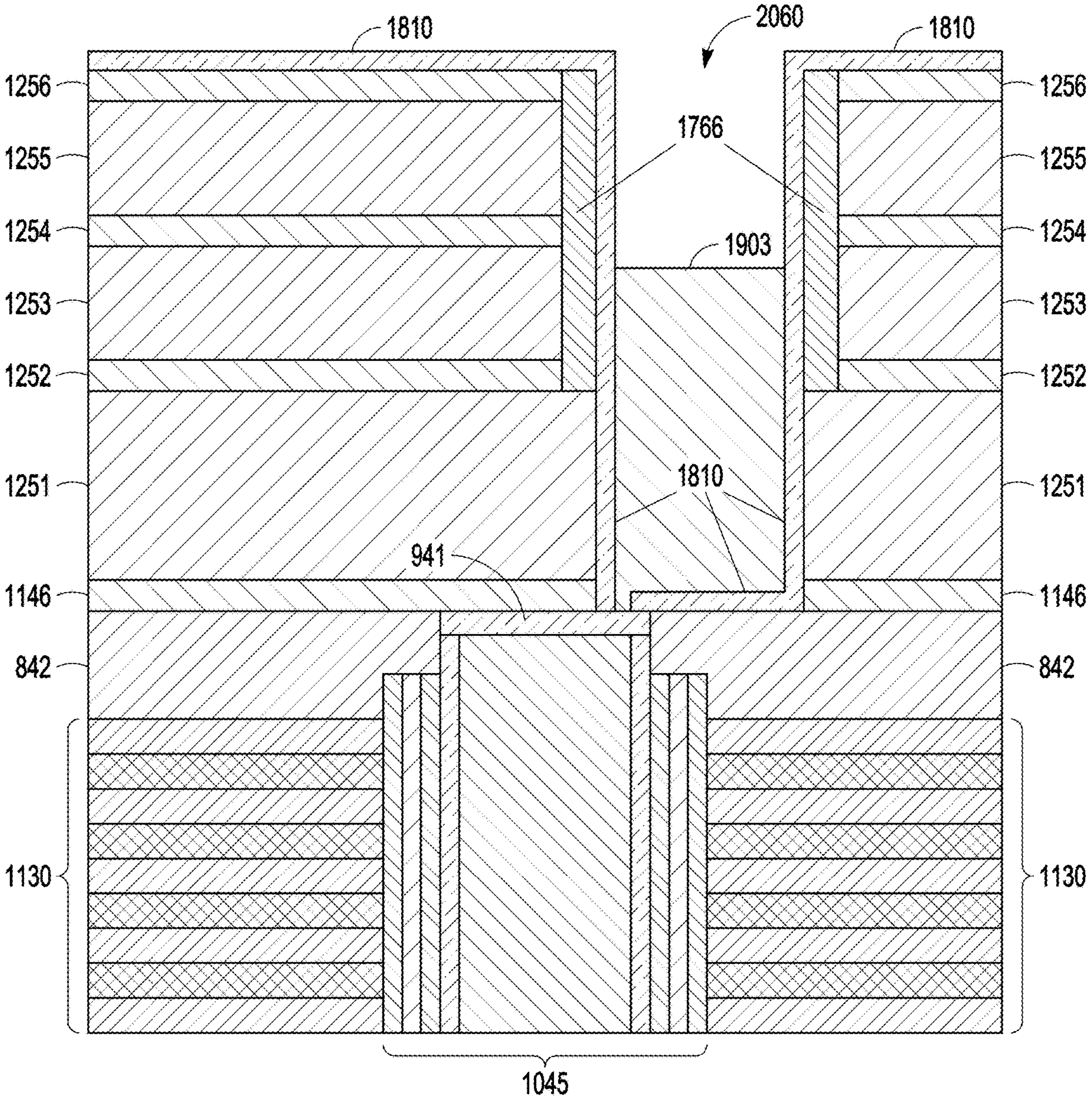

FIG. 20 shows a cross-sectional view of the structure of FIG. 19 after the oxide 1903 has been recessed forming an opening 2060 bordered by the semiconductive material 1810. The cross-sectional view is along the cross-section line of FIG. 13B.

Figure 21:
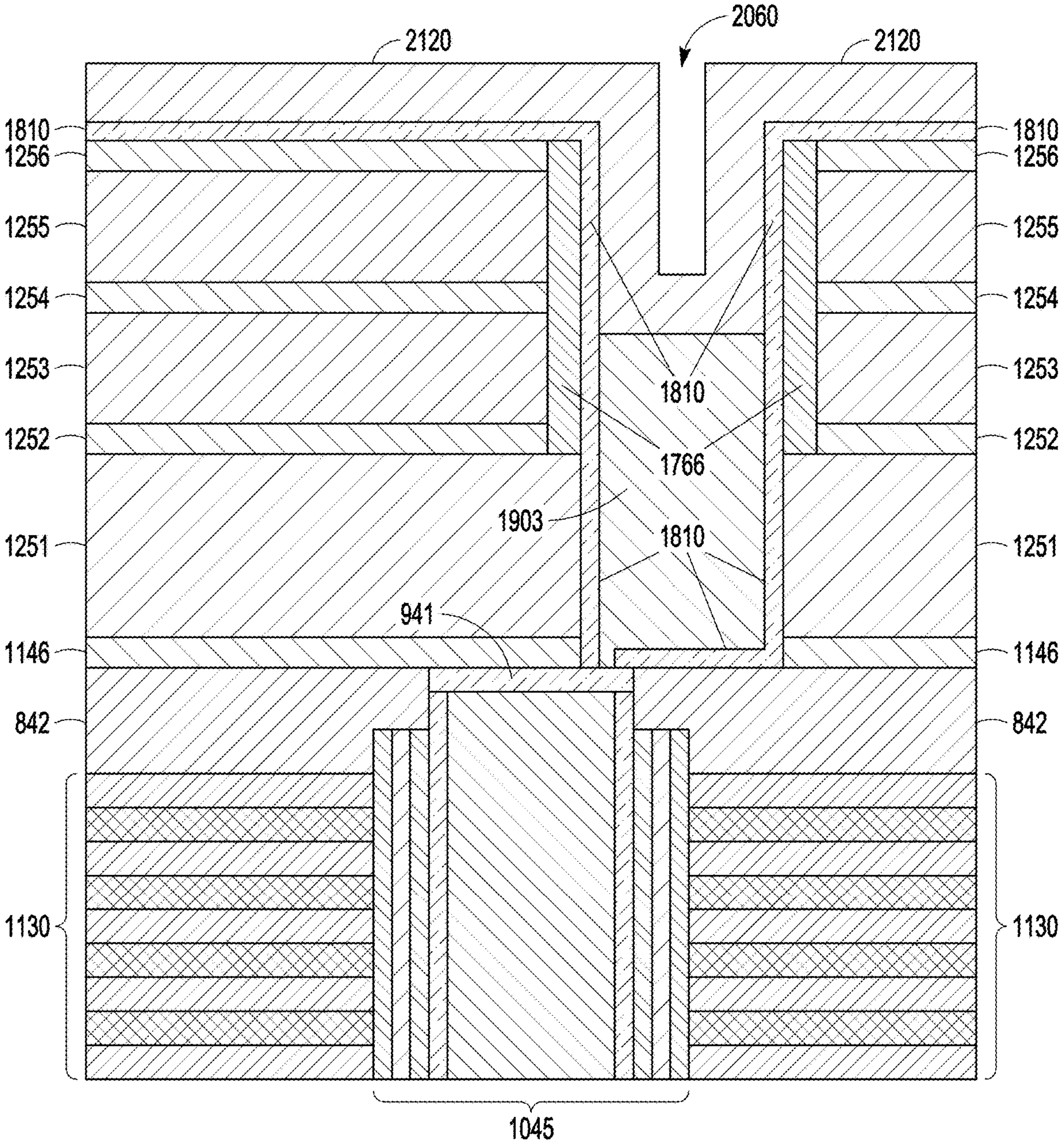

FIG. 21 shows a cross-sectional view of the structure of FIG. 20 after semiconductive material 2120 has been formed on the semiconductive material 1810 and on the oxide 1903 in the opening 2060, reducing the size of the opening 2060. The cross-sectional view is along the cross-section line of FIG. 13B. The semiconductive material 2120 can be formed using a suitable deposition technique. The semiconductive material 2120 can be, but is not limited to, the same as the channel material 501, the semiconductive material 641, or the semiconductive material 941. For example, the semiconductive material 2120 can be polysilicon. However, the semiconductive material 2120 is formed to be more heavily doped than the semiconductive material 1810. For example, the deposited semiconductive material 2120 can be n+ polysilicon. The semiconductive material 2120 is later processed to form a drain for the SGD transistor being formed.

Figure 22:
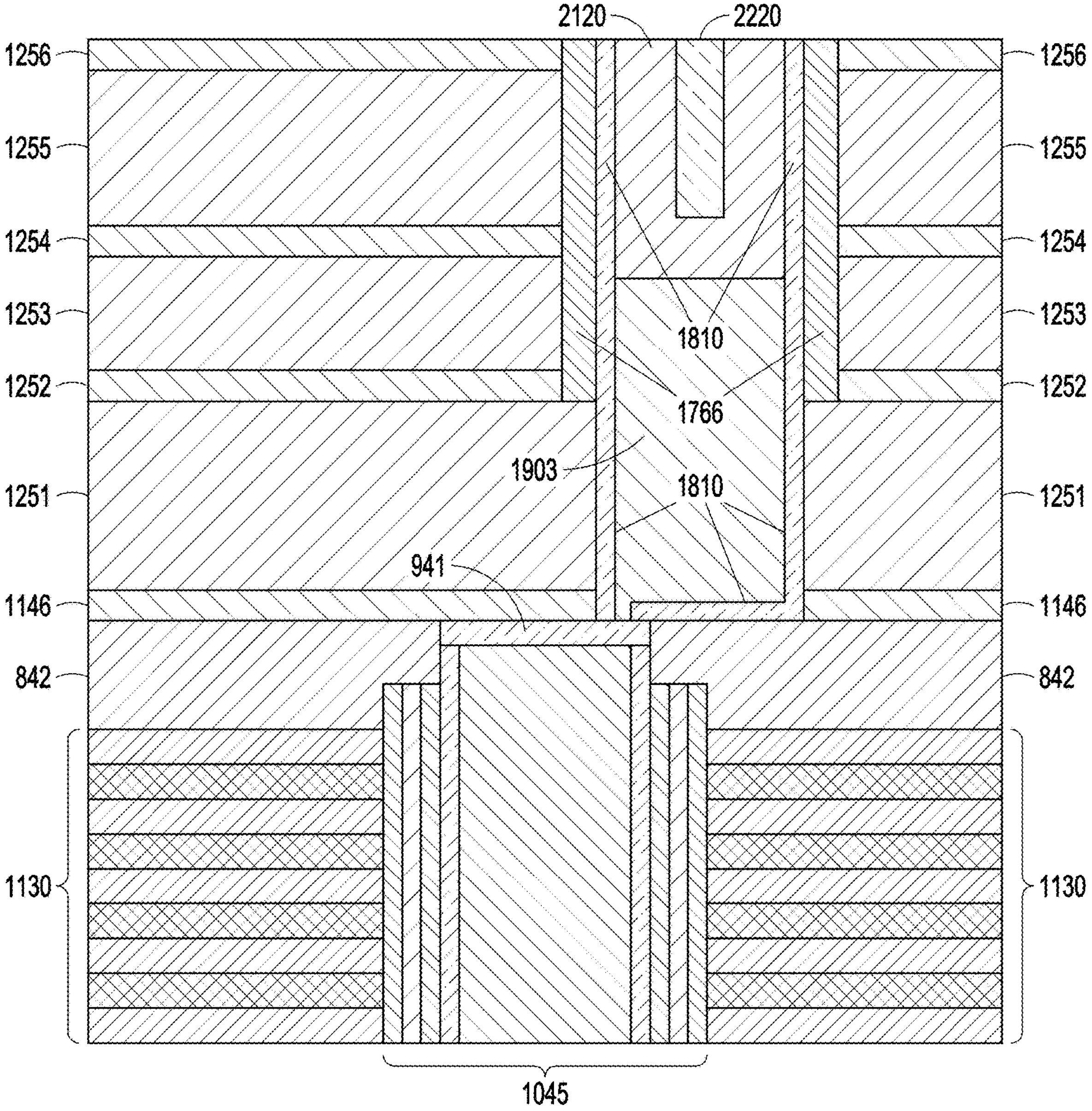

FIG. 22 shows a cross-sectional view of the structure of FIG. 21 after further processing stages have been performed. The cross-sectional view is along the cross-section line of FIG. 13B. A conductive region 2220 has been formed on the semiconductor material 2120 in the reduced opening 2060 and on the semiconductor material 2120 that was formed on the on the semiconductive material 1810 in the structure of FIG. 21. The conductive region 2220 can be a metallic material suitable for use as a contact for a drain of a transistor. For example, the conductive region 2220 can include titanium, titanium nitride, tungsten, a combination of titanium, titanium nitride, or tungsten, or other metals. After formation of the conductive region 2220, the structure of FIG. 22 is attained by applying a CMP procedure in which the semiconductive material 1810, the semiconductive material 2120, and the conductive region 2220 have been removed above the top level of the oxide spacer 1766 and the oxide 1256, leaving the conductive region 2220 bounded by the semiconductive material 2120 above the oxide 1903.

Figure 23:
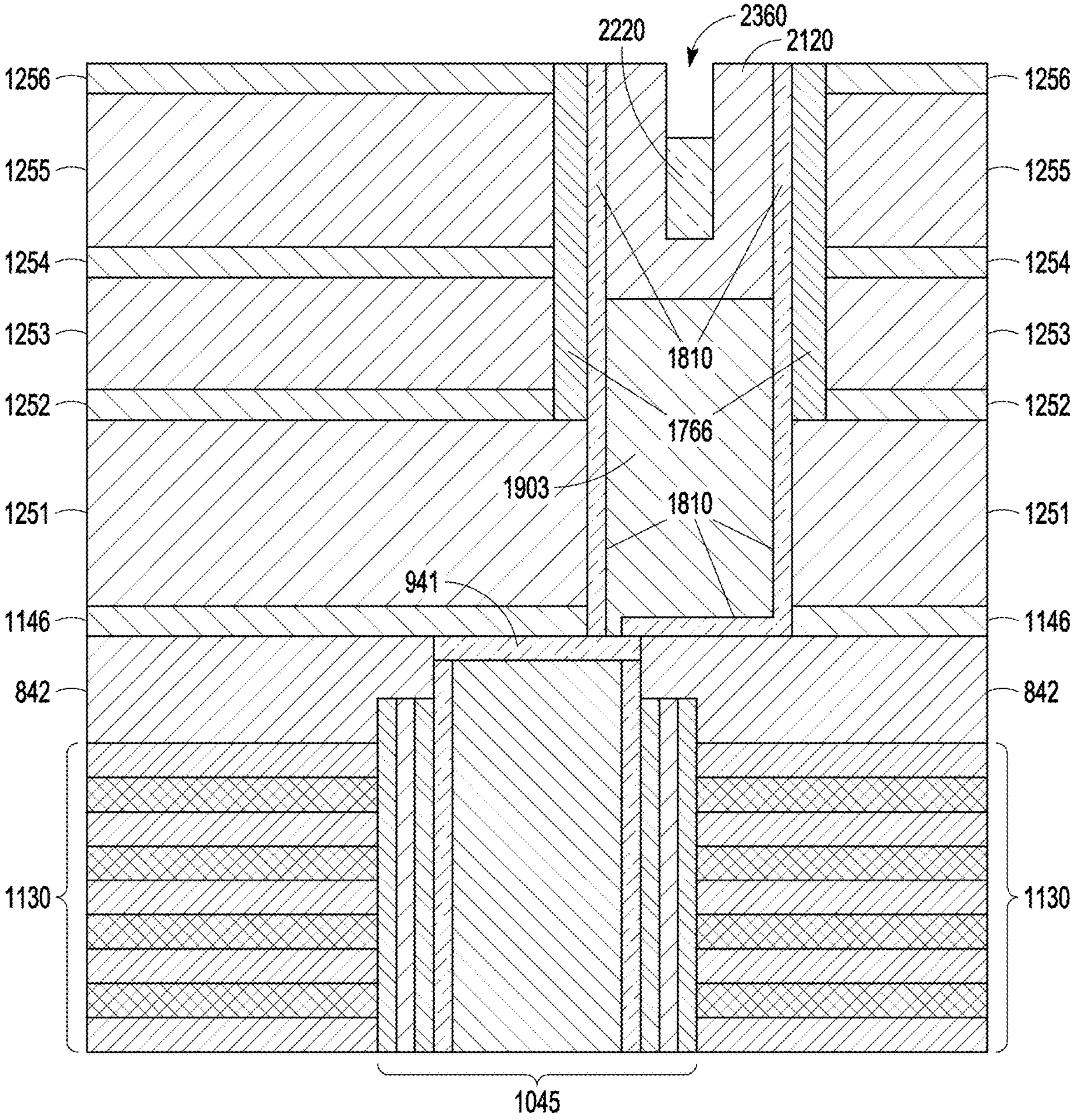

FIG. 23 shows a cross-sectional view of the structure of FIG. 22 after recessing the conductive region 2220 bounded by the semiconductive material 2120 above the oxide 1903, forming an opening 2360. The cross-sectional view is along the cross-section line of FIG. 13B.

Figure 24:
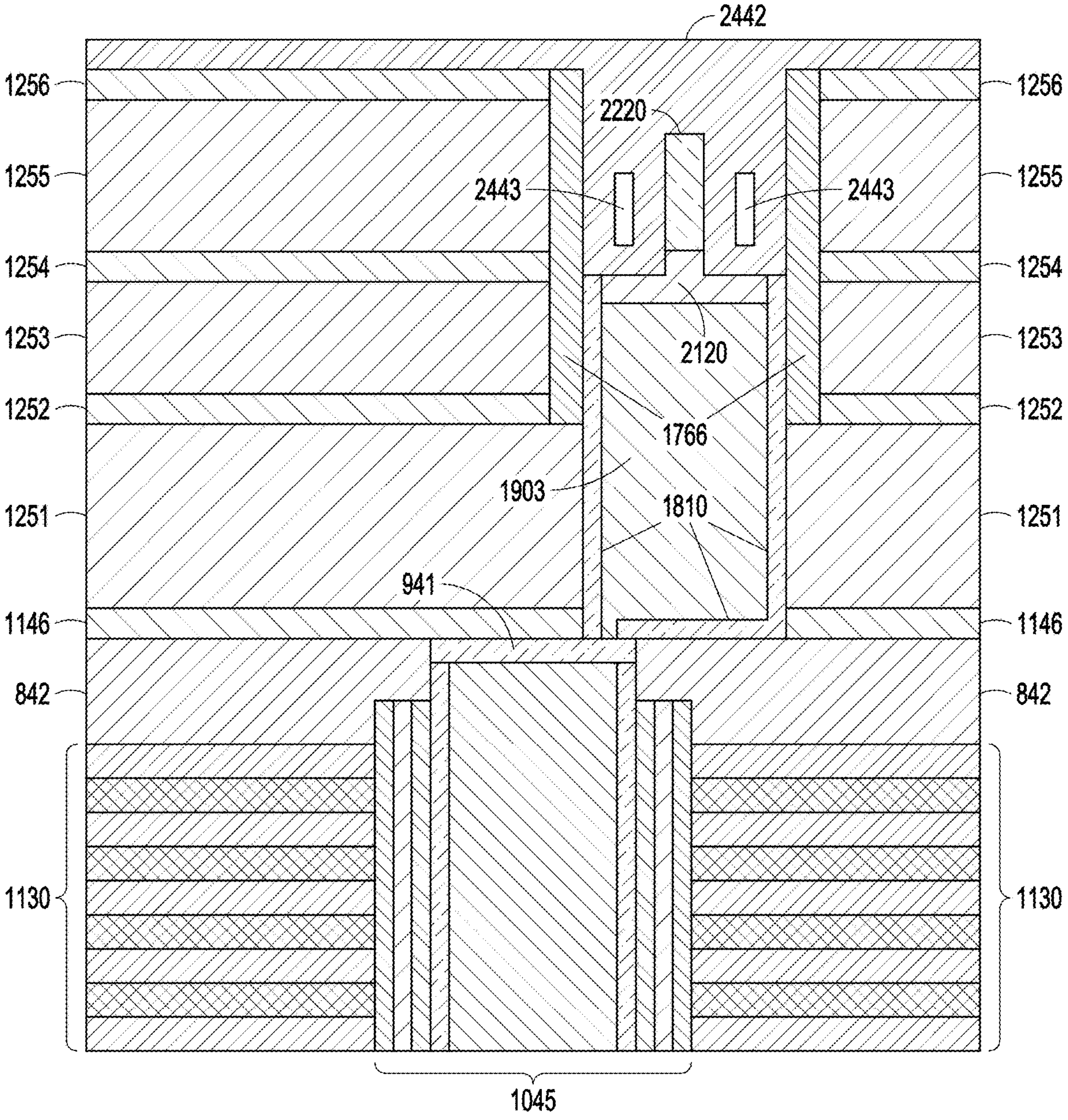

FIG. 24 shows a cross-sectional view of the structure of FIG. 23 after processing stages have been performed. The cross-sectional view is along the cross-section line of FIG. 13B. Portions of the semiconductive material 2120 and the semiconductive material 1810 have been selectively removed. The removal can be performed by selectively dry etching the semiconductive material 2120 and the semiconductive material 1810 expanding the opening 2360 around the conductive region 2220 that is located on a remaining portion of the semiconductive material 2120 above the oxide 1903. A carbon nitride 2442 has been formed in the expanded opening 2360 and on the top surface of the oxide 1256. The formation of the carbon nitride 2442 can be performed using a suitable deposition technique. Voids 2443 may be developed in the formation of the carbon nitride 2442.

Figure 25:
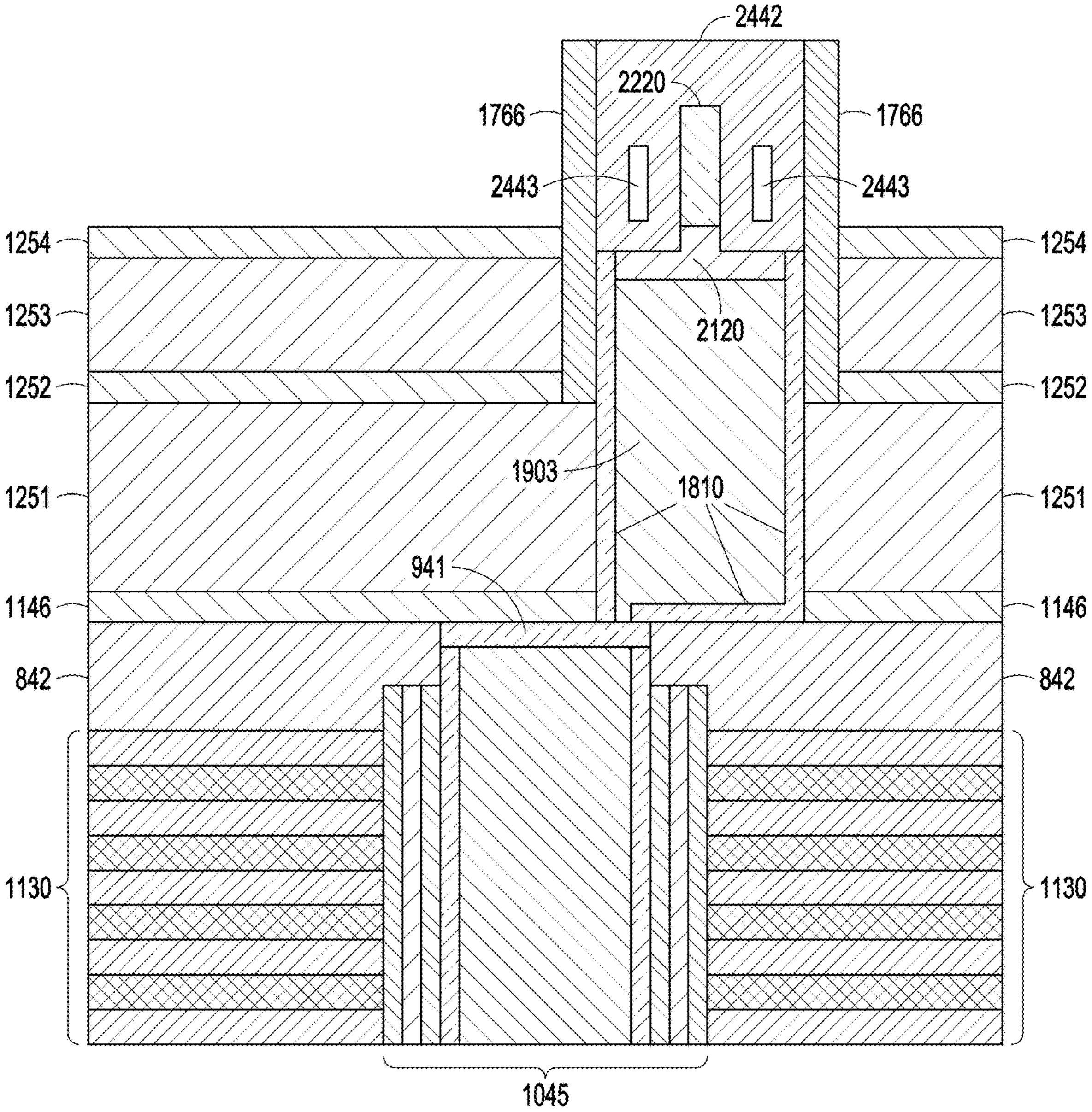

FIG. 25 shows a cross-sectional view of the structure of FIG. 24 after further processing stages have been performed. The cross-sectional view is along the cross-section line of FIG. 13B. A CMP procedure has removed carbon nitride 2442 that was formed on the surface of oxide 1256 and has removed the oxide 1256 along with portions of the oxide spacer 1766 and the carbon nitride 2442 above the top level of the nitride 1256. The nitride 1256 has been removed leaving the conductive region 2220 and carbon nitride 2442 with voids 2443 bounded by the oxide spacer 1766. The removal of the nitride 1256 in this manner can be performed using a wet etch.

Figure 26:
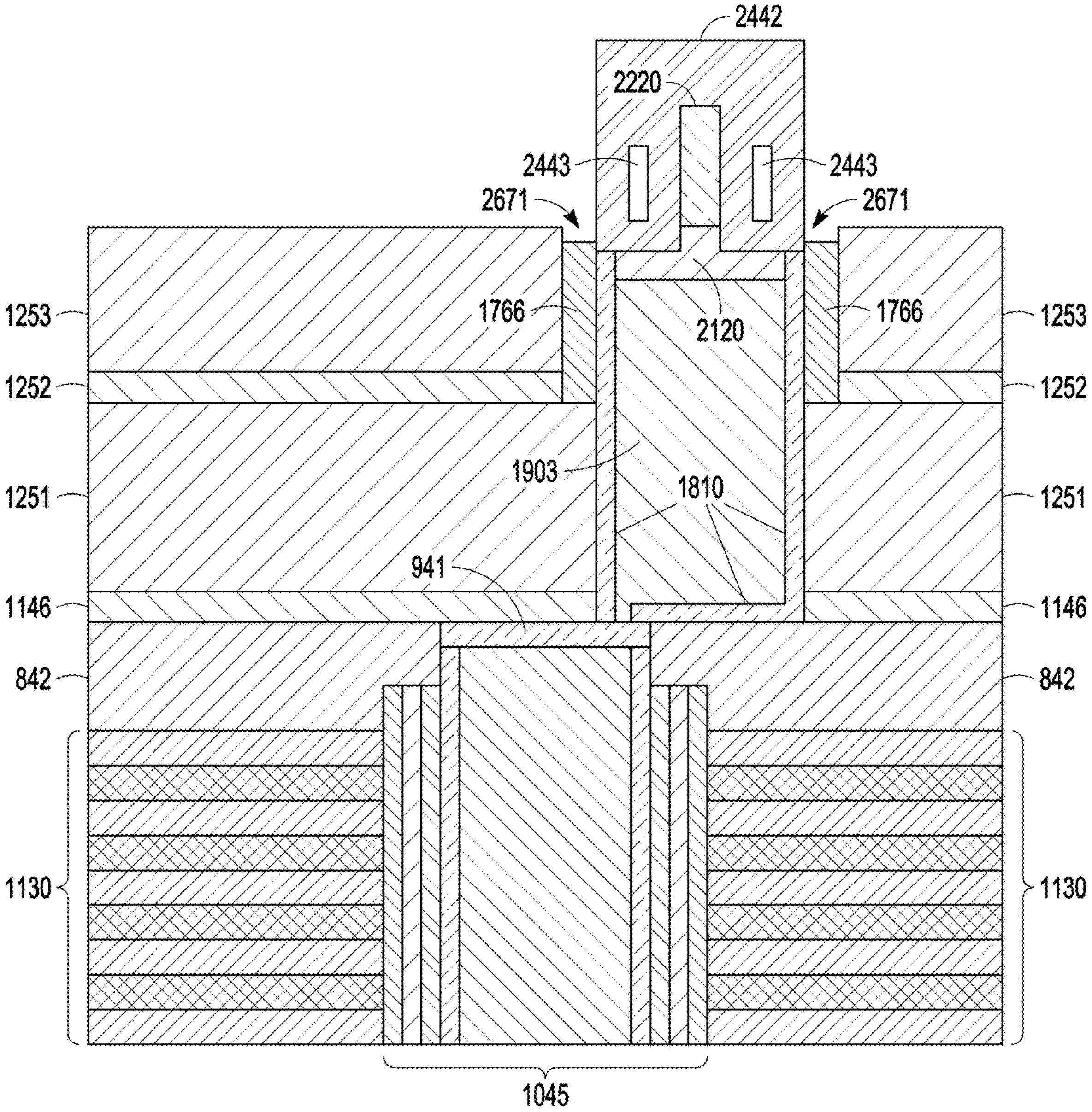

FIG. 26 shows a cross-sectional view of the structure of FIG. 25 after removing oxide 1254 and enough of oxide spacer 1766 to blow oxide out of void areas and expose semiconductive material 1810 at ends of the void areas. Removing such oxide can be performed using a wet etch. The cross-sectional view is along the cross-section line of FIG. 13B, which indicates non-void areas 2671.

Figure 27A:
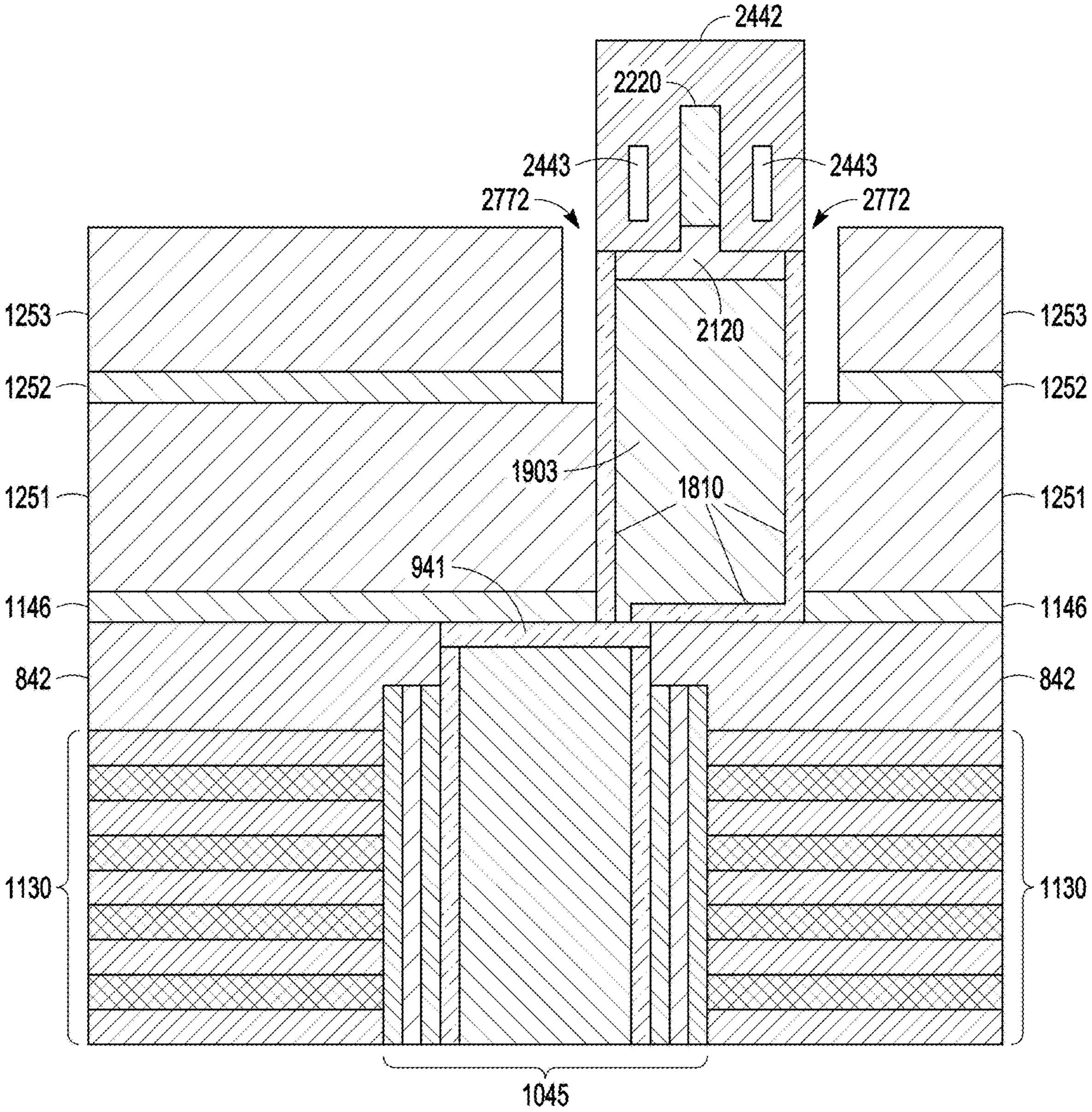
Figure 27B:
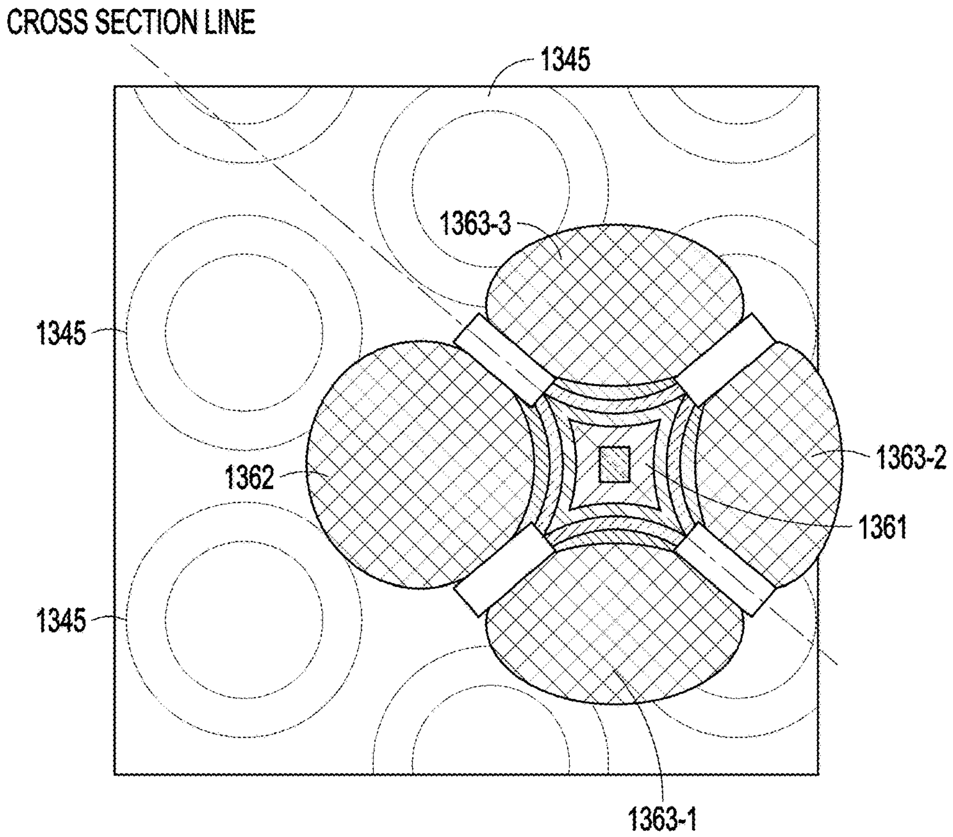
Figure 27C:
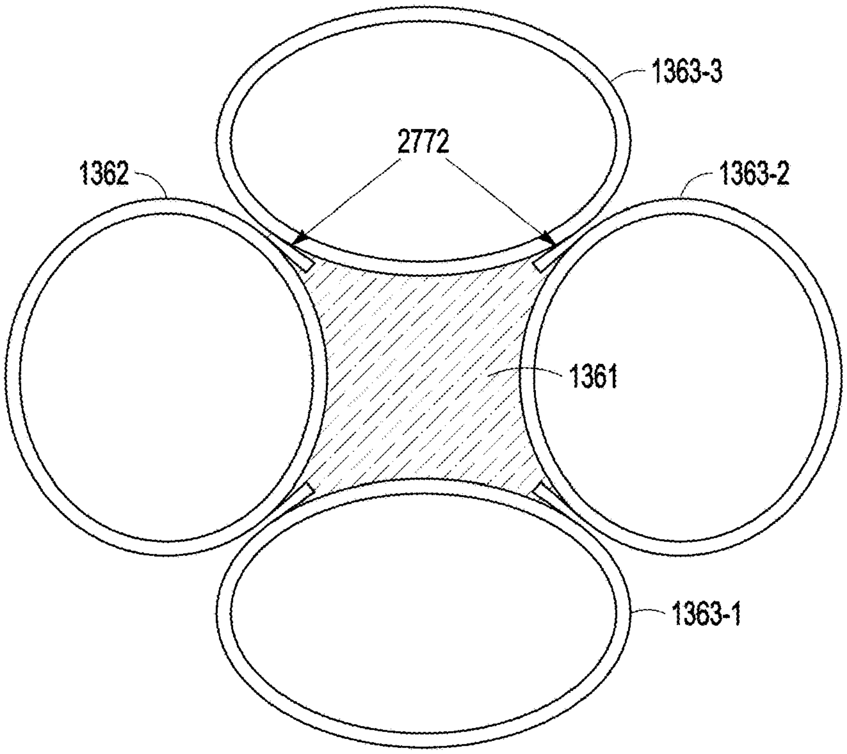

FIG. 27A shows a different cross-sectional view of the structure of FIG. 26 after removing oxide 1254 and enough of oxide spacer 1766 to blow oxide out of corner void areas 2772 and expose semiconductive material 1810 at ends of the corner void areas 2772. The cross-sectional view is along the cross-section line of FIG. 27B for the round pattern 1362 and oval patterns 1363-1, 1363-2, and 1363-3 for the star pattern 1361 shown in FIG. 13B and used in the example formation of SGD transistors for pillars of memory cells of FIGS. 4-14 and 17-41. FIG. 27C is a top view highlighting the corner void areas 2772 formed between etched patterns 1362, 1363-1, 1363-2, and 1363-3 and the star pattern 1361.

Figure 28A:
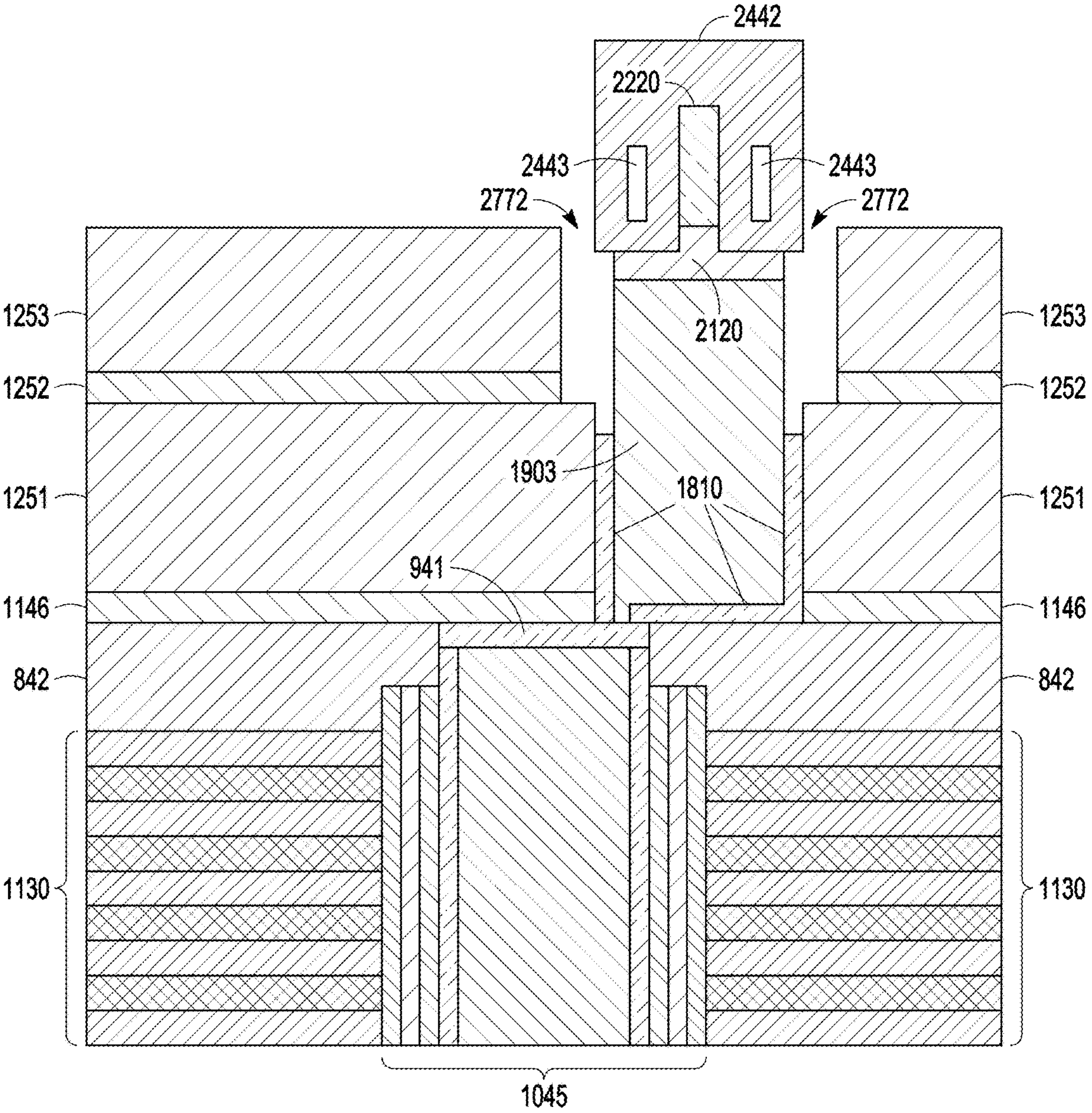
Figure 28B:
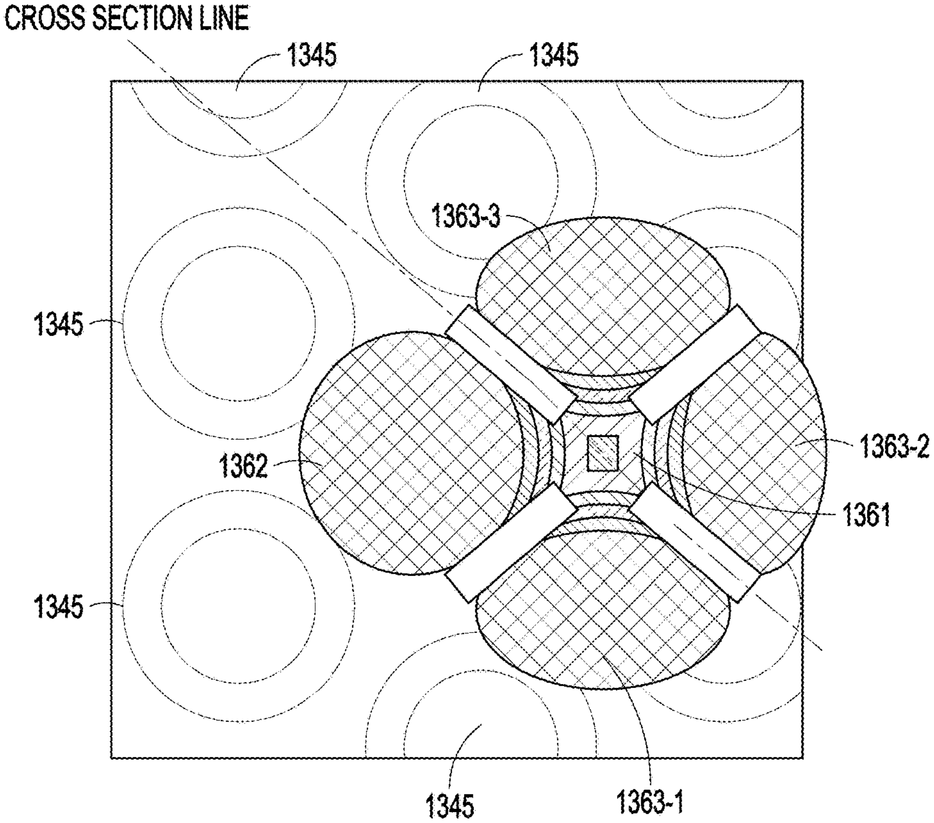
Figure 28C:
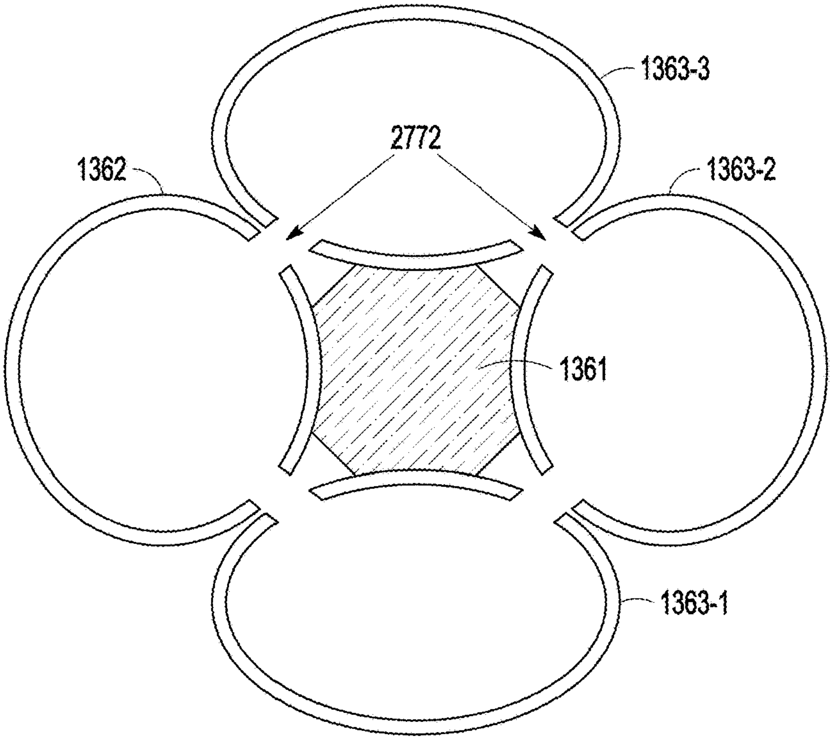

FIG. 28A shows a cross-sectional view of the structure of FIG. 27A after removing the exposed semiconductive material 1810 at ends of the corner void areas 2772 from the carbon nitride 2442 to a distance below the top surface of the nitride 1251. The cross-sectional view is along the cross-section line of FIG. 27B and FIG. 28B for the round pattern 1362 and oval patterns 1363-1, 1363-2, and 1363-3 for the star pattern 1361. FIG. 28B indicates the enhancement for the corner void areas 2772. FIG. 28C is a top view highlighting the increased corner void areas 2772 formed between resist patterns 1362, 1363-1, 1363-2, and 1363-3 and the star pattern 1361.

Figure 29:
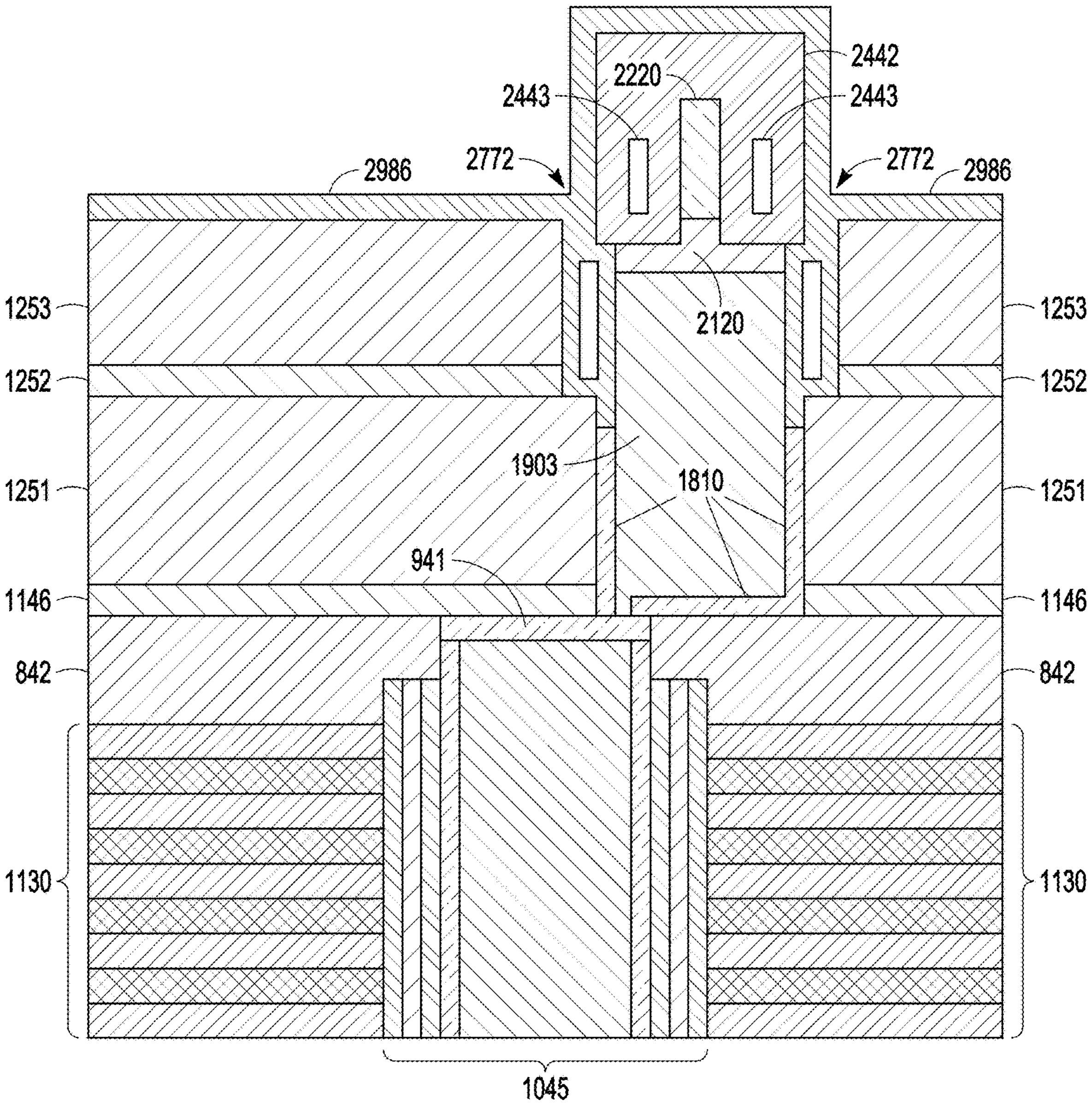

FIG. 29 shows a cross-sectional view of the structure of FIG. 28A after forming oxide 2986 across the tops of the regions of the structure of FIG. 28A to protect the nitride 1251 during an operation exhuming the nitride 1253 to follow. The cross-sectional view is along the cross-section line of FIG. 28B.

Figure 30:
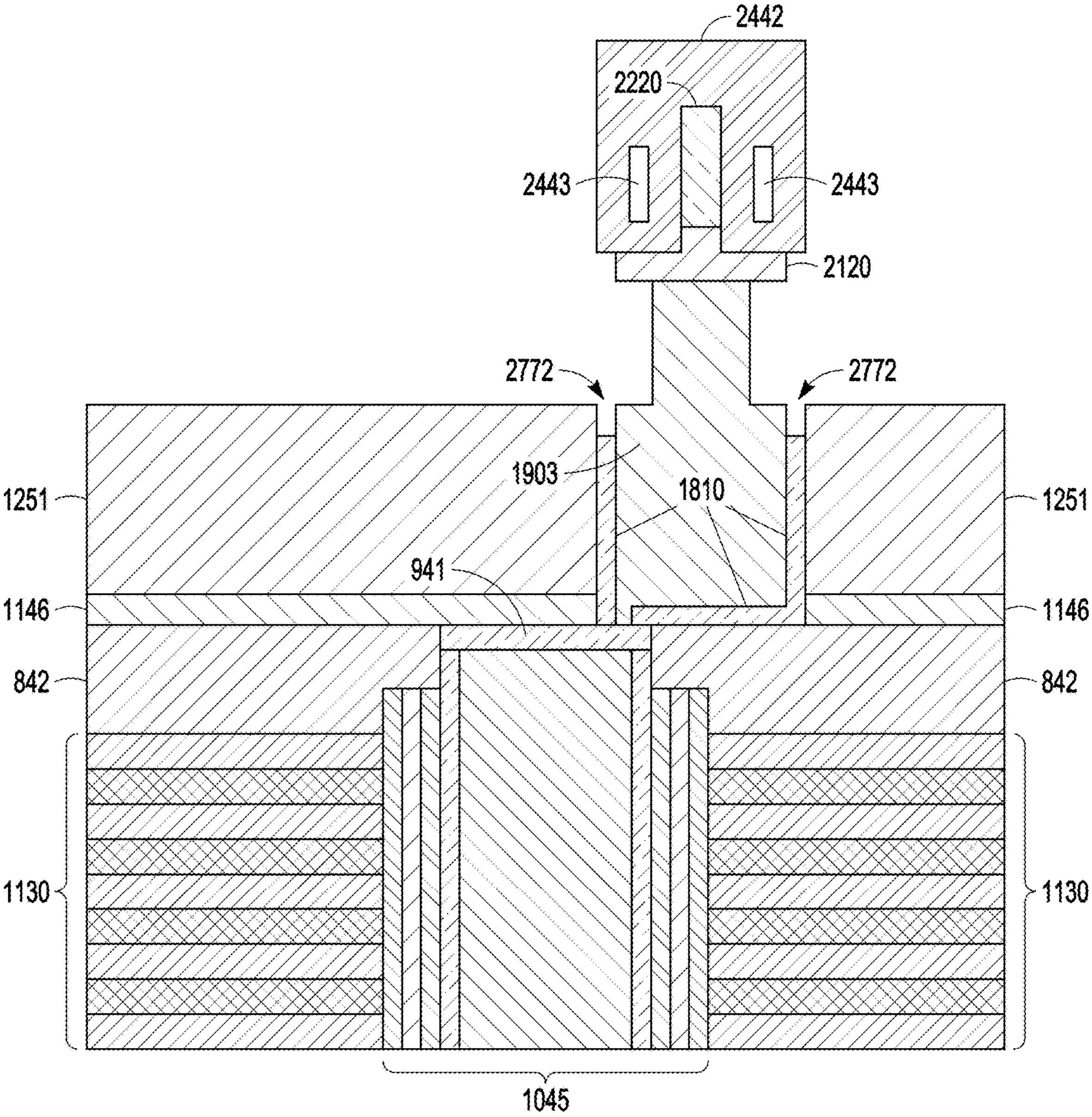

FIG. 30 shows a cross-sectional view of the structure of FIG. 29 after further processing stages have been performed. The cross-sectional view is along the cross-section line of FIG. 28B. The top portions of the oxide 2986 on the carbon nitride 2442 and on the nitride 1253 have been removed. The removal can be performed by etching off the top portions of the oxide 2986 exposing the nitride 1253 and the carbon nitride 2442, leaving remaining portions of the oxide 2986 around the semiconductor material 2120 and the oxide 1903. The exposed nitride 1253 was removed, which can be performed by etching. After removing the nitride 1253, the remaining portions of the oxide 2986 and the oxide 1252 were removed resulting in the structure of FIG. 29 with a small opening above the semiconductor material 1810, relative to the top of the nitride 1251. The removal of the remaining portions of the oxide 2986 and the oxide 1252 can be performed by etching.

Figure 31:
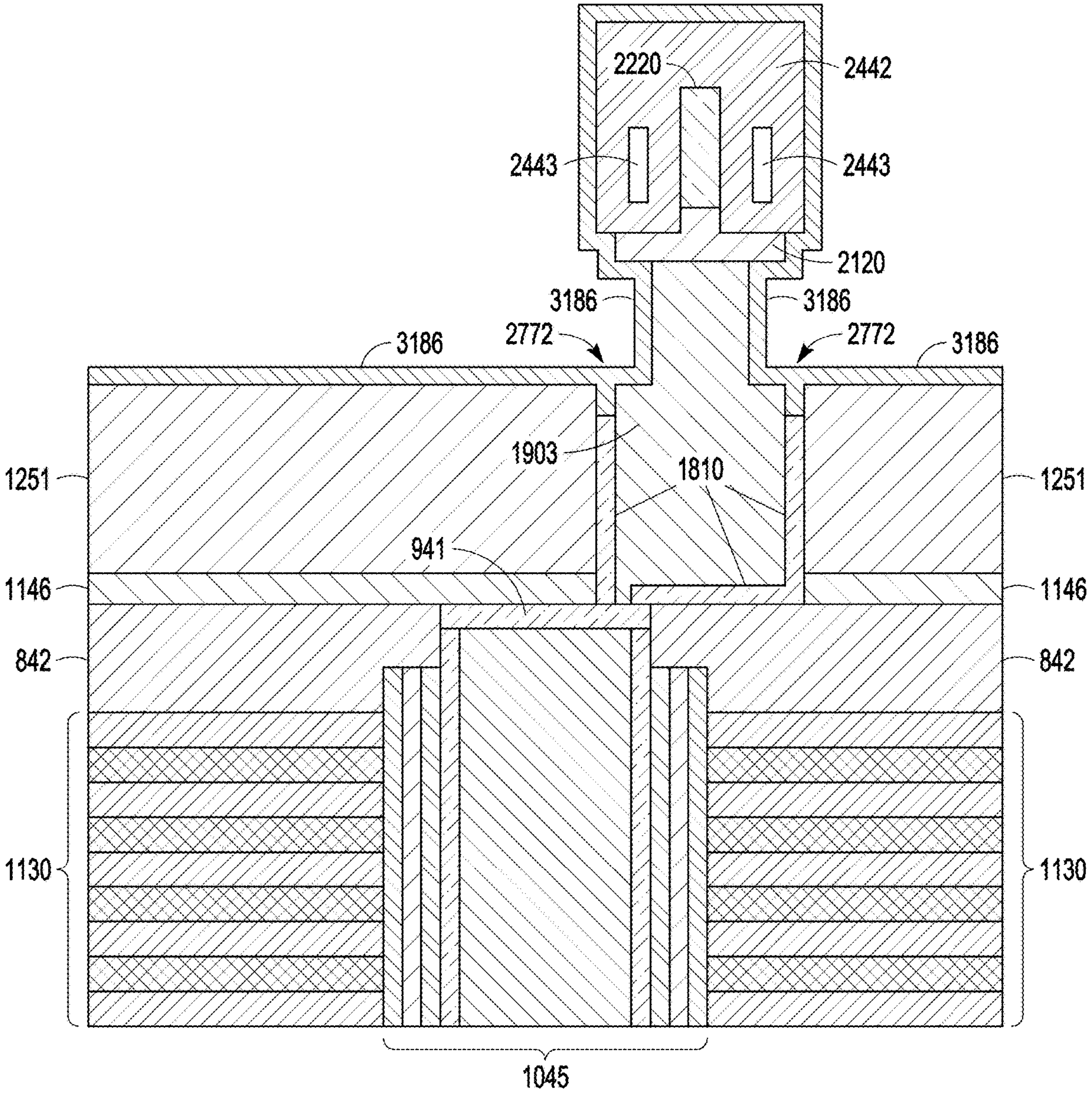

FIG. 31 shows a cross-sectional view of the structure of FIG. 30 after oxide 3186 has been formed over top of the structure of FIG. 30. The cross-sectional view is along the cross-section line of FIG. 28B. The oxide 3186 can be deposited by a suitable deposition technique to cover the carbon nitride 2442, the semiconductor material 2120, the oxide 1903, the horizontal surface of the nitride 1251, and the small opening above the semiconductor material 1810, relative to the top of the nitride 1251 bounded by the oxide 1903, the nitride 1251, and the semiconductor material 1810. With the semiconductor material 1810 to be processed to form a channel region for the SGD transistor, the semiconductor material 1810 can be a n-type semiconductor material.

Figure 32:
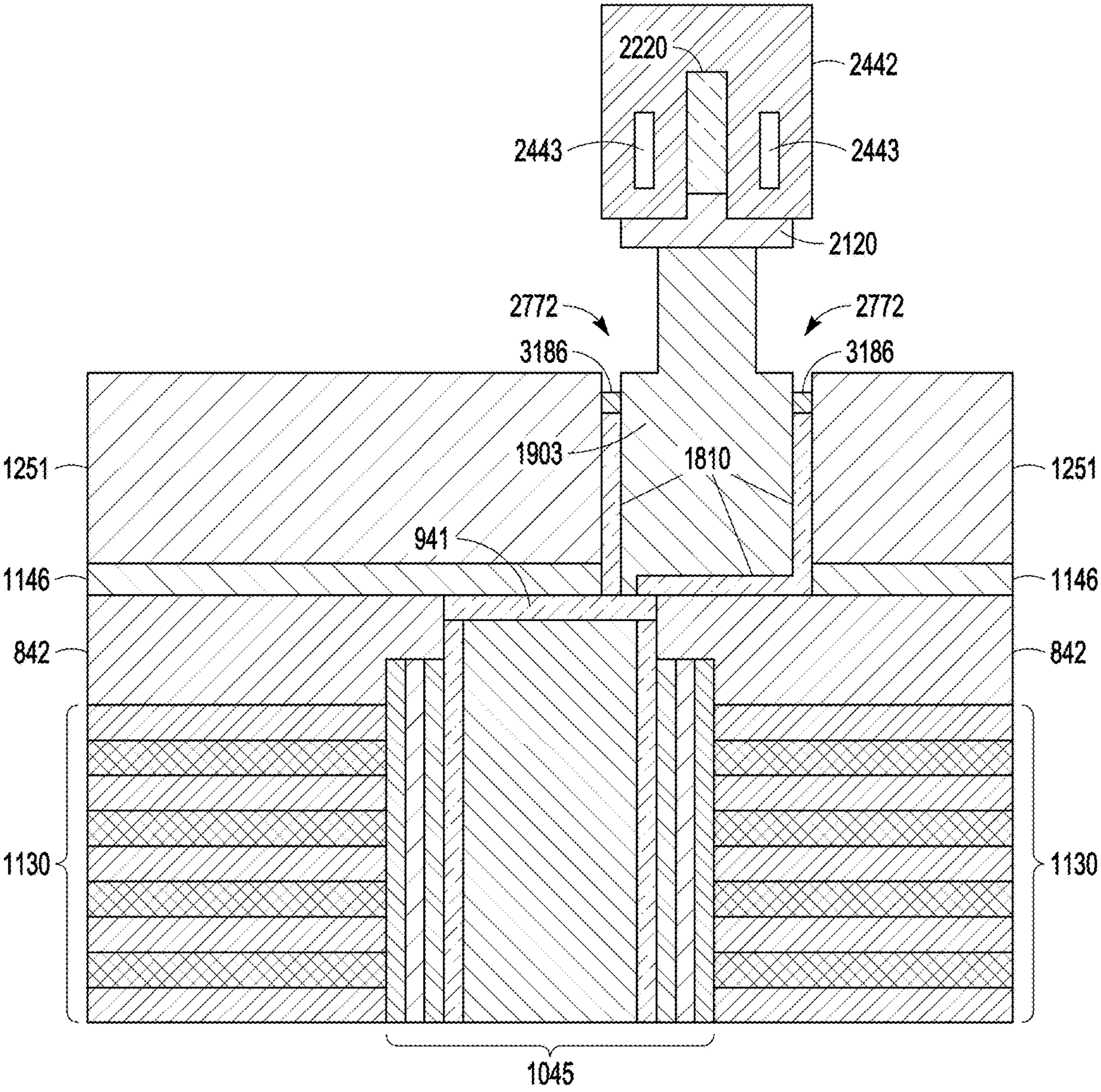

FIG. 32 shows a cross-sectional view, along the cross-section line of FIG. 28B, of the structure of FIG. 31 after oxide 3186 has been removed from covering the carbon nitride 2442, the semiconductor material 2120, the oxide 1903, and the horizontal surface of the nitride 1251. The oxide 3186 has been recessed in the small opening above the semiconductor material 1810, relative to the top of the nitride 1251, and bounded by the oxide 1903, the nitride 1251, and the semiconductor material 1810. The oxide 3186 has been recessed in a gap above the semiconductor material 1810, leaving enough coating on the semiconductor material 1810 to block subsequent processing of more heavily doped material in the bottom of the cut but not the sides. The semiconductor material 1810 can have n− doping with the region above to be doped n+.

Figure 33:
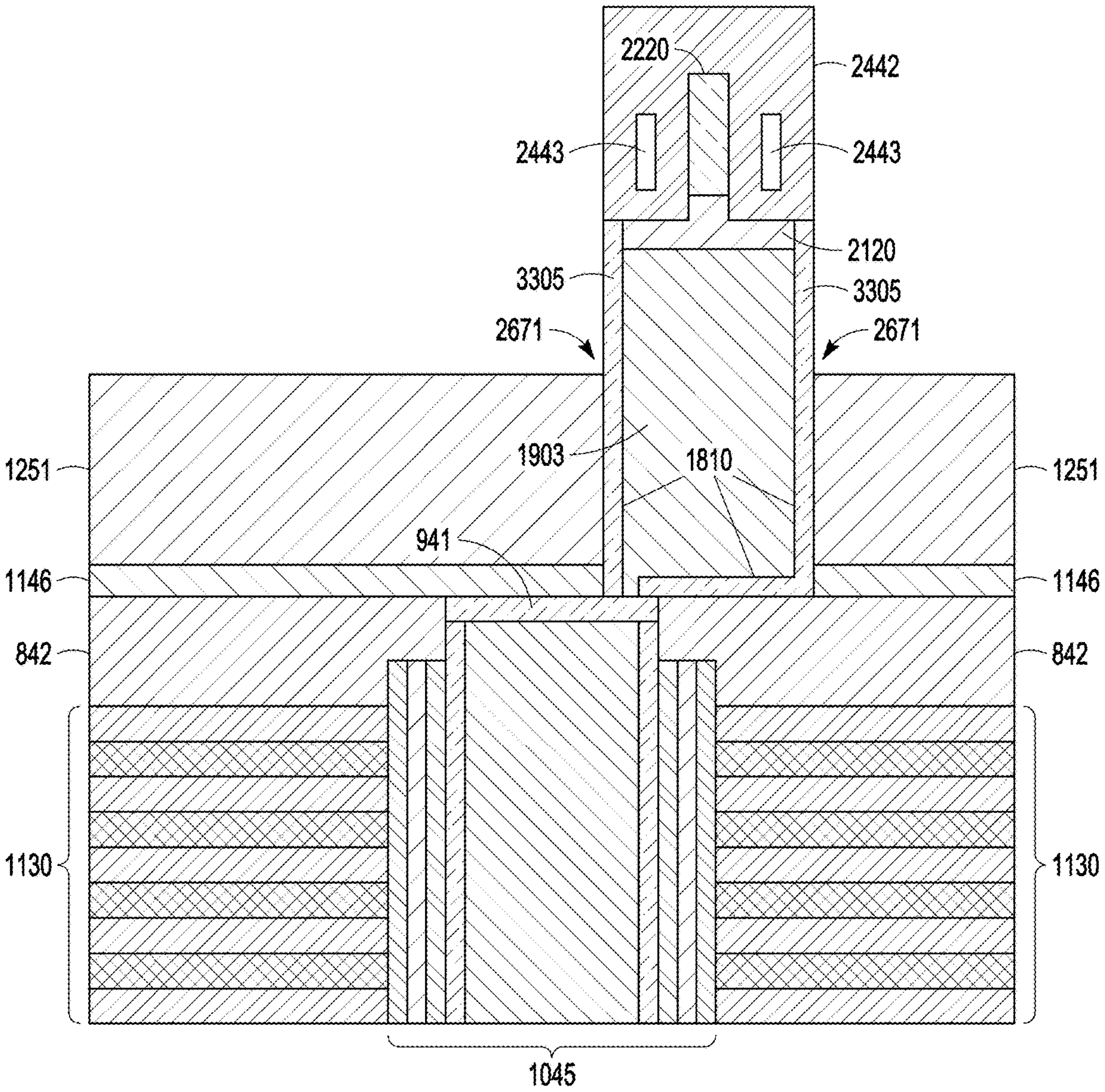

FIG. 33 shows a cross-sectional view, along the cross-section line of FIG. 13B, of the structure of FIG. 32 after forming a semiconductor material 3305 that is heavily doped relative to the semiconductor material 1810. The semiconductor material 3305 is a portion of material 1810 that has had n+ dopant implanted or diffused into it. Along the cross-section line of FIG. 13B are indicated non-void areas 2671. The semiconductive material 3305 can be, but is not limited to, the same as the semiconductive material 2120, semiconductive material 1810, the semiconductive material 941, the semiconductive material 641, or the channel material 501 used in prior processing stages. For example, the semiconductive material 3305 can be poly silicon. With the semiconductor material 1810 being n− semiconductor material, the semiconductor region can be n+ material formed to create abrupt n+ junction. With the semiconductive material 1810 being polysilicon, the semiconductive material 3305 is polysilicon with n+ dopant implanted or diffused into it. This can be done with phosphorus-rich oxide or plasma doping (PLAD) implant with a heat step to drive dopant into the polysilicon of the portion of the semiconductor material 1810 and activating the implanted material in the polysilicon. The doping occurs only to the 1810 polysilicon that is exposed, with a slight amount that will diffuse into the polysilicon from the exposed portion of polysilicon 1810. An abrupt junction is created between the n+ polysilicon of the semiconductive material 3305 and the n-polysilicon of the semiconductive material 1810. Residue from the phosphorus-rich oxide process, the PLAD process, or other process used is cleaned up after the desired n+ region formation. Thickness of the nitride 1251 can set the gate over/underlap. If slightly more distance is desired from n+ of the semiconductive material 3305 to the edge of the gate, small amounts of the nitride 1251 can be removed to adjust this length after the n+ dopant process has been cleaned up.

Figure 34A:
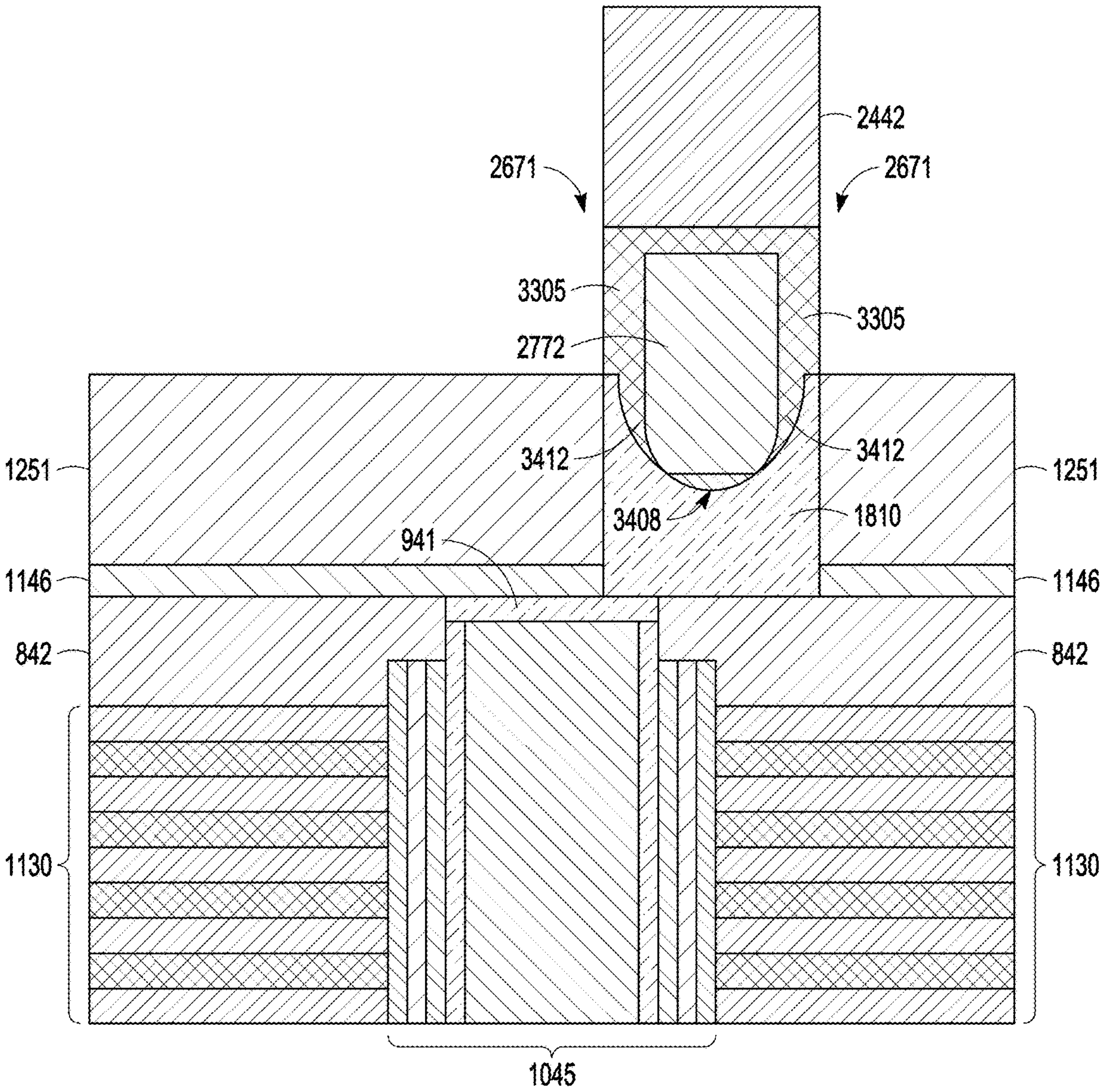
Figure 34B:
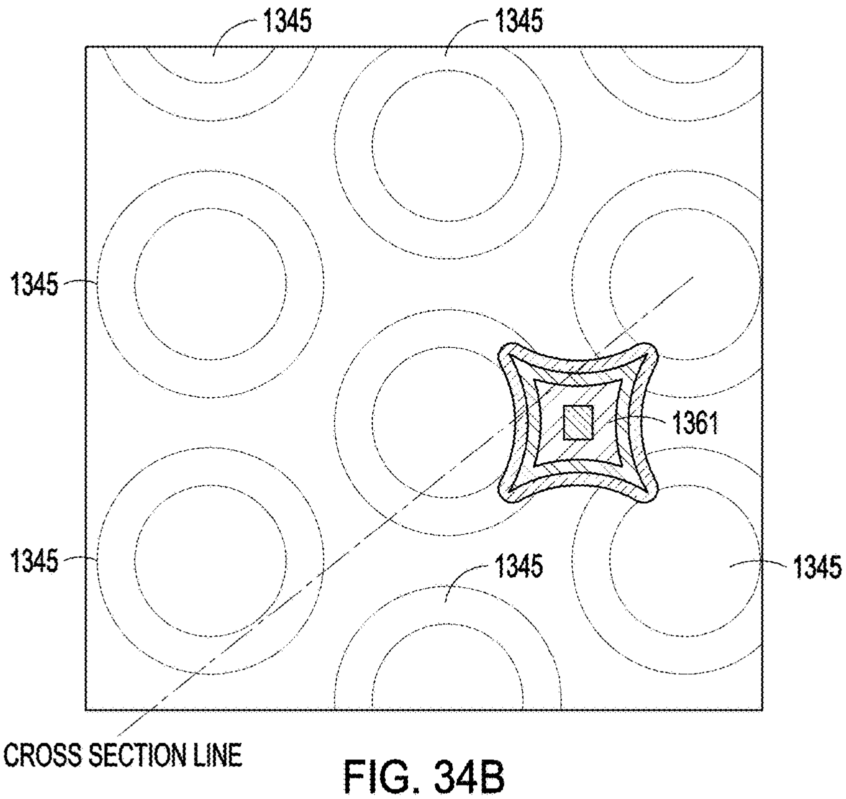

FIG. 34A shows a cross-sectional view of the structure of FIG. 31 along a different cross-section line of the star pattern of FIG. 13B. The cross-section line of the star pattern 1361 for FIG. 34A is shown in FIG. 34B for the star pattern 1361 along pillar structures 1345. FIG. 34A indicates non-void areas 2671 and void 2772. A segmented channel structure is shown extending from the semiconductive material 1810, with the segmented channel structure including n+ semiconductor material 3305 structured as fins and a non-conductive region formed by the void 2772. The n+ semiconductor material 3305 is formed from n+ doping a portion of the semiconductive material 1810, where the semiconductive material 1810 can be polysilicon. A fanged region 3412 extends from the n+ semiconductor material 3305, shown on the left being one fin, towards, but does not meet, a fanged region 3412 extending from the n+ semiconductor material 3305 shown on the right being another fin. The fanged regions 3412 can be doped to the doping level of the semiconductor material 3305 that is provided to form fins. The fanged regions can provide for high GIDL operation. In between the two fanged regions is a rounding 3408 of the vertical border of the semiconductor material 1810. The rounding 3408 can provide a n− bottom of the cut area between n+ fangs, where dopant is blocked by oxide above the rounding 3408. The n+ dopant will diffuse into and dope any exposed silicon to n+ down to the oxide in the bottom of the rounded area. The oxide in the bottom blocks the n+ diffusion into the polysilicon below it.

Figure 34C:
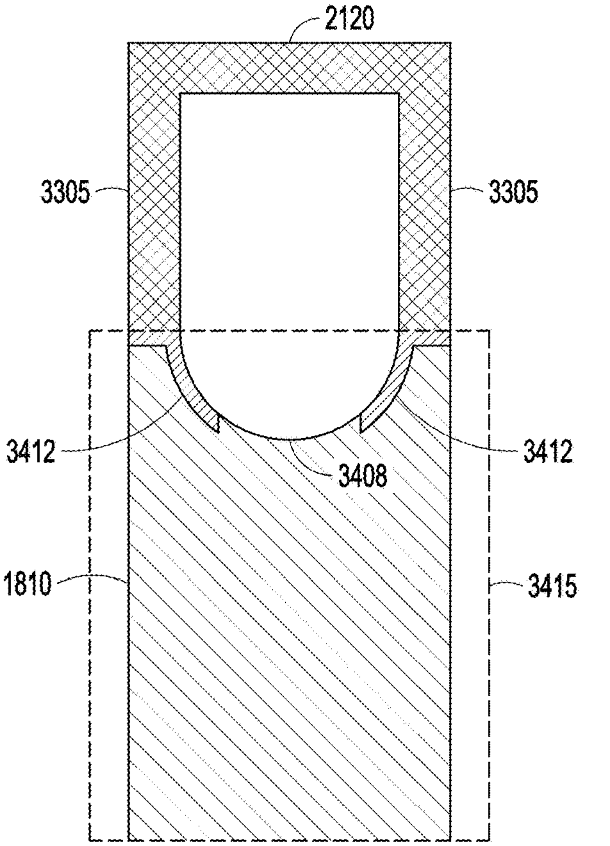

FIG. 34C shows a representation for a SGD transistor structure corresponding to the structure in FIG. 34A extending from the semiconductor material of the structure 1045. The structure of FIG. 34C includes a channel region 1810 adjacent a gate 3415 and includes a drain 2120 coupled to the channel region 1810 by fins 3305 having fanged regions 3412 that extend below an interface of the fins 3305 with the channel region 1810, where the channel region 1810 has a rounding 3408 between the fins 3305.

Figure 35:
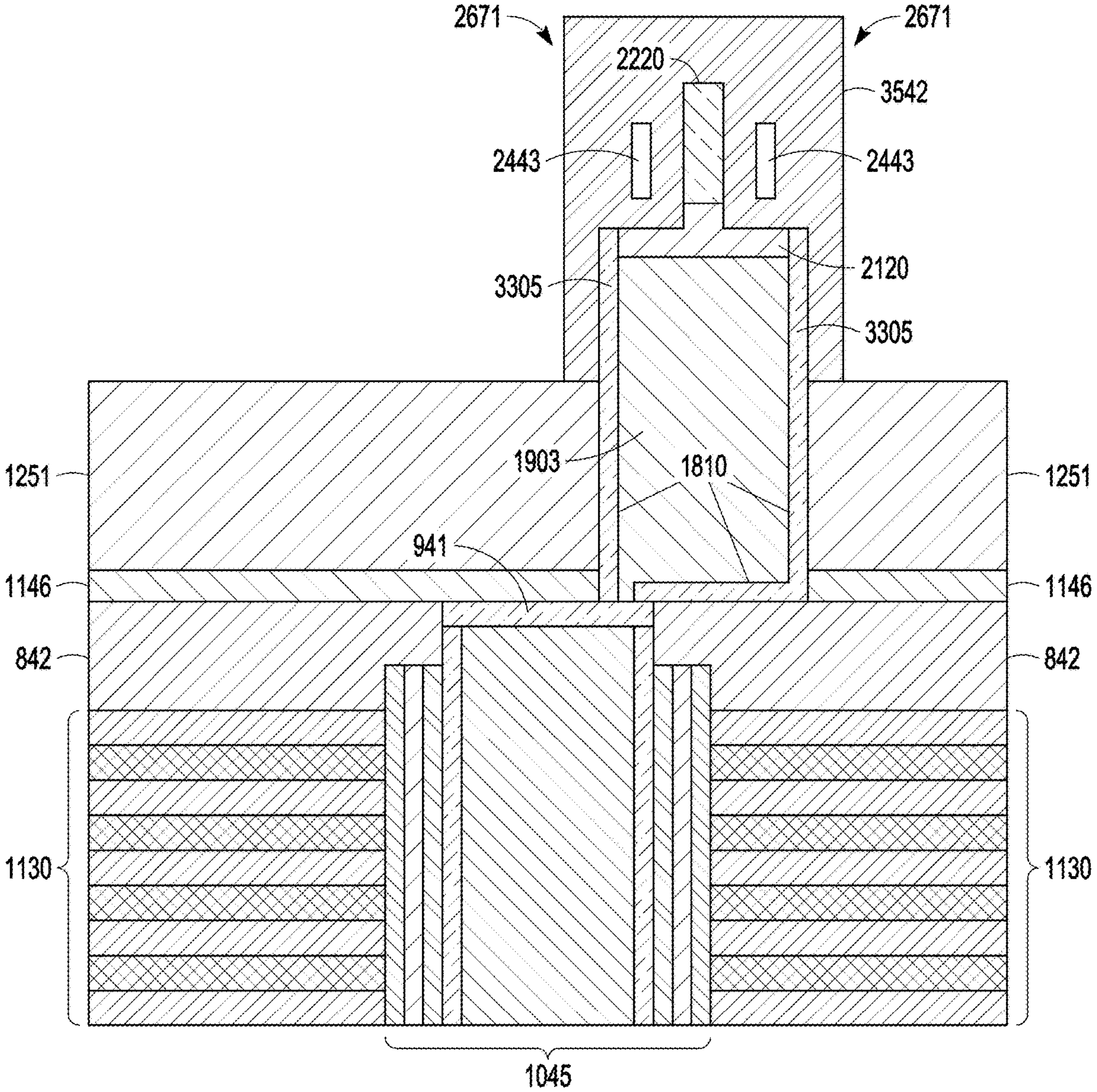

FIG. 35 shows a cross-sectional view of the structure of FIG. 33 after further processing stages have been performed. The cross-sectional view is along the cross-section line of FIG. 13B indicating non-void areas 2671. Carbon nitride 3542 has been formed covering the top surface of the structure of FIG. 33, expanding the carbon nitride 2442 and covering the semiconductor material 3305 and the top surface of the nitride 1251. The carbon nitride 3542 can be formed using a suitable deposition technique. The carbon nitride 3542 has been spacer etched, exposing the top surface of the nitride 1251 and maintaining portions of the carbon nitride 3542 around the conductive region 2220 and around the semiconductive material 3305.

Figure 36:
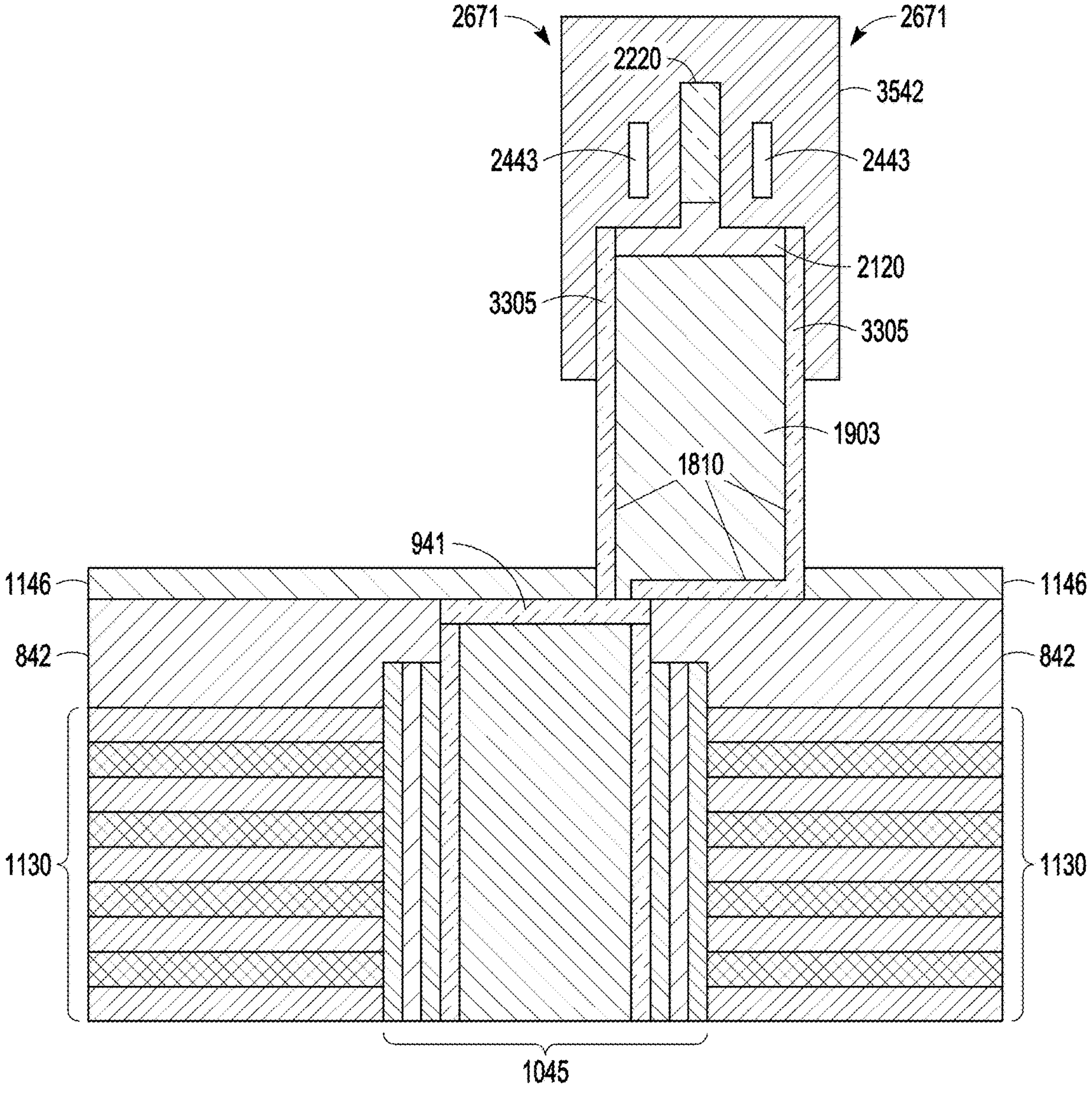

FIG. 36 shows a cross-sectional view of the structure of FIG. 35 after removing the nitride 1251, exposing the oxide 1146. The nitride 1251 can be removed by wet etching. The cross-sectional view is along the cross-section line of FIG. 13B indicating non-void areas 2671.

Figure 37:
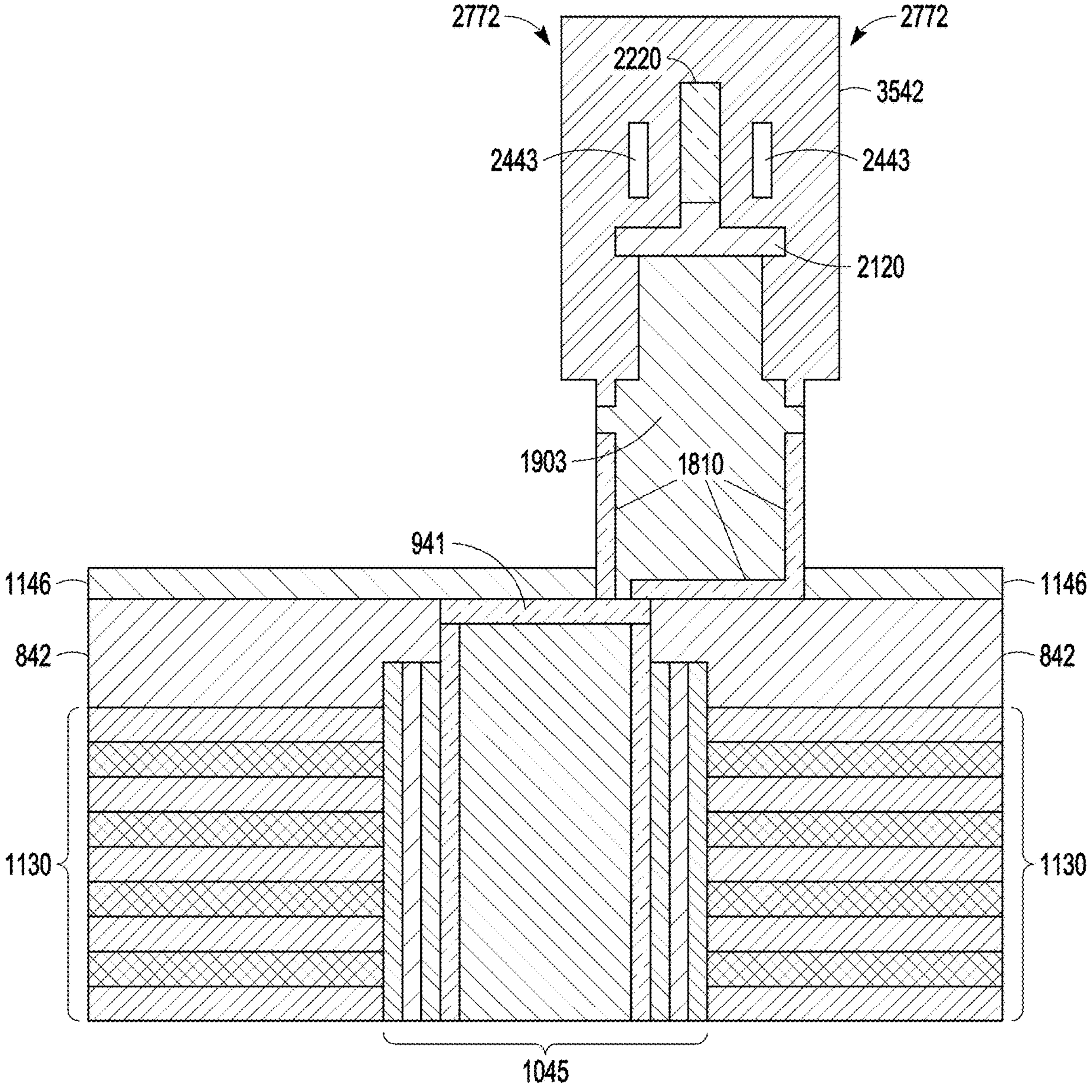

FIG. 37 shows another cross-sectional view of the structure of FIG. 35 after removing the nitride 1251, exposing the oxide 1146. The cross-sectional view is along the cross-section line of FIG. 27B indicating corner void areas 2772.

Figure 38A:
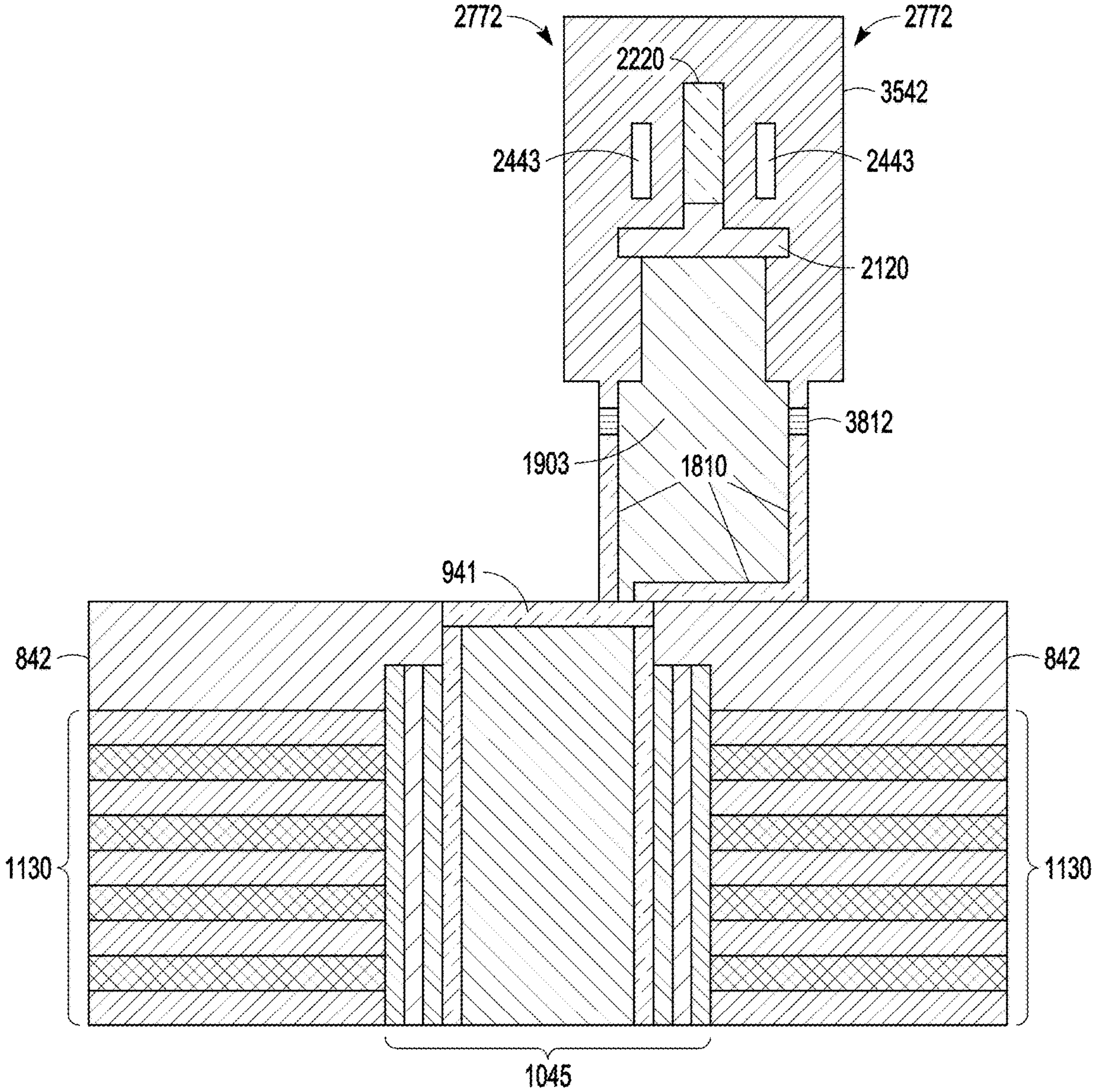
Figure 38B:
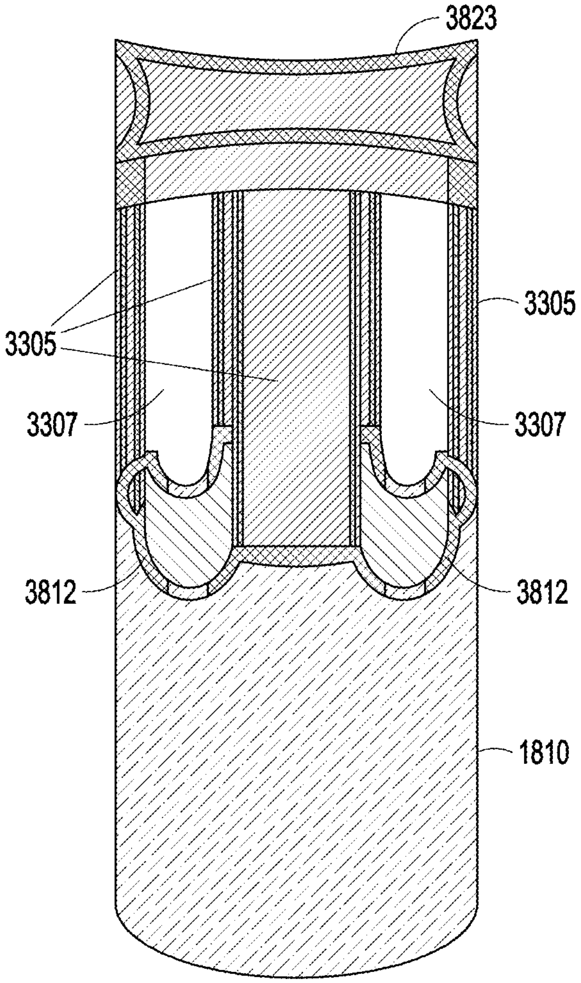

FIG. 38A shows a cross-sectional view of the structure of FIG. 37 after removing the oxide 1146. The cross-sectional view is along the cross-section line of FIG. 27B indicating corner void areas 2772. This view shows small fanged regions 3812, which can be realized as n+ polysilicon fangs at the bottom of an n+ channel (fin) corner cut void area 2772. FIG. 38B illustrates fins 3305, with fangs 3812, separated by non-conductive regions 3307. The fins 3305 couple the semiconductor material 1810 to a n+ drain contact 3823, forming the fins 3305 as a drain channels.

Figure 39A:
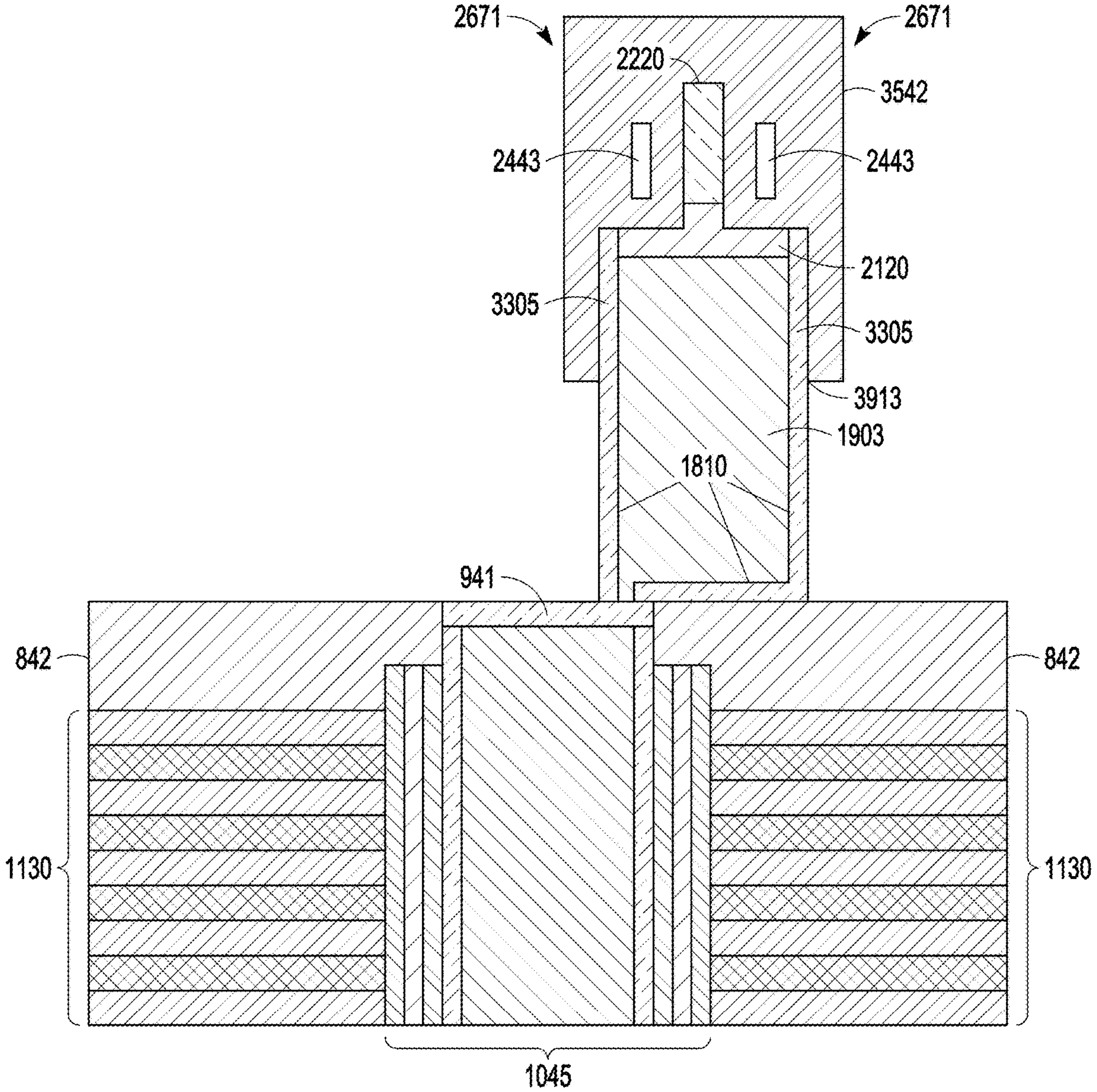
Figure 39B:
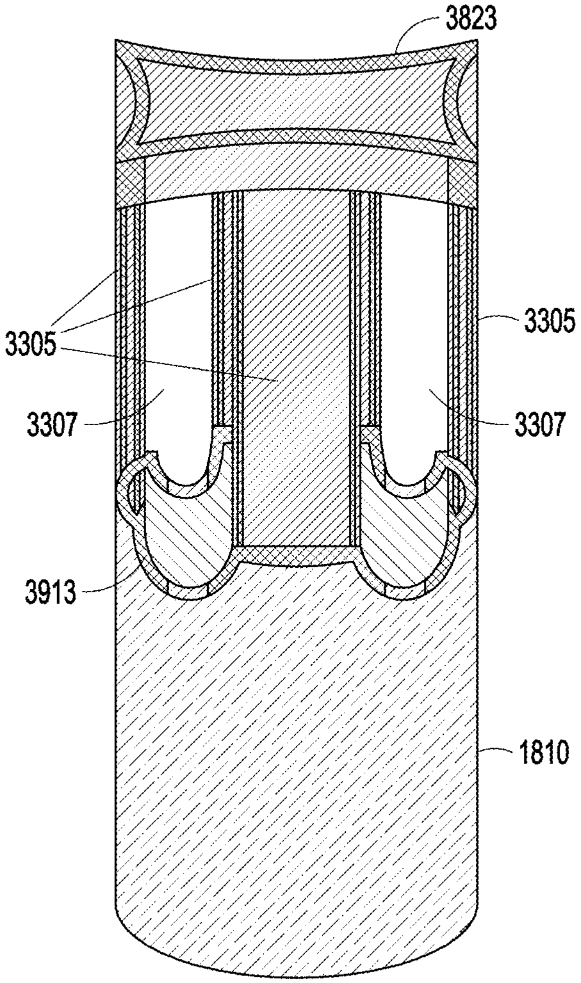

FIG. 39A shows another cross-sectional view of the structure of FIG. 37 after removing the oxide 1146. The cross-sectional view is along the cross-section line of FIG. 13B indicating non-void areas 2671. FIG. 39B illustrates fins 3305 separated by non-conductive regions 3307, with fins 3305 contacting the semiconductor material 1810 at an interface 3913. The interface 3913 can be formed by a n+ polysilicon channel contacting a n− channel at the bottom of n+ fins. The fins 3305 couple the semiconductor material 1810 to a n+ drain contact 3823, forming the fins 3305 as a drain channel region.

Figure 40:
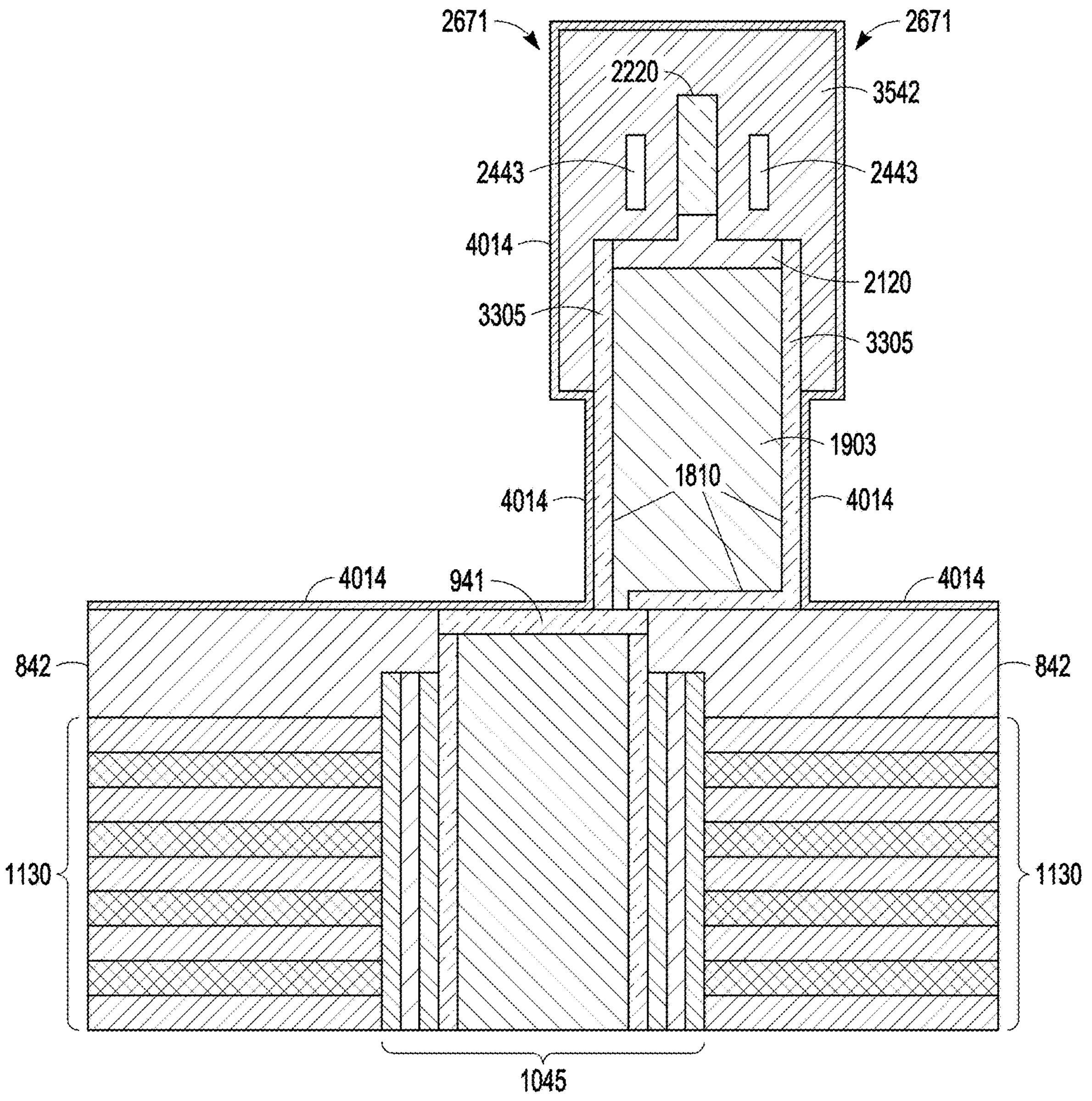

FIG. 40 shows a cross-sectional view of the structure of FIG. 39A after forming an oxide 4014 covering the surfaces of the structure of FIG. 39A. The oxide 4014 can be formed by a suitable deposition technique. Further processing of the oxide 4014 is performed in later stages to form a gate oxide for the SGD transistor being constructed. The cross-sectional view is along the cross-section line of FIG. 13B showing non-void areas 2671.

Figure 41:
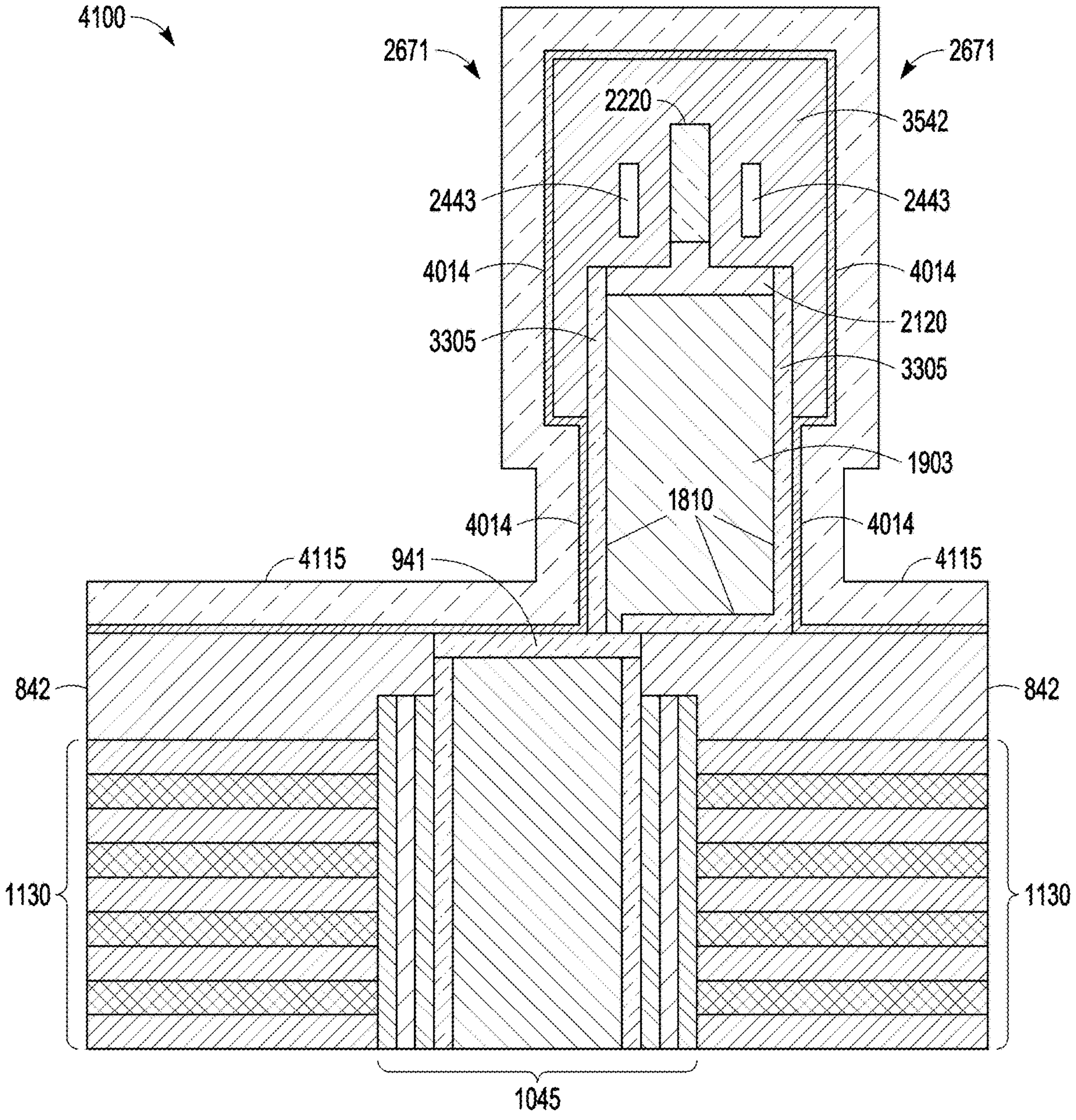

FIG. 41 shows a cross-sectional view of the structure of FIG. 40 after forming conductive material 4115 on the oxide 4014 covering the surfaces of the structure of FIG. 40, forming a structure 4100 above the pillar structure 1045 for the set of tiers 1130 of memory cells. The conductive material 4115 can be formed by a suitable deposition technique. The cross-sectional view is along the cross-section line of FIG. 13B indicating non-void areas 2671. The conductive material 4115 is to be processed to form the gate of the SGD transistor. Titanium, titanium nitride, tungsten, or combinations thereof can be deposited to form the SDG gate. Other conductive materials, which have properties sufficient for a transistor gate, may be used for the SDG gate. The thickness of the gate provided by the conductive material 4115 can be designed to be thick enough to bridge together between SGD transistors of each sub-block of the memory array being constructed, but not so thick as to bridge sub-blocks together. Ideally, there would be enough room between sub-blocks to deposit the gate conductor and an oxide spacer. This room can allow the oxide spacer to be dry etched, allowing the conductive material 4115 to be wet etched out of the bottom of a trench in which it is formed and off of the surface. This would allow the oxide 4014 above the top of channel material 501 of pillar area 405 and portions of semiconductive material 941 to remain undamaged and SGD gate oxide to de deposited directly on the top of channel material 501 of pillar area 405 and the semiconductive material 941. If a dry etch were used to remove the conductive material 4115, these layers would likely be damaged.

Figure 42:
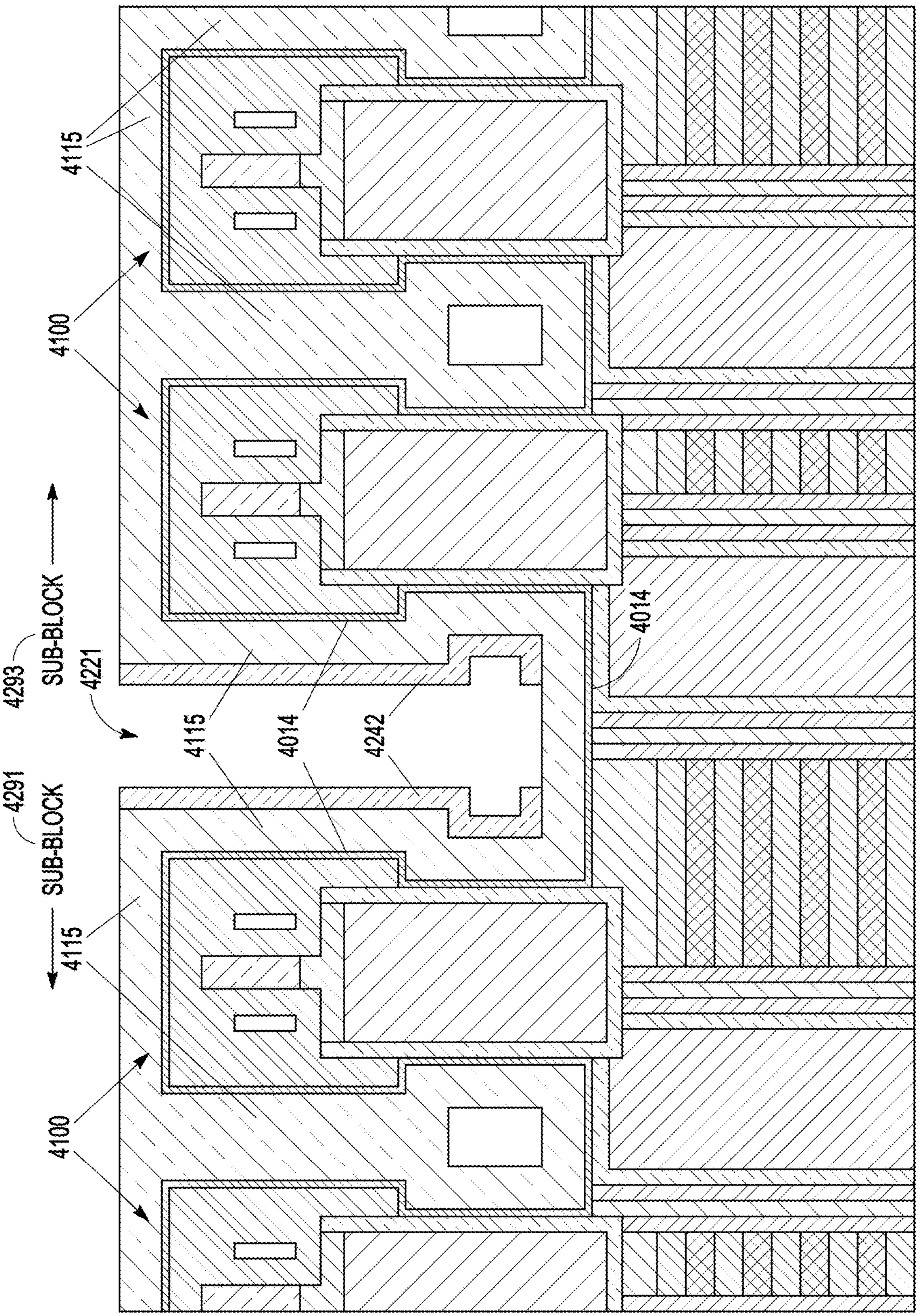

FIG. 42 shows a cross-sectional view of multiple structures 4100 from FIG. 41 for two sub-blocks 4291 and 4293 of a memory array after further processing stages have been performed. A thin spacer oxide 4242 has been formed on the top surfaces of the multiple structures 4100 and on the surface of a trench 4221 separating the two sub-blocks. The thin spacer oxide 4242 can be formed by a suitable deposition technique. After forming the thin spacer oxide 4242, the thin spacer oxide 4242 has been dry etched such that the thin spacer oxide 4242 remained on the verticals walls and bottom corners of the trench 4221, exposing the conductive material 4115 of the top surfaces of the multiple structures 4100 and at the bottom of trench 4221.

Figure 43:
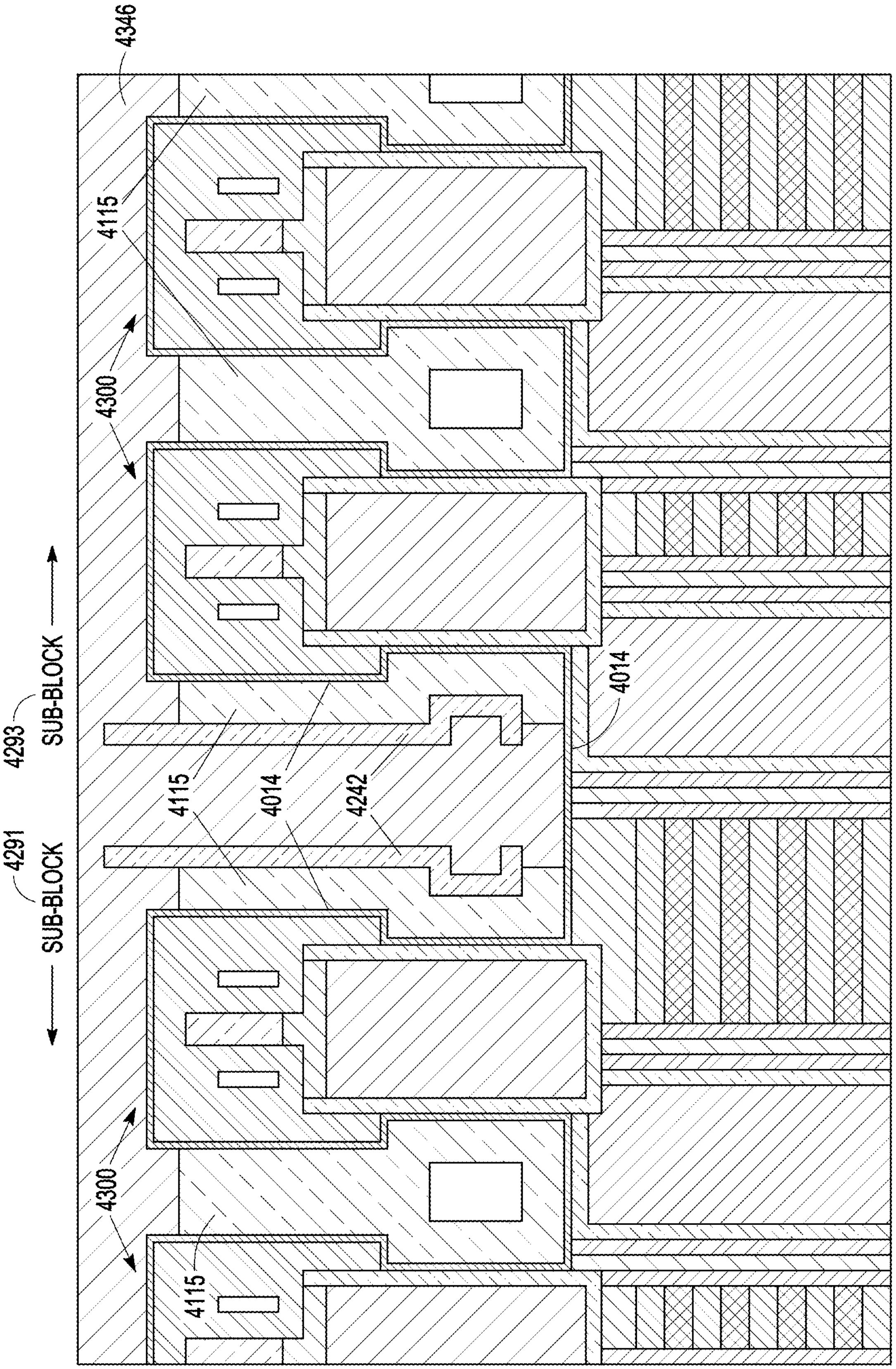

FIG. 43 shows a cross-sectional view of the structure of FIG. 42 for the two sub-blocks 4291 and 4293 after further processing stages have been performed modifying the multiple structure 4100 forming multiple structures 4300. The conductive material 4115 of the top surfaces of the multiple structures 4100 have been wet etched, removing the conductive material 4115 from top surfaces of the oxide 4014 of the multiple structures 4100 and from a region on oxide 4014 in the trench 4221 of the structure of FIG. 42. The conductive material 4115 has also been recessed from between the multiple structures 4100, forming the multiple structures 4300. A oxide 4346 has been formed on the top surfaces of the multiple structures 4300, on the exposed region of the oxide 4014 in the trench 4221 of FIG. 42, and in the recess on the conductive material 4115 between the multiple structures 4300. The oxide 4346 can be deposited using a suitable deposition technique.

Figure 44:
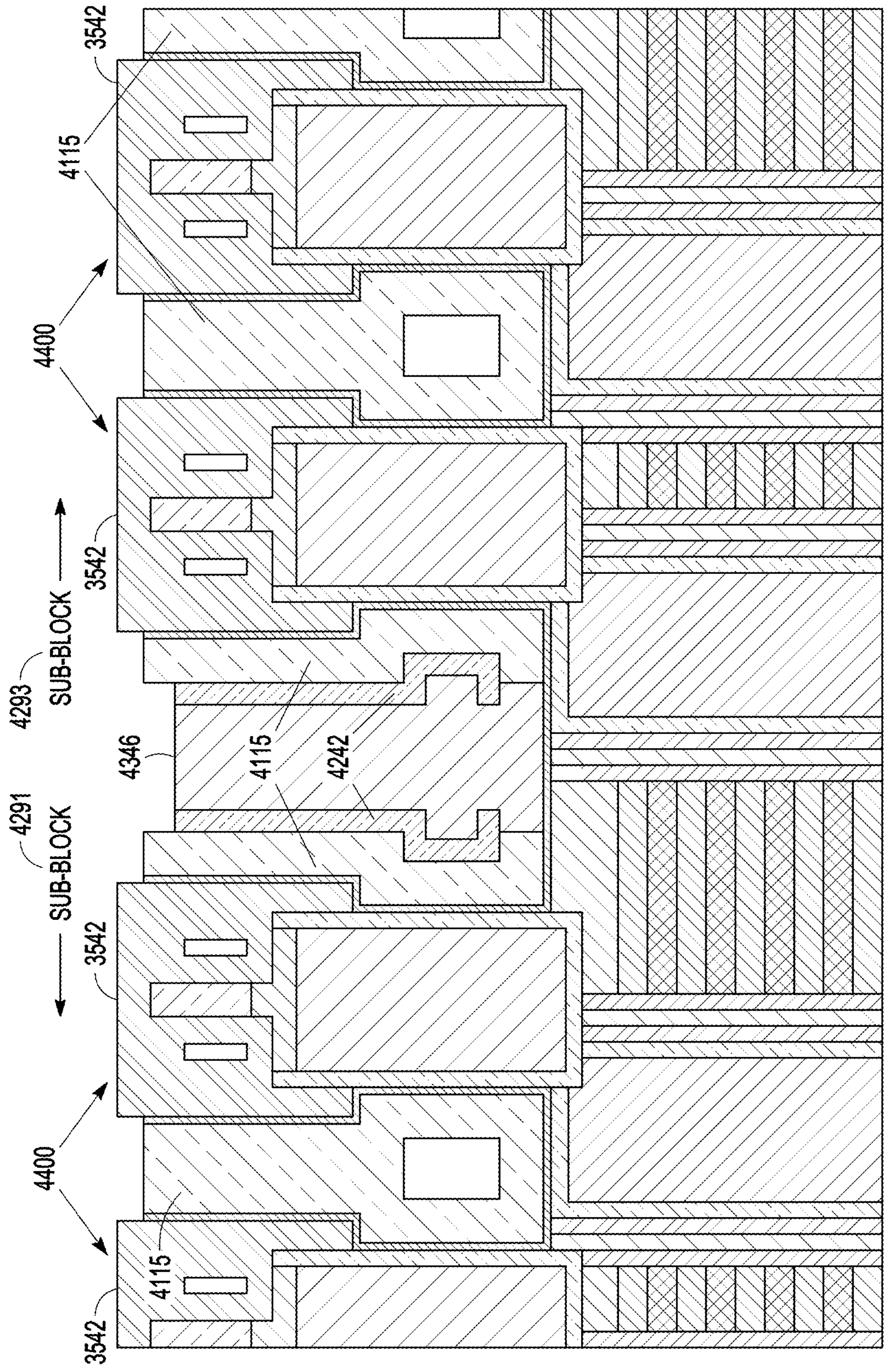

FIG. 44 shows a cross-sectional view of the structure of FIG. 43 for the two sub-blocks 4291 and 4293 after further processing stages have been performed modifying the multiple structure 4300 into multiple structures 4400. The top of the structure of FIG. 43 has been subjected to a CMP procedure planarizing the oxide 4346 down to the carbon nitride 3542. Following the CMP procedure, the remaining oxide 4346 between the carbon nitride 3542 in adjacent structures 4300 in each sub-block has been removed, exposing the conductive material 4115, forming the multiple structures 4400.

Figure 45:
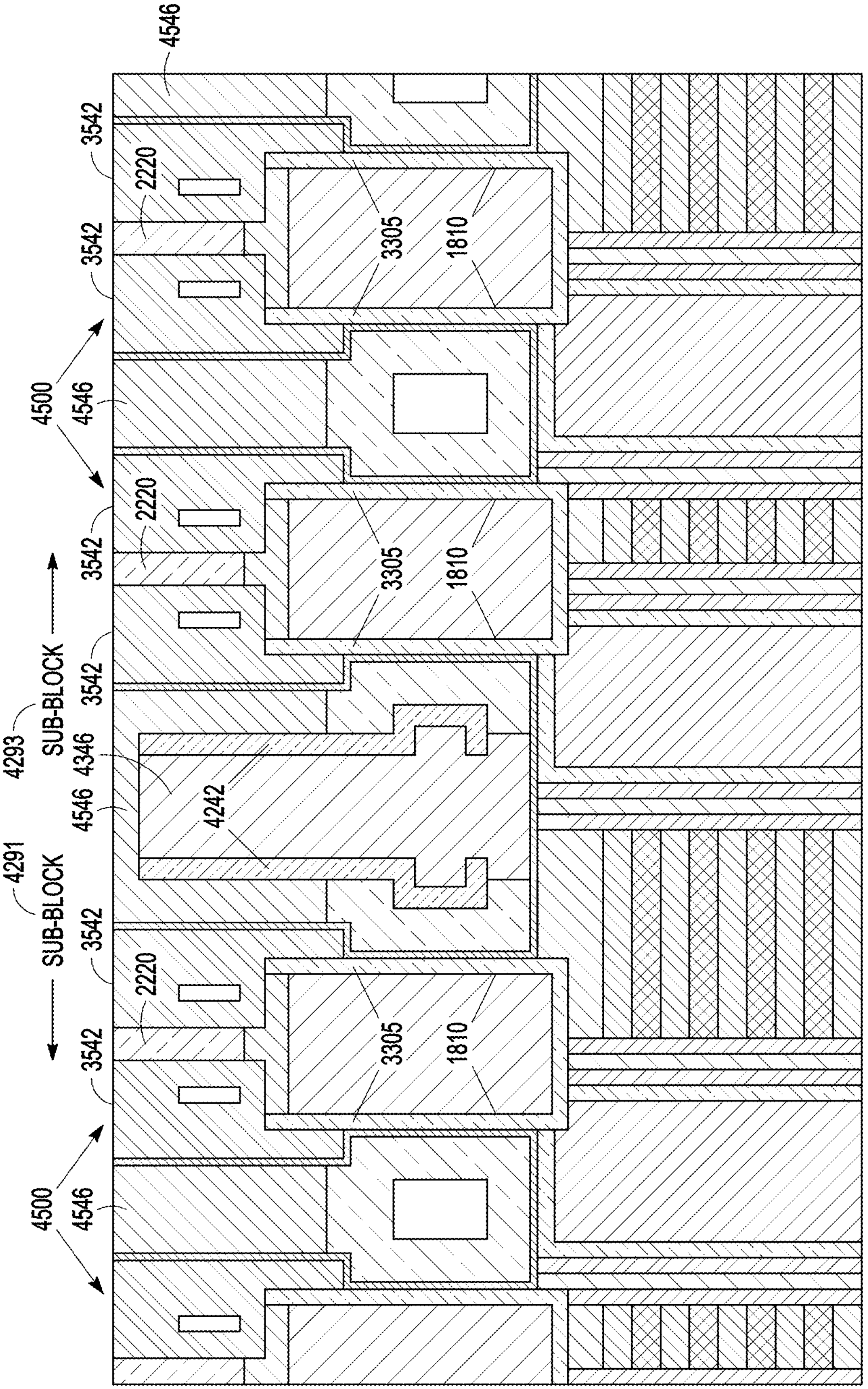

FIG. 45 shows a cross-sectional view of the structure of FIG. 44 for the two sub-blocks 4291 and 4293 after further processing stages have been performed modifying the multiple structure 4400 into multiple structures 4500. The exposed conductive material 4115 adjacent carbon nitride 3542 has been recessed to a level near the top of the semiconductor material 1810 in each of the multiple structures 4400, where the semiconductor material 1810 will form the transistor channel region of a SGD transistor. Openings from recessing the exposed conductive material 4115 have been filled with an oxide 4546 and the surface of the multiple structures have been subjected to a CMP planarization to the tops of the conductive region 2220, resulting in the multiple structures 4500.

Figure 46:
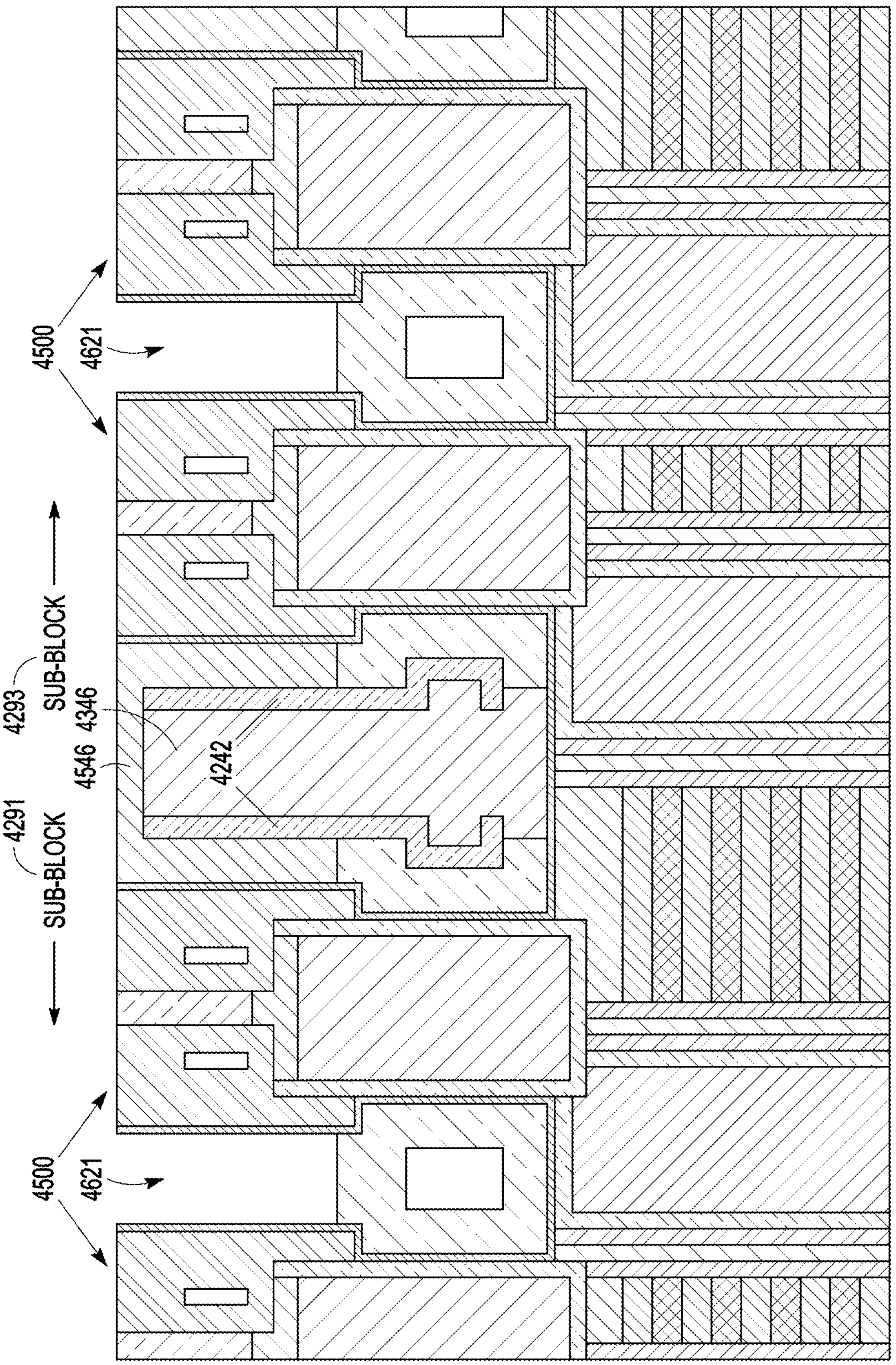

FIG. 46 shows a cross-sectional view of the structure of FIG. 45 for the two sub-blocks 4291 and 4293 after patterning and etchings openings 4621. The openings 4621 are to be processed to be filled with conductive material to form contacts to SGD transistors and other components of the memory device.

Figure 47:
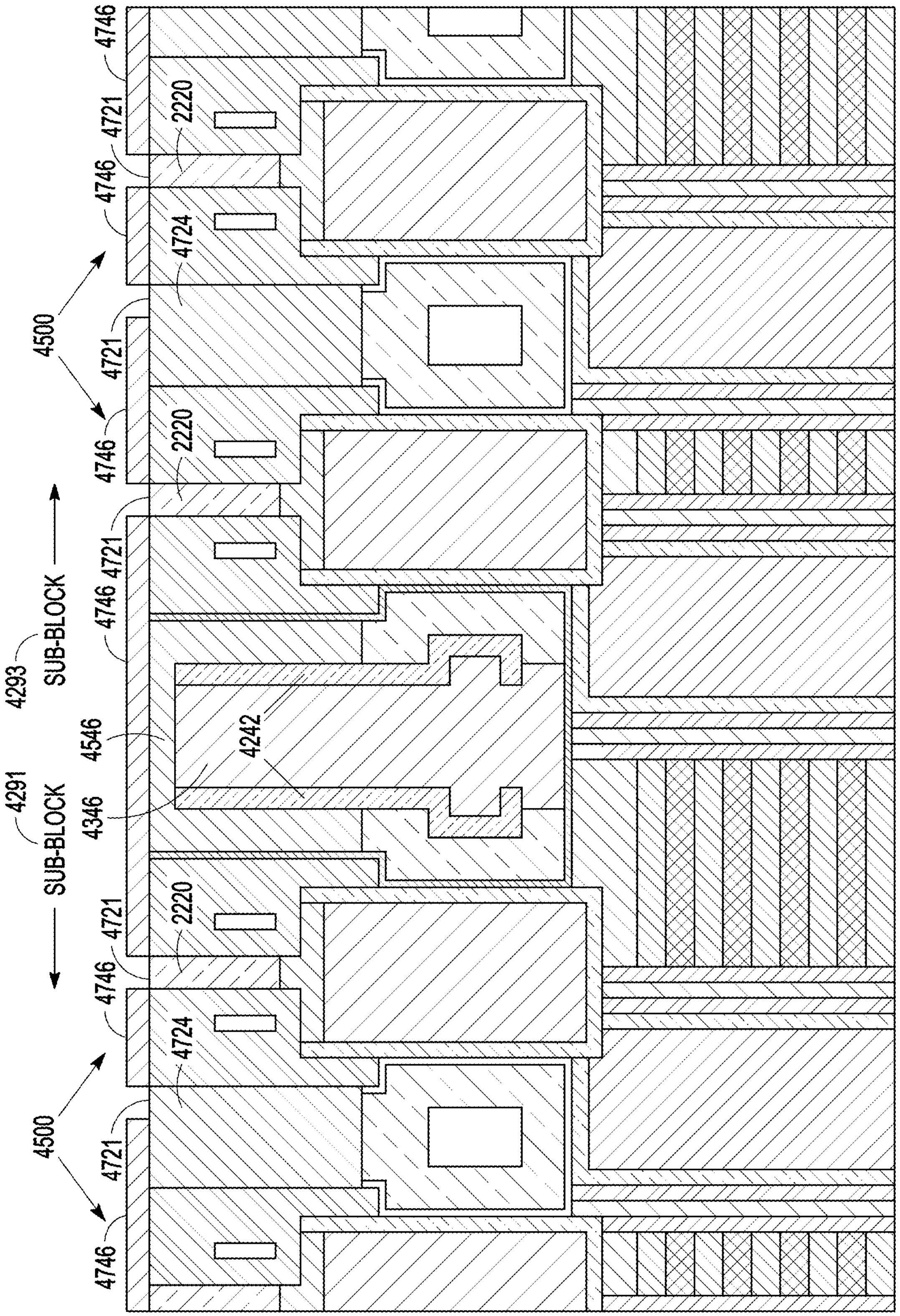

FIG. 47 shows a cross-sectional view of the structure of FIG. 46 for the two sub-blocks 4291 and 4293 after further processing stages have been performed. The openings 4621 of the structure of FIG. 46 have been filled with conductive material 4724 followed by a CMP procedure. The CMP procedure has been followed by forming an oxide 4746 on the planarized surface, patterning the oxide 4746, and removing portions of the oxide 4746 based on the patterning, forming openings 4721 to which contacts can be made.

FIGS. 48-90 illustrate another embodiment of an example method of forming a memory device having an array of strings of memory cells with each string formed as a vertical pillar coupled to a SGD transistor. Features associated with stages of forming the SGD transistors coupled to the strings of memory cells are shown in some of these figures. In this embodiment, SGD transistors with segmented fins and fangs are formed with a drain contacts constructed to touch down to a conductive landing pads, after forming the SGD transistors. The conductive landing pad can be, but is not limited to, a n+ drain landing pad. For the procedures discussed herein, the selection of processing materials can depend on the materials selected to form various components of and contacts to devices of the memory array. The processing materials can be selected to allow removal of one or more materials, while retaining one or more other materials. In addition, deposition techniques can be used that are typical for the material being formed, the dimensions of the material being formed, or the architecture in which the material is being formed.

Figure 48:
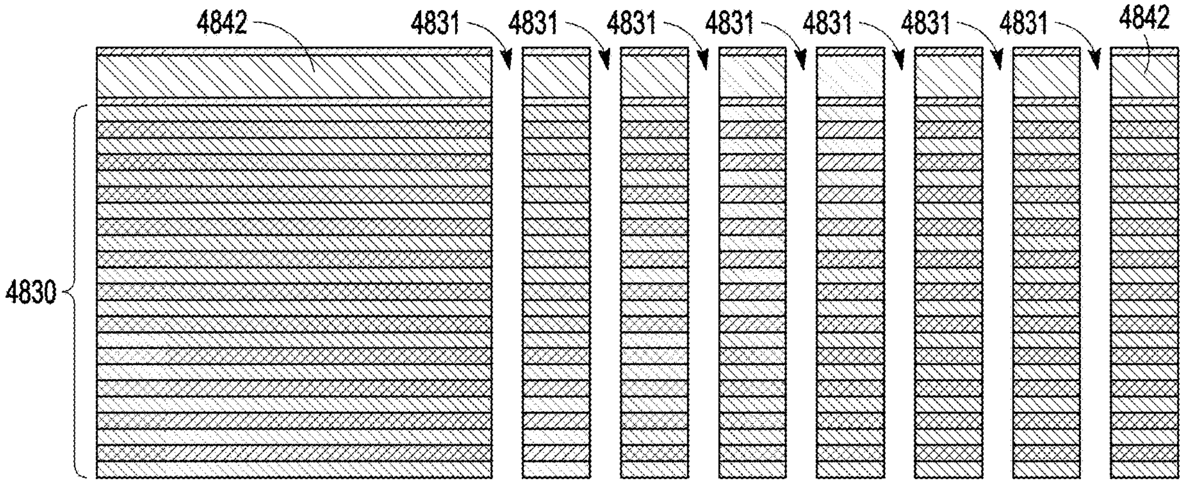
FIGS. 48-90 illustrate another example method of forming a memory device having an array of strings of memory cells with each string formed as a vertical pillar coupled to a drain-side select gate transistor for the string, according to various embodiments.

FIG. 48 shows layers of material 4830 with an carbon nitride layer 4842 on the layers of material 4830 after etching to form openings 4831 in the layers of material 4830 and in the carbon nitride layer 4842 to be used to form pillars of memory cells in the openings 4831. Dielectric materials other than carbon nitride layer can be used for the carbon nitride layer 4842. The layers of material 4830 can include a material stack of alternating layers of isolation dielectrics and sacrificial regions with the sacrificial regions to be used to form gates of the memory cells in which each isolation dielectric separates adjacent tiers of memory cells. The number of layers of material 4830 depends on the number of tiers of memory cells to be formed in the openings 4831. The number of memory cells, hence the number of tiers, in a string can range from several to thousands or more.

Figure 49:
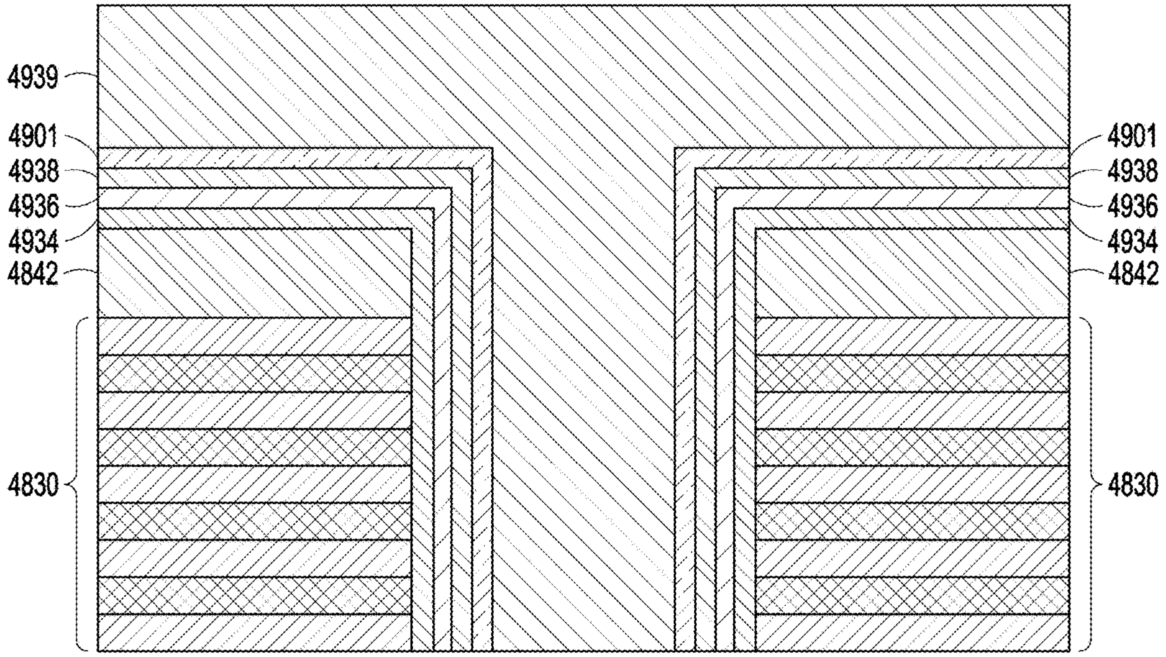

FIG. 49 shows a cross-sectional view of one of the openings 4831 of FIG. 48 after cell films and channel material have been deposited with an oxide 4939 formed on the material for the cell films. Each opening 4831 of FIG. 48 can be structured and processed in the same manner Each cell can include elements of a transistor to store charge. For example, each cell can include a channel region in which current can flow in operation of the memory device, a tunnel region separating the channel from a charge trap region used to store charge, and a dielectric blocking region that separates a gate from the charge trap region. In various embodiments, a dielectric barrier region, structured as a thin region, can be disposed between the dielectric blocking region and the gate that enables an enhanced tunneling barrier that prevents back-tunneling of electrons from the gate through the dielectric blocking region into the charge trap region. The material for the cell films formed in the openings 4831 of FIG. 49 can include a dielectric blocking material 4934, a charge trap material 4936, a tunneling material 4938, and a channel material 4901.

In an embodiment in which a dielectric barrier is used though not shown in FIG. 49, the dielectric barrier material can be deposited on surfaces for the opening 4831. The dielectric barrier material can be realized as an aluminum oxide region or a dielectric region having a higher dielectric constant than aluminum oxide. For example, the dielectric barrier material can include one or more of aluminum oxide, hafnium oxide, zirconium oxide, or mixtures of hafnium oxide and/or zirconium oxide with one or more of aluminum oxide, silicon oxide, titanium oxide, gadolinium oxide, niobium oxide, or tantalum oxide. Other high-K dielectrics can be used in the dielectric barrier. The dielectric barrier material can be formed in a region as a nanolaminate of a number of different compounds in each sub-region of the region with the formed region having a total thickness in the nanometer region. The dielectric barrier material can be formed with a thickness from the wall of the openings 4831 in the range of 20 to 50 angstroms.

The dielectric blocking material 4934 can be formed on the surface of the openings 4831 as shown in FIG. 49 or on dielectric barrier material after forming such dielectric barrier material on the surface of the openings 4831. The dielectric blocking material 4934 can be a silicon oxide, a high-K dielectric, or a combination of silicon oxide or one or more high-K dielectric materials. When dielectric barrier material is used, material of the dielectric blocking material 4934 that interfaces with the dielectric barrier material is selected to be different from material of the dielectric barrier material at the interface.

The charge trap material 4936 can be formed on the dielectric blocking material 4934 after forming the dielectric blocking material 4934. The charge trap material 4936 can be structured from material which in operation can hold electrons received from the channel region of the respective memory cell. For example, the charge trap material 4936 can be a dielectric material that can store charge. The charge trap material 4936 can be a dielectric nitride region such as a region including dielectric silicon nitride. Other dielectric materials for charge trap material 4936 can be used to trap charge. Depending on the memory cell design, materials for operation as a floating-gate transistor structure may be used for the charge trap material 4936.

The tunneling material 4938 can be formed on the charge trap material 4936 after forming the charge trap material 4936. The tunneling material 4938 can be constructed as an engineered region to meet a selected criterion, such as, for example but not limited to, an selected EOT. The tunneling material 4938 can include an oxide and a nitride. The tunneling material 4938 can include a high-K dielectric. The tunneling material 4938 may include a set of dielectric regions. The tunneling material 4938 can be a three-region structure. Such a three-region structure can be arranged as a region of dielectric oxide followed by a region of dielectric nitride followed by another region of dielectric oxide. The tunneling material 4938 can be a two-region tunnel structure or a one-region tunnel structure. Further, the tunneling material 4938 may have four or more regions, where the selection of material and thicknesses depends on the capability of the material with the given thicknesses to perform as a tunneling region in the trapping of charge.

The channel material 4901 can be formed on the tunneling material 4938 after forming the tunneling material 4938. The channel material 4901 can be structured as a pillar of semiconductor material arranged vertically from a source line for the array of strings of memory cells and arranged to couple with a SGD transistor to be formed. The channel material 4901 can be implemented as a polysilicon channel structure. Other semiconductor types and materials can be used for the channel material 4901.

Figure 50:
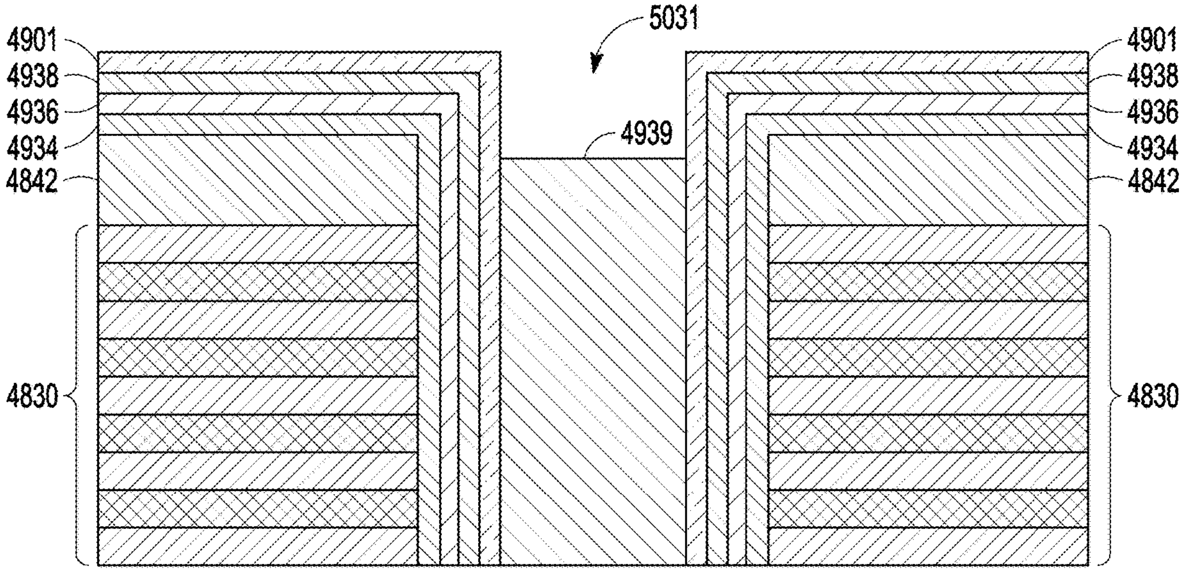

FIG. 50 shows a cross-sectional view of the structure of FIG. 49 after several processing stages have been performed. A CMP procedure has been performed on the oxide 4939, exposing the top surface of the channel material 4901 that was formed above the carbon nitride 4842 residing on the set of layers of material 4830. The oxide 4939 has been recessed, forming an opening 5031.

Figure 51:
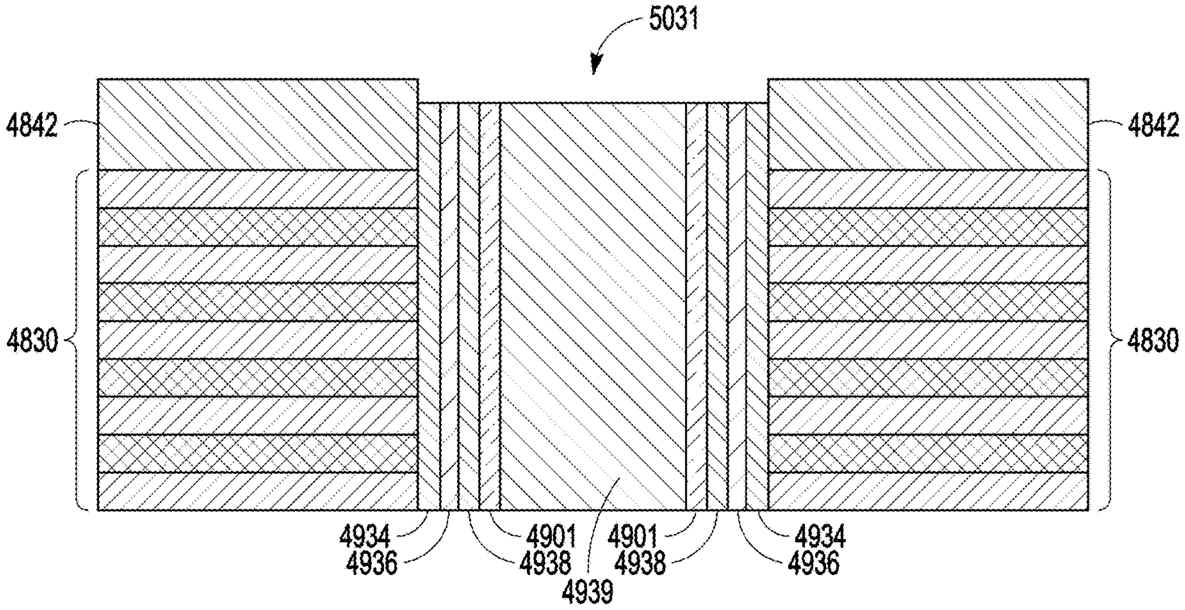

FIG. 51 shows a cross-sectional view of the structure of FIG. 50 after removing channel material 4901, tunneling material 4938, charge trap material 4936, and dielectric blocking material 4934 horizontally above the carbon nitride 4842. The removal of these materials can be performed by an appropriate wet etching technique. The horizontal removal of these materials has recessed the materials for the cell films into a cut out of the opening 5031, which can extend to a level below the top of the carbon nitride 4842.

Figure 52:
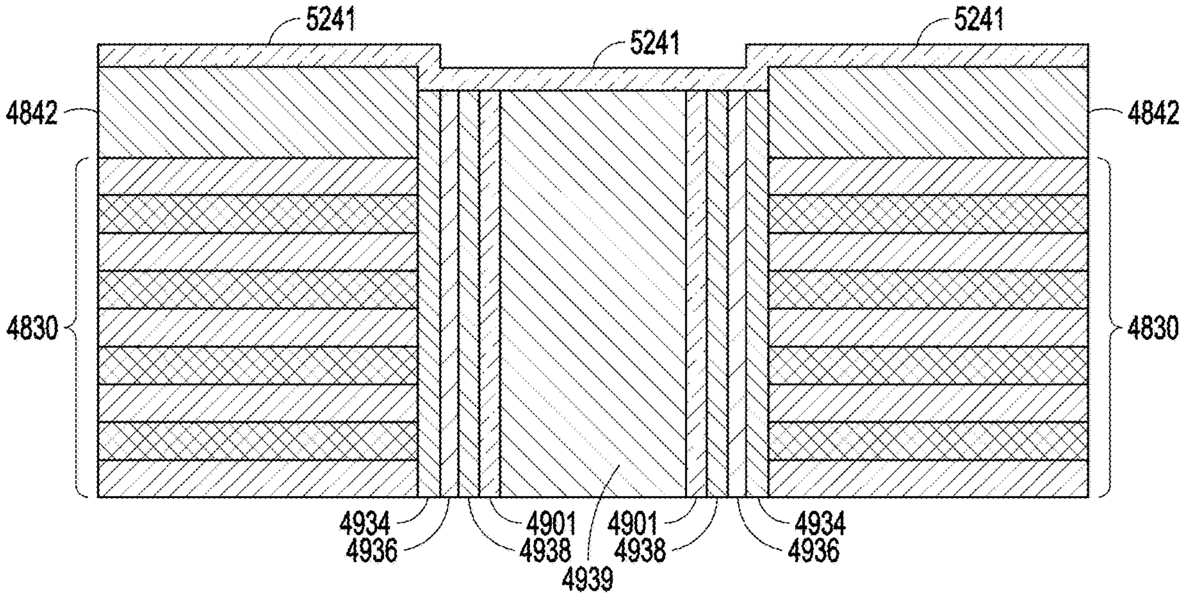

FIG. 52 shows a cross-sectional view of the structure of FIG. 51 after forming a semiconductive material 5241 on the top surface of the structure. The semiconductive material 5241 can be formed using an appropriate deposition technique. The semiconductive material 5241 can be, but is not limited to, the same as the channel material 4901. For example, the semiconductive material 5241 can be polysilicon.

Figure 53:
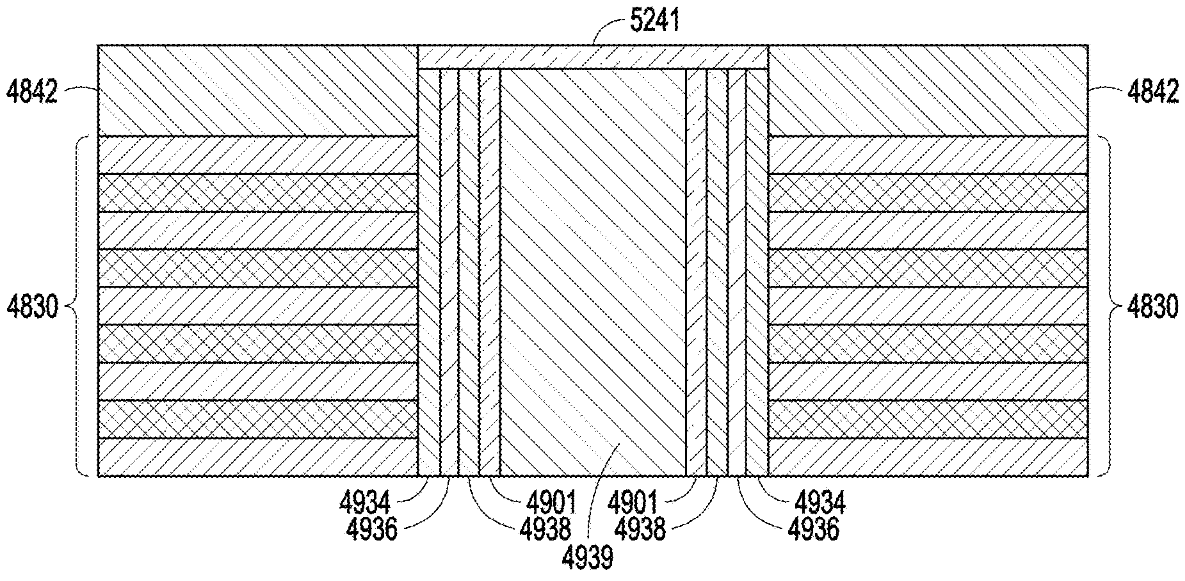

FIG. 53 shows a cross-sectional view of the structure of FIG. 52 after a CMP procedure has been applied to the surface such that the semiconductive material 5241 previously formed on the top surface of the carbon nitride 4842 has been removed, leaving portions of semiconductive material 5241 on the top surfaces of the oxide 4939, the channel material 4901, the tunneling material 4938, the charge trap material 4936, and the dielectric blocking material 4934. The top surface of the semiconductive material 5241 has been planarized to be at the top surface of the carbon nitride 4842.

Figure 54:
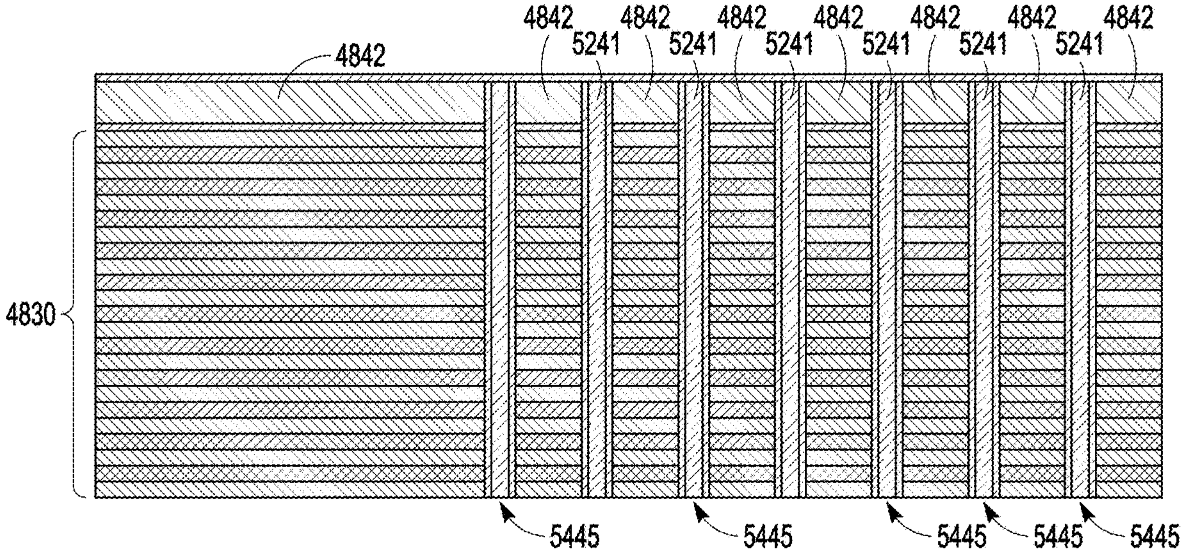

FIG. 54 shows a cross-sectional view of the structure of FIG. 48 after processing the structures of FIG. 53 formed in the processing of the openings 4831 of FIG. 48. After the semiconductive material 5241 has been formed and the tops of the cell films have undergone a CMP procedure, appropriate removal of portions of the set of layers of material 4830 has been performed to form gates for memory cells. The removal can include etching in a replacement gate procedure to form the gates. A thicker oxide may be deposited in the formation of the gates. The processing of the set of layers of material 4830 results in a set of tiers 4830 of memory cells having gates coupled to cell films of the structure 5445. During subsequent processing, discussed below, for a SGD transistor, the configuration of the tiers 4830 and an structure 5445 substantially remains. The structure 5445 includes the vertical string of memory cells having the dielectric blocking material 4934, the charge trap material 4936, the tunneling material 4938, and the channel material 4901 that can be disposed around the oxide 4939.

Figure 55:
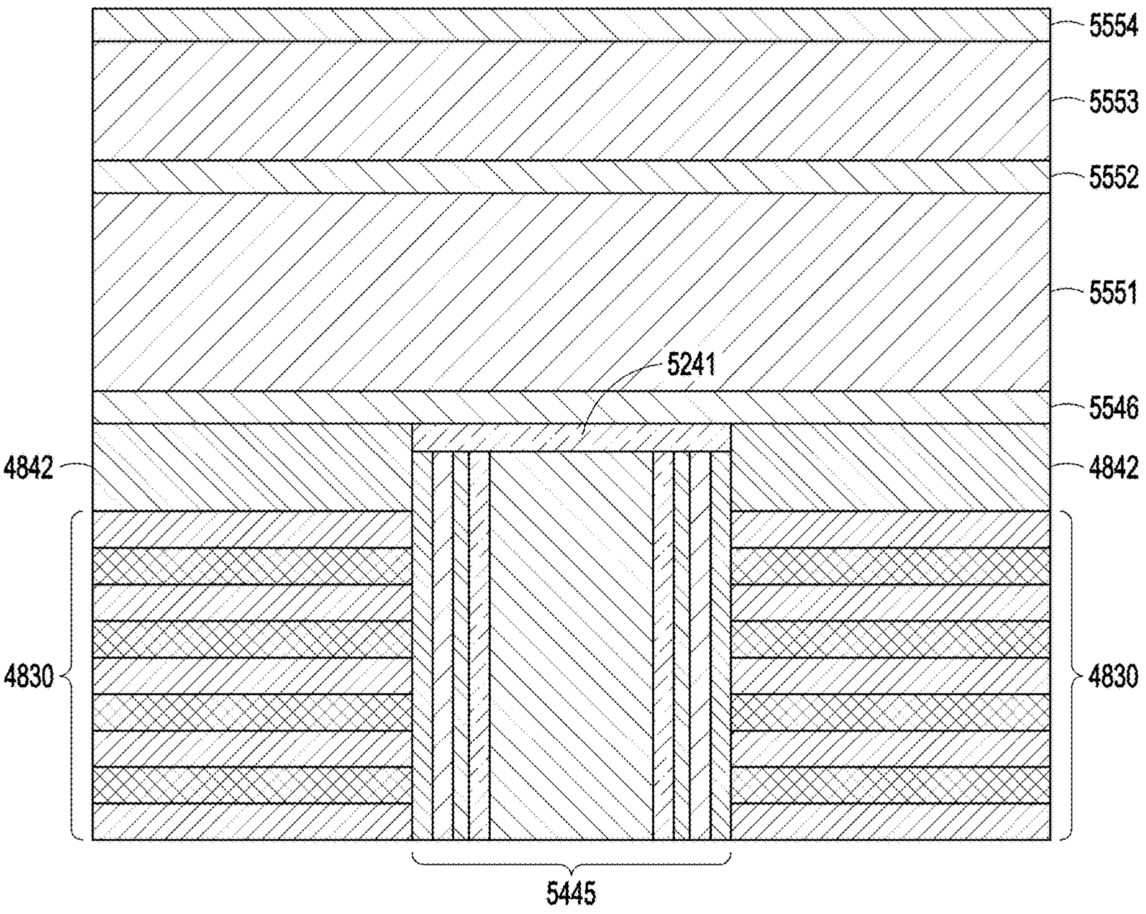

FIG. 55 shows a cross-sectional view of the set of tiers 4830, area 5545, carbon nitride 4842, and semiconductive material 5241, and oxide 5546 for one example string pillar of FIG. 54 after forming processing layers on the top of the structure of FIG. 54. The processing layers can include an oxide 5546, a nitride 5551, an oxide 5552, a nitride 5553, and an oxide 5554. The formation of these processing layers can be performed using one or more suitable deposition techniques.

Figure 56A:
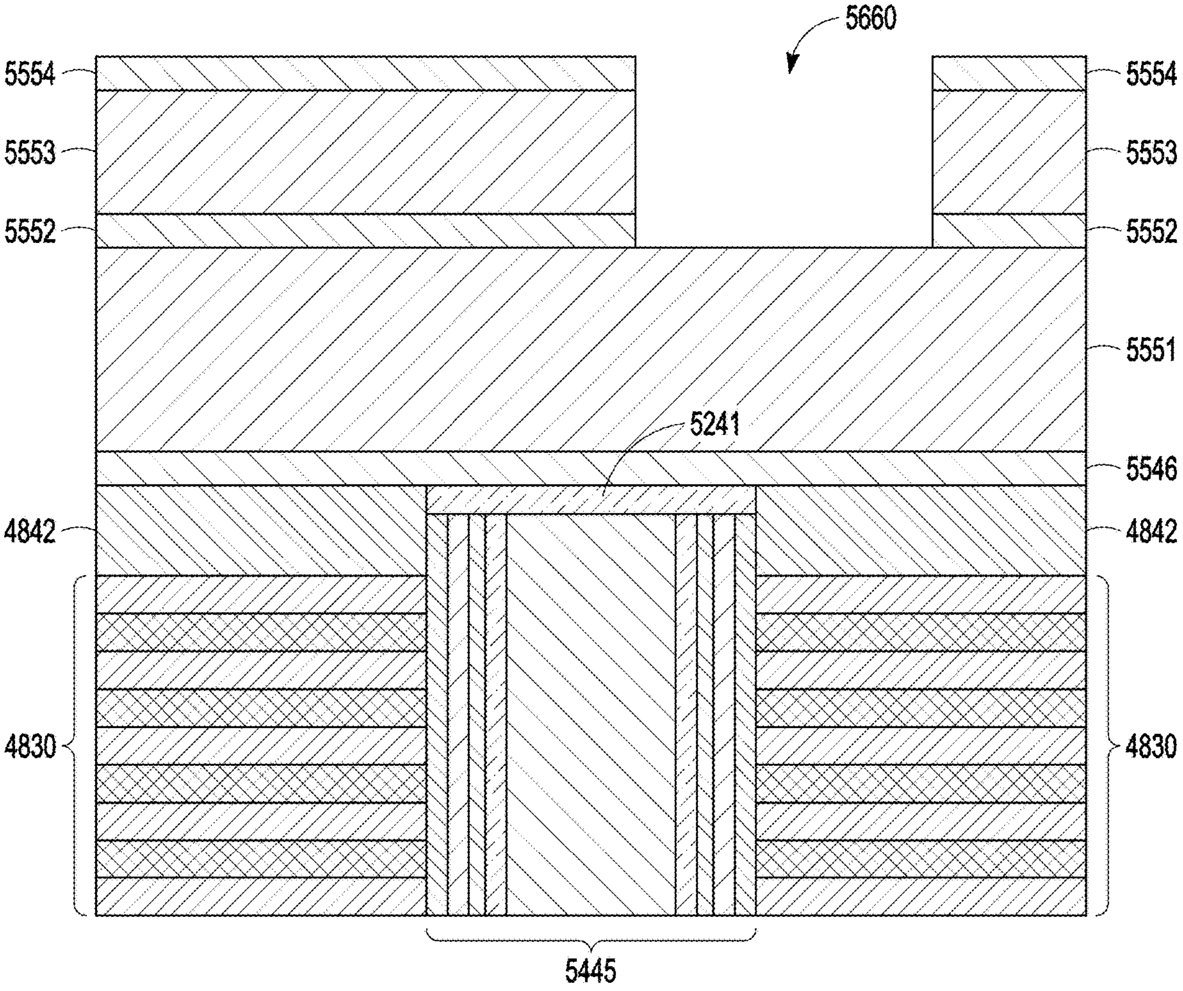

FIG. 56A shows a cross-sectional view of the structure of FIG. 55 after forming an opening 5660 through the oxide

Figure 56B:
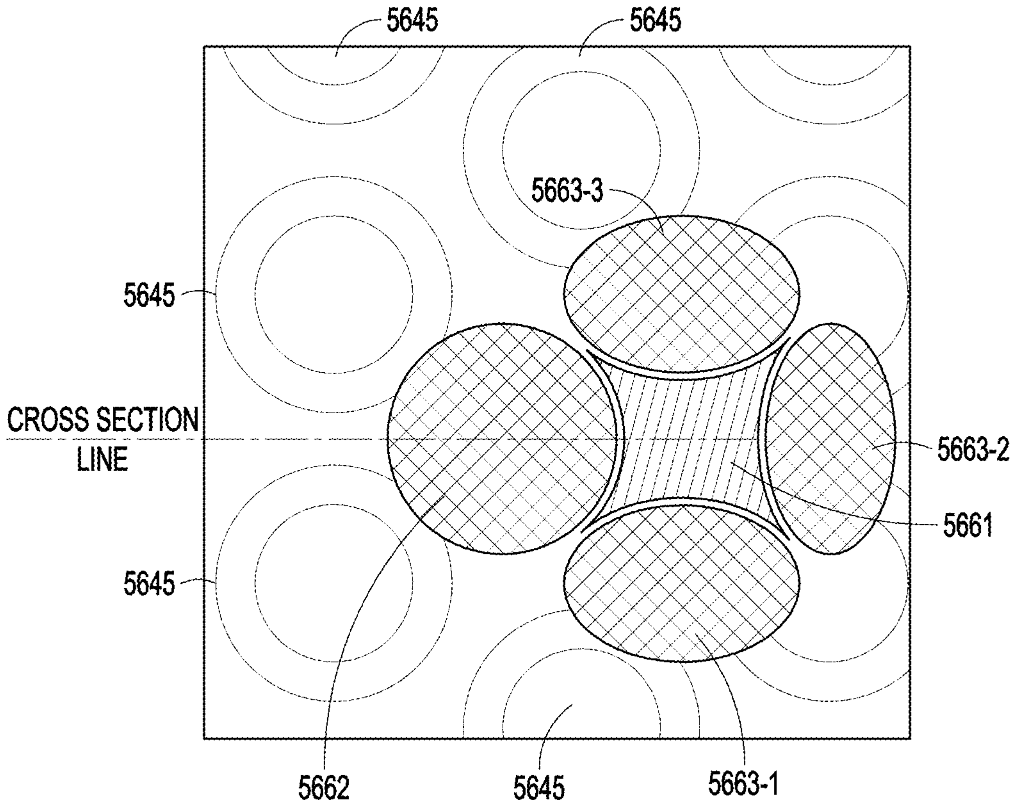

5554, the nitride 5553, and the oxide 5552 to the nitride 5551. In this example, round and oval patterns are etched through the top of the oxide 5554, the nitride 5553, and the oxide 5552 to the nitride 5551. A resist pattern has been formed and round and wavy patterns have been etched through the oxide 5554, the nitride 5553, and the oxide 5552. FIG. 56B shows a top view, above a surface of pillar structures 5645, of a potential resist pattern of a round pattern 5662 and oval patterns 5663-1, 5663-2, and 5663-3 for an etch pattern 5661. The cross-sectional view of FIG. 56A is along the cross-section line of FIG. 56B. The patterns allow gaps to be engineered between the patterns being etched down to form keyholes, where the keyholes remain without material deposited therein in later stages. Narrow gaps in between the resist pattern of round pattern 5662 and oval patterns 5663-1, 5663-2, and 5663-3 and the etch pattern 5661 form the ends of the star of the etch pattern 5661. Fins and the etch points in between the fins are formed by the narrow gaps between the resist pattern of round pattern 5662 and oval patterns 5663-1, 5663-2, and 5663-3 and the etch pattern 5661. The number of points of the star pattern 5661 corresponds to the number of fins to be formed.

The star opening 5661 between circles and ovals is centered for location of contacts to the SGD being formed. Multiple such openings between circles and ovals above and across the surface of pillar structures 5645 are laid out so that the centers of the openings are located for the contacts to the multiple SGD transistors for the pillar structures 5645. The center of the opening 5660 is shifted horizontally with respect to the vertical pillar structure 5645 of FIG. 56A.

Figure 57:
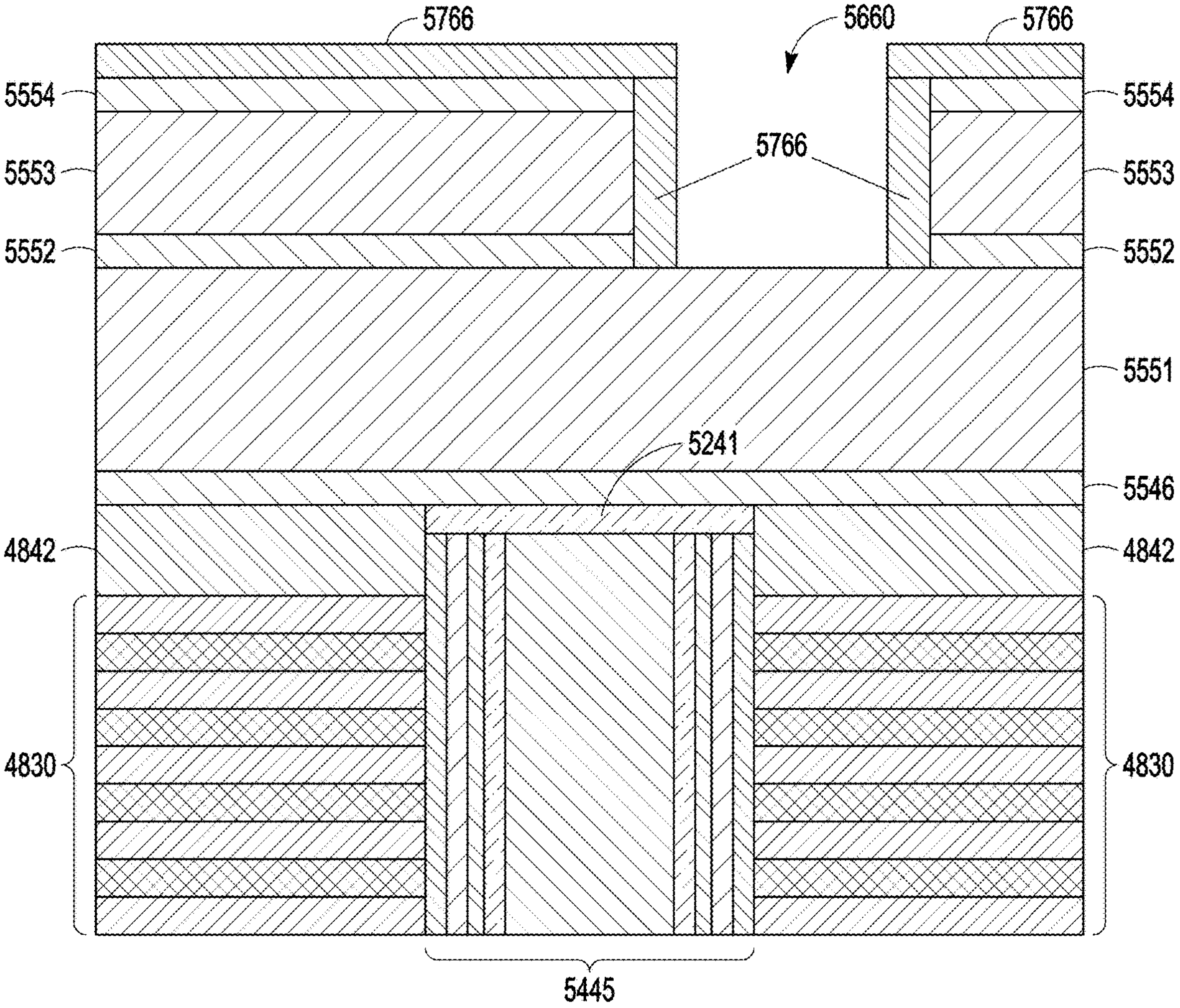

FIG. 57 shows a cross-sectional view of the structure of FIG. 56A after forming an oxide spacer 5766 to bridge together round and oval patterns to form sharp corners. The oxide spacer 5766 can be formed using an appropriate deposition technique. The oxide spacer 5766 was formed non-conformal sufficiently to be deposited more on surface of oxide 5554 than on sidewalls and bottom of opening 5660 so that, after spacer etch, the oxide is removed from the bottom of opening 5660 but remains on the surface to protect voids between patterns. The cross-sectional view is along the cross-section line of FIG. 56B. Sufficient void formation between the round and oval features should be made.

Figure 58:
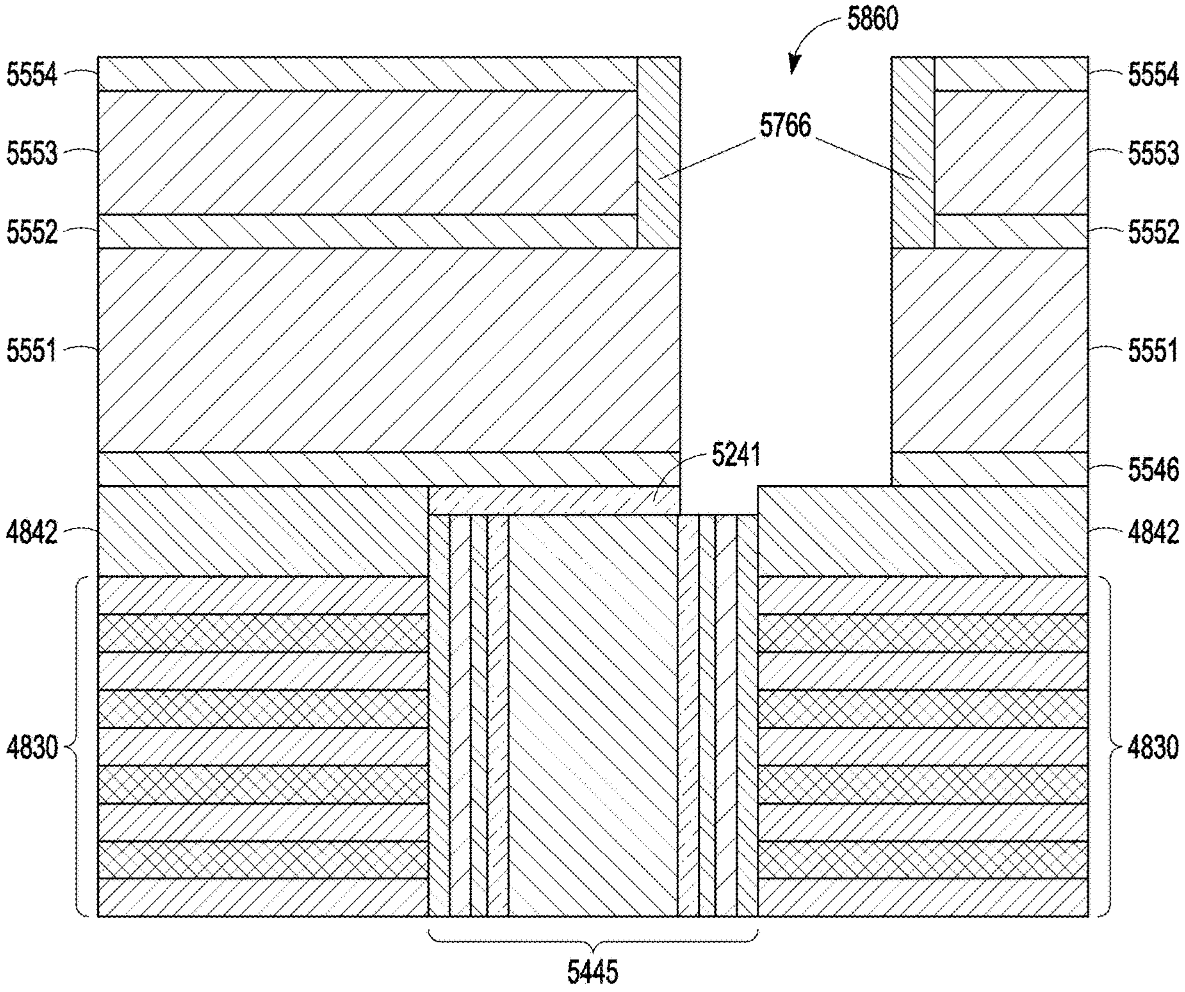

FIG. 58 shows a cross-sectional view of the structure of FIG. 57 after each of the nitride 5551, the oxide 5546, the semiconductive material 5241, and the top of the structure 5445 has been selectively etched. The carbon nitride 4842 is used to act as an etch stop layer to prevent damage to access lines 4830. This selective etch results in forming the opening 5860. The cross-sectional view is along the cross-section line of FIG. 56B. The etch procedure causes a square pattern to etch as round.

Figure 59:
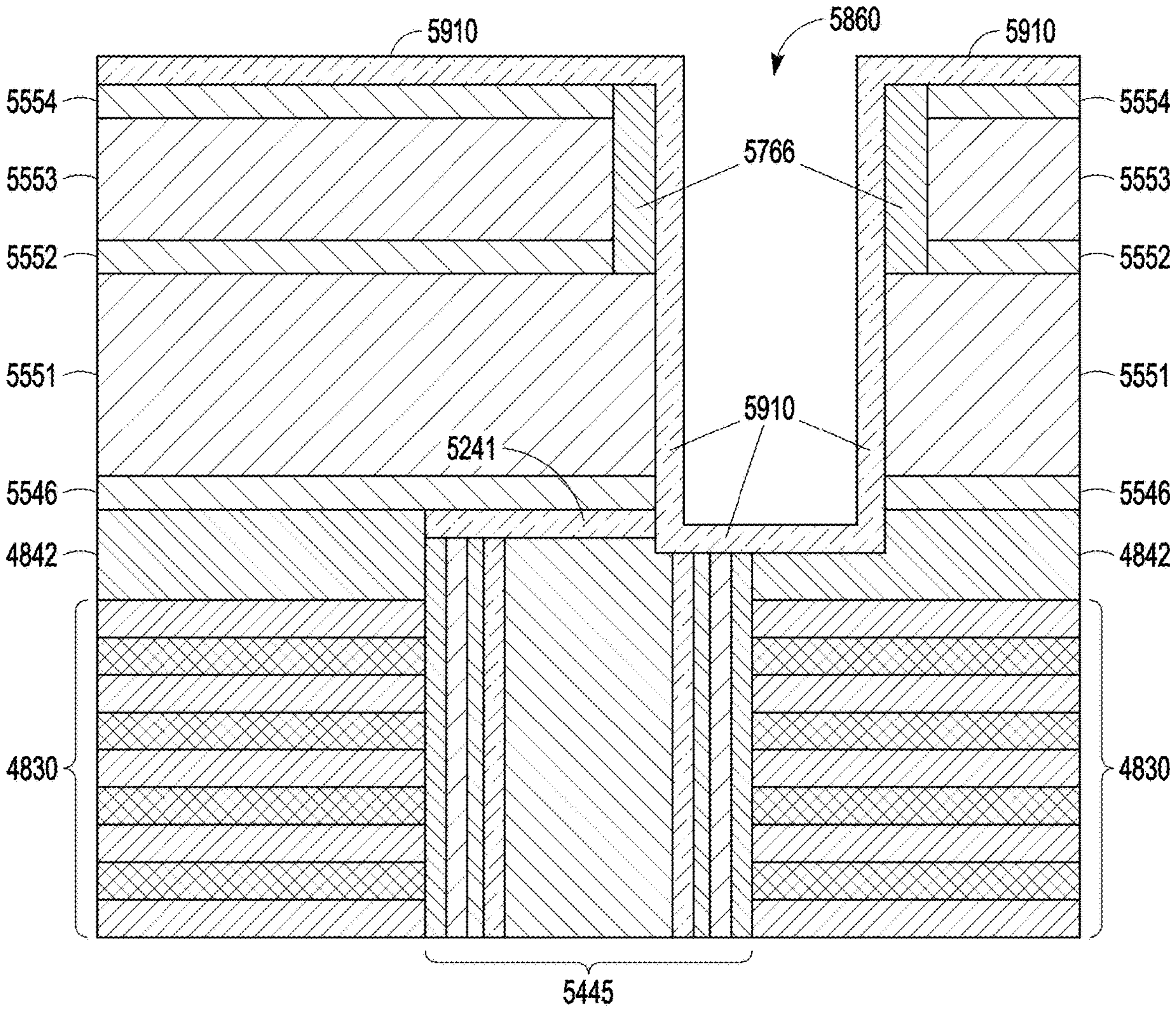

FIG. 59 shows a cross-sectional view of the structure of FIG. 58 after a semiconductor material 5910 has been formed in the opening 5860. The cross-sectional view is along the cross-section line of FIG. 56B. The semiconductor material 5910 can be formed using an appropriate deposition technique. The semiconductor material 5910 can be, but is not limited to, the same as the channel material 4901, or the semiconductive material 5241. For example, the semiconductor material 5910 can be polysilicon. The deposited semiconductor material 5910 can be n− semiconductive material for forming a transistor channel region for the SGD transistor to be formed.

Figure 60:
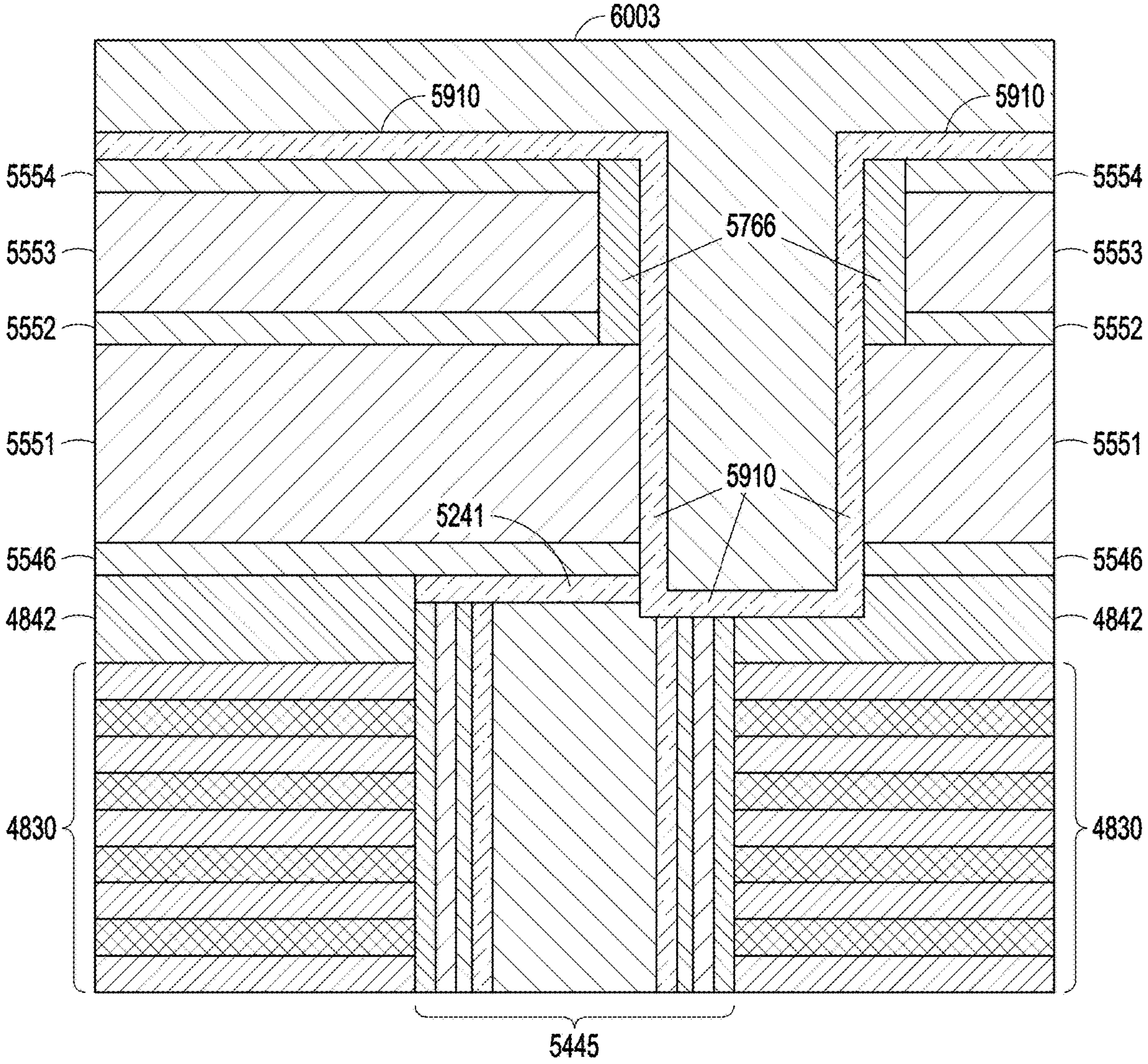

FIG. 60 shows a cross-sectional view of the structure of FIG. 59 after an oxide 6003 has been formed in the opening 5860 shown in FIG. 59 and on the top surface of the semiconductor material 5910 that is on top of the surface of the oxide spacer 5766 and on the oxide 5554. The cross-sectional view is along the cross-section line of FIG. 56B. The formation of the oxide 6003 can be performed using a suitable deposition technique. The oxide 6003 fills the opening 5860 to fill a region for the SGD transistor.

Figure 61:
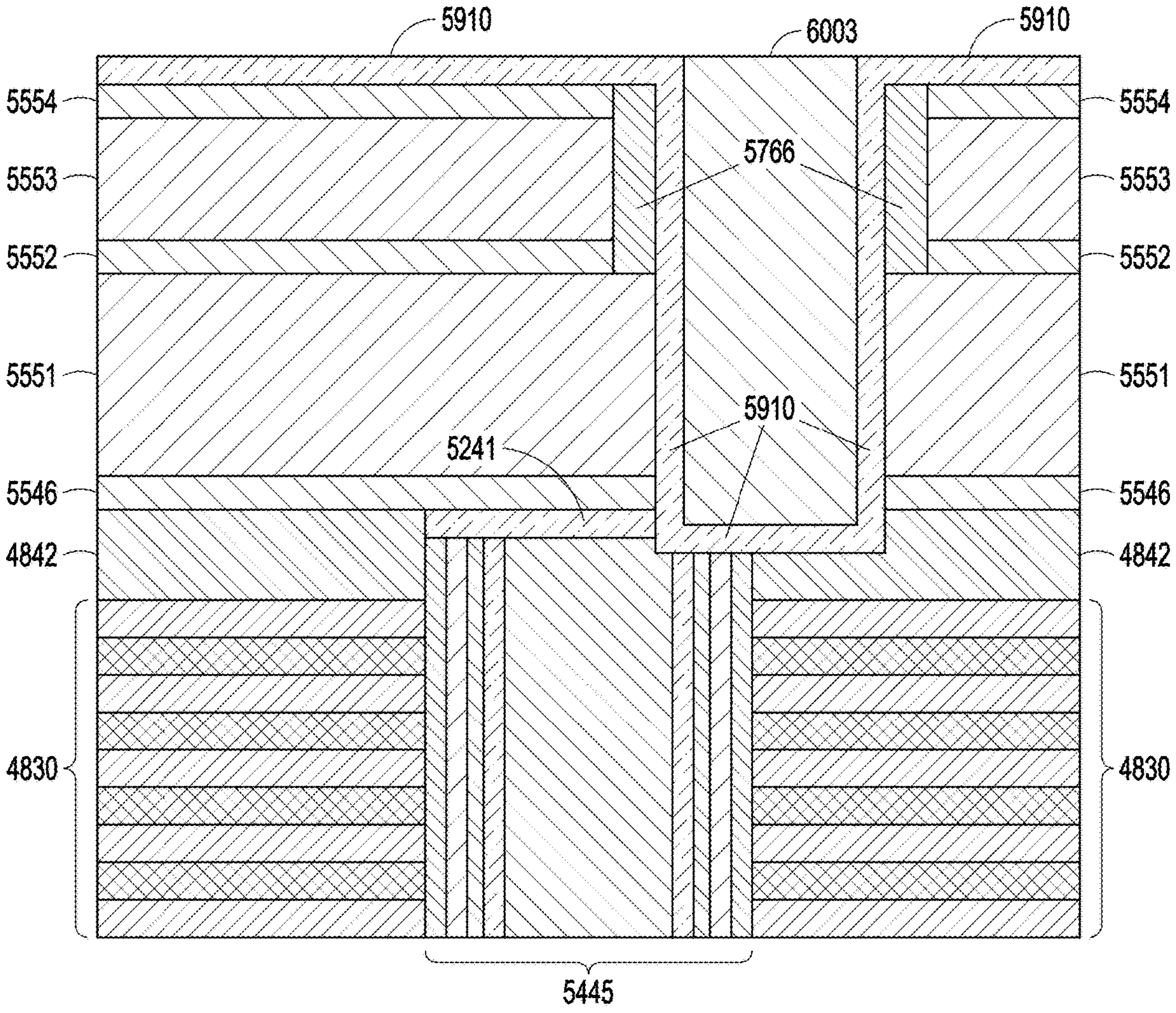

FIG. 61 shows a cross-sectional view of the structure of FIG. 60 after a CMP procedure has been applied to the surface of the oxide 6003. The cross-sectional view is along the cross-section line of FIG. 56B. The CMP procedure resulted in exposing the semiconductor material 5910 that is on the oxide 5554 and structuring the top surface of the oxide 6003, which filled the previous opening 5860, with the top surface of the exposed semiconductor material 5910.

Figure 62:
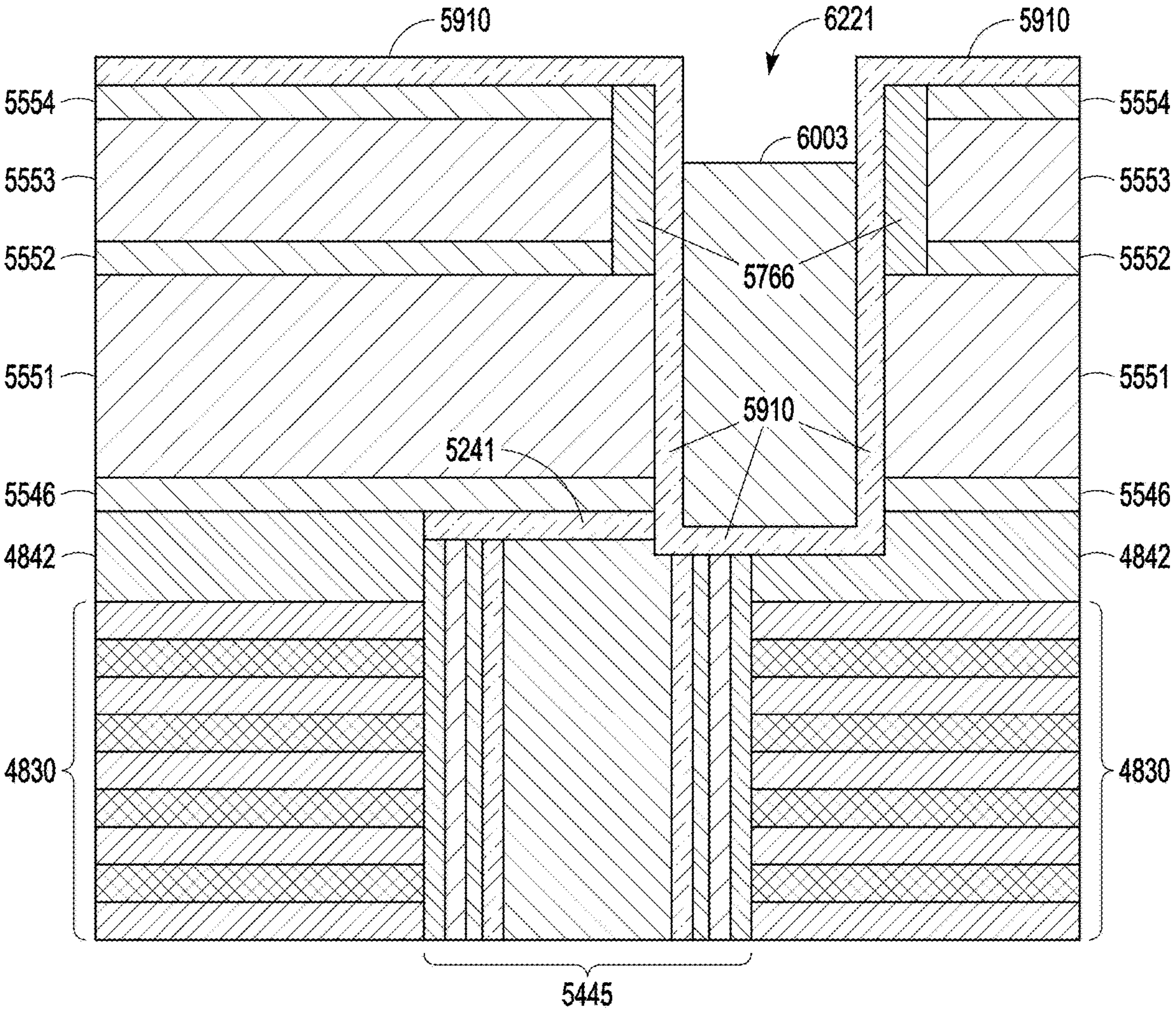

FIG. 62 shows a cross-sectional view of the structure of FIG. 61 after the oxide 6003 has been recessed, forming opening 6221. The cross-sectional view is along the cross-section line of FIG. 56B.

Figure 63:
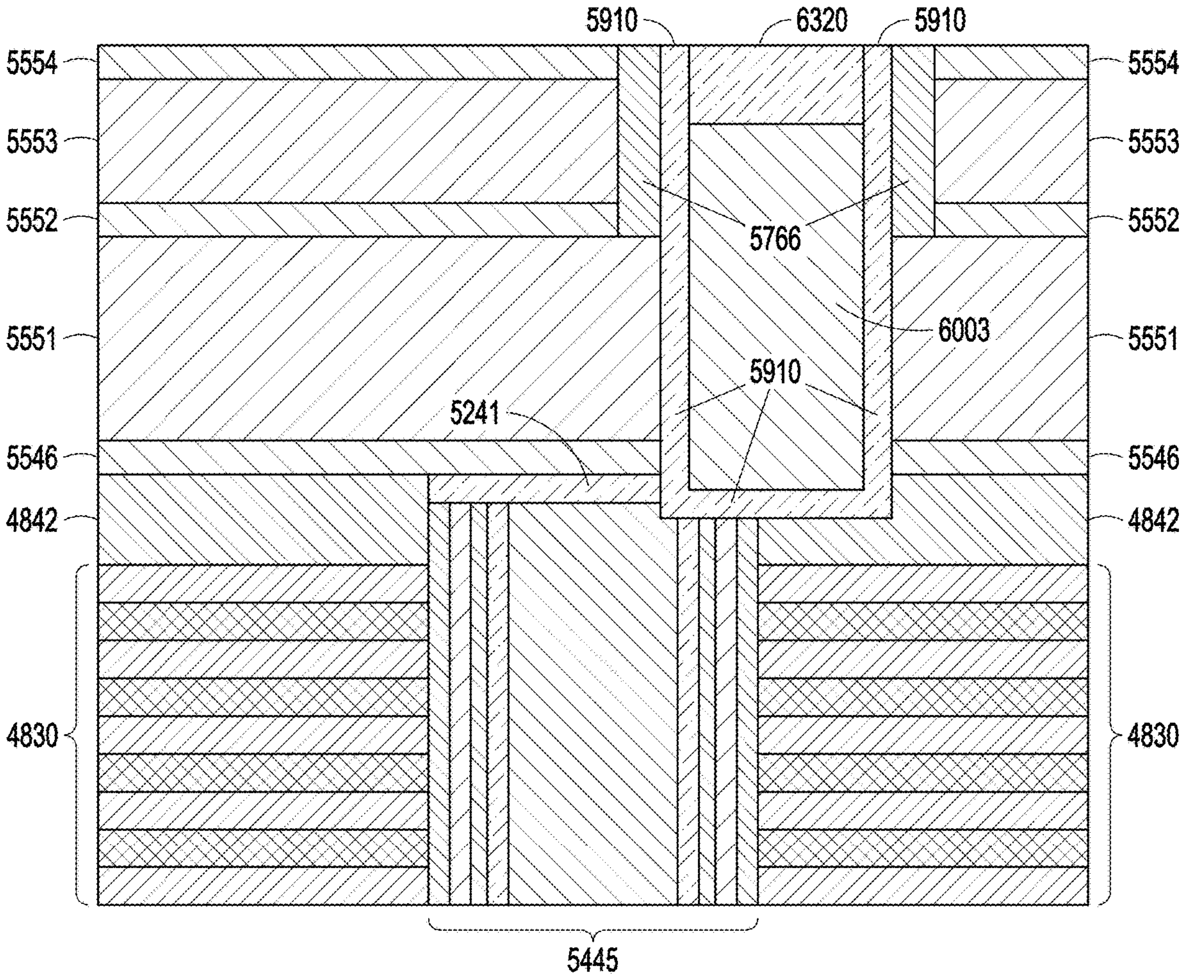

FIG. 63 shows a cross-sectional view of the structure of FIG. 62 after a semiconductor material 6320 has been formed and a CMP procedure has been applied to planarize tops of the semiconductor material 6320, the oxide spacer 5766, and the oxide 5554 and remove the material for the channel 5910 from the surface. The cross-sectional view is along the cross-section line of FIG. 56B. The semiconductor material 6320 can be formed using a suitable deposition technique. The semiconductor material 6320 can be, but is not limited to, the same as the channel material 5910 or semiconductive material 5241. For example, the semiconductor material 6320 can be polysilicon. However, the semiconductor material 6320 is formed to be more heavily doped than the semiconductor material 5910. For example, the deposited semiconductor material 6320 can be n+ polysilicon. The semiconductor material 6320 is later processed to form a drain for the SGD transistor being formed.

Figure 64:
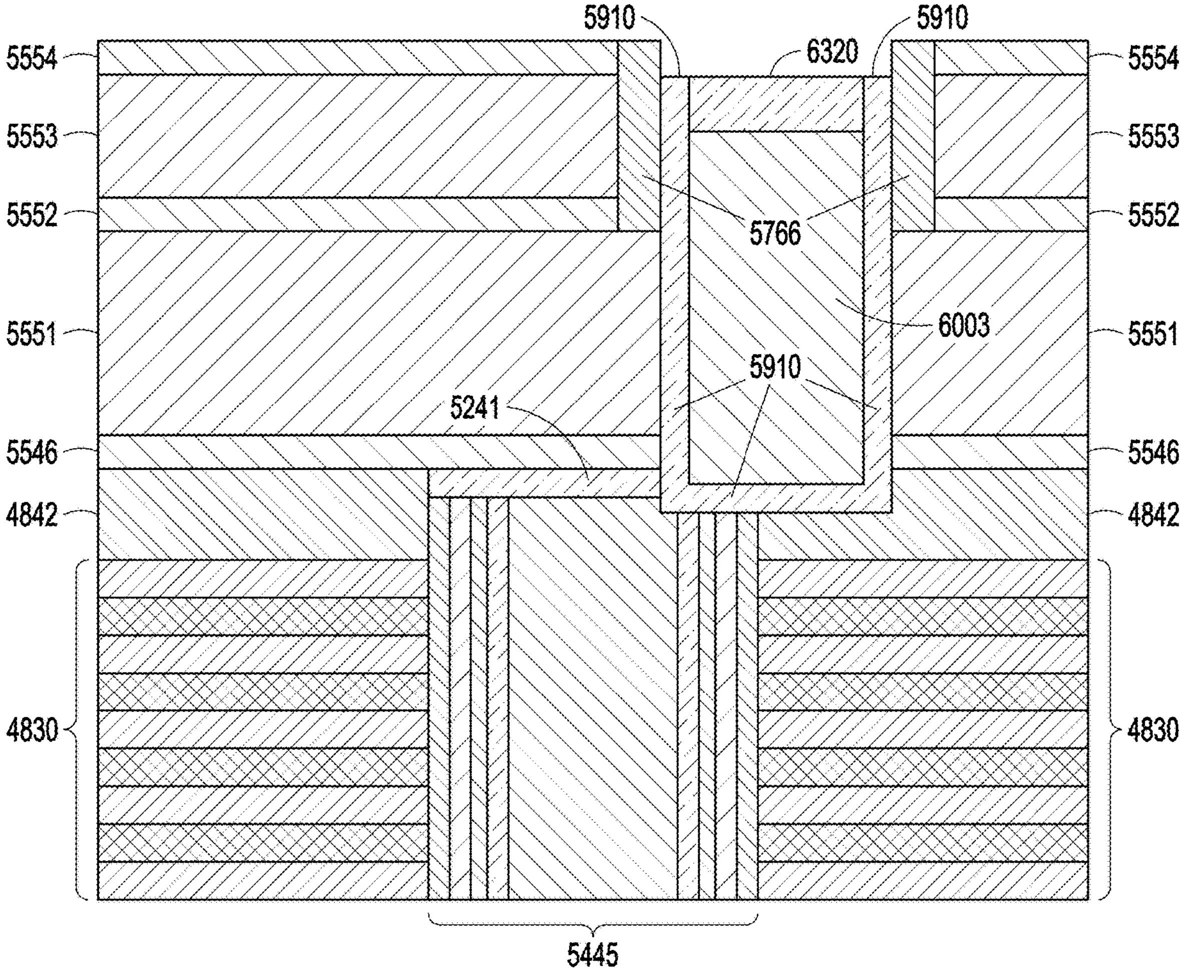

FIG. 64 shows a cross-sectional view of the structure of FIG. 63 after the semiconductor material 6320 has been recessed. The cross-sectional view is along the cross-section line of FIG. 56B.

Figure 65:
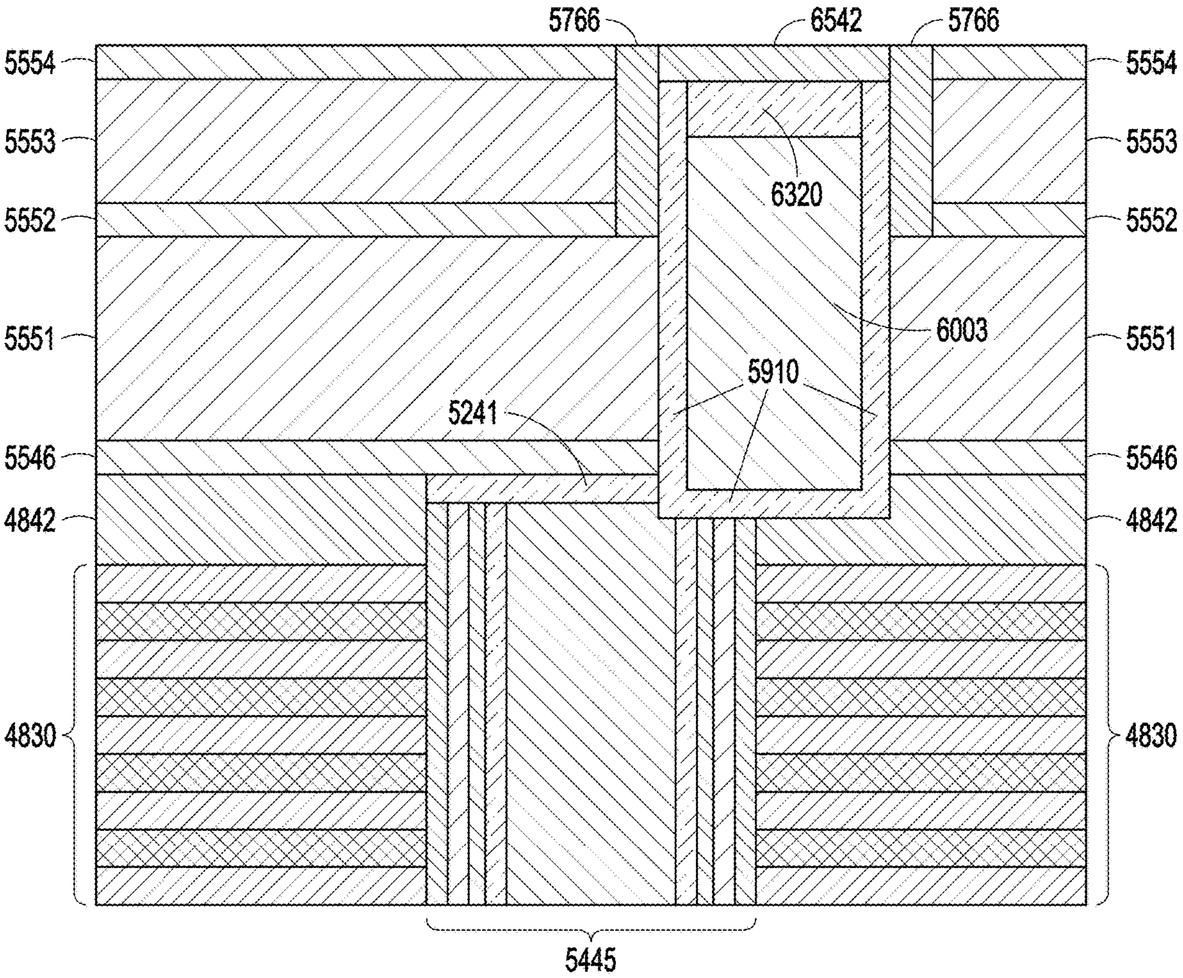

FIG. 65 shows a cross-sectional view of the structure of FIG. 64 after a carbon nitride 6542 has been formed and a CMP procedure has been applied to the carbon nitride 6542, the oxide spacer 5766, and the oxide 5554, leaving a plug over the top of the semiconductor material 6320. This plug provides a landing area for a subsequent etch to form a contact to the formed SGD transistor. Materials, other than carbon nitride 6542, can be used for the contact etch punch material, if such materials can stand up to wet etches of materials, such as polysilicon, oxides, and nitride used in the method. The cross-sectional view is along the cross-section line of FIG. 56B.

Figure 66:
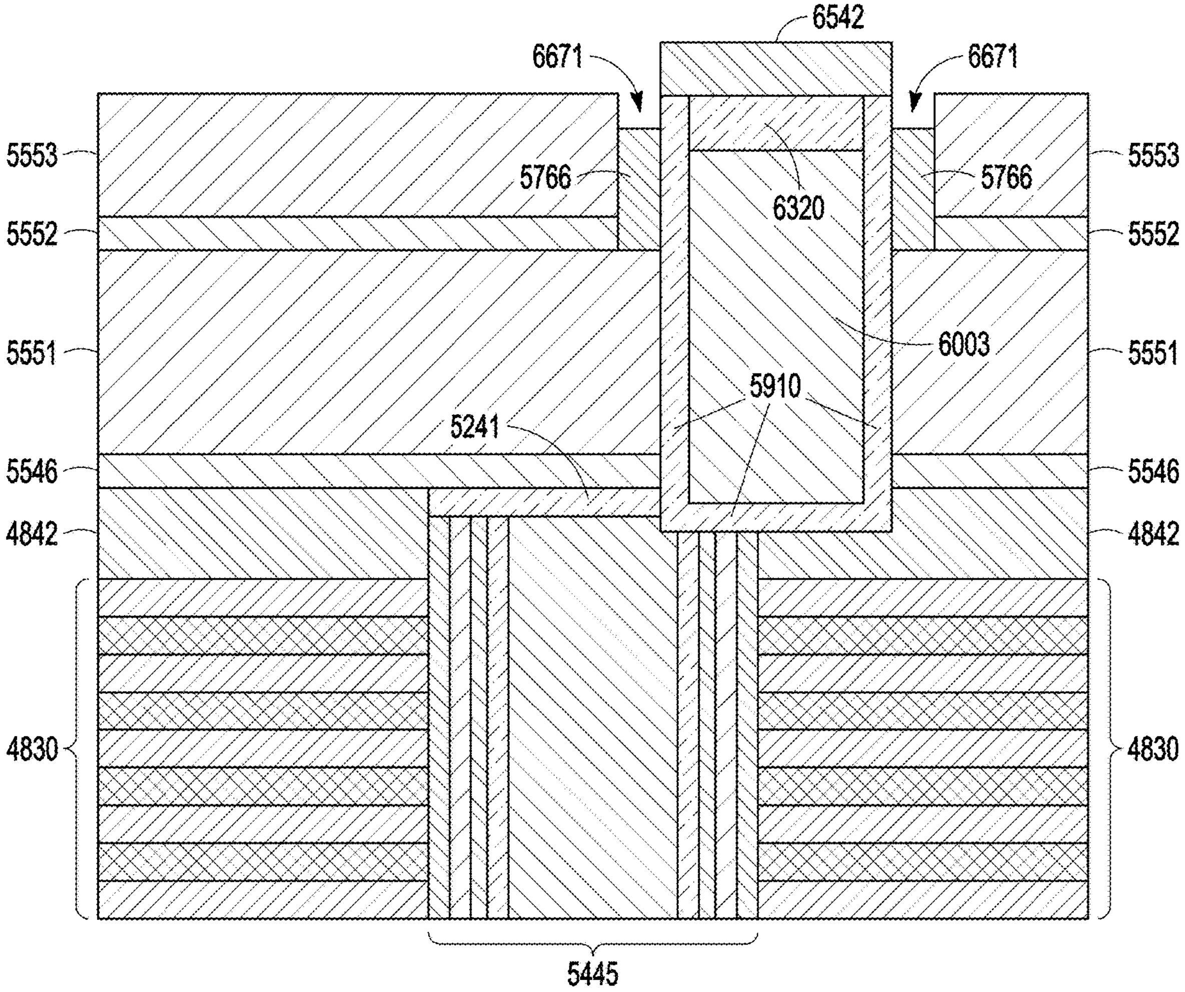

FIG. 66 shows a cross-sectional view of the structure of FIG. 65 indicating non-void areas 6671 after enough of oxide spacer 5766 has been wet etched to blow oxide out of void areas and expose the semiconductor material 5910 at ends of void areas. The semiconductor material 5910 is a more lightly doped material than the semiconductor material 6320. The semiconductor material 5910 can be, but is not limited to, n− polysilicon. The cross-sectional view is along the cross-section line of FIG. 56B.

Figure 67A:
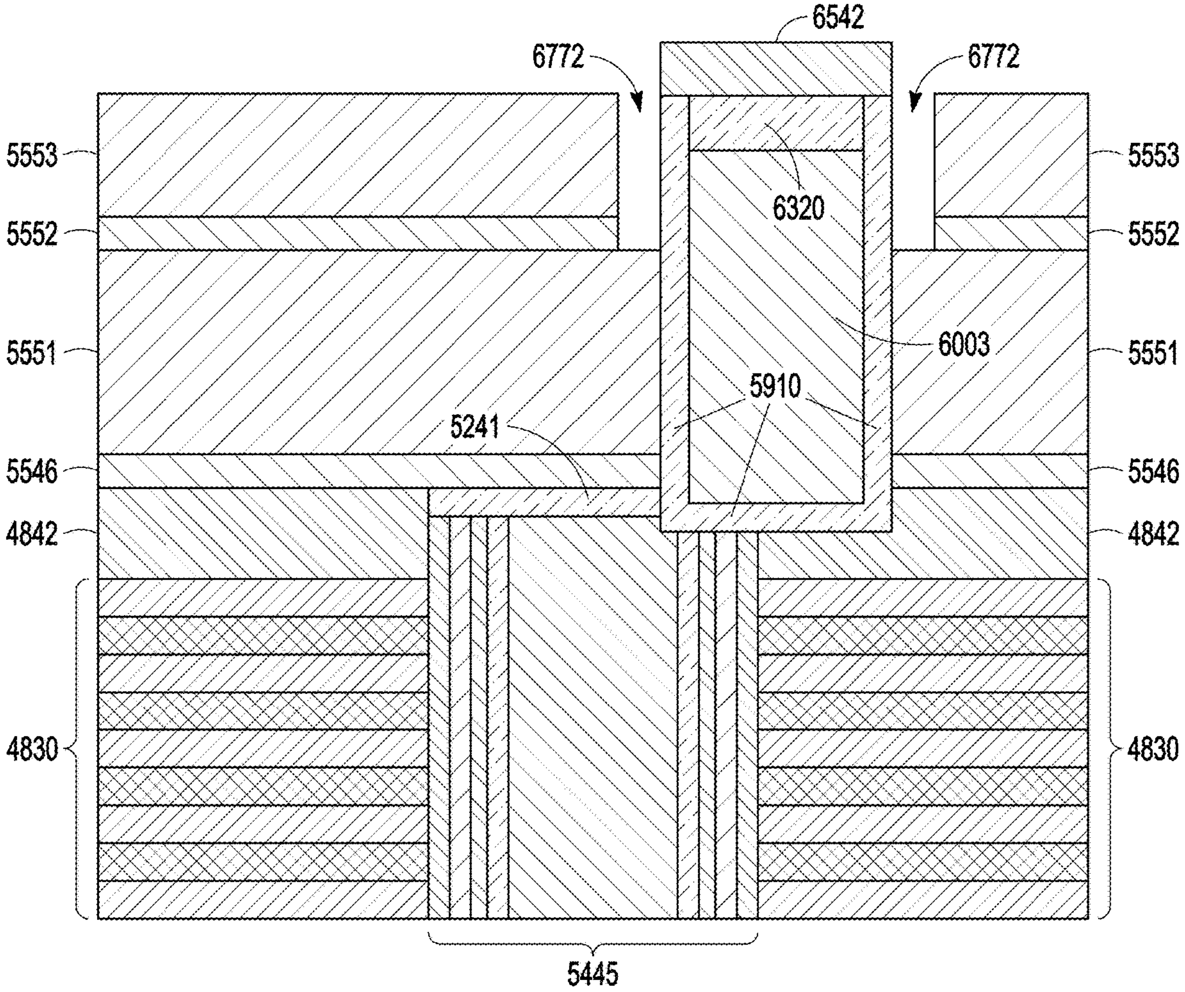
Figure 67B:
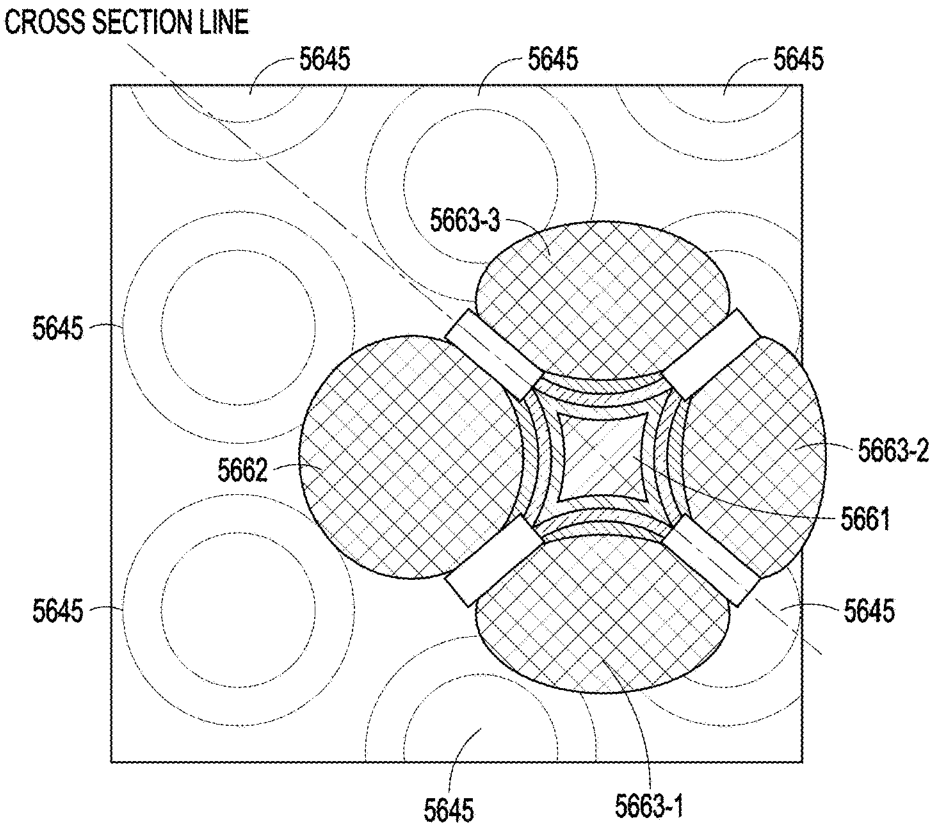
Figure 67C:
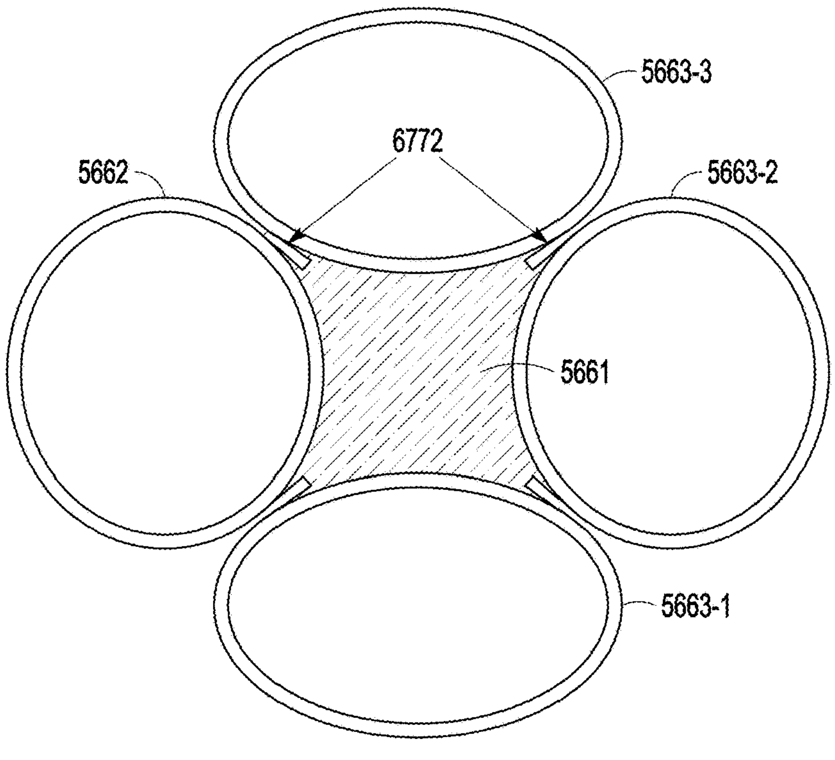

FIG. 67A shows a different cross-sectional view of the structure of FIG. 66 indicating void areas 6772. The cross-sectional view is along the cross-section line shown in FIG. 67B. FIG. 67B shows a top view, above a surface of pillar structures 5645, of a potential resist pattern of a round pattern 5662 and oval patterns 5663-1, 5663-2, and 5663-3 for an etch pattern 5661. FIG. 67C is a top view highlighting the corner void areas 6772 formed between etched patterns 5662, 5663-1, 5663-2, and 5663-3 and the star pattern 5661.

Figure 68A:
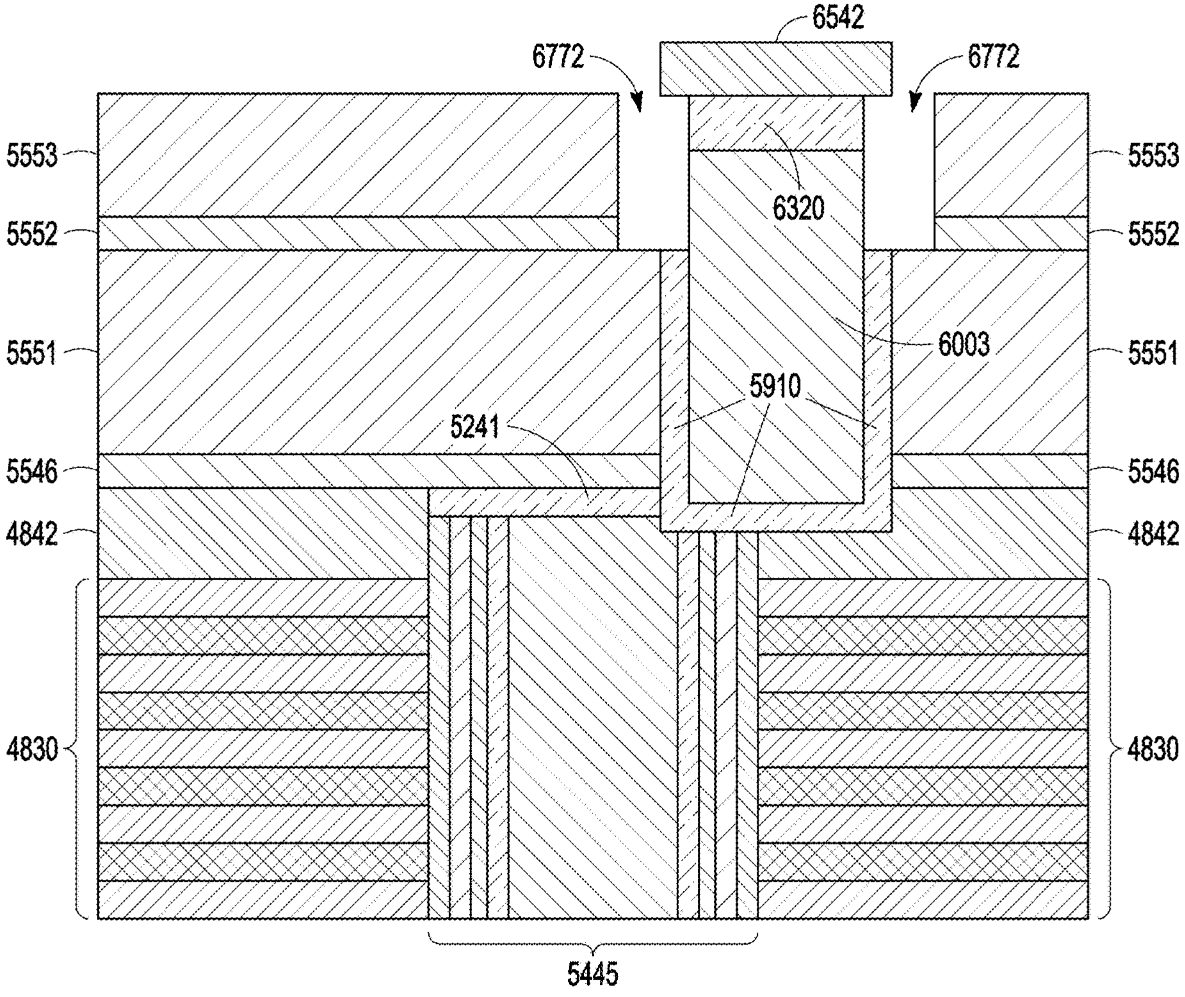
Figure 68B:
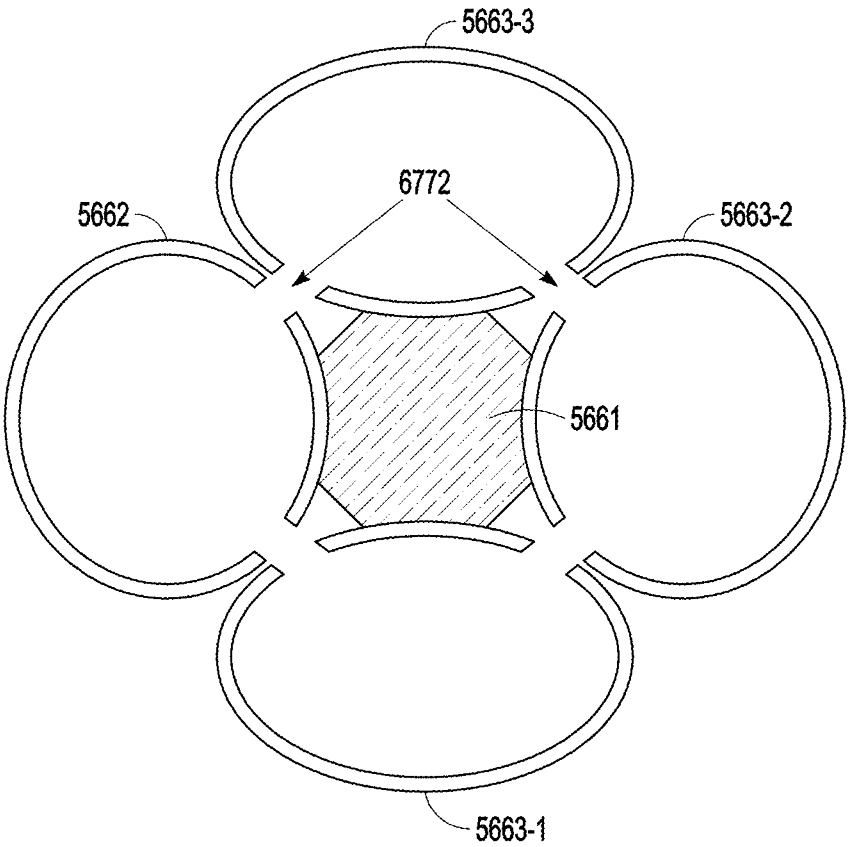

FIG. 68A shows a cross-sectional view of the structure of FIG. 67A after selectively wet etching semiconductor material 6320, oxide 6003, and semiconductor material 5910 at ends of corner void areas 6772. The cross-sectional view is along the cross-section line shown in FIG. 67B. FIG. 68B shows the corner void areas 6772 expanded.

Figure 69:
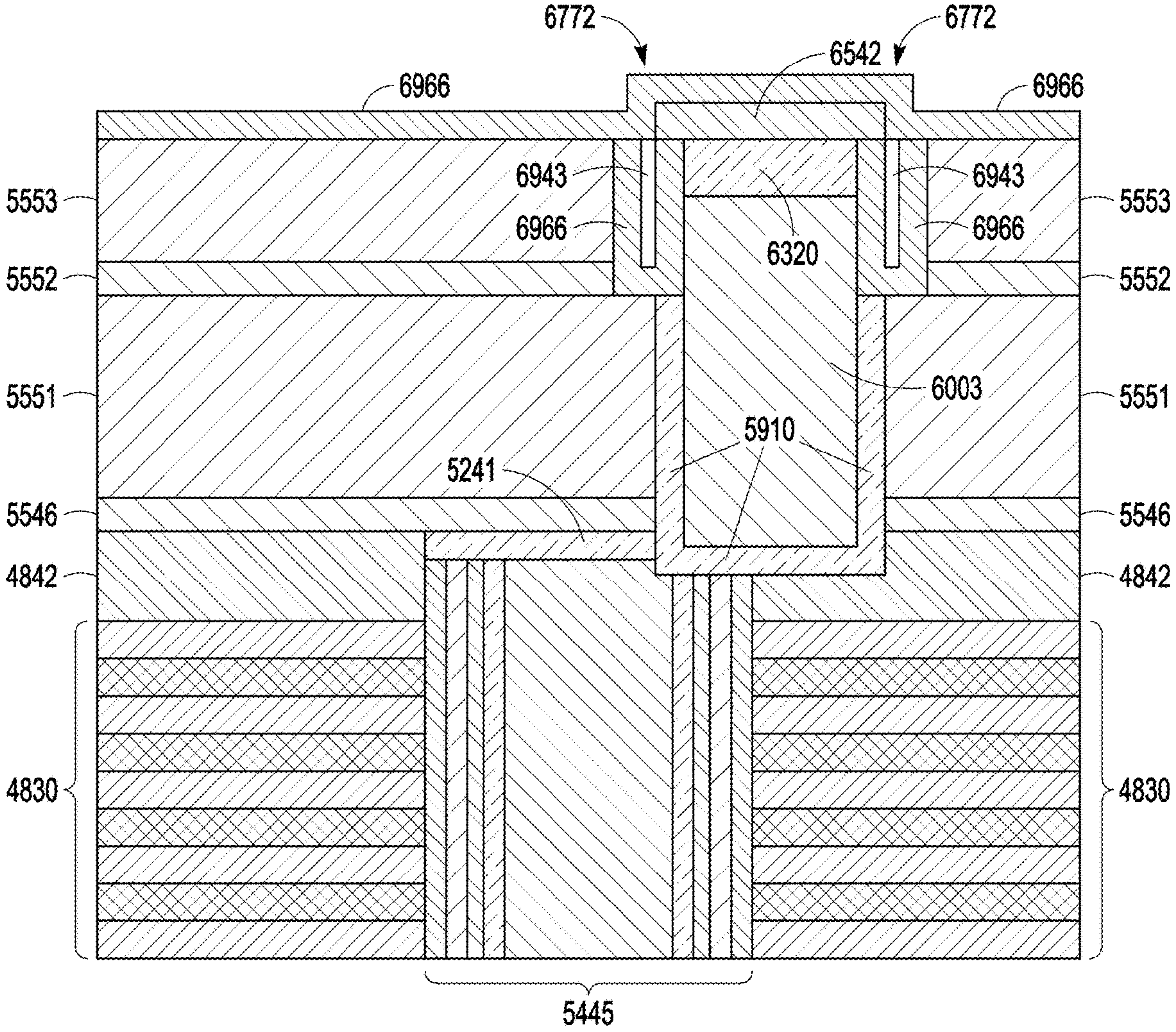

FIG. 69 shows a cross-sectional view of the structure of FIG. 68A after an oxide 6966 has been formed on the exposed surfaces of FIG. 68A. The oxide 6966 can be formed using an appropriate deposition technique. Voids 6943 may be developed in the formation of the oxide 6966. The cross-sectional view is along the cross-section line shown in FIG. 67B.

Figure 70:
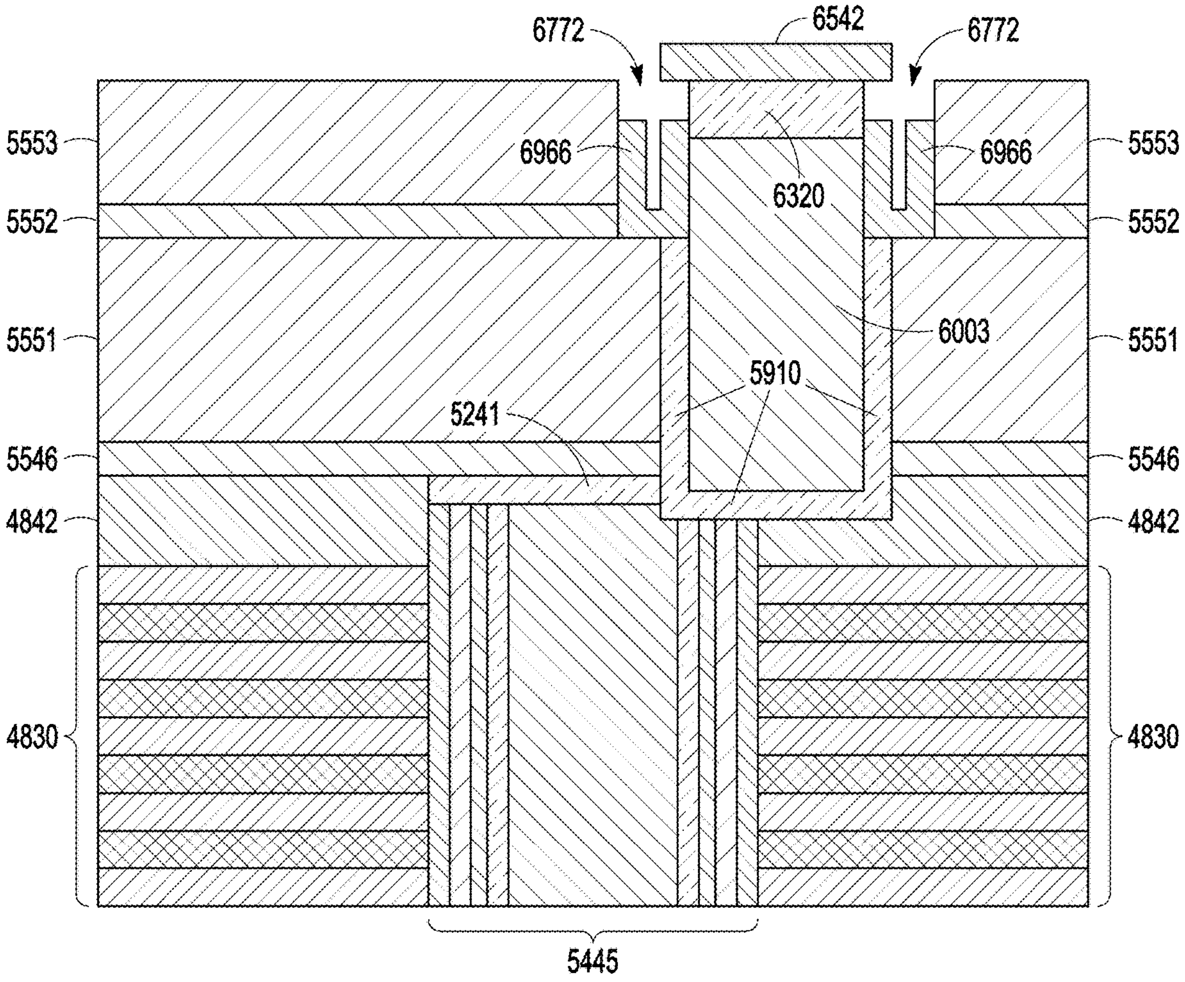

FIG. 70 shows a cross-sectional view of the structure of FIG. 69 after removing portions of the oxide 6966, exposing the nitride 5553. The portions of the oxide 6966 can be removed using an appropriate etching technique. The cross-sectional view is along the cross-section line shown in FIG. 67B.

Figure 71:
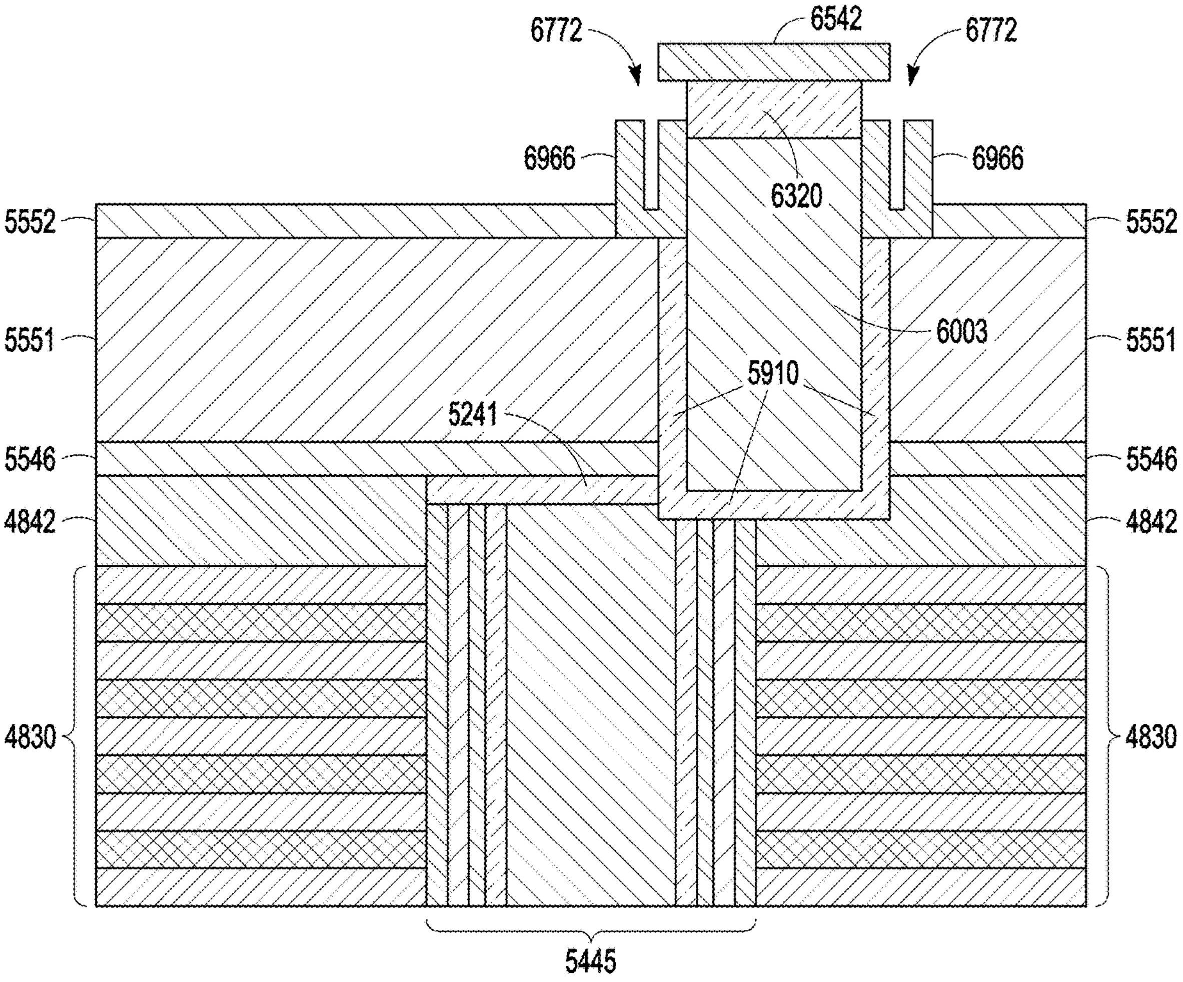

FIG. 71 shows a cross-sectional view of the structure of FIG. 70 after removing the exposed nitride 5553 and exposing the oxide 6966 and the oxide 5552. The exposed nitride 5553 can be removed using an appropriate etching technique. The cross-sectional view is along the cross-section line shown in FIG. 67B.

Figure 72:
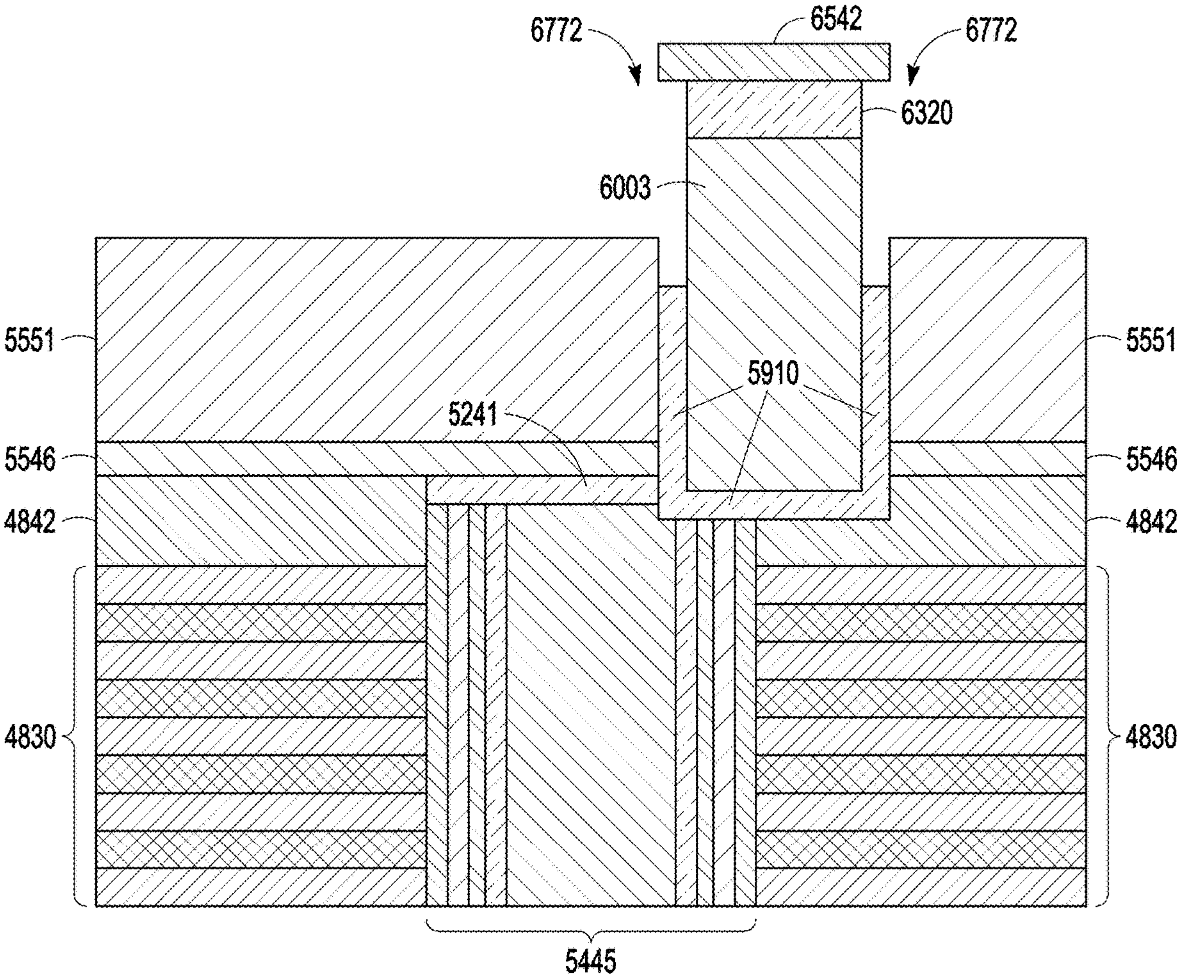

FIG. 72 shows a cross-sectional view of the structure of FIG. 71 after removing the exposed oxide 6966 and the oxide 5552. The exposed oxide 6966 can be removed using an appropriate etching technique. The cross-sectional view is along the cross-section line shown in FIG. 67B.

Figure 73:
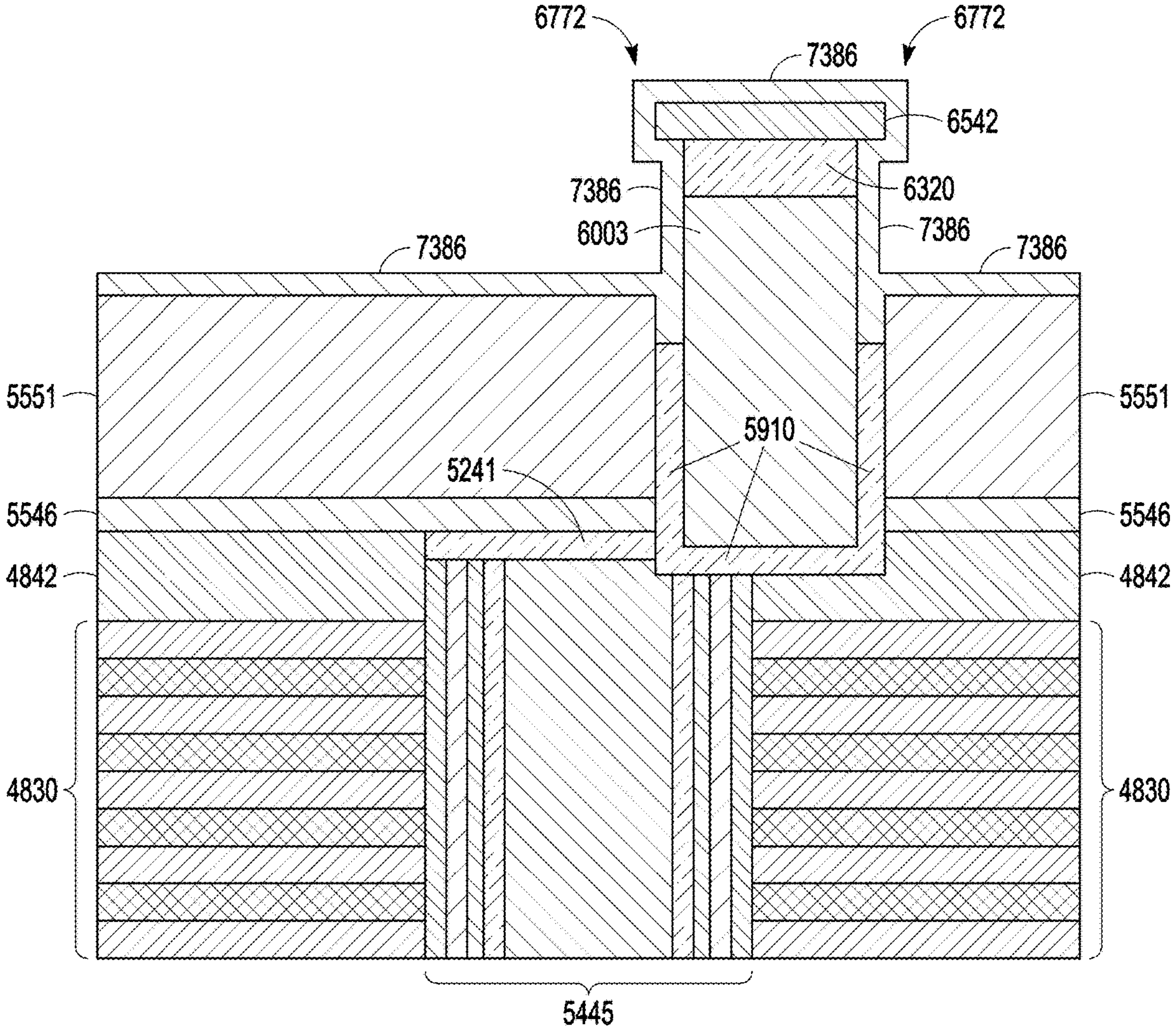

FIG. 73 shows a cross-sectional view of the structure of FIG. 72 after forming an oxide 7386 on the exposed surfaces of the structure of FIG. 72. The exposed oxide 7386 can be formed using an appropriate deposition technique. The cross-sectional view is along the cross-section line shown in FIG. 67B.

Figure 74:
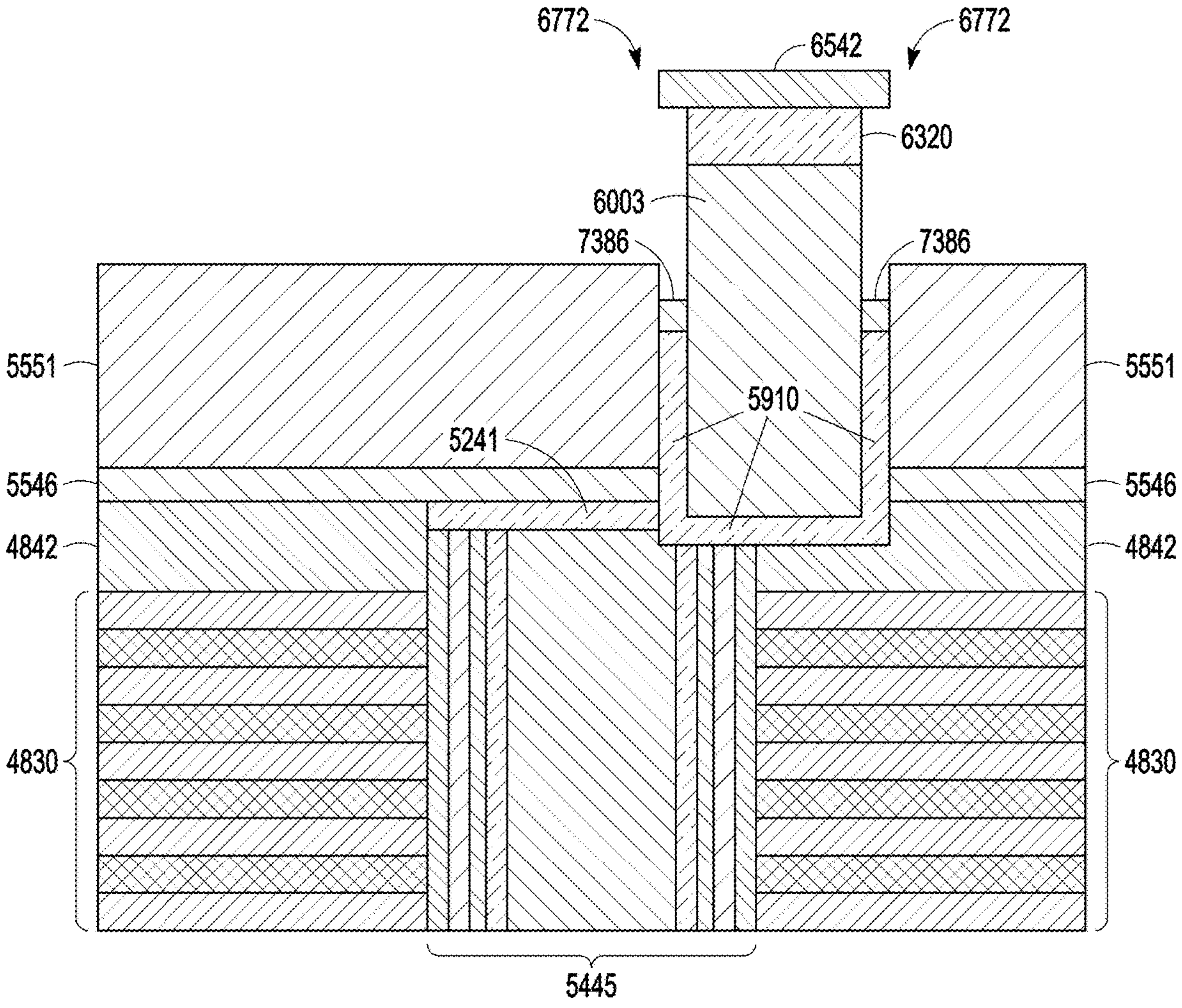

FIG. 74 shows a cross-sectional view of the structure of FIG. 73 after oxide 7386 has been removed from covering the carbon nitride 6542, the semiconductor material 6320, the oxide 6003, and the horizontal surface of the nitride 5551. Remaining oxide 7386 has been recessed in the small opening above the semiconductor material 5910, relative to the top of the nitride 5551, bounded by the oxide 6003, the nitride 5551, and the semiconductor material 5910. The oxide 7386 has been recessed in a gap above the semiconductor material 5910, leaving enough coating on the semiconductor material 5910 to block subsequent processing of more heavily doped material in the bottom of the cut but not the sides. The semiconductor material 5910 can have n− doping with more heavily doped material in the structure being formed to be doped n+. The cross-sectional view is along the cross-section line shown in FIG. 67B.

Figure 75:
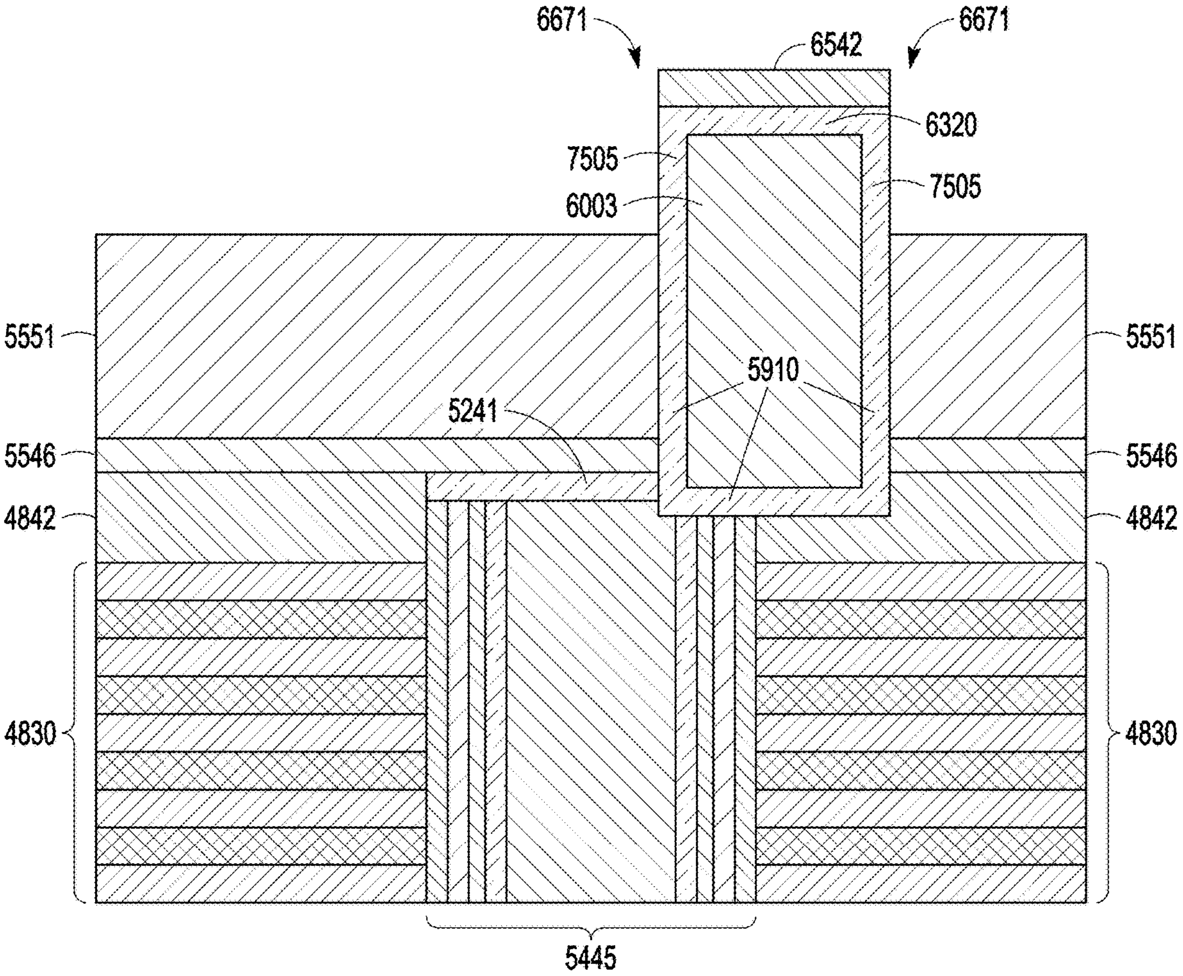

FIG. 75 shows a cross-sectional view, along the cross-section line of FIG. 56B indicating non-void areas 6671, of the structure of FIG. 74 after forming a semiconductor material 7505 that is heavily doped relative to the semiconductor material 5910. The semiconductor material 7505 is a portion of material 5910 that has had n+ dopant implanted or diffused into it. The semiconductive material 7505 can be, but is not limited to, the same as the semiconductor material 6320, semiconductor material 5910, semiconductive material 5241, or the channel material 4901 used in prior processing stages. For example, the semiconductor material 7505 can be polysilicon. With the semiconductor material 5910 being n− semiconductor material, the semiconductor material 7505 is n+ material formed to create an abrupt n+ junction. With the semiconductive material 5910 being polysilicon, the semiconductive material 7505 can be polysilicon n+ dopant implanted or diffused into it. This can be done with phosphorus-rich oxide or plasma doping (PLAD) implant with a heat step to drive dopant into the polysilicon of the portion of the semiconductor material 5910 and activating the implanted material in the polysilicon. The doping occurs only to the 5910 polysilicon that is exposed, with a slight amount that will diffuse into the polysilicon from the exposed portion of polysilicon 5910. An abrupt junction is created between the n+ polysilicon of the semiconductive material 7505 and the n-polysilicon of the semiconductive material 5910. Residue from the phosphorus-rich oxide process, the PLAD process, or other process used is cleaned up after the desired n+ region formation. Thickness of the nitride 5551 can set the gate over/underlap. If slightly more distance is desired from n+ of the semiconductor material 7505 to the edge of the gate, small amounts of the nitride 5551 can be removed to adjust this length after the n+ dopant process has been cleaned up.

Figure 76A:
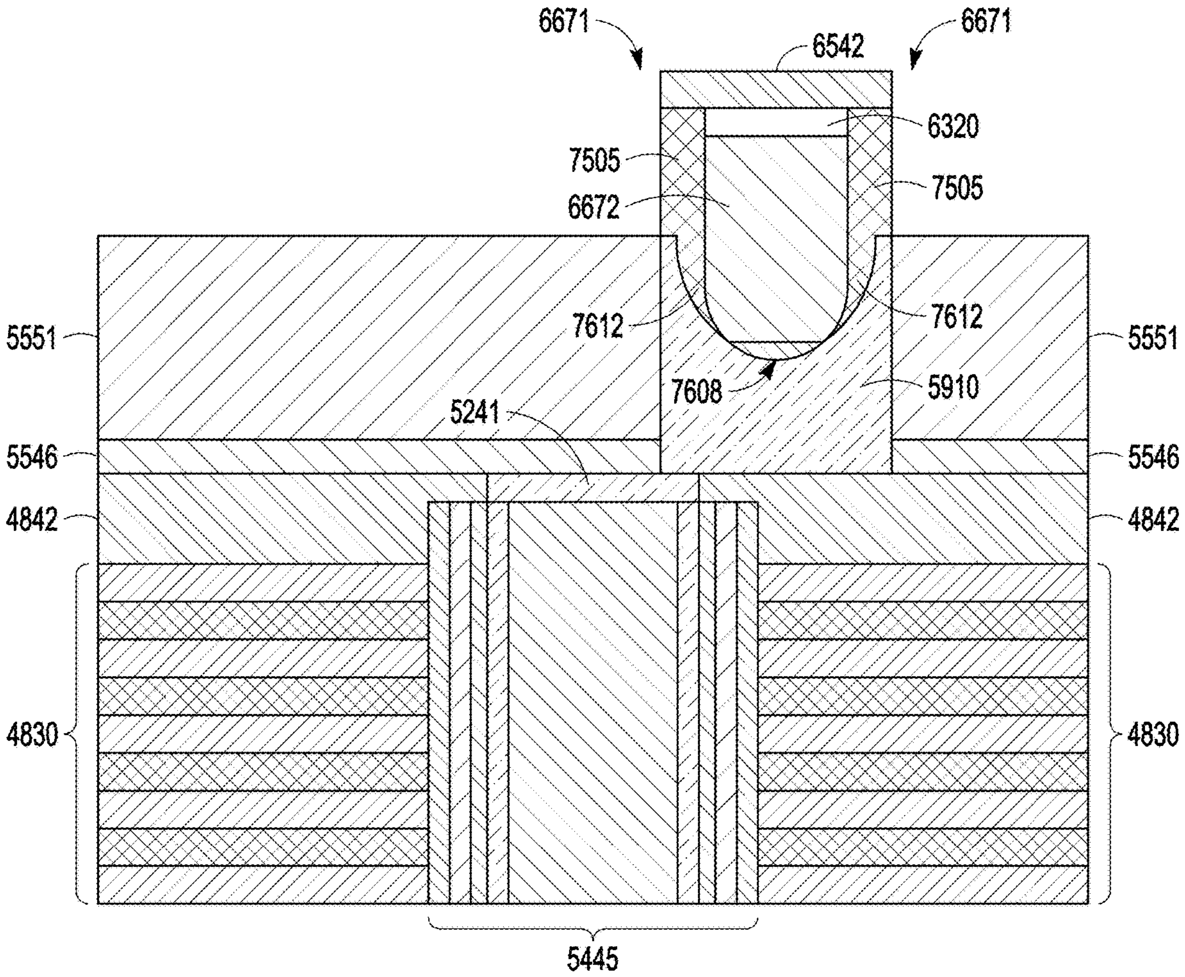
Figure 76B:
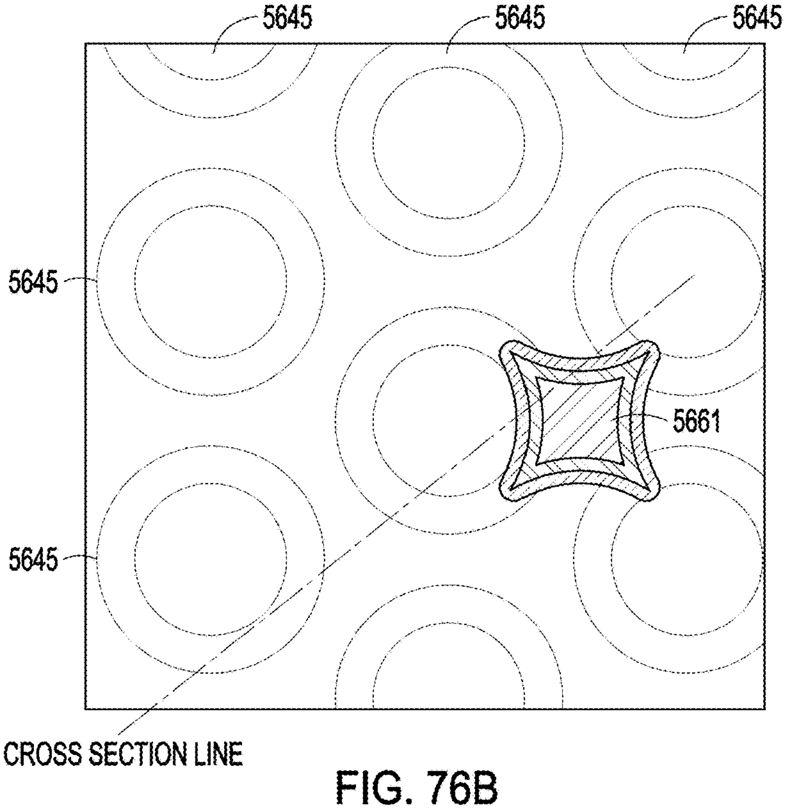

FIG. 76A shows a cross-sectional view of the structure of FIG. 75 along a cross-section line of the star pattern 5661 shown in FIG. 76B among pillar structures 5645. FIG. 76A illustrates non-void areas 6671 and void 6672. A segmented channel structure is shown extending from the semiconductor material 5910, with the segmented channel structure including n+ semiconductor material 7505 structured as fins and a non-conductive region formed by the void 6672. A fanged region 7612 extends from the n+ semiconductor material 7505, shown on the left as being one fin, towards, but does not meet, a fanged region 7612 extending from the n+ semiconductor material 7505 shown on the right as being another fin. The fanged regions 7612 can be doped to the doping level of the semiconductor material 7505 that forms fins. The fanged regions 7612 can provide for high GIDL operation. In between the two fanged regions 7612 is a rounding 7608 of the vertical border of the semiconductor material 5910. The rounding 7608 can provide a n− bottom of the cut area between n+ Fangs, where dopant is blocked by oxide above the rounding 7608. The n+ dopant will diffuse into and dope any exposed silicon to n+ down to the oxide in the bottom of the rounded area. The oxide in the bottom blocks the n+ diffusion into the polysilicon below it.

Figure 76C:
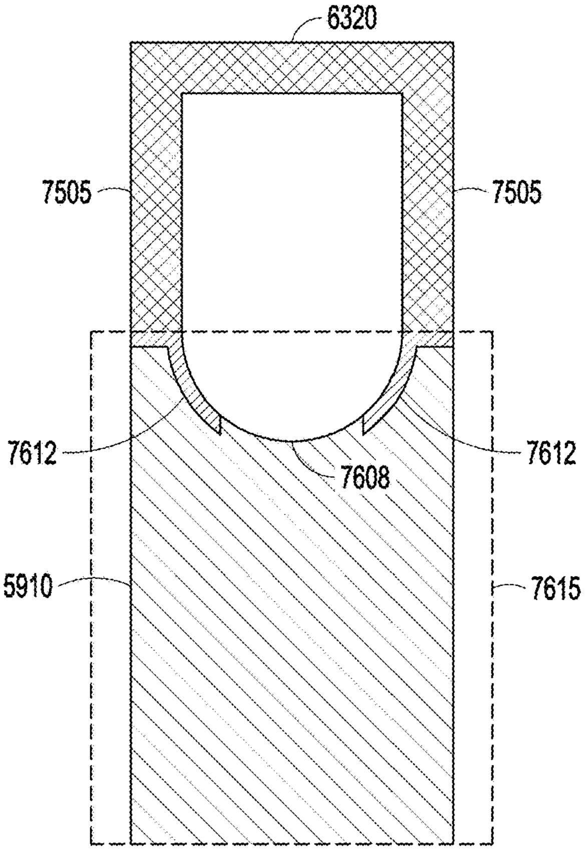

FIG. 76C shows a representation for a SGD transistor structure corresponding to the structure in FIG. 76A extending from the semiconductor material of the unit 5445. The structure of FIG. 76C includes a channel region 5910 adjacent a gate 7615 and includes a drain 6320 coupled to the channel region 5910 by fins 7505 having fanged regions 7612 that extend below an interface of the fins 7505 with the channel region 5910, where the channel region 5910 has a rounding 7608 between the fins 7505.

Figure 77:
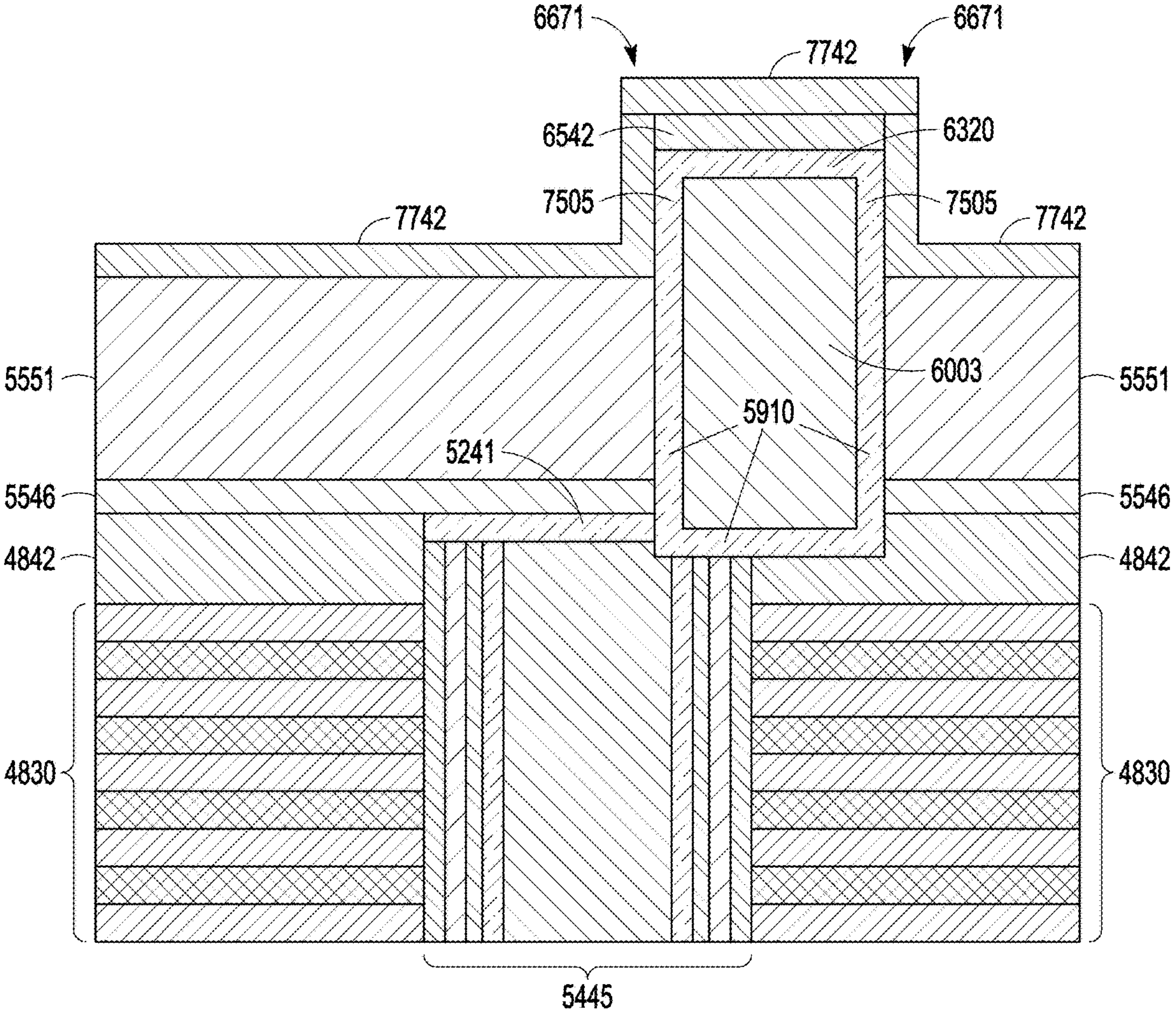

FIG. 77 shows a cross-sectional view of the structure of FIG. 75 after carbon nitride 7742 has been formed covering the top surface of the structure of FIG. 75, expanding the carbon nitride 6542, and covering the semiconductor material 7505 and the top surface of the nitride 5551. The carbon nitride 7742 can be formed using a suitable deposition technique. The cross-sectional view is along the cross-section line shown in FIG. 56B.

Figure 78:
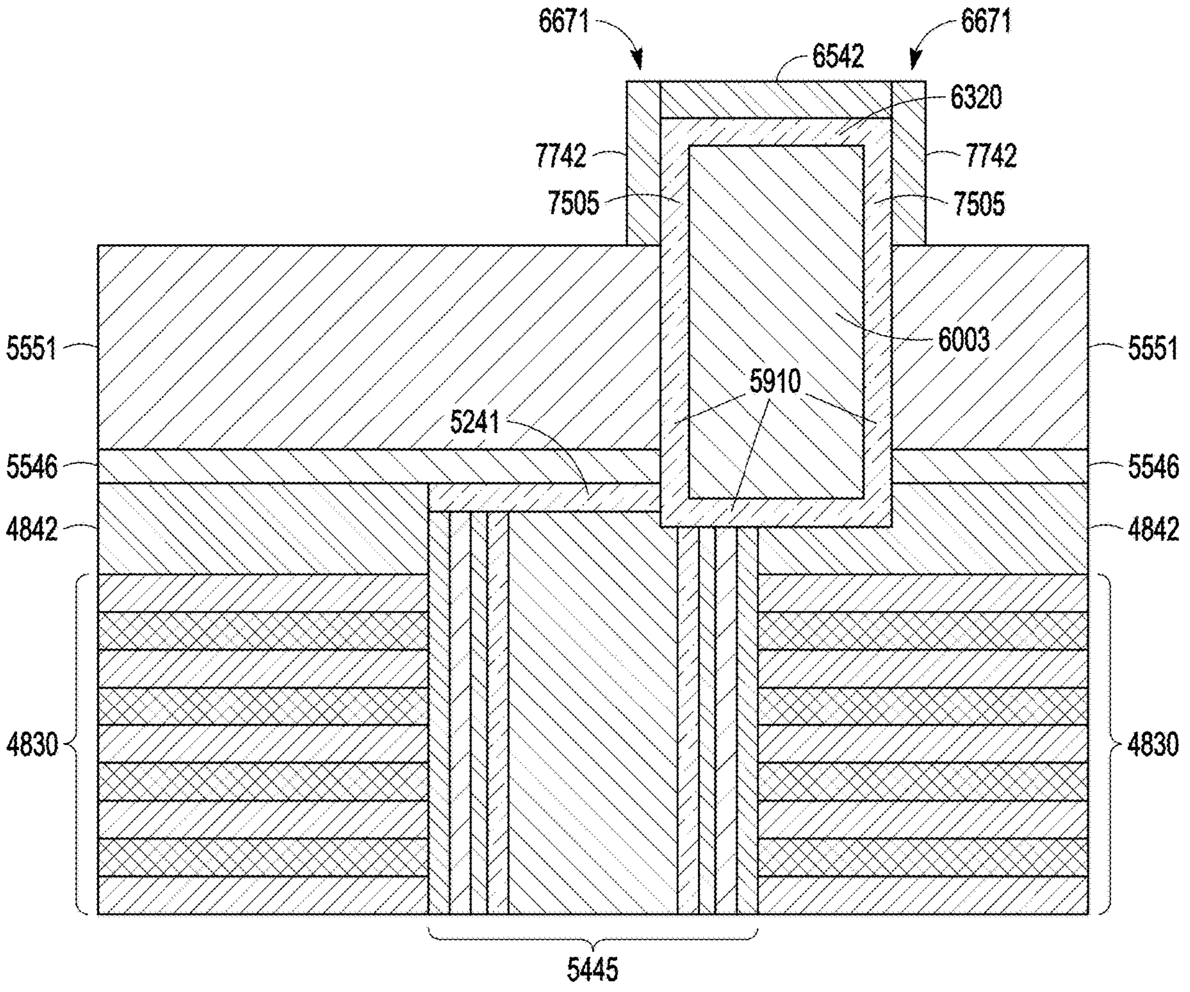

FIG. 78 shows a cross-sectional view of the structure of FIG. 77 after the carbon nitride 7742 is spacer etched, exposing the top surface of the nitride 5551 and maintaining portions of the carbon nitride 7742 on the semiconductor material 6320 and the semiconductive material 7505. The cross-sectional view is along the cross-section line shown in FIG. 56B.

Figure 79:
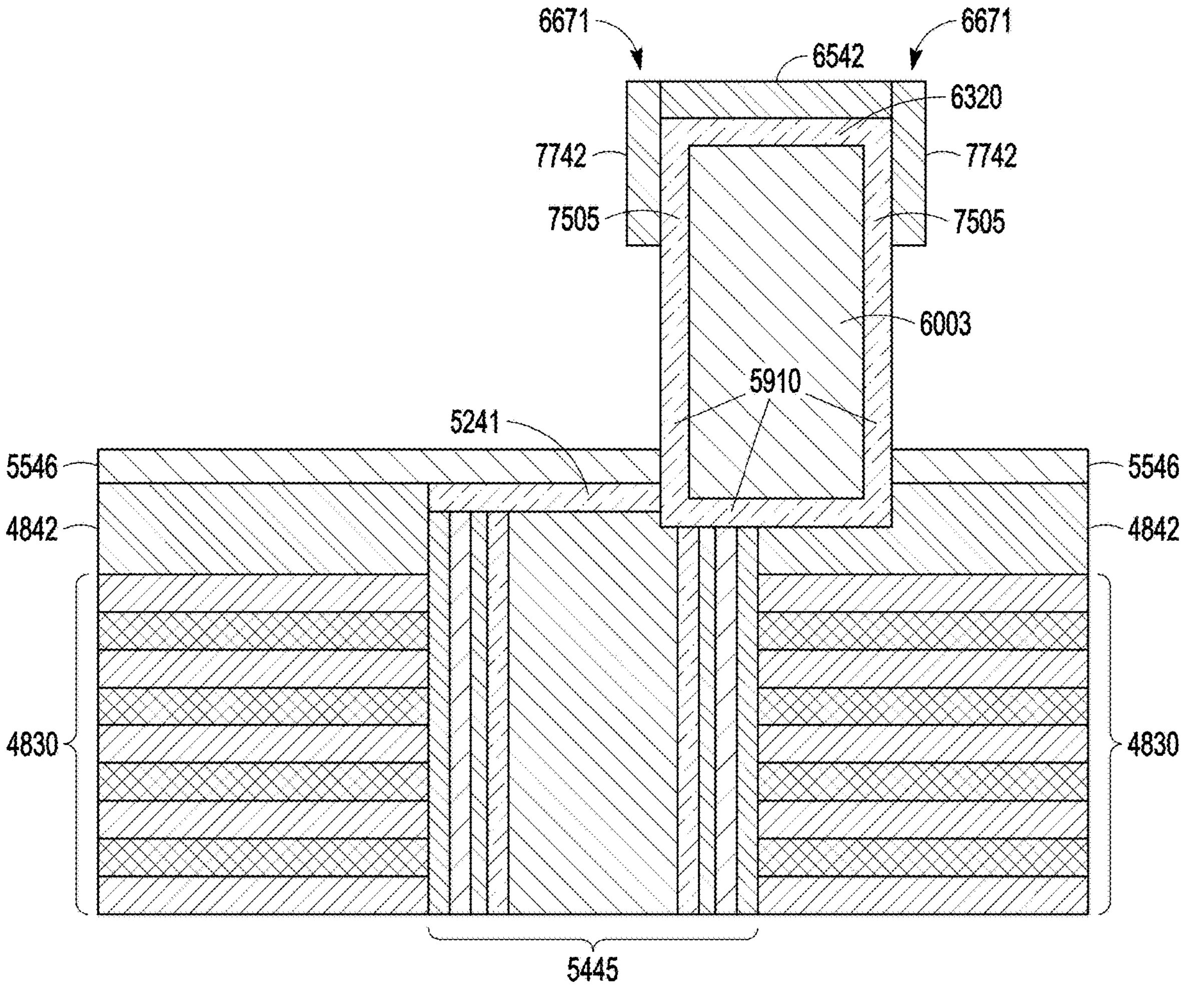

FIG. 79 shows a cross-sectional view of the structure of FIG. 78 after removing the nitride 5551, exposing the oxide 5546. The nitride 5551 can be removed by wet etching. The cross-sectional view is along the cross-section line shown in FIG. 56B.

Figure 80:
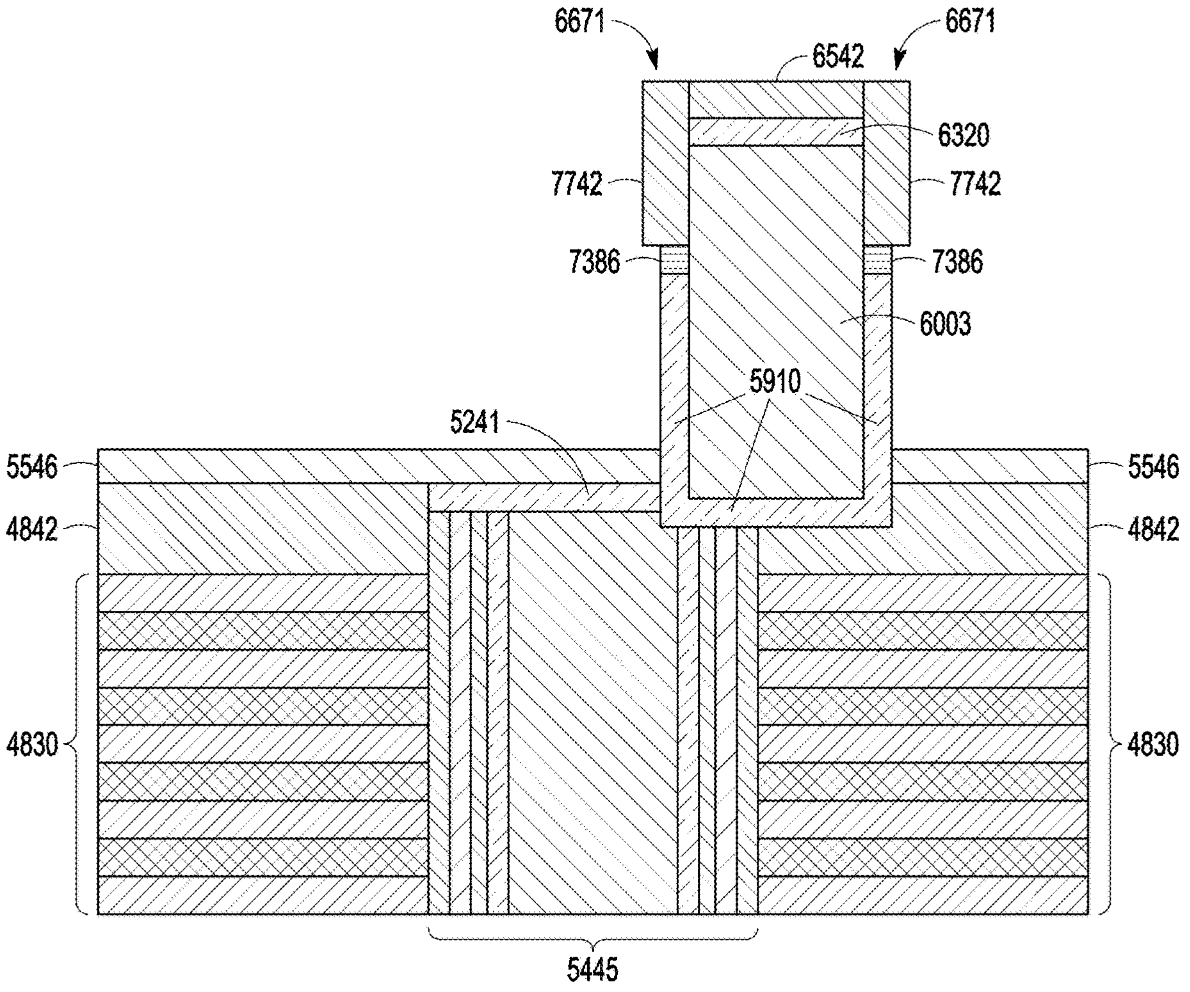

FIG. 80 shows a cross-sectional view of the structure of FIG. 78 after removing the nitride 5551 and exposing the oxide 5546, with the cross-sectional view being along the cross-section line shown in FIG. 67B.

Figure 81A:
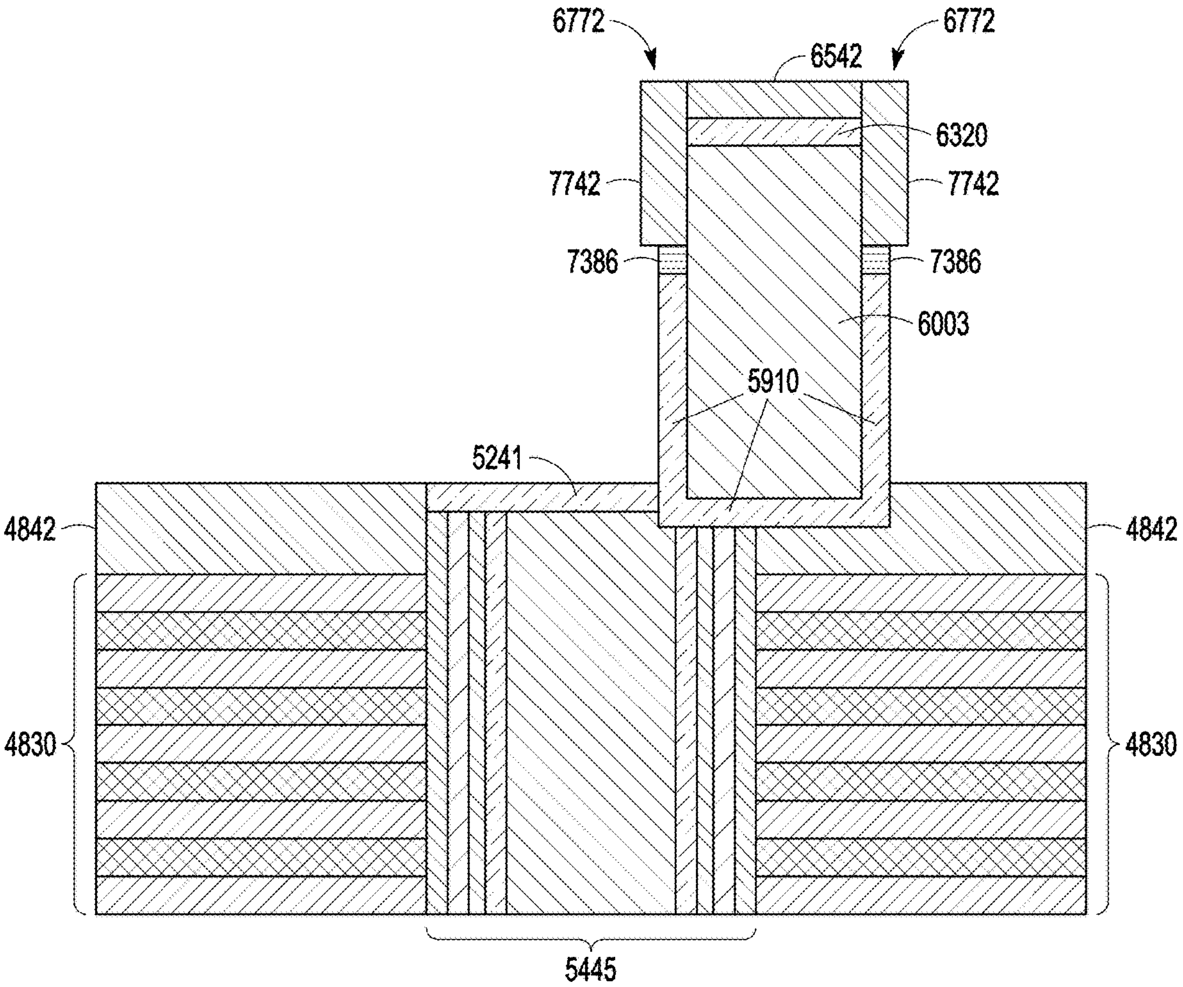
Figure 81B:
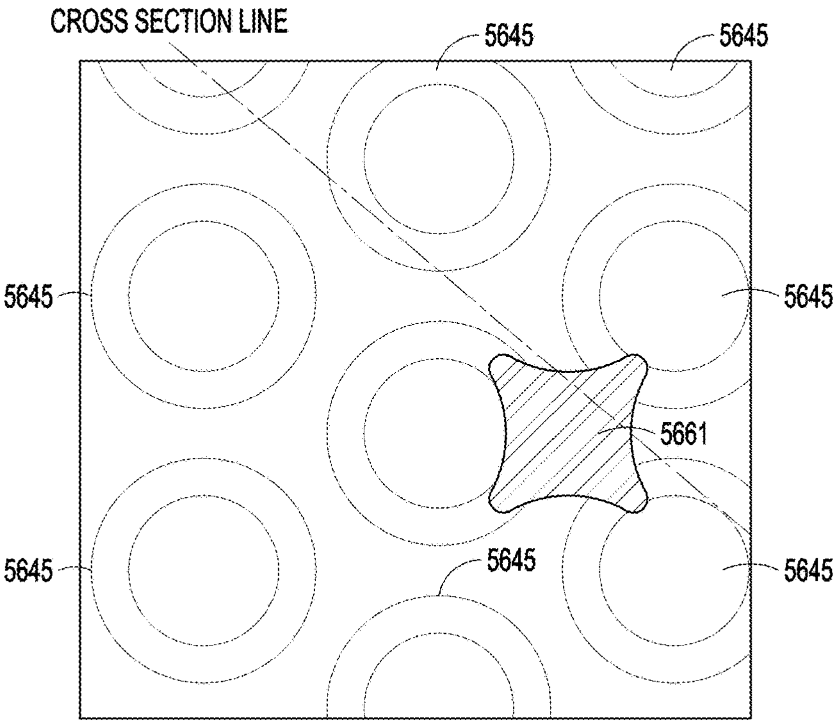
Figure 81C:
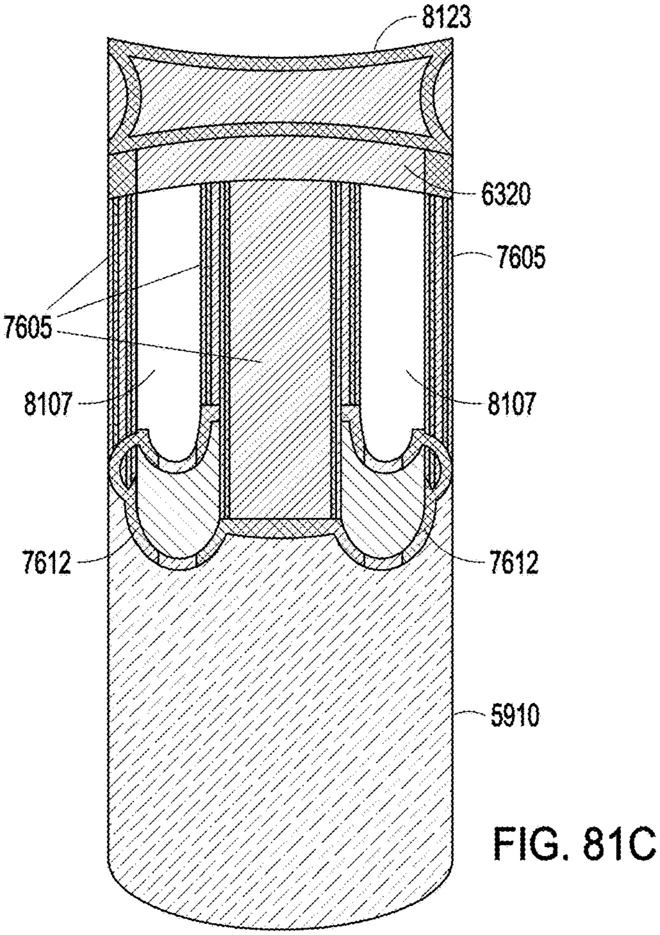

FIG. 81A shows a cross-sectional view of the structure of FIG. 80 after removing the oxide 5546 and exposing the carbon nitride 4842, with respect to corner void areas 6772. The cross-sectional view is along the cross-section line shown in FIG. 67B for star pattern 5661 among the pillar structures 5645. FIG. 81C illustrates fins 7605, with fangs 7612, separated by non-conductive regions 8107. The fins 7605 couple the semiconductor material 5910 to a drain 6320 having a n+ drain contact 8123, forming the fins 7605 as a drain channel regions.

Figure 82A:
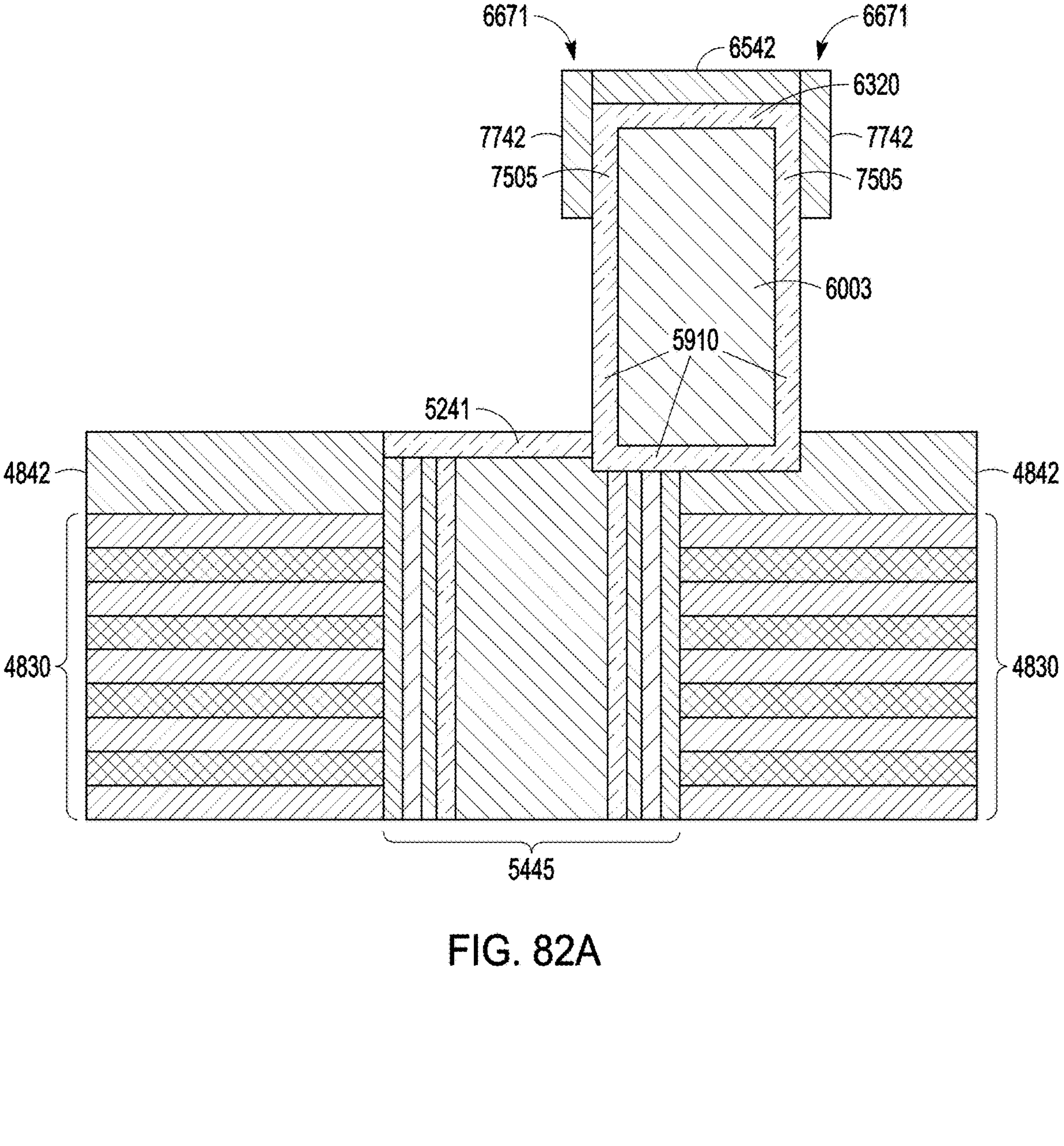
Figure 82B:
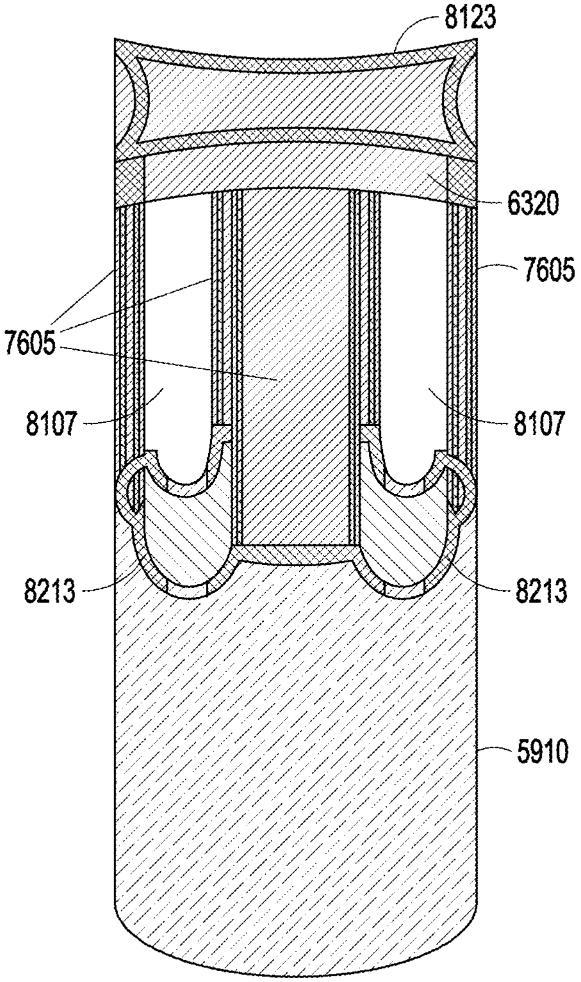

FIG. 82A shows a cross-sectional view of the structure of FIG. 79 after removing the oxide 5546 and exposing the carbon nitride 4842, with respect to the non-void areas 6671. The cross-sectional view is along the cross-section line shown in FIG. 56B. FIG. 82B illustrates fins 7605 separated by non-conductive regions 8107. The fang 8213 can be formed by a n+ polysilicon channel contacting a n− channel at the bottom of n+ fins. The fins 7605 couple the semiconductor material 5910 to a drain 6320 having a n+ drain contact 8123, forming the fins 7605 as a drain channel region.

Figure 83:
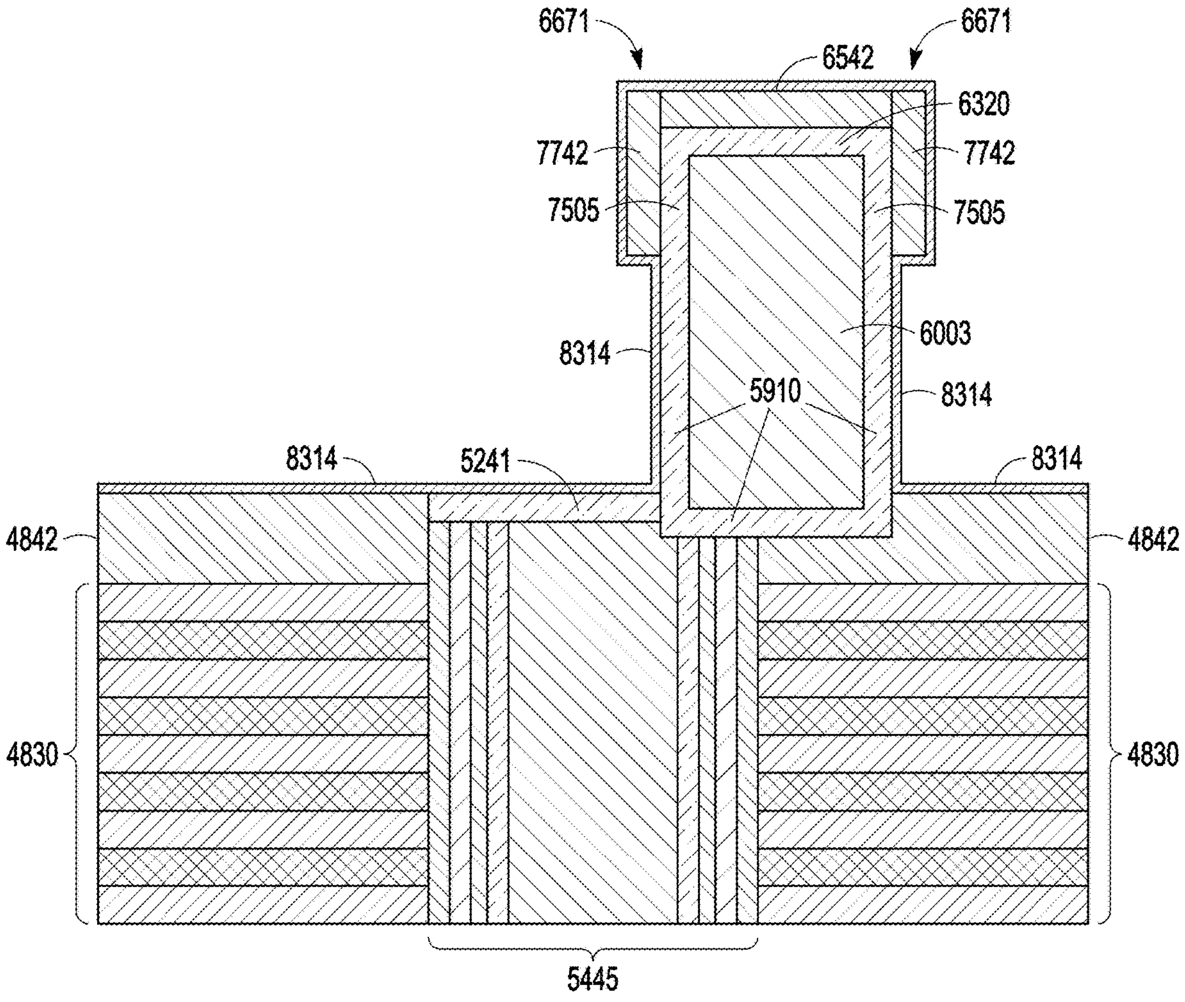

FIG. 83 shows a cross-sectional view of the structure of FIG. 82A after forming an oxide 8314 covering the surfaces of the structure of FIG. 82A. The oxide 8314 can be formed by a suitable deposition technique. Further processing of the oxide 8314 is performed in later stages to form a gate oxide for the SGD transistor being constructed. The cross-sectional view is along the cross-section line of FIG. 56B with respect to non-void areas 6671.

Figure 84:
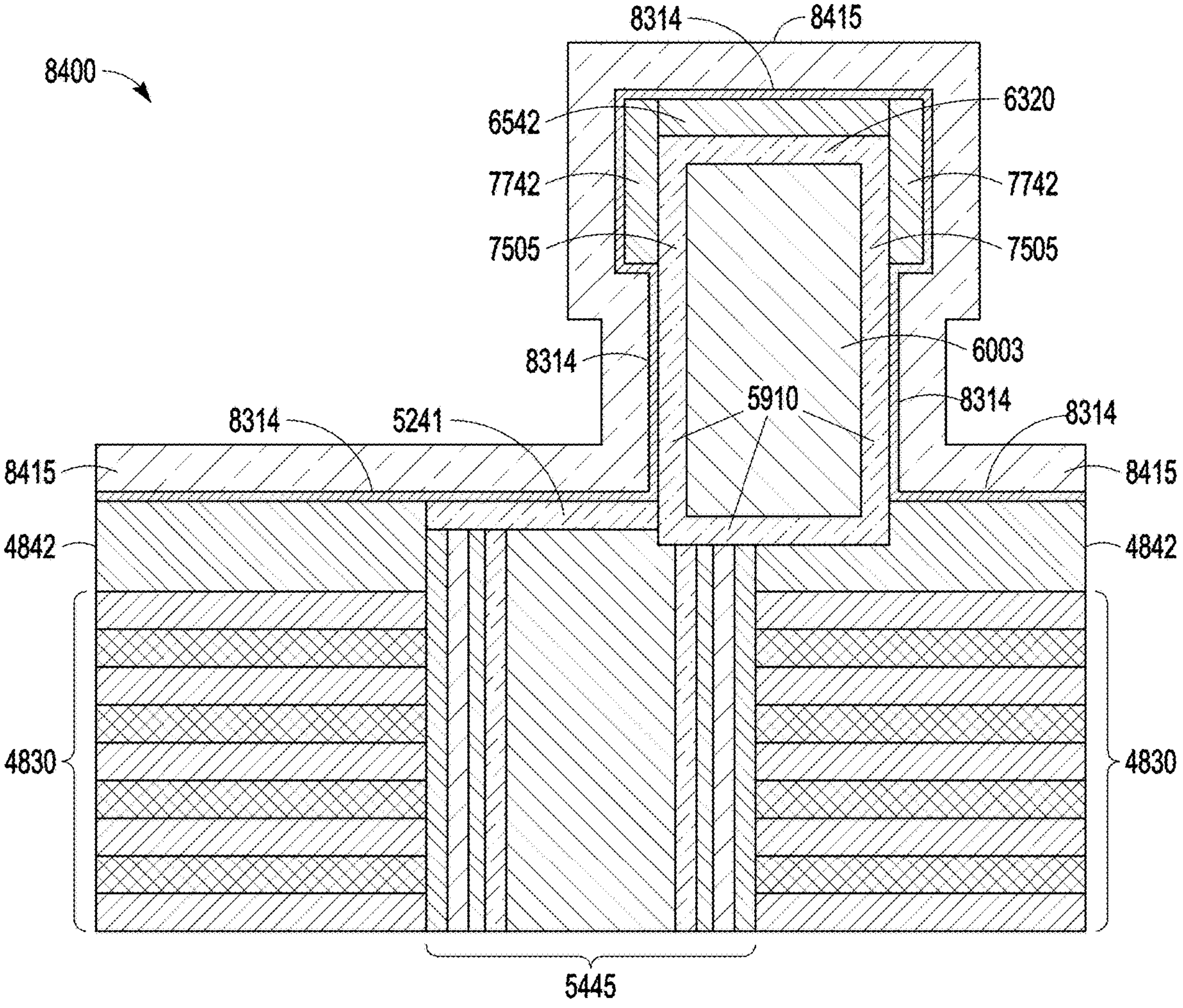

FIG. 84 shows a cross-sectional view of the structure of FIG. 83 after forming conductive material 8415 on the oxide 8314 covering the surfaces of the structure of FIG. 83. The conductive material 8415 can be formed by a suitable deposition technique. The cross-sectional view is along the cross-section line of FIG. 56B. The result of forming the conductive material 8415 is a structure 8400 formed above a pillar structure 5445 for the set of tiers 4830 of memory cells. The structure 8400 is formed above the multiple pillar areas for the set of tiers of memory cells in a memory array of the memory device being processed. The conductive material 8415 is to be processed to form the gate of the SGD transistor. Titanium, titanium nitride, tungsten, or combinations thereof can be deposited to form the SDG gate. Other conductive materials, which have properties sufficient for a transistor gate, may be used for the SDG gate. The thickness of the gate provided by the conductive material 8415 can be designed to be thick enough to bridge together between SGD transistors of each sub-block of the memory array being constructed, but not so thick as to bridge sub-blocks together. Ideally, there would be enough room between sub-blocks to deposit the gate conductor and an oxide spacer. This room can allow the oxide spacer to be dry etched, allowing the conductive material 8415 to be wet etched out of the bottom of a trench in which it is formed and off of the surface. This would allow the SGD gate oxide to be deposited directly on the top of channel material 4901 of pillar structure 5445 and the semiconductive material 5241, thus allowing a transistor gate to be deposited over top of prior mentioned semiconductor materials forming parts of the SGD transistors, and allow the gate material between sub-blocks to be etched without damaging the gate oxide and semiconductor material below.

Figure 85:
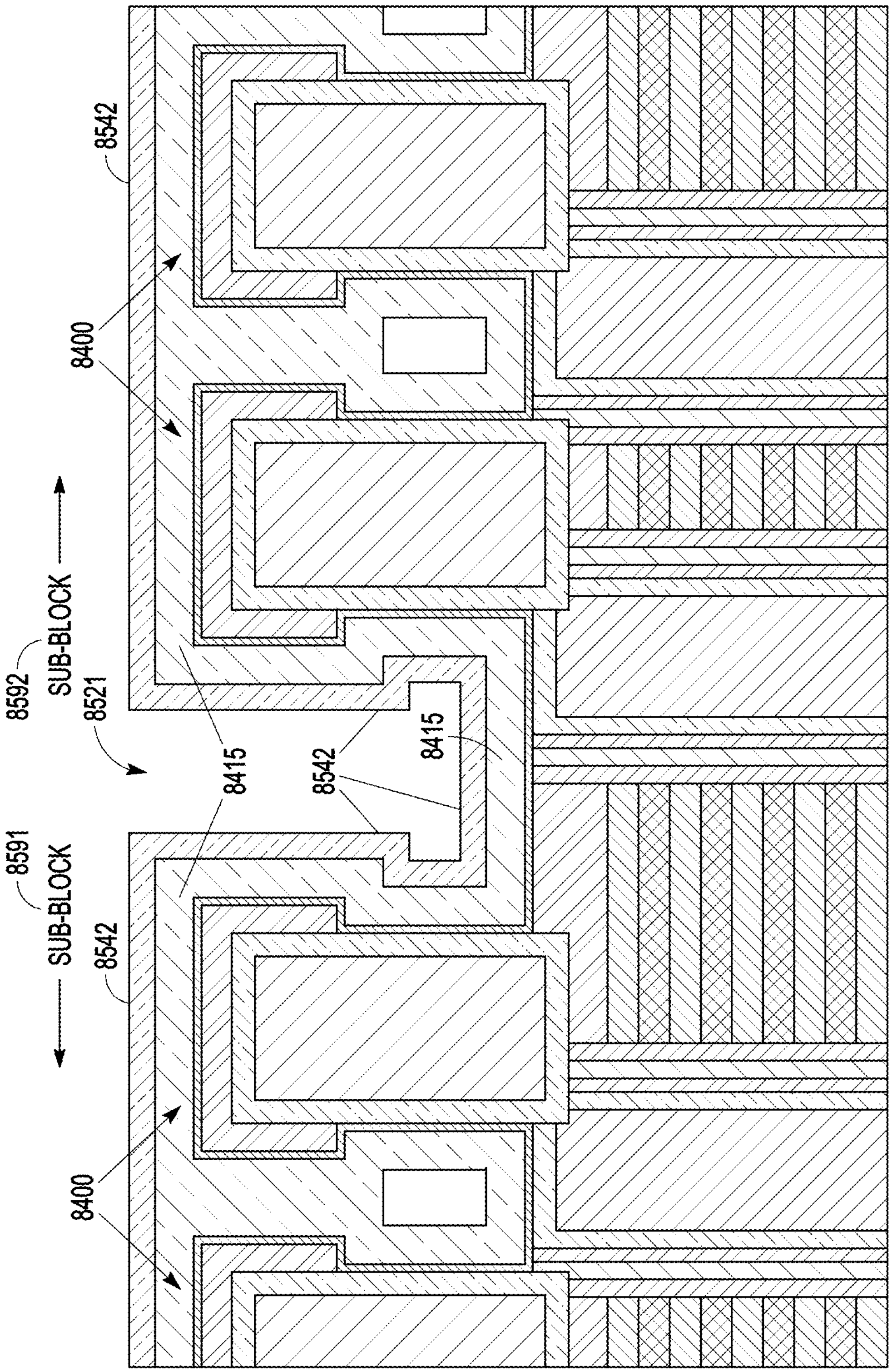

FIG. 85 shows a cross-sectional view of the structures 8400 formed at the stage shown of FIG. 83 after a thin spacer oxide 8542 has been formed on the exposed top surfaces of the conductive material 8415. The spacer oxide 8542 can be formed using an appropriate deposition technique. An opening 8521 has been formed between a sub-block 8591 and a sub-block 8592.

Figure 86:
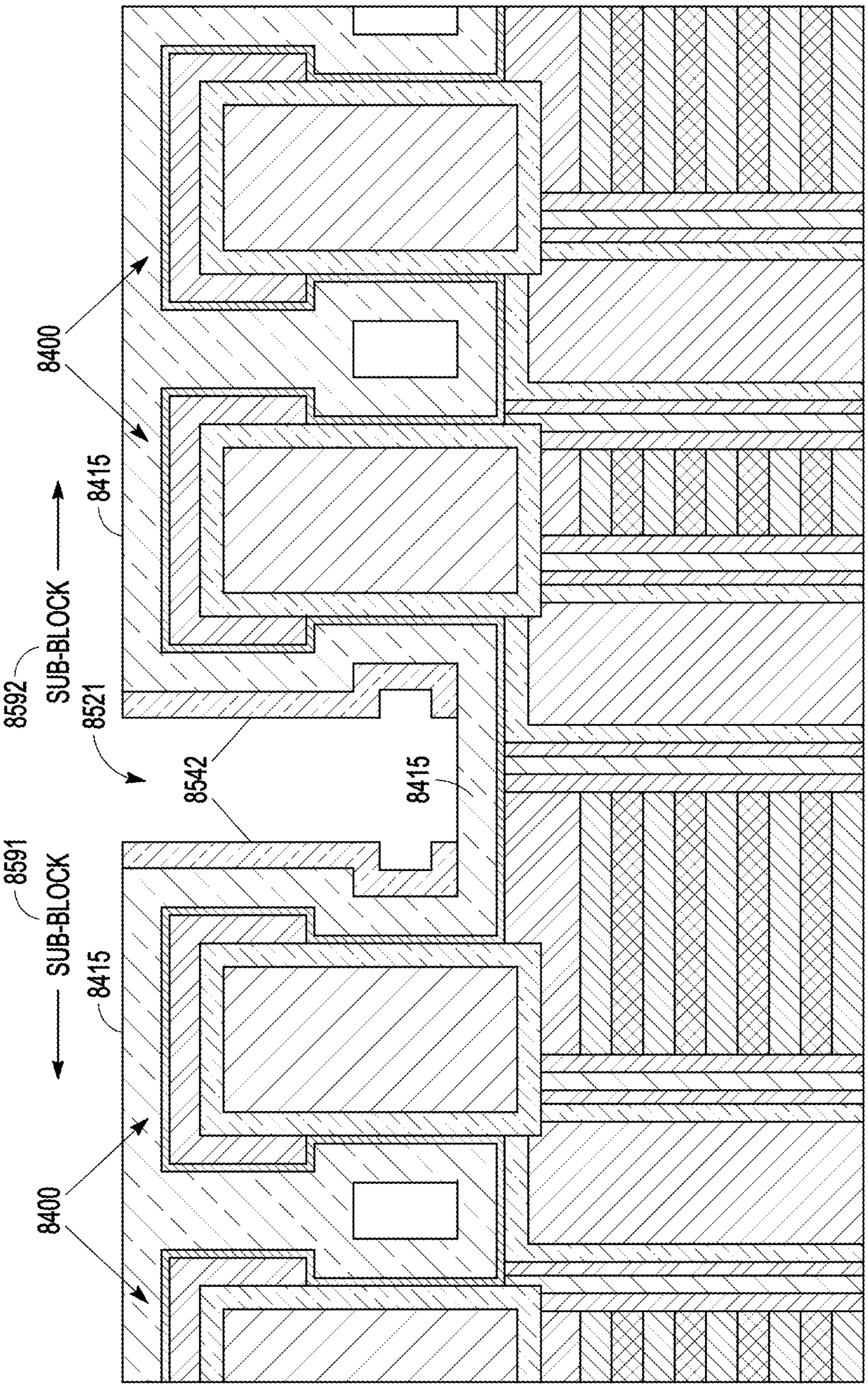

FIG. 86 shows a cross-sectional view of the structure of FIG. 85 after the spacer oxide 8542 has been removed from the horizontal surfaces of the structure of FIG. 85, leaving oxide 8542 on the walls of the opening 8521. The thickness of the oxide 8542 on the walls of the opening 8521 can be formed leaving the opening 8521 available for further processing. The removal of the spacer oxide 8542 can be formed using an appropriate dry etch technique.

Figure 87:
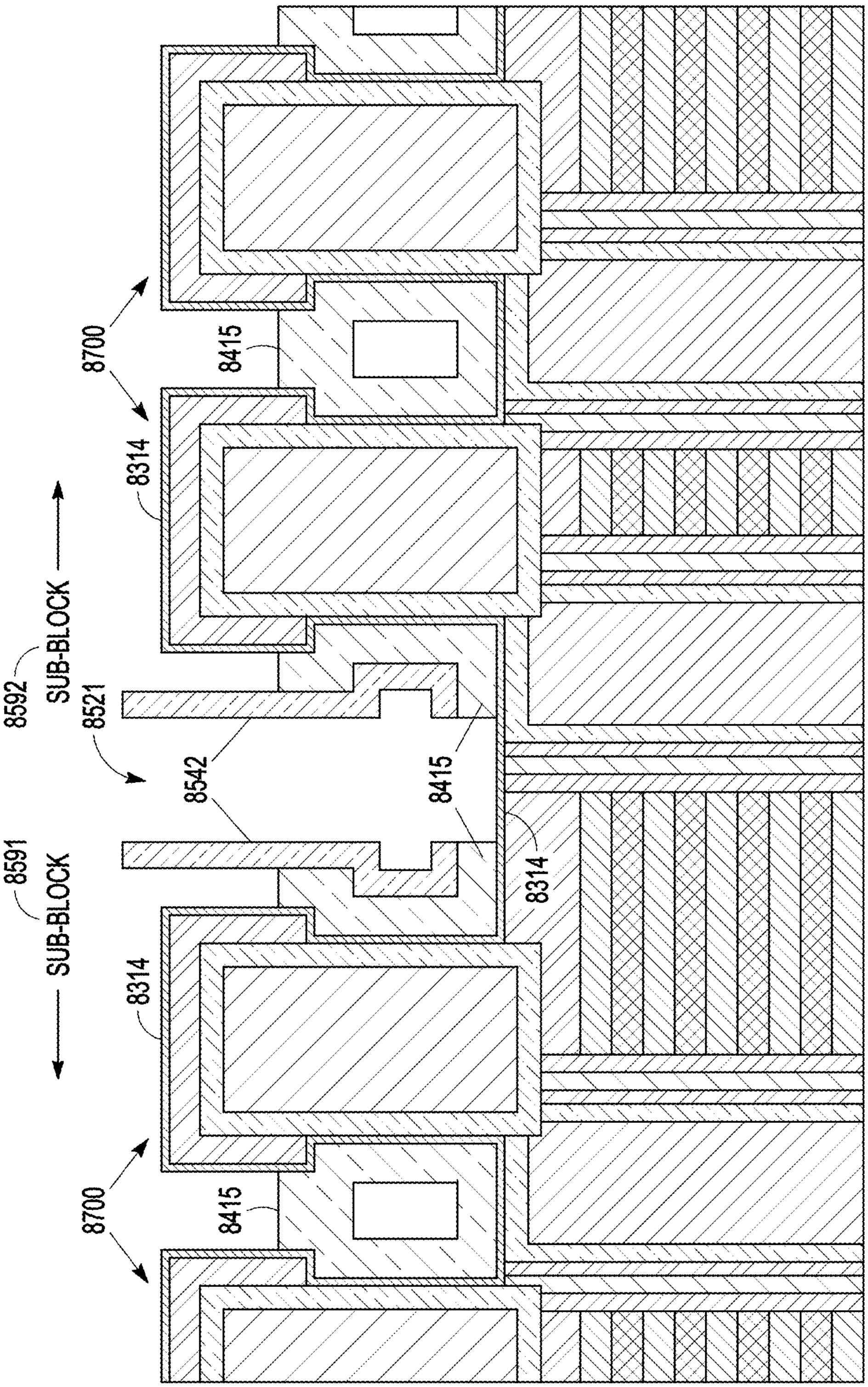

FIG. 87 shows a cross-sectional view of the structure of FIG. 86 after a portion of the conductive material 8415, having exposed surfaces in the structure of FIG. 86, has been removed, forming the structures 8700 from the structures 8400. The structures 8700 have the oxide 8314 as a top surface. The conductive material 8415 can be removed by an appropriate wet etch technique. The conductive material 8415 has been removed from between sub-block 8591 and sub-block 8592 down to the oxide 8314. The remaining conductive material 8415 is to be used for gates of the SGD transistors being formed.

Figure 88:
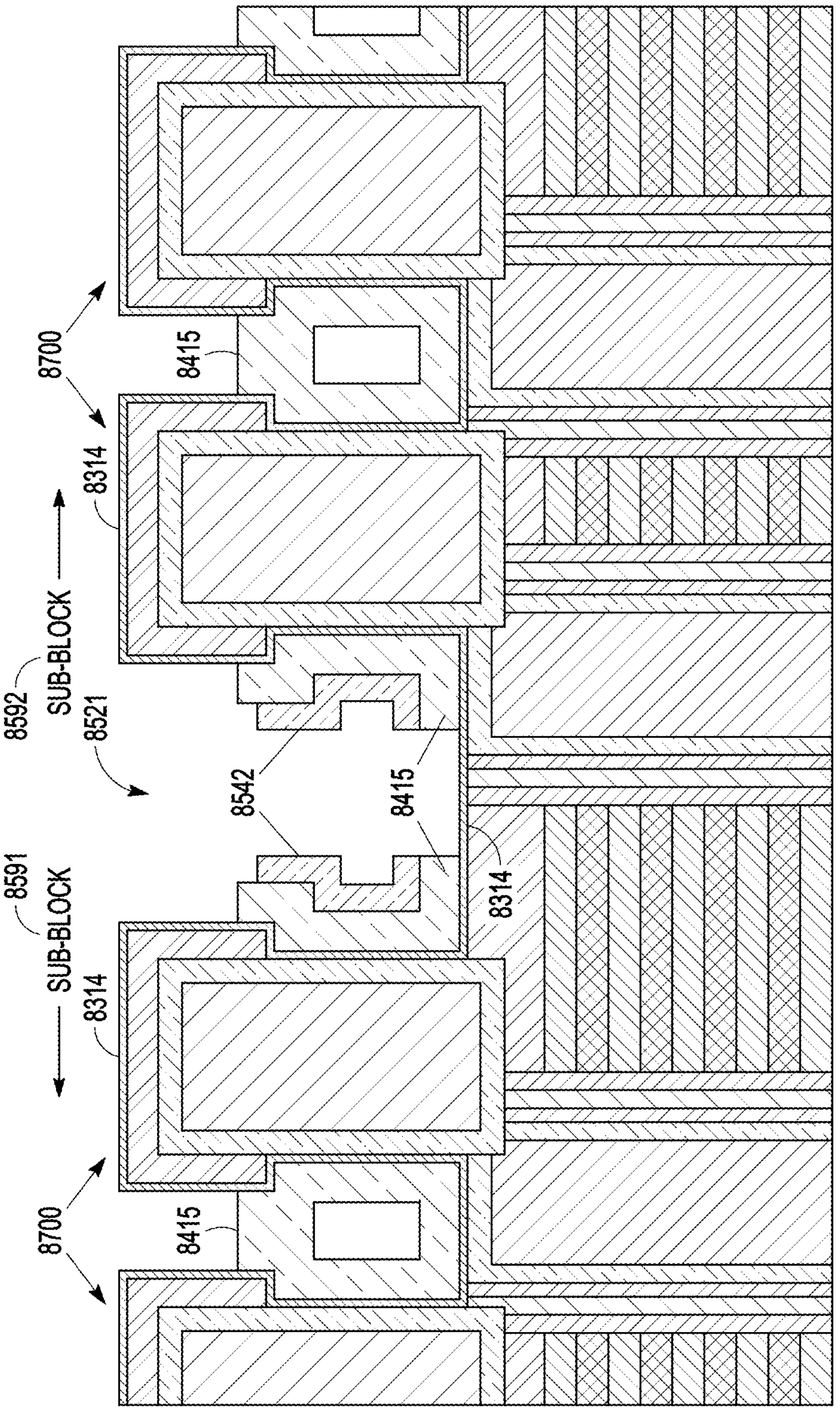

FIG. 88 shows a cross-sectional view of the structure of FIG. 87 after exposed spacer oxide 8542 has been removed. The exposed spacer oxide 8542 can be removed using an appropriate vapor etch technique.

Figure 89:
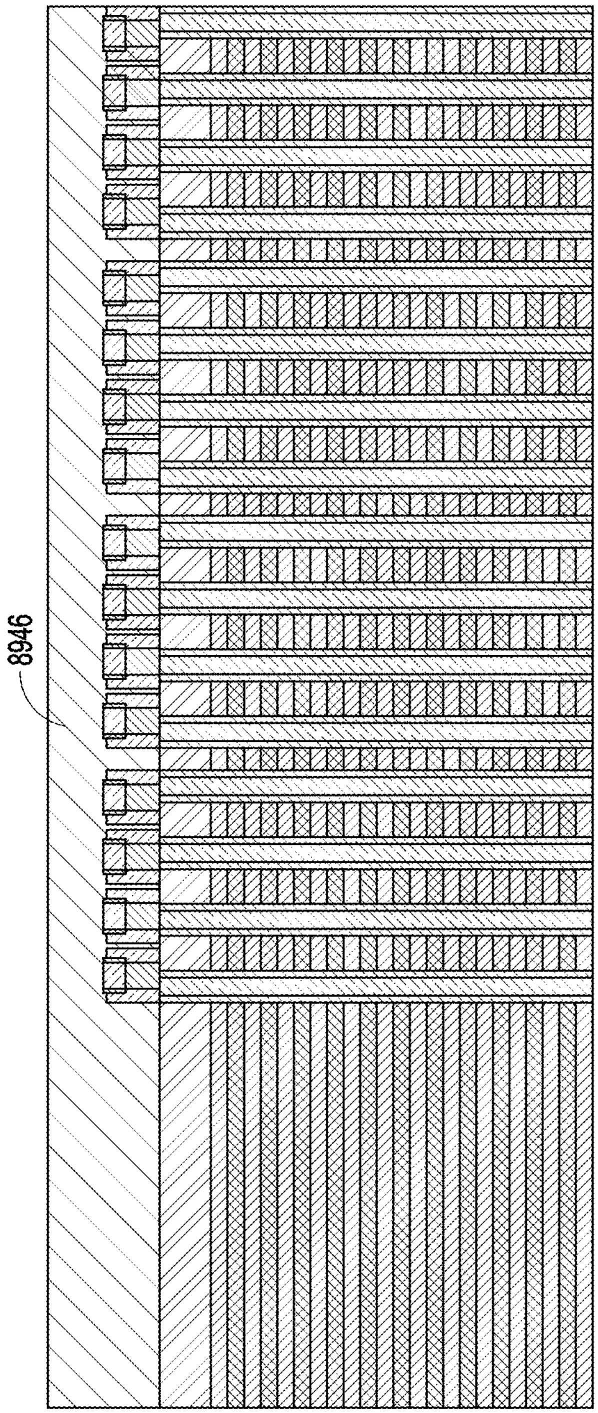

FIG. 89 shows a cross-sectional view of the structure of FIG. 88 after an oxide 8946 has been formed on the exposed top surfaces of the structure of FIG. 88 and a CMP procedure has been applied to the oxide 8946. The oxide 8946 can be formed using an appropriate deposition technique. The oxide material used for the oxide 8946 can be the same oxide material used for oxide 8314.

Figure 90:
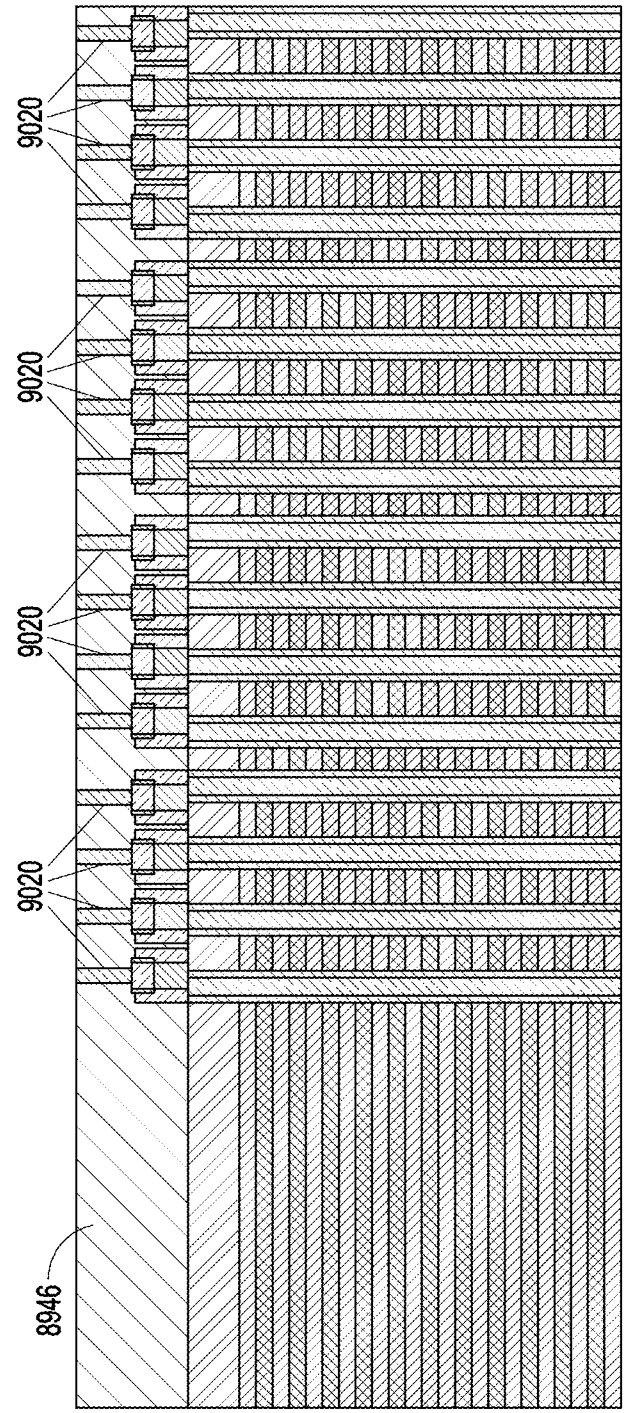

FIG. 90 shows a cross-sectional view of the structure of FIG. 89 after further processing stages have been performed. Portions of the oxide 8946 have been removed from above the conductive material 6320 of the structure 8700 and the carbon nitride 6542 on the conductive material 6320 has been removed. The removal of these materials can be performed using an appropriate etch technique. A conductive material 9020 has been filled into the regions of these removed materials. The conductive material 9020 provides contacts for the drains of the SGD transistors formed. A conductive material 9020 can include, but is not limited to, titanium, titanium nitride, tungsten, a combination of titanium, titanium nitride, or tungsten, or other appropriate metallic material.

Although the method of FIGS. 4-47 and the method FIGS. 48-90 illustrate examples of forming a SGD transistor with a channel structure similar to the channel structure 102D of FIG. 1D, other channel structures can be formed using variations of these methods. For example, teachings of these methods can be implemented to form channel structures similar to the channel structures 102A, 102B, and 102C of FIGS. 1A, 1B, and 1C.

Figure 91:
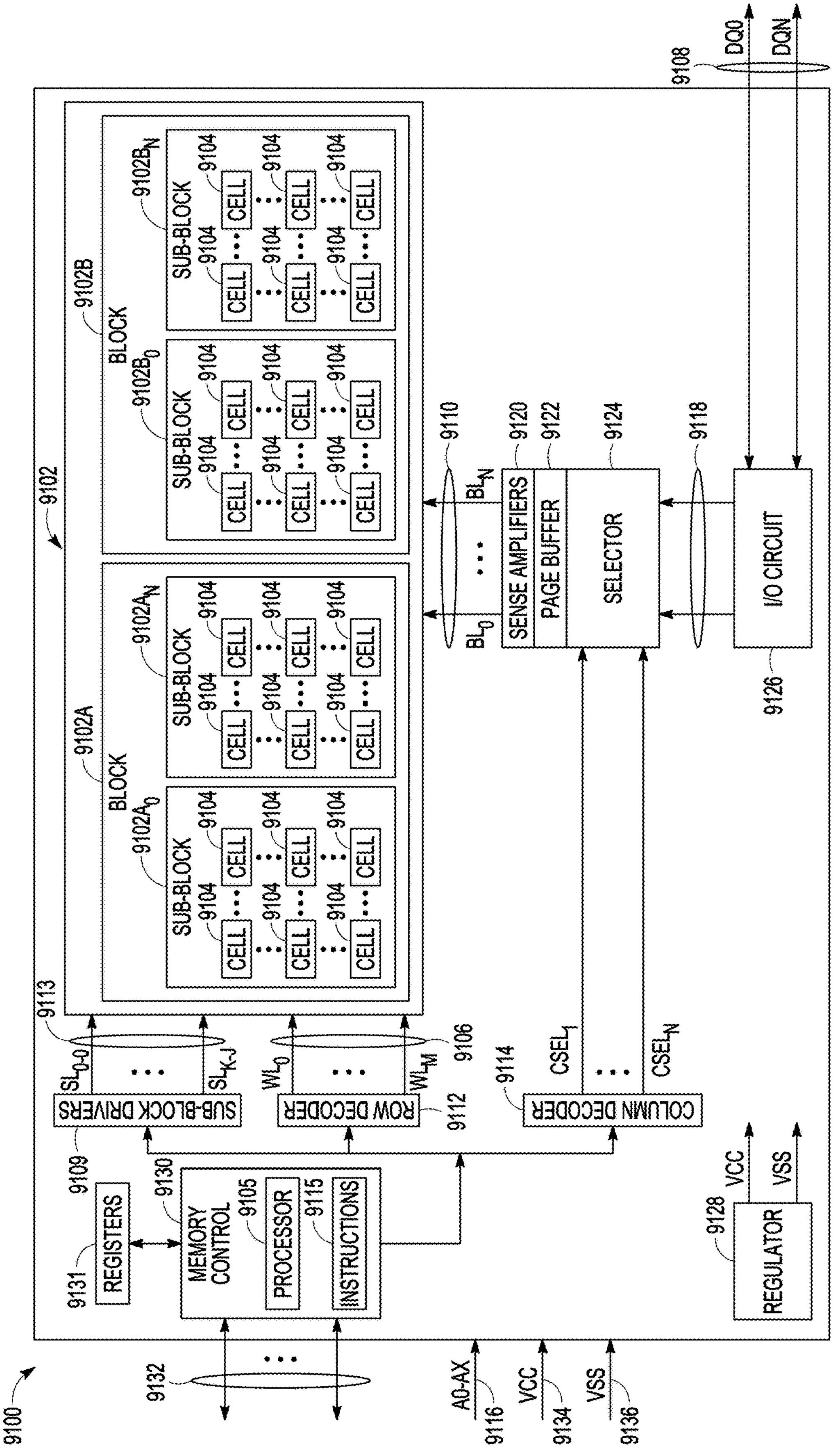
FIG. 91 illustrates a functional block diagram of an example memory device including a memory array having a plurality of memory cells, and one or more circuits or components to provide communication with, or perform one or more memory operations on, the memory array, according to various embodiments.

FIG. 91 illustrates a functional block diagram of an example memory device 9100 including a memory array 9102 having a plurality of memory cells 9104, and one or more circuits or components to provide communication with, or perform one or more memory operations on, the memory array 9102. The memory device 9100 can be a memory die, for example, a NAND memory die. The memory device 9100 can include a row decoder 9112, a column decoder 9114, sub-block drivers 9109, sense amplifiers 9120, a page buffer 9122, a selector 9124, an input/output (I/O) circuit 9126, and a memory controller 9130. The memory controller 9130 can include processing circuitry, including one or more processors 9105, and can be configured to perform operations of the memory device 9100 by executing instructions 9115. The memory controller 9130 can be coupled to registers 9131 that can contain parameter data for the memory controller 9130. For purposes of the present example, the instructions 9115 may be performed by memory within or dedicated to memory controller 9130. In other examples, at least some portion of the instructions executed by memory controller 9130 may be stored in other memory structures and loaded, for example into local (memory controller) memory for execution by the memory controller 9130. The operations can include an erase algorithm using SGD transistors coupling strings of memory cells to data lines, with each SGD transistor having a drain channel structure segmented with one or more fins separated by one or more non-conductive regions, where the fins and the non-conductive regions extend vertically from a transistor channel region of the given SGD transistor, as taught herein. The segmented drain channel structure and transistor channel region of each SGD transistor can be implemented by any of the channel structures 102A, 102B, 102C, and 102D of FIGS. 1A, 1B, 1C, and 1D respectively.

The memory cells 9104 of the memory array 9102 can be arranged in blocks, such as first and second blocks 9102A, 9102B. Each block can include sub-blocks. For example, the first block 9102A can include first and second sub-blocks 9102$A_0$, 9102$A_N$, and the second block 9102B can include first and second sub-blocks 9102$B_0$, 9102$B_N$. Each sub-block can include a number of physical pages, with each page including a number of memory cells 9104. Although illustrated herein as having two blocks, with each block having two sub-blocks, and each sub-block having a number of memory cells 9104, in other examples, the memory array 9102 can include more or fewer blocks, sub-blocks, memory cells, etc. In other examples, the memory cells 9104 can be arranged in a number of rows, columns, pages, sub-blocks, blocks, etc., and accessed using, for example, access lines 9106, first data lines 9110, or one or more select gates, source lines, etc.

The memory controller 9130 can control memory operations of the memory device 9100 according to one or more signals or instructions received on control lines 9132, including, for example, one or more clock signals or control signals that indicate a desired operation (e.g., write, read, erase, etc.), or address signals (A0-AX) received on one or more address lines 9116. One or more devices external to the memory device 9100 can control the values of the control signals on the control lines 9132 or the address signals on the address line 9116. Examples of devices external to the memory device 9100 can include, but are not limited to, a host, an external memory controller, a processor, or one or more circuits or components not illustrated in FIG. 91.

The memory device 9100 can use access lines 9106 and first data lines 9110 to transfer data to (e.g., write or erase) or from (e.g., read) one or more of the memory cells 9104. The row decoder 9112 and the column decoder 9114 can receive and decode the address signals (A0-AX) from the address line 9116, can determine which of the memory cells 9104 are to be accessed, and can provide signals to one or more of the access lines 9106 (e.g., one or more of a plurality of access lines ($WL_0$-$WL_M$)) or the first data lines 9110 (e.g., one or more of a plurality of data lines (BL0-BLN)), such as described above.

The memory device 9100 can include sense circuitry, such as the sense amplifiers 9120, configured to determine the values of data on (e.g., read), or to determine the values of data to be written to, the memory cells 9104 using the first data lines 9110. For example, in a selected string of memory cells 9104, one or more of the sense amplifiers 9120 can read a logic level in the selected memory cell 9104 in response to a read current flowing in the memory array 9102 through the selected string associated with the data lines 9110.

One or more devices external to the memory device 9100 can communicate with the memory device 9100 using the I/O lines (DQ0-DQN) 9108, address lines 9116 (A0-AX), or control lines 9132. The I/O circuit 9126 can transfer values of data in or out of the memory device 9100, such as in or out of the page buffer 9122 or the memory array 9102, using the I/O lines 9108, according to, for example, the control lines 9132 and address lines 9116. The page buffer 9122 can store data received from the one or more devices external to the memory device 9100 before the data is programmed into relevant portions of the memory array 9102, or can store data read from the memory array 9102 before the data is transmitted to the one or more devices external to the memory device 9100.

The column decoder 9114 can receive and decode address signals (A0-AX) into one or more column select signals ($CSEL_1$-$CSEL_N$). The selector 9124 (e.g., a select circuit) can receive the column select signals ($CSEL_1$-$CSEL_N$) and select data in the page buffer 9122 representing values of data to be read from or to be programmed into memory cells 9104. Selected data can be transferred between the page buffer 9122 and the I/O circuit 9126 using second data lines 9118.

The memory controller 9130 can receive positive and negative supply signals, such as a supply voltage (Vcc) 9134 and a negative supply (Vss) 9136 (e.g., a ground potential) with respect to Vcc, from an external source or supply (e.g., an internal or external battery, an AC-to-DC converter, etc.). In certain examples, the memory controller 9130 can include a regulator 9128 to internally provide positive or negative supply signals.

To program or write data to a memory cell, a programming voltage (VPGM) (e.g., one or more programming pulses, etc.) can be applied to selected access lines (e.g., $WL_i$), and, thus, to a control gate of each memory cell coupled to the selected access lines. Programming pulses can begin, for example, at or near 15V, and, in certain examples, can increase in magnitude during each programming pulse application. While the program voltage is applied to the selected access lines, a potential, such as a ground potential (e.g., Vss), can be applied to the data lines and substrates (and thus the channel structures between the sources and drains) of the memory cells targeted for programming, resulting in a charge transfer (e.g., direct injection or Fowler-Nordheim (FN) tunneling, etc.) from the channel structures to the floating gates of the targeted memory cells.

A Vpass can be applied to one or more access lines having memory cells that are not targeted for programming, or an inhibit voltage (e.g., Vcc) can be applied to data lines having memory cells that are not targeted for programming, for example, to inhibit charge from being transferred from the channel structures to the floating gates of such non-targeted memory cells. The pass voltage can be variable, depending, for example, on the proximity of the applied pass voltages to an access line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific access line, such as WL4, a pass voltage of 10V can be applied to one or more other access lines, such as WL3, WL5, etc., to inhibit programming of non-targeted memory cells, or to retain the values stored on such memory cells not targeted for programming. As the distance between an applied program voltage and the non-targeted memory cells increases, the pass voltage to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of access lines, etc., can be higher or lower, or more or less.

Between applications of one or more programming pulses (e.g., VPGM), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically VPGM) can be applied to the substrates (and thus the channel structures, between the sources and drains) of the memory cells targeted for erasure (e.g., using one or more data lines, select gates, etc.), while the access lines of the targeted memory cells are kept at a potential, such as a ground potential (e.g., Vss), resulting in a charge transfer (e.g., direct injection or FN tunneling, etc.) from the floating gates of the targeted memory cells to the channel structures.

When a host, which is a user device, sends an address to the memory device 9100, it typically can have an identification of a block, a page, and a column. The identification of the block is used to select the block of interest in the operation. The identification of the page is used to select the WL on which the page resides, and it also is used to select one particular sub-block, as the WL is shared among the sub-blocks of the block. The sub-block on which the page resides is decoded and that sub-block is selected. The address provided by the user device is used to turn on and off the selector device and access memory cells. In typical operations, one sub-block only is selected such that SGDs of one sub-block are active.

Based on the address provided by the user device, the memory controller 9130 can select any one sub-block or all sub-blocks. The memory controller 9130 can generate the sub-block address to the sub-block drivers 9109 and select any one sub-block or all sub-blocks. The memory controller 9130 can send the WL information to the row decoder 9112 and a column address to the column decoder 9114.

The sub-block drivers 9109 can include a number of independent drivers that generate signals to select lines 9113 $SL_{0-0} \ldots SL_{K-J}$. These select lines can be coupled to different SGD transistors and different SGS transistors in different blocks. Multiple input signals can be assigned to each individual driver, depending on the different voltages designed for operation of the respective driver during erase operations, program operations, and read operations. From the sub-block drivers 9109, appropriate operational signals can be sent to the memory array 9102 via the select lines 9113 ($SL_{(sub\text{-}block\ \#)\text{-}(SGD\ \#\ or\ SGS\ \#)}$) $SL_{0-0} \ldots SL_{K-J}$.

Figure 92:
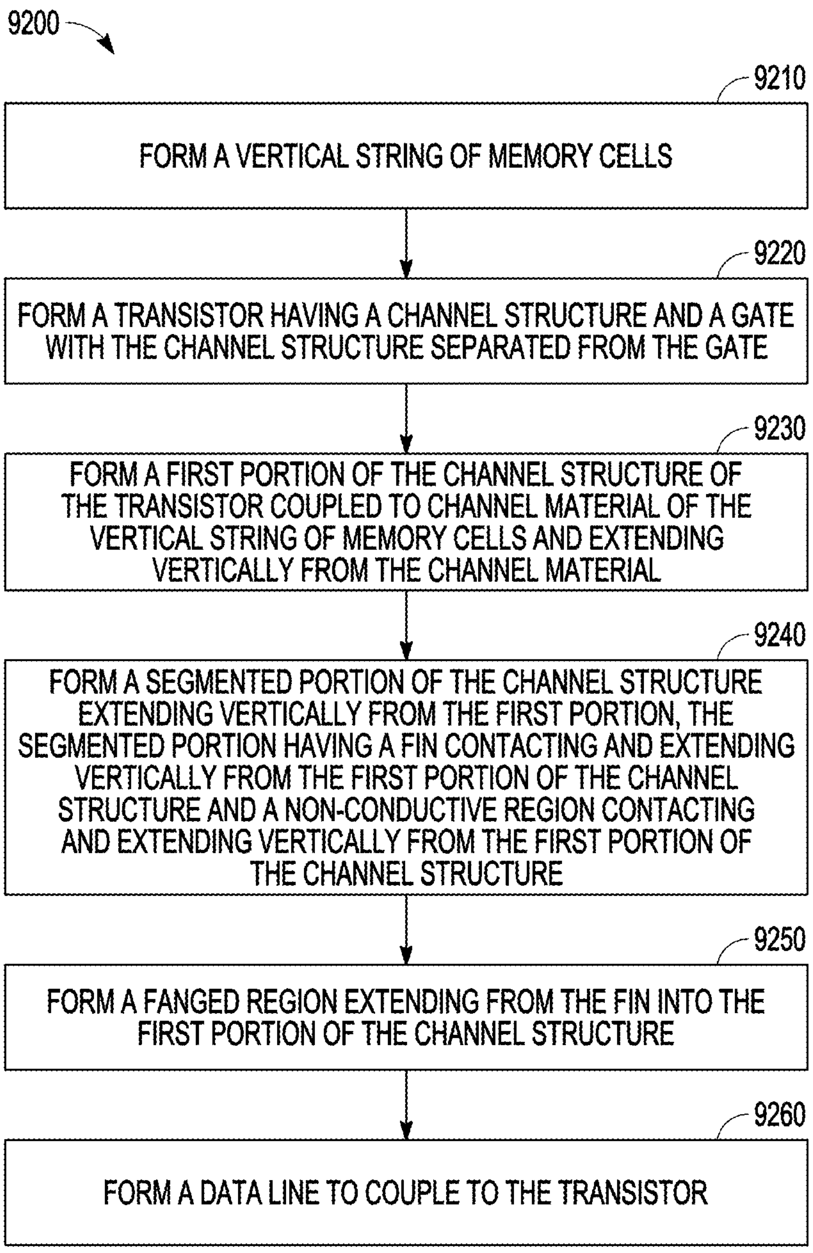
FIG. 92 is a flow diagram of features of an example method of forming a memory device having a drain-side select gate coupling a string of memory cells to a data line, according to various embodiments.

FIG. 92 is a flow diagram of features of an embodiment of an example method 9200 of forming a memory device having a drain-side select gate transistor coupling a string of memory cells to a data line. At 9210, a vertical string of memory cells is formed. A drain-side select gate transistor is subsequently formed to couple a data line to the vertical string. At 9220, the transistor having a channel structure and a gate with the channel structure separated from the gate is formed. At 9230, a first portion of the channel structure of the transistor is formed coupled to channel material of the vertical string of memory cells and extending vertically from the channel material. At 9240, a segmented portion of the channel structure is formed extending vertically from the first portion, with the segmented portion having a fin contacting and extending vertically from the first portion of the channel structure and having a non-conductive region contacting and extending vertically from the first portion of the channel structure. At 9250, a fanged region is formed extending from the fin into the first portion of the channel structure. The fin and the fanged region can be formed heavily doped relative to doping of the first portion. The fin and the fanged region can be formed as n+ regions and the first portion can be formed as an n− region. At 9260, a data line is formed to couple to the transistor.

Variations of the method 9200 or methods similar to the method 9200 can include a number of different embodiments that may be combined depending on the application of such methods and/or the architecture of memory devices in which such memory devices are implemented. Such methods can include using a single photomask to form the transistor such that cuts and block segmentation for a memory array of the memory device are self-aligned. Variations can include layering of sacrificial materials for forming the segmented portion of the channel structure and a drain. Variations can include forming the transistor shifted from the vertical string with a drain contact substantially centered on and extending vertically from a drain of the transistor, and forming the data line coupled to a top of the drain contact. Variations can include forming the gate having a top level that underlaps an interface between the first portion and the fin or forming the gate aligned with the interface. Variations can include forming the gate having a top level that overlaps the interface between the first portion and the fin.

Variations of the method 9200 or methods similar to the method 9200 can include forming the transistor with a drain contact built in situ with forming a module containing the fin. Forming such a drain contact can include forming a vertical region of a first conductive material extending vertically from the first portion of the channel structure, with the first conductive material surrounding a region of dielectric material and removing portions of the region of dielectric material, forming an opening to the region of dielectric material with the opening surrounded by the first conductive material. In the opening, a second conductive material can be formed on the region of dielectric material with the second conductive material extending vertically from the region of dielectric material. Portions of the second conductive material can be removed, forming an opening to the second conductive material with the opening surrounded by remaining portions of the second conductive material. Material for the drain contact can be formed in the opening to the second conductive material. Further processing of the first conductive material, the region of dielectric material, the second conductive material, and the material for the drain contact can be conducted to form the drain contact, the fin, the fanged portion, and the first portion of the channel structure. The fin and the fanged portion can be doped more heavily than the first portion. Forming the material for the drain contact can include forming a titanium silicide and a combination of titanium nitride and tungsten in the opening to the second conductive material with the titanium silicide between the combination of the titanium nitride and tungsten and the second conductive material. In an alternative embodiment, the drain contact can be formed on a landing pad to a drain region for the transistor, after forming the transistor.

In various embodiments, a memory device can comprise a vertical pillar of memory cells, a data line, and a transistor to couple the data line to the vertical pillar of memory cells. The transistor can have a channel structure and a gate, where the channel structure is separated from the gate. The channel structure can have a first portion and a segmented portion. The first portion of the channel structure of the transistor is coupled to channel material of the vertical pillar of memory cells and extends vertically from the channel material. The segmented portion of the channel structure extends vertically from the first portion, where the segmented portion has a fin contacting the first portion and a non-conductive region. The fin extends vertically from the first portion of the channel structure and the non-conductive region contacts and extends vertically from the first portion of the channel structure. The first portion can have a border with the non-conductive region, with the border decreasing from the fin to a location below a lowest level of the fin. The border can be a rounded border where the peak of the border is located symmetrically below the non-conductive region. The segmented portion can have one or more fins and one or more non-conductive regions.

Variations of such a memory device or similar memory devices can include a number of different embodiments that may be combined depending on the application of such memory devices and/or the architecture in which such memory devices are implemented. Such memory devices can include the channel structure having a border region along the border, with the border region along the border being heavily doped relative to doping of the first portion outside the border region. Variations of such memory devices can include the channel structure having an emitter region extending downward in the first portion from the border with the emitter region being heavily doped relative to doping of the first portion outside the emitter region. Other variations can include the channel structure having a border region along the border, with an emitter extending downward from the border region, with the border region along the border and the emitter being heavily doped relative to doping of the first portion outside the border region and the emitter. Another variation of such memory devices can include the channel structure having a fanged region extending from the fin along the border into the first portion of the channel structure, where the fanged region is heavily doped relative to doping of the first portion outside the fanged region. The memory device can be based on n-type semiconductor material. In other embodiments, the memory device can be based on p-type semiconductor material.

In various embodiments, a memory device can comprise a vertical pillar of memory cells, a data line, and a transistor to couple the data line to the vertical pillar of memory cells. The transistor can have a channel structure and a gate, where the channel structure is separated from the gate. A first portion of the channel structure of the transistor can be coupled to channel material of the vertical pillar of memory cells and can extend vertically from the channel material. A segmented portion of the channel structure can extend vertically from the first portion. The segmented portion can have a fin contacting and extending vertically from the first portion of the channel structure and can have a non-conductive region contacting and extending vertically from the first portion of the channel structure. A fanged region can extend from the fin into the first portion of the channel structure. The fin and the fanged region can be heavily doped relative to doping of the first portion. For example, the fin and the fanged regions can be n+ regions with the first portion being an n− region. In other embodiments, the memory device can be based on p-type semiconductor material. A top of the gate can overlap an interface between the first portion and the fin, underlap the interface, or be aligned at a bottom level of the fin.

Variations of such a memory device or similar memory devices can include a number of different embodiments that may be combined depending on the application of such memory devices and/or the architecture in which such memory devices are implemented. Such memory devices can include the transistor shifted horizontally with respect to the vertical pillar. The memory device can include a drain contact coupled to the fin with the drain contact having a width equal to or less than a width of the data line. The drain contact can include tungsten.

Variations of such a memory device or similar memory devices can include a top of the first portion having a rounded border from the fin to a second fin, where the second fin is separated from the fin by the non-conductive region. The rounded border decreases from the fin towards a border location of the first portion with the non-conductive region. The rounded border can extend under the non-conductive region from an end of the fanged region to an end of a second fanged region, where the second fanged region extends from the second fin into the first portion of the channel structure. Variations can include the non-conductive region being a void region.

In various embodiments, a memory system can comprise multiple memory devices. One or more of the memory devices can include data lines, a memory array, and a memory controller including processing circuitry. The memory array has vertical strings of memory cells with each vertical string formed as a pillar coupled to a transistor, where the transistor couples the string to a data line of the data lines. The transistor can have a channel structure and a gate, where the channel structure is separated from the gate. The channel structure has a first portion and a segmented portion. The first portion of the channel structure is coupled to channel material of the vertical string and extends vertically from the channel material. The segmented portion of the channel structure extends vertically from the first portion. The segmented portion has a fin contacting and extending vertically from the first portion of the channel structure and has a non-conductive region contacting and extending vertically from the first portion of the channel structure. A fanged region extends from the fin into the first portion of the channel structure. The memory controller is configured to perform operations including performance of an erase operation on a selected string of the memory array with application of an erase voltage to the gate of the transistor coupling the selected string to the data line associated with the selected string. The fin and the fanged region can be n+ regions and the first portion can be an n-region.

Variations of such a memory system or similar memory systems can include a number of different embodiments that may be combined depending on the application of such memory systems and/or the architecture in which such memory systems are implemented. Such memory systems can include the transistor shifted horizontally with respect to the string. A top of the gate can overlap an interface between the first portion and the fin, can underlap the interface, or can be aligned at a bottom level of the fin. The memory device can include a drain contact coupled to the fin with the drain contact having a width equal to or less than a width of the data line.

Variations can include a top of the first portion having a rounded border extending under the non-conductive region from an end of the fanged region to an end of a second fanged region. The second fanged region extends from a second fin into the first portion of the channel structure, where the second fin is separated from the fin by the non-conductive region. Variations can include the segmented portion of the channel structure having four fins, where each fin is separated from adjacent fins by non-conductive regions. Other configurations can include more or less than four fins.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and Internet-connected appliances or devices (e.g., Internet-of-Things (IoT) devices, etc.), have varying storage needs depending on, among other things, the type of electronic device, use environment, performance expectations, etc.

Electronic devices can be broken down into several main components: a processor (e.g., a central processing unit (CPU) or other main processor); memory (e.g., one or more volatile or non-volatile RAM memory device, such as DRAM, mobile or low-power double-data-rate synchronous DRAM (DDR SDRAM), etc.); and a storage device (e.g., a NVM device such as flash memory, ROM, an SSD, a MultiMediaCard (MMC), or other memory card structure or assembly, etc.). In certain examples, electronic devices can include a user interface (e.g., a display, touch-screen, keyboard, one or more buttons, etc.), a graphics processing unit (GPU), a power management circuit, a baseband processor or one or more transceiver circuits, etc.

Figure 93:
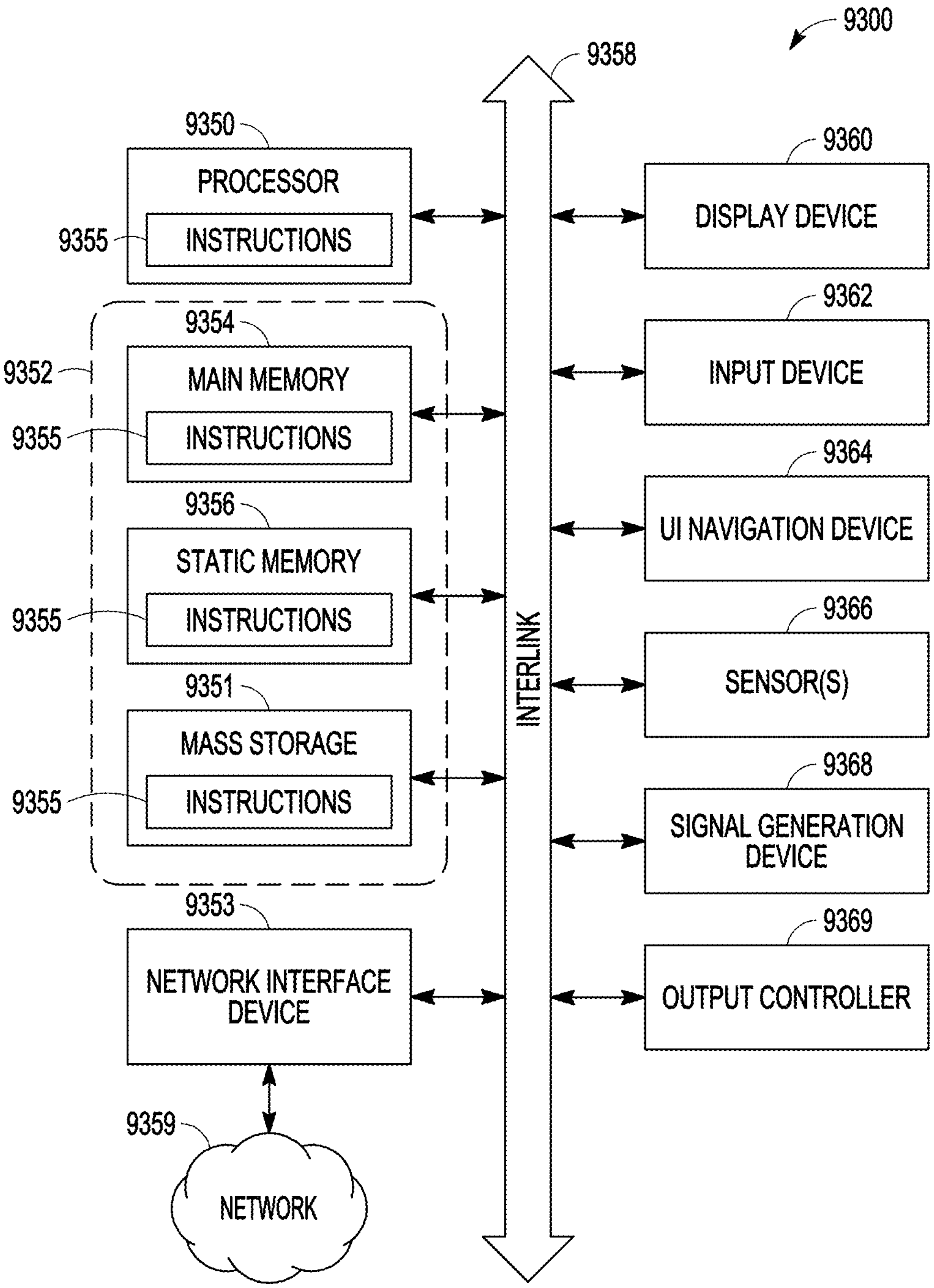
FIG. 93 is a block diagram of an example machine having one or more memory devices structured to enhance band-to-band tunneling, during erase operations, in select gate transistors that couple data lines to strings of memory cells in a memory array of the one or more memory devices, according to various embodiments.

FIG. 93 is a block diagram of an embodiment of an example machine having one or more memory devices structured to enhance band-to-band tunneling, during erase operations, in SGD transistors coupling data lines to strings of memory cells in a memory array of the one or more memory devices. The SGD transistors can be constructed using any of the channel structures 102A, 102B, 102C, and 102D of FIGS. 1A, 1B, 1C, and 1D respectively. The machine 9300, having one or more such memory devices, may operate as a standalone machine or may be connected, for example networked, to other machines.

In a networked deployment, the machine 9300 may operate in the capacity of a server machine, a client machine, or both in server-client network environments. In an example, the machine 9300 may act as a peer machine in peer-to-peer (P2P) (or other distributed) network environment. The machine 9300 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations. The example machine 9300 can be arranged to operate with one or more memory devices having SGD transistors. having a segmented structure extending vertically from a transistor channel region, coupling strings of memory cells to associated data lines in the one or more memory devices, as taught herein. The example machine 9300 can include one or more memory devices having structures similar to the structure as discussed with respect to the memory device 9100 of FIG. 91.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent can be changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 9300 may include a hardware processor 9350 (e.g., a CPU, a GPU, a hardware processor core, or any combination thereof), a main memory 9354, and a static memory 9356, some or all of which may communicate with each other via an interlink (e.g., bus) 9358. The machine 9300 may further include a display device 9360, an alphanumeric input device 9362 (e.g., a keyboard), and a user interface (UI) navigation device 9364 (e.g., a mouse). In an example, the display device 9360, input device 9362, and UI navigation device 9364 may be a touch screen display. The machine 9300 may additionally include a mass storage device (e.g., drive unit) 9351, a signal generation device 9368 (e.g., a speaker), a network interface device 9353, and one or more sensors 9366, such as a global positioning system (GPS) sensor, compass, accelerometer, or other sensor. The machine 9300 may include an output controller 9369, such as a serial (e.g., Universal Serial Bus (USB), parallel, or other wired or wireless (e.g., infrared (IR), near field communication (NFC), etc.) connection to communicate or control one or more peripheral devices (e.g., a printer, card reader, etc.).

The machine 9300 may include a machine-readable medium 9352 on which is stored one or more sets of data structures or instructions 9355 (e.g., software) embodying or utilized by the machine 9300 to perform any one or more of the techniques or functions for which the machine 9300 is designed. The instructions 9355 may also reside, completely or at least partially, within the main memory 9354, within static memory 9356, within the mass storage device 9351, or within the hardware processor 9350 during execution thereof by the machine 9300. In an example, one or any combination of the hardware processor 9350, the main memory 9354, the static memory 9356, or the mass storage device 9351 may constitute the machine-readable medium 9352.

While the machine-readable medium 9352 is illustrated as a single medium, the term "machine-readable medium" may include a single medium or multiple media (e.g., a centralized or distributed database, or associated caches and servers) configured to store the one or more instructions 9355. The term "machine-readable medium" may include any medium that is capable of storing or encoding instructions for execution by the machine 9300 and that cause the machine 9300 to perform any one or more of the techniques to which the machine 9300 is designed, or that is capable of storing or encoding data structures used by or associated with such instructions. Non-limiting machine-readable medium examples may include solid-state memories, and optical and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include non-volatile memory, such as semiconductor memory devices (e.g., EPROM, EEPROM) and flash memory devices; magnetic disks, such as internal hard disks and removable disks; magneto-optical disks; and compact disc-ROM (CD-ROM) and digital versatile disc-read only memory (DVD-ROM) disks.

The instructions 9355 (e.g., software, programs, an operating system (OS), etc.) or other data, stored on the mass storage device 9351, can be accessed by the main memory 9354 for use by the processor 9350. The main memory 9354 (e.g., DRAM) is typically fast, but volatile, and thus a different type of storage than the mass storage device 9351 (e.g., an SSD), which is suitable for long-term storage, including while in an "off" condition. The instructions 9355 or data in use by a user or the machine 9300 are typically loaded in the main memory 9354 for use by the processor 9350. When the main memory 9354 is full, virtual space from the mass storage device 9351 can be allocated to supplement the main memory 9354; however, because the mass storage device 9351 is typically slower than the main memory 9354, and write speeds are typically at least twice as slow as read speeds, use of virtual memory can greatly reduce user experience due to storage device latency (in contrast to the main memory 9354, e.g., DRAM). Further, use of the mass storage device 9351 for virtual memory can greatly reduce the usable lifespan of the mass storage device 9351.

In contrast to virtual memory, virtual memory compression (e.g., the Linux® kernel feature "ZRAM") uses part of the memory as compressed block storage to avoid paging to the mass storage device 9351. Paging takes place in the compressed block until it is necessary to write such data to the mass storage device 9351. Virtual memory compression increases the usable size of main memory 9354, while reducing wear on the mass storage device 9351.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device and are often removable and separate components from the host device. In contrast, embedded MMC (eMMC™) devices are attached to a circuit board and considered a component of the host device, with read speeds that rival Serial Advanced Technology Attachment (SATA)-based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 9355 may further be transmitted or received over a communications network 9359 using a transmission medium via the network interface device 9353 utilizing any one of a number of transfer protocols (e.g., frame relay, Internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 9353 may include one or more physical jacks (e.g., Ethernet, coaxial, or phone jacks) or one or more antennas to connect to the communications network 9359. In an example, the network interface device 9353 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any tangible medium that is capable of carrying instructions to and for execution by the machine 9300, and includes instrumentalities to propagate digital or analog communications signals to facilitate communication of such instructions, which instructions may be implemented by software.

The following are example embodiments of devices and methods, in accordance with the teachings herein.

An example memory device 1 can comprise: a vertical pillar of memory cells; a data line; a transistor to couple the data line to the vertical pillar of memory cells, the transistor having a channel structure and a gate, the channel structure separated from the gate; a first portion of the channel structure of the transistor coupled to channel material of the vertical pillar of memory cells and extending vertically from the channel material; and a segmented portion of the channel structure extending vertically from the first portion, the segmented portion having a fin contacting and extending vertically from the first portion of the channel structure and a non-conductive region contacting and extending vertically from the first portion of the channel structure, the first portion having a border with the non-conductive region, with the border decreasing from the fin to a location below a lowest level of the fin.

An example memory device 2 can include features of example memory device 1 and can include the channel structure including a border region along the border, with the border region along the border being heavily doped relative to doping of the first portion outside the border region.

An example memory device 3 can include features of any of the preceding example memory devices and can include the channel structure including an emitter region extending downward in the first portion from the border with the emitter region being heavily doped relative to doping of the first portion outside the emitter region.

An example memory device 4 can include features of example memory device 3 and any of the preceding example memory devices 1-2 and can include the channel structure including a border region along the border, with the emitter extending downward from the border region, with the border region along the border being heavily doped relative to doping of the first portion outside the border region.

An example memory device 5 can include features of any of the preceding example memory devices and can include the channel structure including a fanged region extending from the fin along the border into the first portion of the channel structure, the fanged region being heavily doped relative to doping of the first portion outside the fanged region.

In an example memory device 6, any of the memory devices of example memory devices 1 to 5 may include memory devices incorporated into an electronic memory apparatus further comprising a host processor and a communication bus extending between the host processor and the memory device.

In an example memory device 7, any of the memory devices of example memory devices 1 to 6 may be modified to include any structure presented in another of example memory device 1 to 6.

In an example memory device 8, any apparatus associated with the memory devices of example memory devices 1 to 7 may further include a machine-readable storage device configured to store instructions as a physical state, wherein the instructions may be used to perform one or more operations of the apparatus.

In an example memory device 9, any of the memory devices of example memory devices 1 to 8 may be operated in accordance with any of the methods of the below example methods 1 to 14.

An example memory device 10 can comprise: a vertical pillar of memory cells; a data line; and a transistor to couple the data line to the vertical pillar of memory cells. The transistor has a channel structure and a gate, the channel structure separated from the gate; a first portion of the channel structure of the transistor coupled to channel material of the vertical pillar of memory cells and extending vertically from the channel material; a segmented portion of the channel structure extending vertically from the first portion, the segmented portion having a fin contacting and extending vertically from the first portion of the channel structure and a non-conductive region contacting and extending vertically from the first portion of the channel structure; and a fanged region extending from the fin into the first portion of the channel structure.

An example memory device 11 can include features of example memory device 10 and can include the transistor shifted horizontally with respect to the vertical pillar.

An example memory device 12 can include features of any of the preceding example memory devices 10 or 11 and can include the fin and the fanged region being heavily doped relative to doping of the first portion.

An example memory device 13 can include features of any of memory devices 10-12 and can include a top of the gate overlapping an interface between the first portion and the fin, underlapping the interface, or being aligned at a bottom level of the fin.

An example memory device 14 can include features of any of the preceding example memory devices 10-14 and can include the memory device including a drain contact coupled to the fin with the drain contact having a width equal to or less than a width of the data line.

An example memory device 15 can include features of example memory device 14 and any of the preceding example memory devices 10-14 and can include the drain contact including tungsten.

An example memory device 16 can include features of any of the preceding example memory devices 10-15 and can include a top of the first portion having a rounded border from the fin to a second fin, the second fin separated from the fin by the non-conductive region, with the rounded border decreasing from the fin towards a border location of the first portion with the non-conductive region.

An example memory device 17 can include features of example memory device 16 and any of the preceding example memory devices 10-15 and can include the rounded border extending under the non-conductive region from an end of the fanged region to an end of a second fanged region, the second fanged region extending from the second fin into the first portion of the channel structure.

An example memory device 18 can include features of any of the preceding example memory devices 10-17 and can include the non-conductive region being a void region.

In an example memory device 19, any of the memory devices of example memory devices 10 to 18 may include memory devices incorporated into an electronic memory apparatus further comprising a host processor and a communication bus extending between the host processor and the memory device.

In an example memory device 20, any of the memory devices of example memory devices 10 to 19 may be modified to include any structure presented in another of example memory device 10 to 19.

In an example memory device 21, any apparatus associated with the memory devices of example memory devices 10 to 20 may further include a machine-readable storage device configured to store instructions as a physical state, wherein the instructions may be used to perform one or more operations of the apparatus.

In an example memory device 22, any of the memory devices of example memory devices 10 to 21 may be operated in accordance with any of the methods of the below example methods 1 to 14.

An example memory system 1 can comprise: multiple memory devices, with one or more of the memory devices including: data lines; a memory array having vertical strings of memory cells with each vertical string arranged as a pillar coupled to a transistor, the transistor coupling the string to a data line of the data lines, the transistor having: a channel structure and a gate, the channel structure separated from the gate; a first portion of the channel structure coupled to channel material of the vertical string and extending vertically from the channel material; and a segmented portion of the channel structure extending vertically from the first portion, the segmented portion having a fin contacting and extending vertically from the first portion of the channel structure and a non-conductive region contacting and extending vertically from the first portion of the channel structure; and a fanged region extending from the fin into the first portion of the channel structure. The memory system comprises a memory controller including processing circuitry, the memory controller configured to perform operations including performance of an erase operation on a selected string of the memory array with application of an erase voltage to the gate of the transistor coupling the selected string to the data line associated with the selected string.

An example memory system 2 can include features of example memory system 1 and can include the transistor shifted horizontally with respect to the string.

An example memory system 3 can include features of any of the preceding example memory systems and can include the fin and the fanged region being n+ regions and the first portion being an n− region.

An example memory system 4 can include features of any of the preceding example memory systems and can include a top of the gate overlapping an interface between the first portion and the fin, underlapping the interface, or aligned at a bottom level of the fin.

An example memory system 5 can include features of any of the preceding example memory systems and can include the memory device including a drain contact coupled to the fin with the drain contact having a width equal to or less than a width of the data line.

An example memory system 6 can include features of any of the preceding example memory systems and can include a top of the first portion having a rounded border extending under the non-conductive region from an end of the fanged region to an end of a second fanged region, the second fanged region extending from a second fin into the first portion of the channel structure, the second fin separated from the fin by the non-conductive region.

An example memory system 7 can include features of any of the preceding example memory systems and can include the segmented portion of the channel structure including four fins, each fin separated from adjacent fins by non-conductive regions.

In an example memory system 8, any of the memory systems of example memory systems 1 to 7 may include memory systems incorporated into an electronic memory apparatus further comprising a host processor and a communication bus extending between the host processor and the memory system.

In an example memory system 9, any of the memory systems of example memory systems 1 to 8 may be modified to include any structure presented in another of example memory system 1 to 8.

In an example memory system 10, any of apparatus associated with the memory systems of example memory systems 1 to 9 may further include a machine-readable storage device configured to store instructions as a physical state, wherein the instructions may be used to perform one or more operations of the apparatus.

In an example memory system 11, any of the memory systems of example memory systems 1 to 10 may be operated in accordance with any of the methods of the following example methods 1 to 14.

An example method 1 of forming a memory device can comprise: forming a vertical string of memory cells; forming a transistor to couple a data line to the vertical string, including: forming the transistor having a channel structure and a gate with the channel structure separated from the gate; forming a first portion of the channel structure of the transistor coupled to channel material of the vertical string of memory cells and extending vertically from the channel material; forming a segmented portion of the channel structure extending vertically from the first portion, the segmented portion having a fin contacting and extending vertically from the first portion of the channel structure and a non-conductive region contacting and extending vertically from the first portion of the channel structure; and forming a fanged region extending from the fin into the first portion of the channel structure; and forming the data line to couple to the transistor.

An example method 2 of forming a memory device can include features of example method 1 of forming a memory device and can include forming the transistor shifted from the vertical string, forming a drain contact substantially centered on and extending vertically from a drain of the transistor, and forming the data line coupled to a top of the drain contact.

An example method 3 of forming a memory device can include features of any of the preceding example methods of forming a memory device and can include forming the fin and the fanged region as n+ regions and forming the first portion as an n− region.

An example method 4 of forming a memory device can include features of any of the preceding example methods of forming a memory device and can include forming the gate having a top level that underlaps an interface between the first portion and the fin or forming the gate aligned with the interface.

An example method 5 of forming a memory device can include features of any of the preceding example methods of forming a memory device and can include using a single photomask to form the transistor such that cuts and block segmentation for a memory array of the memory device are self-aligned.

An example method 6 of forming a memory device can include features of any of the preceding example methods of forming a memory device and can include layering of sacrificial materials for forming the segmented portion of the channel structure and a drain.

An example method 7 of forming a memory device can include features of any of the preceding example methods of forming a memory device and can include forming the transistor including forming a drain contact built in situ with forming a module containing the fin. An example method 8 of forming a memory device can include features of example method 7 of forming a memory device and features of any of the example methods 1-6 of forming a memory device and can include forming a vertical region of a first conductive material extending vertically from the first portion of the channel structure, with the first conductive material surrounding a region of dielectric material; removing portions of the region of dielectric material, forming an opening to the region of dielectric material with the opening surrounded by the first conductive material; forming, in the opening, a second conductive material on the region of dielectric material, the second conductive material extending vertically from the region of dielectric material; removing portions of the second conductive material, forming an opening to the second conductive material with the opening surrounded by remaining portions of the second conductive material; forming material for the drain contact in the opening to the second conductive material; further processing the first conductive material, the region of dielectric material, the second conductive material, and the material for the drain contact to form the drain contact, the fin, the fanged portion, and the first portion of the channel structure, with the fin and the fanged portion being doped more heavily than the first portion.

An example method 9 of forming a memory device can include features of example method 8 of forming a memory device and features of any of the example methods 1-7 of forming a memory device and can include forming the material for the drain contact including forming a titanium silicide and a combination of titanium nitride and tungsten in the opening to the second conductive material with the titanium silicide between the combination of the titanium nitride and tungsten and the second conductive material.

An example method 10 of forming a memory device can include features of any of the preceding example methods of forming a memory device and can include forming a drain contact on a landing pad to a drain region for the transistor, after forming the transistor.

In an example method 11 of forming a memory device, any of the example methods 1 to 10 of forming a memory device may be performed in forming an electronic memory apparatus further comprising a host processor and a communication bus extending between the host processor and the memory device.

In an example method 12 of forming a memory device, any of the example methods 1 to 11 of forming a memory device may be modified to include operations set forth in any other of method examples 1 to 11 of forming a memory device.

In an example method 13 of forming a memory device, any of the example methods 1 to 12 of forming a memory device may be implemented at least in part through use of instructions stored as a physical state in one or more machine-readable storage devices.

An example method 14 of forming a memory device can include features of any of the preceding example methods 1 to 13 of forming a memory device and can include performing functions associated with any features of example memory devices 1 to 22 and memory systems 1 to 11.

An example machine-readable storage device 1 storing instructions, that when executed by one or more processors, cause a machine to perform operations, can comprise instructions to perform functions associated with any features of example memory devices 1 to 22 and memory systems 1 to 11 or perform methods associated with any features of example methods 1 to 14.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. The above description is intended to be illustrative, and not restrictive, and the phraseology or terminology employed herein is for the purpose of description. Combinations of the above embodiments and other embodiments will be apparent to those of skill in the art upon studying the above description.

What is claimed is:

1. A method of forming a memory device, the method comprising:

forming a vertical string of memory cells;

forming a transistor to couple a data line to the vertical string, including:

forming the transistor having a channel structure and a gate with the channel structure separated from the gate;

forming a first portion of the channel structure of the transistor coupled to channel material of the vertical string of memory cells and extending vertically from the channel material;

forming a segmented portion of the channel structure extending vertically from the first portion, the segmented portion having a fin contacting and extending vertically from the first portion of the channel structure and a non-conductive region contacting and extending vertically from the first portion of the channel structure; and forming a fanged region extending from the fin into the first portion of the channel structure; and forming the data line to couple to the transistor.

2. The method of claim 1, wherein the method includes forming the transistor shifted from the vertical string, forming a drain contact substantially centered on and extending vertically from a drain of the transistor, and forming the data line coupled to a top of the drain contact.

3. The method of claim 1, wherein the method includes forming the fin and the fanged region as n+ regions and forming the first portion as an n− region.

4. The method of claim 3, wherein the method includes forming the gate having a top level that underlaps an interface between the first portion and the fin or forming the gate aligned with the interface.

5. The method of claim 1, wherein the method includes using a single photomask to form the transistor such that cuts and block segmentation for a memory array of the memory device are self-aligned.

6. The method of claim 1, wherein the method includes layering of sacrificial materials for forming the segmented portion of the channel structure and a drain.

7. The method of claim 1, wherein forming the transistor includes forming a drain contact built in situ with forming a module containing the fin.

8. The method of claim 7, wherein forming the drain contact includes:

forming a vertical region of a first conductive material extending vertically from the first portion of the channel structure, with the first conductive material surrounding a region of dielectric material;

removing portions of the region of dielectric material, forming an opening to the region of dielectric material with the opening surrounded by the first conductive material;

forming, in the opening, a second conductive material on the region of dielectric material, the second conductive material extending vertically from the region of dielectric material;

removing portions of the second conductive material, forming an opening to the second conductive material with the opening surrounded by remaining portions of the second conductive material;

forming material for the drain contact in the opening to the second conductive material;

further processing the first conductive material, the region of dielectric material, the second conductive material, and the material for the drain contact to form the drain contact, the fin, the fanged portion, and the first portion of the channel structure, with the fin and the fanged portion being doped more heavily than the first portion.

9. The method of claim 8, wherein forming the material for the drain contact includes forming a titanium silicide and a combination of titanium nitride and tungsten in the opening to the second conductive material with the titanium silicide between the combination of the titanium nitride and tungsten and the second conductive material.

10. The method of claim 1, wherein the method includes forming a drain contact on a landing pad to a drain region for the transistor, after forming the transistor.

11. A method of forming a memory device, the method comprising:

forming a vertical pillar of memory cells;

forming a transistor including:

forming the transistor having a channel structure and a gate with the channel structure separated from the gate;

forming a first portion of the channel structure of the transistor coupled to channel material of the vertical pillar of memory cells and extending vertically from the channel material; and segmenting a portion of the channel structure extending vertically from the first portion, including forming the segmented portion having a fin contacting and extending vertically from the first portion of the channel structure and a non-conductive region contacting and extending vertically from the first portion of the channel structure, the first portion having a border with the non-conductive region, with the border decreasing from the fin to a location below a lowest level of the fin; and forming a data line to couple to the vertical pillar by the transistor.

12. The method of claim 11, wherein the method includes forming the channel structure having a border region along the border and doping the border region along the border heavily relative to doping of the first portion outside the border region.

13. The method of claim 11, wherein the method includes forming the channel structure having an emitter region extending downward in the first portion from the border with the emitter region being heavily doped relative to doping of the first portion outside the emitter region.

14. The method of claim 13, wherein forming the channel structure includes forming a border region along the border, with the emitter extending downward from the border region, with the border region along the border being heavily doped relative to doping of the first portion outside the border region.

15. The method of claim 11, wherein the method includes forming the channel structure having a first region extending from the fin along the border into the first portion of the channel structure and a second region extending from another fin along the border into the first portion of the channel structure, the first region separated from the second region by an area of the first portion.

16. The method of claim 15, wherein the forming the first region being heavily doped relative to doping of the first portion outside the first region.

17. A method of forming a memory device, the method comprising:

forming a vertical pillar of memory cells;

forming a transistor on the vertical pillar shifted from the vertical pillar, including:

forming the transistor having a channel structure and a gate with the channel structure separated from the gate;

forming a first portion of the channel structure of the transistor coupled to channel of the vertical pillar of memory cells and extending vertically from the channel material; and segmenting a portion of the channel structure extending vertically from the first portion, including forming fins separated from each other by a non-conductive region between the fins; and forming a data line to couple to the vertical pillar by the transistor.

18. The method of claim 17, wherein the method includes:

forming a drain contact substantially centered on and extending vertically from a drain of the transistor; and forming the data line coupled to a top of the drain contact.

19. The method of claim 17, wherein the method includes forming a fanged region or an emitter region extending from each fin into the first portion of the channel structure.

20. The method of claim 19, wherein the method includes forming the fanged region or the emitter region as n+ regions and forming the first portion as an n− region.

* * * * *